United States Patent
Kashiwagi et al.

(12)

(10) Patent No.: US 6,797,323 B1
(45) Date of Patent: Sep. 28, 2004

(54) METHOD OF FORMING SILICON OXIDE LAYER

(75) Inventors: Akihide Kashiwagi, Kanagawa (JP); Kazuhiko Tokunaga, Kanagawa (JP); Toshihiko Suzuki, Kanagawa (JP); Hideki Kimura, Kanagawa (JP); Toyotaka Kataoka, Kanagawa (JP); Atsushi Suzuki, Kanagawa (JP); Shinji Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/979,259

(22) Filed: Nov. 26, 1997

(30) Foreign Application Priority Data

| Nov. 29, 1996 | (JP) | ............................................ | P08-335065 |
| Mar. 12, 1997 | (JP) | ............................................ | P09-057691 |
| Apr. 4, 1997 | (JP) | ............................................ | P09-086806 |
| Apr. 9, 1997 | (JP) | ............................................ | P09-090766 |
| Apr. 30, 1997 | (JP) | ............................................ | P09-112338 |
| Oct. 13, 1997 | (JP) | ............................................ | P09-278977 |

(51) Int. Cl.$^7$ ............................................. C23C 16/40
(52) U.S. Cl. ............................. 427/255.29; 427/255.11; 427/376.1
(58) Field of Search ................... 427/255.29, 255.11, 427/376.1

(56) References Cited

U.S. PATENT DOCUMENTS

| 4,027,380 | A | * | 6/1977 | Deal et al. .................. | 438/227 |
| 4,181,537 | A | * | 1/1980 | Ichinohe ..................... | 438/297 |
| 5,686,346 | A | * | 11/1997 | Duane ........................ | 438/439 |
| 6,297,172 | B1 | * | 10/2001 | Kashiwagi .................. | 438/773 |
| 6,372,663 | B1 | * | 4/2002 | Yeh et al. .................... | 438/773 |
| 6,541,393 | B2 | * | 4/2003 | Sugizaki et al. ............ | 438/763 |
| 6,544,835 | B2 | * | 4/2003 | Yamamoto et al. ......... | 438/240 |
| 6,713,343 | B2 | * | 3/2004 | Sugawara et al. .......... | 438/239 |

FOREIGN PATENT DOCUMENTS

JP 2000183055 A * 6/2000

* cited by examiner

*Primary Examiner*—Bret Chen
(74) *Attorney, Agent, or Firm*—Sonnenschein, Nath & Rosenthal LLP

(57) ABSTRACT

A method of forming a silicon oxide layer comprising initiating formation of a silicon oxide layer on a surface of a silicon layer by an oxidation method using wet gas at an ambient temperature at which no silicon atom is eliminated from the surface of the silicon layer, and then, forming the silicon oxide layer up to a predetermined thickness by an oxidation method using wet gas.

75 Claims, 84 Drawing Sheets

[STEP-110]
INTRODUCTION OF SEMICONDUCTOR SUBSTRATES INTO SUBSTRATE TRANSFER PORTION $N_2$ GAS ATMOSPHERE, AT 400° C $N_2$ GAS ATMOSPHERE, AT ROOM TEMPERATURE

[STEP-120]
OPENING OF SHUTTER 15

$N_2$ GAS ATMOSPHERE, AT 400° C $N_2$ GAS ATMOSPHERE, AT ROOM TEMPERATURE

INTRODUCTION OF SEMICONDUCTOR SUBSTRATES INTO PROCESS CHAMBER $N_2$ GAS ATMOSPHERE, AT 400° C

[STEP-130]

INTRODUCTION OF WET GAS INTO PROCESS CHAMBER

WATER VAPOR ATMOSPHERE, AT 400° C

[STEP-140]

HEATING-UP IN PROCESS CHAMBER

[STEP-150]

INTRODUCTION OF WET GAS INTO PROCESS CHAMBER

EVALUATION OF TDDB PROPERTY

[STEP-510]

INTRODUCTION OF SEMICONDUCTOR SUBSTRATES INTO SUBSTRATE TRANSFER PORTION

[STEP-520]

[STEP-530]
RAISING OF AMBIENT TEMPERATURE

N₂ GAS ATMOSPHERE, ROOM TEMPERATURE → 200° C

[STEP-530] CONTINUED
INTRODUCTION OF WET GAS INTO PROCESS CHAMBER

WATER VAPOR ATMOSPHERE CONTAINING HCl GAS, 200 → 400° C

[STEP-540]

HEATING-UP IN PROCESS CHAMBER

N₂ GAS ATMOSPHERE, 400 → 600° C

[STEP-550]

INTRODUCTION OF WET GAS INTO PROCESS CHAMBER

WATER VAPOR ATMOSPHERE CONTAINING HCl GAS, AT 600° C

[STEP-610]

INTRODUCTION OF SEMICONDUCTOR SUBSTRATES INTO SUBSTRATE TRANSFER PORTION

[STEP-620]

OPENING OF SHUTTER 15

[STEP-630]

[STEP-640]

HEATING-UP IN PROCESS CHAMBER $N_2$ GAS ATMOSPHERE, 400 → 800° C

[STEP-650]

INTRODUCTION OF WET GAS INTO PROCESS CHAMBER

WATER VAPOR ATMOSPHERE CONTAINING HCl GAS, AT 800° C

[STEP-800]

[STEP-830]

[STEP-860]

[STEP-870]

[STEP-820] CONTINUED

[STEP-830]

[STEP-870] CONTINUED

[STEP-950]

INTRODUCTION OF SEMICONDUCTOR SUBSTRATES INTO 2ND PROCESS CHAMBER

[STEP-960]

FORMATION OF
SILICON OXIDE LAYER IN
2ND PROCESS CHAMBER

[STEP-970] CONTINUED

HEAT TREATMENT IN 2ND PROCESS CHAMBER

[STEP-1120]

[STEP-1140]

[STEP-1160]

[STEP-1170]

[STEP-1180]

[PRIORITY ART]
[STEP-10]

[STEP-20]
INTRODUCTION OF SEMICONDUCTOR SUBSTRATES INTO SUBSTRATE TRANSFER PORTION

[PRIORITY ART]

INTRODUCTION OF 0.5 VOL% $O_2$ GAS $N_2$ GAS ATMOSPHERE CONTAINING 0.5 VOL% $O_2$ GAS, AT 700~800° C $N_2$ GAS ATMOSPHERE, AT ROOM TEMPERATURE

[STEP-30]

OPENING OF SHUTTER $N_2$ GAS ATMOSPHERE CONTAINING 0.5 VOL% $O_2$ GAS, AT 700~800° C $N_2$ GAS ATMOSPHERE, AT ROOM TEMPERATURE

INTRODUCTION OF
SEMICONDUCTOR SUBSTRATES INTO
PROCESS CHAMBER $N_2$ GAS ATMOSPHERE CONTAINING 0.5 VOL% $O_2$ GAS, AT 700~800° C

[STEP-40]
INTRODUCTION OF
WET GAS INTO PROCESS CHAMBER

WATER VAPOR ATMOSPHERE, AT 800~900° C

METHOD OF FORMING SILICON OXIDE LAYER

BACKGROUND OF THE INVENTION AND RELATED ART

The present invention relates to a method of forming a silicon oxide layer in the production of, for example, a semiconductor device.

In the production of, for example, a metal oxide semiconductor (MOS) device, it is required to form a gate oxide of silicon oxide on a surface of a silicon semiconductor substrate. Further, in the production of a thin film transistor (TFT), it is required to form a gate oxide of silicon oxide on a surface of a silicon layer provided on an insulating substrate as well. It can be said that a silicon oxide layer fully takes part in the reliability of a semiconductor device. A silicon oxide layer is therefore constantly required to have high dielectric breakdown resistance and long-term reliability.

For example, when a MOS semiconductor device is produced, conventionally, a surface of a silicon semiconductor substrate is cleaned by RCA cleaning prior to the formation of a gate oxide. In the RCA cleaning, the surface of the silicon semiconductor substrate is cleaned with an $NH_4OH/H_2O_2$ aqueous solution and then further cleaned with an $HCl/H_2O_2$ aqueous solution to remove fine particles and metal impurities from the surface. Meanwhile, when the RCA cleaning is carried out, the surface of the silicon semiconductor substrate reacts with the cleaning liquid to form a silicon oxide layer having a thickness of approximately 0.5 nm to 1 nm. This silicon oxide layer will be simply referred to as "oxide layer" hereinafter. The oxide layer is non-uniform in thickness and contains a residual component of the cleaning liquid. The oxide layer is therefore removed by immersing the silicon semiconductor substrate in a hydrofluoric acid aqueous solution, and further, a chemical component is removed with pure water. As a result, there can be obtained a silicon semiconductor substrate surface which is mostly terminated with hydrogen and only partly terminated with fluorine. In the present specification, obtaining a silicon semiconductor substrate surface which is mostly terminated with hydrogen and only partly terminated with fluorine will be represented as "exposing the surface of a silicon semiconductor substrate". Thereafter, the above-obtained silicon semiconductor substrate is introduced into a process chamber (oxidation chamber) to form a silicon oxide layer on its surface.

With a decrease in thickness of a gate oxide and an increase in diameter of a substrate, an apparatus for the formation of a silicon oxide layer has been being converted from a horizontal-type apparatus in which a process chamber extends in the horizontal direction to a vertical-type apparatus in which a process chamber extends in the vertical direction. The horizontal-type apparatus for the formation of a silicon oxide layer is referred to as "horizontal-type processing apparatus" hereinafter, and the vertical-type apparatus for the formation of a silicon oxide layer is referred to as "vertical-type processing apparatus" hereinafter. The reason therefor is as follows. Not only the vertical-type processing apparatus can easily cope with an increase in the diameter of a substrate as compared with the horizontal-type processing apparatus, but also the vertical-type processing apparatus can serve to decrease the formation of a layer of silicon oxide caused by atmosphere taken into a process chamber of the vertical-type processing apparatus during the transfer of a silicon semiconductor substrate into the process chamber. The above layer of silicon oxide will be referred to as "natural oxide" hereinafter. However, even the use of the vertical-type processing apparatus results in the formation of a natural oxide having a thickness of approximately 2 nm on the surface of the silicon semiconductor substrate. The natural oxide contains a large amount of impurities derived from atmosphere, and the presence of the natural oxide is not at all negligible when a gate oxide is decreased in thickness. There have been therefore proposed methods for preventing the formation of the natural oxide to the lowest level possible, such as (1) a method in which a nitrogen gas atmosphere is formed in a substrate transfer portion provided in a vertical-type processing apparatus by flowing a large volume of nitrogen gas (nitrogen gas purge method), and (2) a method in which a substrate transfer portion is vacuumed and then inert gas such as nitrogen gas is introduced into the substrate transfer portion (vacuum loadlock method).

Thereafter, in a state where an inert gas atmosphere is formed in the process chamber (oxidation chamber), a silicon semiconductor substrate is brought into the process chamber. Then, an atmosphere of the process chamber is replaced with an oxidative atmosphere to form a gate oxide. For the formation of the gate oxide, there is generally employed a method in which a surface of a silicon semiconductor substrate is thermally oxidized by introducing high-purity water vapor into the process chamber maintained at a high temperature (wet oxidation method). In this method, a gate oxide having high electric reliability can be obtained as compared with a method in which the surface of a silicon semiconductor substrate is oxidized with dry oxygen gas (dry oxidation method). Included in the above wet oxidation method is an oxidation method using pyrogenic gas (hydrogen gas combustion oxidation method) in which hydrogen gas is mixed with oxygen gas at a high temperature and is combusted and the so-generated water vapor is used for oxidizing silicon in the silicon semiconductor substrate. The oxidation method using pyrogenic gas is widely used. In the oxidation method using pyrogenic gas, generally, oxygen gas is supplied into a combustion chamber disposed outside the process chamber and being maintained at 700 to 900° C., and then hydrogen gas is supplied into the combustion chamber to combust the hydrogen gas with the oxygen gas at a high temperature. The so-obtained water vapor is used as oxidizing species.

FIG. 13 shows a schematic view of a vertical-type processing apparatus based on an oxidation method using pyrogenic gas. The vertical-type processing apparatus comprises a double-tubular structured process chamber 10 which is made of fused quartz and perpendicularly held, a gas inlet port 12 for introducing water vapor and/or gas into the process chamber 10, a gas exhaust port 13 for exhausting the water vapor and/or the gas from the process chamber 10, a heater 14 for maintaining the interior of the process chamber 10 at a predetermined ambient temperature through a cylindrical liner tube 16 made of SiC, a substrate transfer portion 20, a gas introducing portion 21 for introducing inert gas such as nitrogen gas into the substrate transfer portion 20, a gas exhaust portion 22 for exhausting the gas from the substrate transfer portion 20, a shutter 15 for partitioning the process chamber 10 and the substrate transfer portion 20, and an elevator unit 23 for bringing silicon semiconductor substrates into and out of the process chamber 10. Attached to the elevator unit 23 is a fused quartz boat 24 on which the silicon semiconductor substrates are to be placed. Further, hydrogen gas supplied to a combustion chamber 30 is mixed with oxygen gas at a high temperature and combusted in the combustion chamber 30, to generate water vapor. The water vapor is introduced into the process chamber 10 through a piping 31, a gas passage 11 and the gas inlet port 12. The gas passage 11 corresponds to a space between an inner wall and an outer wall of the double-tubular structured process chamber 10.

The outline of a conventional method of forming a silicon oxide layer with the vertical-type processing apparatus based on an oxidation method using pyrogenic gas will be explained below with reference to FIG. 13 and FIGS. 82, 83 and 84.

[Step-10]

Nitrogen gas is introduced into the process chamber 10 through a piping 32, the combustion chamber 30, the piping 31, the gas passage 11 and the gas inlet port 12 so as to bring a nitrogen atmosphere into the process chamber 10, and the ambient temperature in the process chamber 10 is maintained at 700 to 800° C. with the heater 14 through the liner tube 16. In this state, the shutter 15 is kept closed (see FIG. 82A). The substrate transfer portion 20 is in a state where it is open to atmosphere.

[Step-20]

Silicon semiconductor substrates 40 are transferred into the substrate transfer portion 20, and placed on the fused quartz boat 24. After the transfer of the silicon semiconductor substrates 40 into the substrate transfer portion 20 is completed, a door (not shown) is closed. Then, nitrogen gas is introduced into the substrate transfer portion 20 through the gas introducing portion 21 and is exhausted through the gas exhaust portion 22, so that the atmosphere of the substrate transfer portion 20 is replaced with a nitrogen gas atmosphere (see FIG. 82B).

[Step-30]

When a sufficient nitrogen gas atmosphere is formed inside the substrate transfer portion 20, the shutter 15 is opened (see FIG. 83B), and the elevator unit 23 is actuated to elevate the fused quartz boat 24, whereby the silicon semiconductor substrates 40 are transferred into the process chamber 10 (see FIG. 84A). When the elevator unit 23 reaches its uppermost position, the base portion of the fused quartz boat 24 prevents the communication between the process chamber 10 and the substrate transfer portion 20.

If the interior of the process chamber 10 is left in a nitrogen gas atmosphere when the shutter 15 is opened, the following problem occurs. That is, when a silicon semiconductor substrate of which a surface is exposed with a hydrofluoric acid aqueous solution and pure water is introduced into a nitrogen gas atmosphere having a high temperature, the silicon semiconductor substrate 40 undergoes surface roughening. This phenomenon is assumed to be caused for the following reason. Part of Si—H bonds and Si—F bonds, which are formed on the surface of the silicon semiconductor substrate 40 by the cleaning with a hydrofluoric acid aqueous solution and pure water, are eliminated due to the elimination of hydrogen and/or fluorine caused by an increase in temperature, to cause an etching phenomenon on the surface of the silicon semiconductor substrate 40. For example, "Ultraclean ULSI Technology" (OMI Tadahiro, issued by Baifukan), page 21, describes that, when a silicon semiconductor substrate is temperature-increased to 600° C. or higher in an argon gas atmosphere, a heavy concave or convex shape is formed on a surface of the silicon semiconductor substrate. For preventing the above phenomenon, for example, nitrogen gas containing 0.5 vol % of oxygen gas is introduced into the process chamber 10 through the gas inlet port 12 before the shutter 15 is opened, thereby to form a nitrogen gas atmosphere containing 0.5 vol % of oxygen gas inside the process chamber 10 (see FIG. 83A).

[Step-40]

Then, the ambient temperature inside the process chamber 10 is raised to 800 to 900° C. Oxygen gas and hydrogen gas are supplied to the combustion chamber 30 through the pipings 32 and 33, and the hydrogen gas is mixed with the oxygen gas at a high temperature and combusted in the combustion chamber 30. The so-generated water vapor is introduced into the process chamber 10 through the piping 31, the gas passage 11 and the gas inlet port 12, and is exhausted through the gas exhaust port 13 (see FIG. 84B), whereby a silicon oxide layer is formed on the surface of each silicon semiconductor substrate 40. For preventing the occurrence of a detonating gas reaction of incomplete-combusted hydrogen gas in the process chamber 10, which incomplete-combusted hydrogen gas may flow into the process chamber 10 prior to the introduction of water vapor into the process chamber 10, oxygen gas is introduced into the combustion chamber 30 through the piping 32 before hydrogen gas is introduced into the combustion chamber 30 through the piping 33. As a result, the oxygen gas flows into the process chamber 10 through the piping 31, the gas passage 11 and the gas inlet port 12. The temperature in the combustion chamber 30 is maintained at 700 to 900° C., for example, with a heater (not shown).

Since a nitrogen gas atmosphere containing about 0.5 vol % of oxygen gas is formed in the process chamber 10 by introducing nitrogen gas containing about 0.5 vol % of oxygen gas into the process chamber 10 through the gas inlet port 12 before the shutter 15 is opened, the formation of a concave or convex shape on the surface of each silicon semiconductor substrate can be prevented. According to "Ultraclean ULSI Technology" (OMI Tadahiro, issued by Baifukan), page 21, the formation of a concave or convex shape on a surface of a silicon semiconductor substrate can be also prevented by dry-oxidizing the silicon semiconductor substrate having a surface terminated with hydrogen, at 300° C. at which the terminal hydrogen is stably present and thereby forming a silicon oxide layer as a protective layer.

Since, however, nitrogen gas which contains oxygen gas is introduced into the process chamber 10 for preventing the phenomenon of formation of a concave or convex shape on the surface of each silicon semiconductor substrate, a silicon oxide layer is formed on the surface of the silicon semiconductor substrate transferred into the process chamber 10. The so-formed silicon oxide layer is essentially a silicon oxide layer formed by dry oxidation (called "dry oxide layer"), and its properties are inferior to those of a silicon oxide layer formed by a wet oxidation method (called "wet oxide layer"). For example, when a silicon semiconductor substrate is transferred into the process chamber 10 while the ambient temperature of the process chamber 10 is kept at a temperature of 800° C. and the atmosphere of the process chamber 10 is a nitrogen gas atmosphere containing 0.5 vol % of oxygen gas, a dry oxide layer having a thickness of 2 nm or more is formed on the surface of the silicon semiconductor substrate. It is expected that a semiconductor device having a gate length of 0.18 $\mu$m to 0.13 $\mu$m uses a gate oxide of 4 nm–3 nm thickness. When a gate oxide having a thickness of 4 nm is formed, 50% or more of the thickness of the gate oxide is formed of the dry oxide layer.

JP-A-6-291112 discloses a method for overcoming the above problem. That is, in this method, a silicon semiconductor substrate is cleaned with a hydrofluoric acid aqueous solution and then immersed in a hydrogen peroxide aqueous solution to form a silicon oxide layer as a protective layer on a surface of the silicon semiconductor substrate. In this method, however, it is difficult to form a uniform silicon oxide layer with good reproducibility by controlling the concentration of the hydrogen peroxide aqueous solution and some other means. Further, there is another problem that impurities contained in the hydrogen peroxide aqueous solution are included in the silicon oxide layer.

For example, JP-A-6-318588 discloses a method of forming a silicon oxide layer having excellent stability for a long period of time, having high dielectric breakdown resistance and having a small thickness. In this method, an ultra-thin thermal oxidation silicon layer is formed on a surface of a silicon semiconductor substrate by a thermal oxidation method, then, a silicon oxide layer is deposited on the thermal oxidation silicon layer by a chemical vapor deposition (CVD) method. Then, the deposited silicon oxide layer is heat-treated in an oxidative atmosphere. The above method has a problem that the process of forming a silicon oxide layer is complicated since the silicon oxide layer is deposited by the chemical vapor deposition (CVD) method.

The above problems occur not only on a surface of a silicon semiconductor substrate but also on a surface of a silicon layer formed on an insulating substrate or an insulating layer.

OBJECT AND SUMMARY OF THE INVENTION

It is therefore an object of the present invention to provide a method of forming a silicon oxide layer having excellent properties on a surface of a silicon layer, in which the occurrence of surface roughening (a concave or convex shape) can be prevented and the formation of a dry oxide on the surface of the silicon layer can be prevented.

A method of forming a silicon oxide layer according to the first aspect of the present invention for achieving the above object comprises initiating formation of a silicon oxide layer on a surface of a silicon layer by an oxidation method using wet gas at an ambient temperature at which no silicon atom is eliminated from the surface of the silicon layer, and then forming the silicon oxide layer up to a predetermined thickness by an oxidation method using wet gas.

In a method according to the first aspect of the present invention, the ambient temperature at which no silicon atom is eliminated from the surface of the silicon layer is preferably a temperature at which bond of an atom terminating the surface of the silicon layer and a silicon atom is not broken. Specifically, the temperature at which no silicon atom is eliminated from the surface of the silicon layer is preferably a temperature at which Si—H bond on the surface of the silicon layer is not broken or a temperature at which Si—F bond on the surface of the silicon layer is not broken. When a silicon semiconductor substrate having a (100) crystal orientation is used, such a silicon semiconductor substrate has a termination structure in which most of hydrogen atoms on the surface of the silicon semiconductor substrate bond to silicon atoms in a manner that two hydrogen atoms bond to one silicon atom such as H—Si—H. In a portion, for example, a STEP-formed portion where the surface state of the silicon semiconductor substrate is collapsed, however, there is formed a termination structure in which only one bond of a silicon atom is bound to a hydrogen atom or a termination structure in which each of three bonds of a silicon atom is bound to a hydrogen atom. Generally, remaining bond or bonds of each silicon atom on the surface of the silicon semiconductor substrate is or are bound to a silicon atom or silicon atoms inside a crystal. The term "Si—H bond" in the present specification includes all of a termination structure in which each of two bonds of a silicon atom is bound to a hydrogen atom, a termination structure in which only one bond of a silicon atom is bound to a hydrogen atom and a termination structure in which each of three bonds of a silicon atom is bound to a hydrogen atom. In view of a throughput, more specifically, the ambient temperature at which the formation of a silicon oxide layer on the surface of the silicon layer is initiated is a temperature at which the wet gas does not undergo condensation on the surface of the silicon layer, preferably at least 200° C., more preferably at least 300° C.

A method of forming a silicon oxide layer according to the second aspect of the present invention for achieving the above object comprises initiating formation of a silicon oxide layer on the surface of a silicon layer by an oxidation method using wet gas at an ambient temperature which is equivalent to, or higher than, a temperature at which the wet gas does not undergo condensation on the surface of the silicon layer and is equivalent to, or lower than, 500° C., preferably 450° C., more preferably 400° C., and then forming the silicon oxide layer up to a predetermined thickness by an oxidation method using wet gas.

In a method according to the first or second aspect of the present invention, the oxidation method using wet gas is at least one selected from an oxidation method using pyrogenic gas, an oxidation method using water vapor generated by heating pure water and an oxidation method using water vapor generated by bubbling hot pure water with oxygen gas or inert gas. Since the oxidation method using wet gas is employed, there can be obtained a silicon oxide layer having an excellent time dependent dielectric breakdown (TDDB) property. In the oxidation method using wet gas, the wet gas may be diluted with inert gas such as nitrogen gas, argon gas or helium gas.

In a method according to the first or second aspect of the present invention, the ambient temperature when the formation of the silicon oxide layer having the predetermined thickness is completed is preferably higher than the ambient temperature at which the formation of a silicon oxide layer is initiated. Although not specially limited, the ambient temperature when the formation of the silicon oxide layer having the predetermined thickness is completed is 600 to 1200° C., preferably 700 to 1000° C., more preferably 750 to 900° C.

In a method according to the first or second aspect of the present invention, after the formation of the silicon oxide layer having the predetermined thickness is completed, heat treatment of the silicon oxide layer is preferably carried out for further improving its properties.

An atmosphere for the heat treatment in the above case is preferably an inert gas atmosphere containing a halogen element. When the silicon oxide layer is heat-treated in the inert gas atmosphere containing a halogen element, the resultant silicon oxide layer has an excellent time-zero dielectric breakdown (TZDB) property and an excellent time dependent dielectric breakdown (TDDB) property. The inert gas used for the above heat treatment includes nitrogen gas, argon gas and helium gas. The halogen element includes chlorine, bromine and fluorine, and chlorine is preferred. The form of the halogen element contained in the inert gas may include hydrogen chloride (HCl), $CCl_4$, $C_2HCl_3$, $Cl_2$, HBr and $NF_3$. The content of the halogen element in the inert gas in terms of molecules or compounds is 0.001 to 10 vol %, preferably 0.005 to 10 vol %, more preferably 0.02 to 10 vol %. When, for example, chlorine is introduced as hydrogen chloride gas, the content of the hydrogen chloride gas in the inert gas is preferably 0.02 to 10 vol %.

In a method according to the first or second aspect of the present invention, the heat treatment may be carried out with a so-called single wafer processing, while the heat treatment with furnace annealing is preferred. The ambient temperature for the heat treatment is 700 to 1200° C., preferably 700 to 1000° C., more preferably 700 to 950° C. When the heat treatment is carried out with furnace annealing, the heat treatment time is 5 to 60 minutes, preferably 10 to 40 minutes, more preferably 20 to 30 minutes. When the heat treatment is carried out with a single wafer processing, the heat treatment time is preferably 1 to 10 minutes.

In a method according to the first or second aspect of the present invention, the ambient temperature for the heat treatment of the formed silicon oxide layer is preferably higher than the ambient temperature at which the formation of the silicon oxide layer having the predetermined thickness is completed. In this case, after the formation of the silicon oxide layer having the predetermined thickness is completed, the atmosphere is replaced with an inert gas atmosphere, and then, the ambient temperature may be raised to a temperature for the heat treatment. Further, it is preferred to raise the ambient temperature to a temperature for the heat treatment after the atmosphere is replaced with an inert gas atmosphere containing a halogen element. The inert gas includes nitrogen gas, argon gas and helium gas. The form of the halogen element contained in the inert gas may include hydrogen chloride (HCl), $CCl_4$, $C_2HCl_3$, $Cl_2$, HBr and $NF_3$. The content of the halogen element in the inert gas in terms of molecules or compounds is 0.001 to 10 vol %, preferably 0.005 to 10 vol %, more preferably 0.02 to 10 vol %. When chlorine is introduced as hydrogen chloride gas for example, the content of the hydrogen chloride gas in the inert gas is preferably 0.02 to 10 vol %.

The heat treatment may be carried out in an inert gas atmosphere containing a halogen element under reduced pressure in which the pressure of the inert gas containing a halogen element is lower than atmospheric pressure.

After the heat treatment, the silicon oxide layer may be subjected to nitridation. The nitridation is preferably carried out in an $N_2O$ gas, NO gas or $NO_2$ gas atmosphere, and it is most preferably carried out in an $N_2O$ gas atmosphere. Alternatively, it is preferred to carry out the nitridation in an $NH_3$ gas, $N_2H_4$ or hydrazine derivative atmosphere and then to carry out an annealing in an $N_2O$ gas or $O_2$ atmosphere. Desirably, the nitridation is carried out at a temperature of 700 to 1200° C., preferably 800 to 1150° C., more preferably 900 to 1100° C. In this case, the silicon layer is preferably heated by irradiation with infrared ray or by treatment with furnace annealing.

Further, alternatively, an atmosphere for the heat treatment may be a nitrogen-containing gas atmosphere. The nitrogen-containing gas includes $N_2$, $NH_3$, $N_2O$, $NO_2$ and NO.

A preferred embodiment of the method according to the first aspect of the present invention may include a first step of forming a silicon oxide layer and a second step of forming a silicon oxide layer, in which the first step of forming a silicon oxide layer comprises initiating formation of a silicon oxide layer on the surface of the silicon layer by an oxidation method using wet gas at an ambient temperature at which no silicon atom is eliminated from the surface of the silicon layer, and then maintaining the atmosphere at an ambient temperature range in which no silicon atom is eliminated from the surface of the silicon layer, for a predetermined period of time, to form the silicon oxide layer, and the second step of forming a silicon oxide layer comprises further forming the silicon oxide layer up to the predetermined thickness by an oxidation method using wet gas at an ambient temperature higher than the ambient temperature range in which no silicon atom is eliminated from the surface of the silicon layer. The first step of forming a silicon oxide layer is simply referred to as "first oxidation step" hereinafter, and the second step of forming a silicon oxide layer is simply referred to as "second oxidation step" hereinafter.

In the above preferred embodiment of the present invention, the ambient temperature at which no silicon atom is eliminated from the surface of the silicon layer is preferably a temperature at which bond of an atom terminating the surface of the silicon layer and a silicon atom is not broken. Specifically, the temperature at which no silicon atom is eliminated from the surface of the silicon layer is preferably a temperature at which Si—H bond on the surface of the silicon layer is not broken or a temperature at which Si—F bond on the surface of the silicon layer is not broken. In view of a throughput, more specifically, the ambient temperature at which the formation of a silicon oxide layer on the surface of the silicon layer is initiated is a temperature at which the wet gas does not undergo condensation on the surface of the silicon layer, preferably at least 200° C., more preferably at least 300° C. Further, in the first oxidation step, in the second oxidation step or in the first and second oxidation steps, the oxidation method using wet gas is preferably at least one selected from an oxidation method using pyrogenic gas, an oxidation method using water vapor generated by heating pure water and an oxidation method using water vapor generated by bubbling hot pure water with oxygen gas or inert gas. Since the oxidation method using wet gas is employed, there can be obtained a silicon oxide layer having an excellent time dependent dielectric breakdown (TDDB) property. The first oxidation step and the second oxidation step may use the same oxidation method or different oxidation methods. The wet gas used in the first oxidation step, in the second oxidation step or in the first and second oxidation steps may be diluted with inert gas such as nitrogen gas, argon gas or helium gas.

The wet gas used in the first oxidation step, in the second oxidation step or in the first and second oxidation steps may contain a halogen element. When the wet gas containing a halogen element is used, there can be obtained a silicon oxide layer having an excellent time-zero dielectric breakdown (TZDB) property and an excellent time dependent dielectric breakdown (TDDB) property. The halogen element includes chlorine, bromine and fluorine, and chlorine is preferred. The form of the halogen element contained in the wet gas may include hydrogen chloride (HCl), $CCl_4$, $C_2HCl_3$, $Cl_2$, HBr and $NF_3$. The content of the halogen element in the inert gas in terms of molecules or compounds is 0.001 to 10 vol %, preferably 0.005 to 10 vol %, more preferably 0.02 to 10 vol %. When chlorine is introduced as hydrogen chloride gas for example, the content of the hydrogen chloride gas in the wet gas is preferably 0.02 to 10 vol %.

In the preferred embodiment of the present invention, the temperature for forming a silicon oxide layer in the second oxidation step is 600 to 1200° C., preferably 700 to 1000° C., more preferably 750 to 900° C.

In the preferred embodiment of the present invention, an apparatus for the formation of a silicon oxide layer having one process chamber is used, and the first step and second oxidation steps can be carried out in the process chamber. The above embodiment will be referred to as a preferred first embodiment of the present invention. In this case, it is preferred to carry out the first and second oxidation steps with a batch processing. This embodiment will be referred to as a preferred first embodiment A of the present invention.

In the preferred first embodiment of the present invention, the process chamber is provided with heating means for heating the silicon layer, the heating means is disposed outside the process chamber and nearly in parallel with the surface of the silicon layer, and the first and second oxidation steps can be carried out with a single wafer processing. This embodiment will be referred to as a preferred first embodiment B of the present invention.

The preferred first embodiment of the present invention preferably includes a heating-up step between the first oxidation step and the second oxidation step. In this case, an atmosphere in the heating-up step is preferably an inert gas atmosphere or an atmosphere under reduced pressure, or it is preferably an oxidative atmosphere containing wet gas. The inert gas includes nitrogen gas, argon gas and helium gas. The inert gas or the wet gas in the atmosphere in the heating-up step may contain a halogen element. Owing to the presence of a halogen element, the silicon oxide layer formed in the first oxidation step can be further improved in properties. That is, a silicon dangling bond (Si.) and Si—OH which are defects caused in the first oxidation step react with a halogen element at the heating-up step, so that the silicon dangling bond is terminated or a dehydrating reaction is caused. As a result, these defects as reliability-decreasing factors are removed. In particular, the removal of the above defects is effectively applied to an initial silicon oxide layer formed in the first oxidation step. The halogen element includes chlorine, bromine and fluorine, and chlorine is preferred. The form of the halogen element contained in the inert gas or the wet gas may include hydrogen chloride (HCl), $CCl_4$, $C_2HCl_3$, $Cl_2$, HBr and $NF_3$. The content of the halogen element in the inert gas or the wet gas in terms of molecules or compounds is 0.001 to 10 vol %, preferably 0.005 to 10 vol %, more preferably 0.02 to 10 vol %. When chlorine is introduced as hydrogen chloride gas for example, the content of the hydrogen chloride gas in the inert gas or the wet gas is preferably 0.02 to 10 vol %. The atmosphere in the heating-up step may be an oxidative atmosphere containing the wet gas diluted with inert gas.

Alternatively, in the preferred embodiment of the present invention, used is an apparatus for the formation of a silicon oxide layer which has a first process chamber for forming a silicon oxide layer, a second process chamber for forming a silicon oxide layer and a transfer passage connecting the first process chamber and the second process chamber. And, the first oxidation step is carried out in the first process chamber, the silicon layer is transferred from the first process chamber to the second process chamber through the transfer passage, and then, the second oxidation step is carried out in the second process chamber. The above embodiment will be referred to as a preferred second embodiment of the present invention.

In the preferred second embodiment of the present invention, it is preferred to transfer the silicon layer from the first process chamber to the second process chamber through the transfer passage without exposing the silicon layer to atmosphere in view of the prevention of contamination of the surface of the formed silicon oxide layer. An atmosphere inside the transfer passage during the transfer of the silicon layer is preferably an inert gas atmosphere or an atmosphere under reduced pressure. The inert gas includes nitrogen gas, argon gas and helium gas. In this case, the ambient temperature in the transfer passage during the transfer of the silicon layer from the first process chamber to the second process chamber may be room temperature (ordinary temperature), while it is preferably a temperature nearly equivalent to the ambient temperature at which a silicon oxide layer is formed on the surface of the silicon layer in the first process chamber, in view of an improvement in a throughput.

In the preferred second embodiment of the present invention, the first and second oxidation steps may be carried out with a batch processing. Otherwise, the first oxidation step may be carried out with a single wafer processing, and the second oxidation step may be carried out with a batch processing. Further, the first and second oxidation steps may be carried out with a single wafer processing.

The preferred second embodiment of the present invention may use the apparatus for the formation of a silicon oxide layer, in which a shutter is further disposed between that portion of the transfer passage which communicates with the first process chamber and that portion of the transfer passage which communicates with the second process chamber.

In the preferred embodiment of the present invention, it is preferred to heat-treat the silicon oxide layer after the second oxidation step is completed. The heat treatment can be carried out in the same manner as in the first or second aspect of the present invention, and its detailed explanation is therefore omitted. The second oxidation step and the heat treatment may be carried out in the same process chamber or may be carried out in different process chambers. Although not specially limited, examples of combinations of preferred processings in the first and second oxidation steps and in the heat treatment are as shown in Table 1 below. In Table 1 and Table 5, "Batch" means a batch processing and "Single" means a single wafer processing.

TABLE 1

| First oxidation step | Second oxidation step | Heat treatment |
| --- | --- | --- |
| Batch | Batch | Batch |
| Single | Batch | Batch |
| Single | Single | Single |
| Single | Single | Batch |

In the preferred embodiment of the present invention, the final thickness of the silicon oxide layer obtained after the second oxidation step can be a thickness which a semiconductor device is required to have. On the other hand, the thickness of the silicon oxide layer obtained after the first oxidation step is preferably as thin as possible. However, a silicon semiconductor substrate used for the production of semiconductor devices has a (100) crystal orientation in most cases, and a (100) silicon semiconductor substrate necessarily has a so-called STEP on its surface whatever means is taken to smoothen and flatten the surface of the silicon semiconductor substrate. The above STEP is generally of a one silicon atom layer height, while a STEP of a few silicon atoms layer height is sometimes formed. Although not specially limited, it is therefore preferred to form a silicon oxide layer having a thickness of at least 1 nm in the first oxidation step when a (100) silicon semiconductor substrate is used as a silicon layer.

In a method according to the first aspect of the present invention including the preferred embodiment of the present invention, or in a method according to the second aspect of the present invention, an atmosphere before the formation of a silicon oxide is preferably an atmosphere of inert gas such as nitrogen gas, argon gas or helium gas or an atmosphere under reduced pressure for preventing the formation of an undesirable silicon oxide layer before the formation of a silicon oxide layer based on the wet gas.

Generally, a surface of a silicon layer is cleaned by the RCA cleaning, which is composed of cleaning with an $NH_4OH/H_2O_2$ aqueous solution and cleaning with $HCl/H_2O_2$, to remove fine particles and impurities of metals from the surface of the silicon layer before the formation of a silicon oxide layer on the surface of the silicon layer, and then the silicon layer is immersed in a hydrofluoric acid aqueous solution and then in pure water. However, when the so-prepared silicon layer is exposed to atmosphere, the surface of the silicon layer may be contaminated, water and organic substances may adhere to the surface of the silicon layer, or Si atoms on the surface of the silicon layer may bond to hydroxy groups (OH) (e.g., see "Highly-reliable Gate Oxide Formation for Giga-Scale LSIs by using Closed Wet Cleaning System and Wet Oxidation with Ultra-Dry Unloading", J. Yugami, et al., International Electron Device Meeting Technical Digest 95, pp. 855–858). When the formation of a silicon oxide layer is initiated in the above state, the formed silicon oxide layer includes water, organic substances or Si—OH bond, which may degrade the properties of the formed silicon oxide layer or cause a defective portion. The term "defective portion" refers to a portion containing a silicon dangling bond (Si.) or Si—H bond in the silicon oxide layer or a portion containing Si—O—Si bond which is compressed due to stress or has a bond angle different from that of Si—O—Si in a thick or bulk silicon oxide layer. For preventing the above problems, preferably, the preferred embodiment of the present invention includes a step for cleaning the surface of the silicon layer before the first oxidation step, and the first oxidation step is initiated without exposing the surface-cleaned silicon layer to atmosphere (i.e., with keeping the silicon layer in an inert gas atmosphere or an atmosphere under reduced pressure from the cleaning of the surface of the silicon layer to the initiation of the first oxidation step). A method according to the first or second aspect of the present invention preferably includes a step for cleaning the surface of the silicon layer before forming a silicon oxide layer, and the formation of a silicon oxide layer is initiated without exposing the surface-cleaned silicon layer to atmosphere (i.e., with keeping the silicon layer in an inert gas atmosphere or an atmosphere under reduced pressure from the cleaning the surface of the silicon layer to the initiation of formation of a silicon oxide layer). As a result, a silicon oxide layer can be formed on the surface of the silicon layer terminated with hydrogen in most parts and terminated with fluorine in very small parts, so that the degradation of properties of the silicon oxide layer or the occurrence of the defective portion can be prevented.

FIGS. 1 to 11 schematically show ambient temperature profiles in the method of forming a silicon oxide layer in the present invention. In these Figures, the lower limit temperature of the ambient temperature at a time when the formation of a silicon oxide layer on the surface of the silicon layer is initiated is indicated as $T_1$, and the upper limit temperature of the ambient temperature at which no silicon atom is eliminated from the surface of the silicon layer is indicated as $T_2$. Further, the ambient temperature at which the formation of a silicon oxide layer having a predetermined thickness is completed or the ambient temperature in the second oxidation step is indicated as $T_3$, and the ambient temperature in the heat treatment is indicated as $T_4$. In these Figures, a solid line shows a state where a silicon oxide layer is being formed, and a chain line shows a process of increasing the ambient temperature up to the ambient temperature at which the formation of a silicon oxide layer on the surface of the silicon layer is initiated, a process of decreasing the ambient temperature to room temperature after the completion of the formation of a silicon oxide layer or a process of increasing the ambient temperature from that in the transfer step to the ambient temperature in the second oxidation step. A dotted line shows the transfer step in the transfer passage, and a doubled line shows the heat treatment step. An ambient temperature profile showing a heating-up step in a solid line shows that the formation of a silicon oxide layer is carried out in the heating-up step, and an ambient temperature profile showing a heating-up step in a short dashes line shows that the formation of a silicon oxide layer is not carried out in the heating-up step. In these Figures, further, "RT" stands for room temperature (ordinary temperature).

In examples of ambient temperature profiles shown in FIGS. 1A and 1B, the formation of a silicon oxide layer by an oxidation method using wet gas is initiated at an ambient temperature at which no silicon atom is eliminated from the surface of the silicon layer or at an ambient temperature at which the wet gas does not undergo condensation on the surface of the silicon layer and is equivalent to, or lower than, 500° C. And, the silicon oxide layer is formed up to a predetermined thickness by the oxidation method using wet gas. The ambient temperature when the formation of the silicon oxide layer having a predetermined thickness is completed is the same as the ambient temperature at which the formation of a silicon oxide layer on the surface of the silicon layer was initiated (see FIG. 1A), or it is higher than the ambient temperature at which the formation of a silicon oxide layer on the surface of the silicon layer was initiated but within the temperature range in which no silicon atom is eliminated from the surface of the silicon layer (see FIG. 1B).

In examples of ambient temperature profiles shown in FIGS. 2A and 2B, the formation of a silicon oxide layer by an oxidation method using wet gas is initiated at an ambient temperature at which no silicon atom is eliminated from the surface of the silicon layer, or at an ambient temperature which is higher than a temperature at which the wet gas undergoes condensation on the surface of the silicon layer and is equivalent to, or lower than, 500° C. And, the silicon oxide layer is formed up to a predetermined thickness by an oxidation method using wet gas. An ambient temperature ($T_3$) when the formation of the silicon oxide layer having a predetermined thickness is completed is higher than the ambient temperature ($T_1$–$T_2$) at which the formation of the silicon oxide layer on the surface of the silicon layer was initiated, and it is higher than the ambient temperature range in which no silicon atom is eliminated from the surface of the silicon layer. In the example of the ambient temperature profile shown in FIG. 2A, the heating-up rate is constant. On the other hand, in the example of the ambient temperature profile shown in FIG. 2B, the heating-up rate is varied. The varying pattern of the heating-up rate is given for an illustration purpose, and shall not be limited to the pattern in FIG. 2B.

Examples of ambient temperature profiles shown in FIGS. 3 to 7 are concerned with the preferred first embodiment of the present invention, and a silicon oxide layer is formed in the first oxidation step, in the heating-up step in some cases and in the second oxidation step. In examples of FIGS. 3A and 3B, an ambient temperature in the first oxidation step and an ambient temperature in the second oxidation step are constant. In examples of FIGS. 4A and 4B, an ambient temperature in the first oxidation step is varied, while an ambient temperature in the second oxidation step is constant. In examples of FIGS. 5A and 5B, an ambient temperature in the first oxidation step is constant, while an ambient temperature in the second oxidation step is varied. In examples of FIGS. 6A and 6B, an ambient temperature in the first oxidation step and an ambient temperature in the second oxidation step are varied. The heating-up rate in the heating-up step may be constant or varied. Further, when the ambient temperature is varied in the first oxidation step and/or in the second oxidation step, the varying rate may be constant or varied. Alternatively, ambient temperature profiles shown in FIGS. 7A and 7B may be employed. In the example of the ambient temperature profile shown FIG. 7A, the heating-up rate is constant. On the other hand, in an example of the ambient temperature profile shown in FIG. 7B, the heating-up rate is varied. In addition, in the examples of FIGS. 3A, 4A, 5A and 6A, the heating-up step is carried out in an inert gas atmosphere, and a silicon oxide layer is not formed in the heating-up step. On the other hand, in examples of FIGS. 3B, 4B, 5B and 6B, the heating-up step is carried out in an oxidative atmosphere containing wet gas, and a silicon oxide layer is also formed in the heating-up step.

Examples of ambient temperature profiles shown in FIGS. 8 to 11 are concerned with the preferred second embodiment of the present invention. A silicon oxide layer is formed in the first oxidation step, and in the second oxidation. In the examples of FIGS. 8A and 8B, an ambient temperature in the first oxidation step and the ambient temperature in the second oxidation step are constant. In the examples of FIGS. 9A and 9B, an ambient temperature in the first oxidation step is varied, while an ambient temperature in the second oxidation step is constant. In the examples of FIGS. 10A and 10B, an ambient temperature in the first oxidation step is constant, while an ambient temperature in the second oxidation step is varied. In the examples of FIGS. 11A and 11B, an ambient temperature in the first oxidation step and an ambient temperature in the second oxidation step are varied. In the examples of FIGS. 8A, 9A, 10A and 11A, an ambient temperature in the transfer passage in the transfer step is, for example, room temperature (ordinary temperature). On the other hand, in the examples of FIGS. 8B, 9B, 10B and 11B, an ambient temperature in the transfer passage in the transfer step is nearly equivalent to the ambient temperature in the first process chamber in the first oxidation step.

In the method according to the first or second aspect of the present invention, the silicon layer includes not only substrates such as a silicon semiconductor substrate, but also silicon layers where a silicon oxide layer is to be formed, such as an epitaxial silicon layer including an epitaxial silicon layer formed by a selectively epitaxial growth, a polysilicon layer, an amorphous silicon layer, a silicon layer in a silicon-on-insulator (SOI) structure produced by a so-called wafer bonding method or by a "Separation by Implanted Oxygen" (SIMOX) method, and a substrate or any layer of these where a semiconductor device or a semiconductor device component have been formed. The silicon semiconductor substrate may be produced by any one of a Czochralski (CZ) method, a magnetic field applied Czochralski (MCZ) method, a double layered Czochralski (DLCZ) method, a floating zone melting (FZ) method and the like. Further, a silicon semiconductor substrate of which the crystal defect is removed in advance by hydrogen annealing at a high temperature may be also used.

The method of forming a silicon oxide layer, provided by the present invention, can be applied to the formation of silicon oxide layers in various semiconductor devices, such as the formation of a gate oxide, a dielectric interlayer and a isolation region of a MOS transistor, the formation of a gate oxide of a top gate type or bottom gate type thin film transistor, and the formation of a tunnel gate oxide of a flash memory.

In the method of forming a silicon oxide layer according to the first aspect of the present invention, the formation of a silicon oxide layer on the surface of the silicon layer by an oxidation method using wet gas is initiated in an atmosphere which is maintained at a temperature at which no silicon atom is eliminated from the surface of the silicon layer. In the method of forming a silicon oxide layer according to the second aspect of the present invention, the formation of a silicon oxide layer on a surface of a silicon layer by an oxidation method using wet gas is initiated at an ambient temperature which is equivalent to, or higher than, a temperature at which the wet gas does not undergo condensation on the surface of the silicon layer and is 500° C. or lower. Since the ambient temperature is set at the above temperature when the formation of a silicon oxide layer is initiated, the occurrence of a concave or convex shape on the surface of the silicon layer can be prevented. Further, the oxidation of silicon atoms begins not in the outermost surface of the silicon layer but with silicon atoms present one layer inside, i.e., with a so-called back bond. The flatness in the interface between the silicon layer and the silicon oxide layer is therefore maintained at an atomic level, and the finally formed silicon oxide layer has excellent properties. Further, since a silicon oxide layer is formed on the surface of the silicon layer by the oxidation method using wet gas, the finally formed silicon oxide layer contains no dry oxide layer, and has excellent properties.

In the method of forming a silicon oxide layer according to the first or second aspect of the present invention, it sometimes takes a long period of time to form a silicon oxide layer which fully satisfies the properties required of, for example, a gate oxide. In this case, the preferred embodiment of the present invention can be employed. In the preferred embodiment of the present invention, since the second oxidation step is carried out after the silicon oxide layer which works as a protective layer as well is formed on the surface of the silicon layer, a concave or convex shape (roughening) does not occur on the surface of the silicon layer, for example, in the heating-up step or in the transfer step in which the atmosphere is a non-oxidative atmosphere. Further, a silicon oxide layer having excellent properties, which can fully satisfy the properties required of a gate oxide, can be produced for a short period of time.

In the method according to the preferred first embodiment A of the present invention, there can be used a conventional vertical-type, resistance-heating apparatus for the formation of a silicon oxide layer, which apparatus has a process chamber (oxidation chamber) made of fused quartz and vertically held. When a vertical-type apparatus for the formation of a silicon oxide layer is used, for example, a heater is arranged outside a silicon semiconductor substrate in its circumferential direction and the peripheral portion of the silicon semiconductor substrate is more temperature-increased than the central portion thereof. As a result, when a silicon oxide layer is formed during the heating-up step, the peripheral portion of the silicon semiconductor substrate has a larger thickness than the central portion thereof. In the method according to the preferred first embodiment B of the present invention, a silicon layer is heated with heating means arranged nearly in parallel with the surface of the silicon layer, and the in-plane (within-a-wafer) variability of temperature on the silicon layer can be therefore decreased. As a result, even when a silicon oxide layer is formed during the heating-up step, the occurrence of the in-plane (within-a-wafer) variability in thickness of the silicon oxide layer can be prevented.

When the formation of a silicon oxide layer by two silicon oxidation steps is carried out in one process chamber, it is required to control the ambient temperature in the process chamber in a broad range, and it is sometimes difficult to accurately control the ambient temperature in the process chamber. Further, since it is required to raise the ambient temperature in the process chamber, the throughput is liable to decrease. In the preferred second embodiment of the present invention, a silicon oxide layer is formed in the first process chamber and the second process chamber. The ambient temperature in each process chamber can be therefore maintained at a constant temperature in a narrow range. Accordingly, not only the ambient temperature in each process chamber can be more accurately controlled, but also the temperature stability in each process chamber is excellent. Therefore, the preferred second embodiment of the present invention is excellent in the controllability of thickness of the silicon oxide layer. Moreover, unlike the formation of a silicon oxide layer in one process chamber by two silicon oxidation steps, it is not required to raise the temperature from the ambient temperature in the first oxidation step to the ambient temperature in the second oxidation step, and a decrease in the throughput is therefore not incurred.

BRIEF DESCRIPTION OF THE DRAWINGS

The present invention will be explained with reference to Examples while referring to drawings hereinafter.

DESCRIPTION OF THE PREFERRED EMBODIMENTS

EXAMPLE 1

Figure 13:
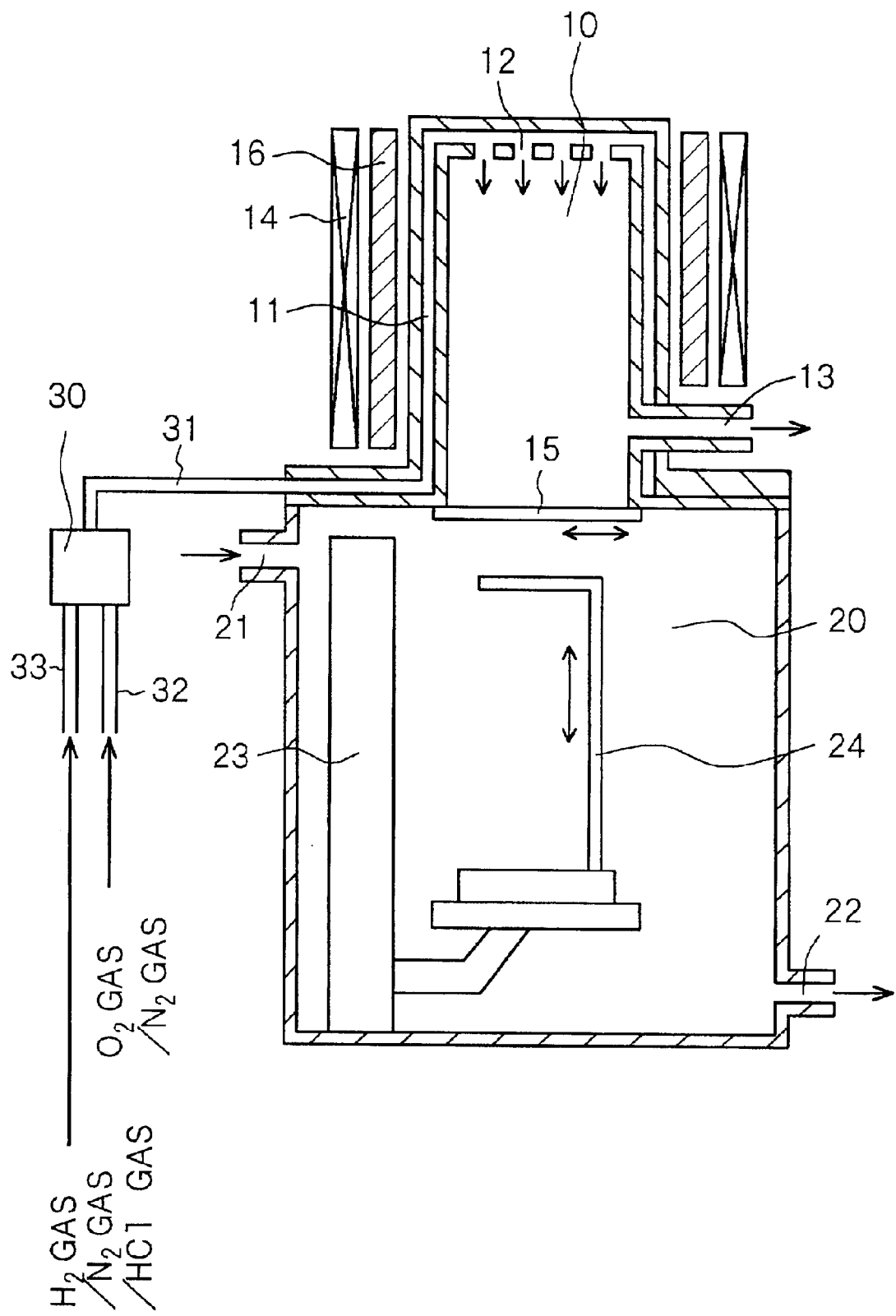
FIG. 13 is a schematic cross section of a vertical-type processing apparatus (thermal oxidation furnace) for the formation of a silicon oxide layer.
Figure 14:
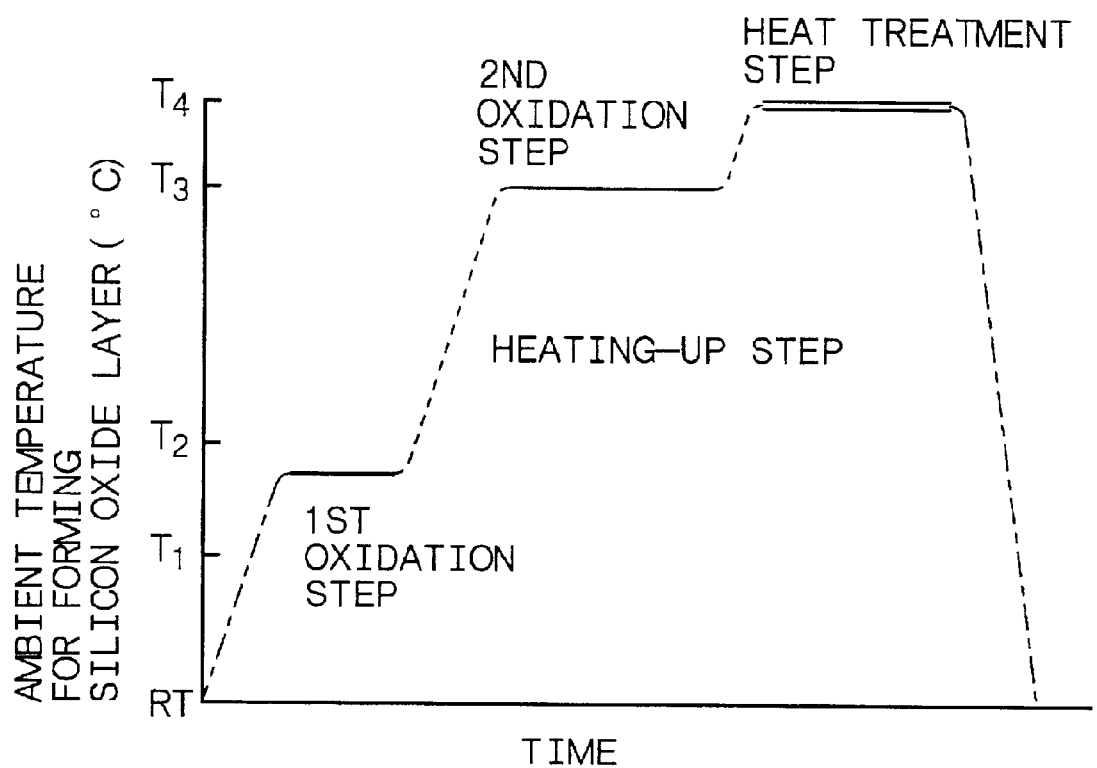
FIG. 14 schematically shows an ambient temperature profile in Example 1.

Example 1 is concerned with the preferred first embodiment A of the method of forming a silicon oxide layer according to the first aspect of the present invention, and is further concerned with the method of forming a silicon oxide layer according to the second aspect of the present invention. Example 1 uses a vertical-type processing apparatus having one process chamber for forming a silicon oxide layer, and a first oxidation step and a second oxidation step are carried out in the process chamber. Further, the first oxidation step and the second oxidation step are carried out with a batch processing. A heating-up step is included between the first oxidation step and the second oxidation step. Specifically, Example 1 used the vertical-type processing apparatus as shown in FIG. 13. A silicon semiconductor substrate was used as a silicon layer. A formed silicon oxide layer was to function as a gate oxide. Example 1 used an oxidation method using pyrogenic gas as an oxidation method using wet gas in each of the first oxidation step and the second oxidation step. Further, an inert gas atmosphere was used as an atmosphere in the heating-up step. In the second oxidation step, the silicon oxide layer was formed so as to have a predetermined thickness, and then the so-formed silicon oxide layer was heat-treated in the process chamber under an atmosphere containing a halogen element such as hydrogen chloride gas. The method of forming a silicon oxide layer in Example 1 will be explained with reference to FIGS. 12 to 17. FIG. 14 also shows an ambient temperature profile in Example 1.

[Step-100]

First, isolation regions 41 having a local oxidation of silicon (LOCOS) structure were formed on a silicon semiconductor substrate 40 which was a phosphorus-doped N-type silicon wafer prepared by CZ method and had a diameter of 8 inches. Then, the silicon semiconductor substrate 40 was ion implanted with well ion implantation, with channel step ion implantation and with threshold value adjusting ion implantation. The isolation region may have a trench isolation structure, or it may be a combination of a LOCOS structure with a trench isolation structure. Then, fine particles and metal impurities on the surface of the silicon semiconductor substrate 40 were removed by RCA cleaning, and the surface of the silicon semiconductor substrate 40 was cleaned with a 0.1% hydrofluoric aqueous solution and then with pure water to expose the surface of the silicon semiconductor substrate 40 (see FIG. 12A). The surface of the silicon semiconductor substrate 40 was terminated with hydrogen in most parts and with fluorine in very small parts.

[Step-110]

Figure 15A:
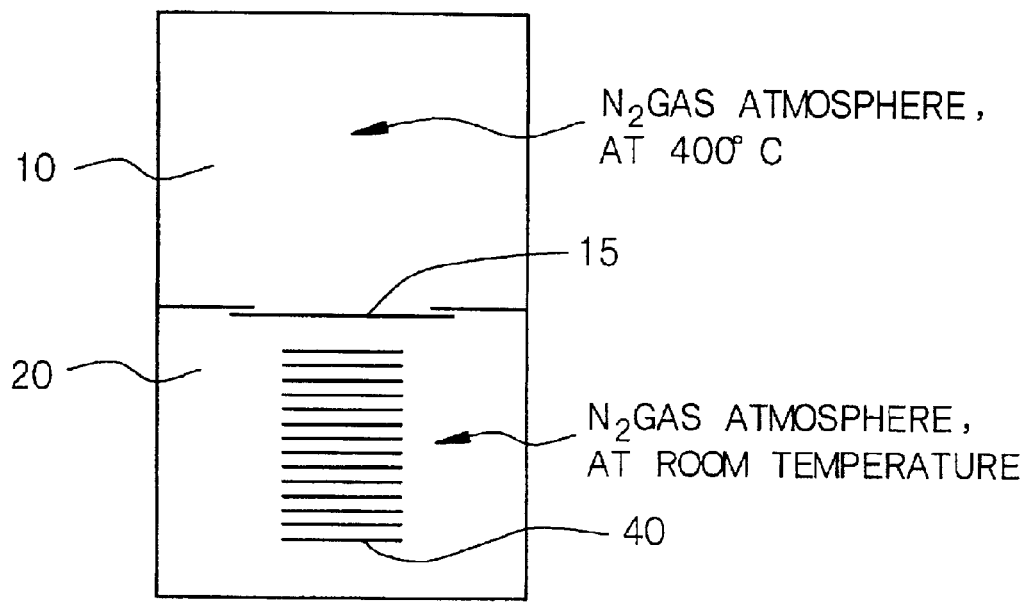
FIGS. 15A and 15B show conceptual cross sections of the vertical-type processing apparatus and so on for explaining the method of forming a silicon oxide layer in Example 1.
Figure 15B:
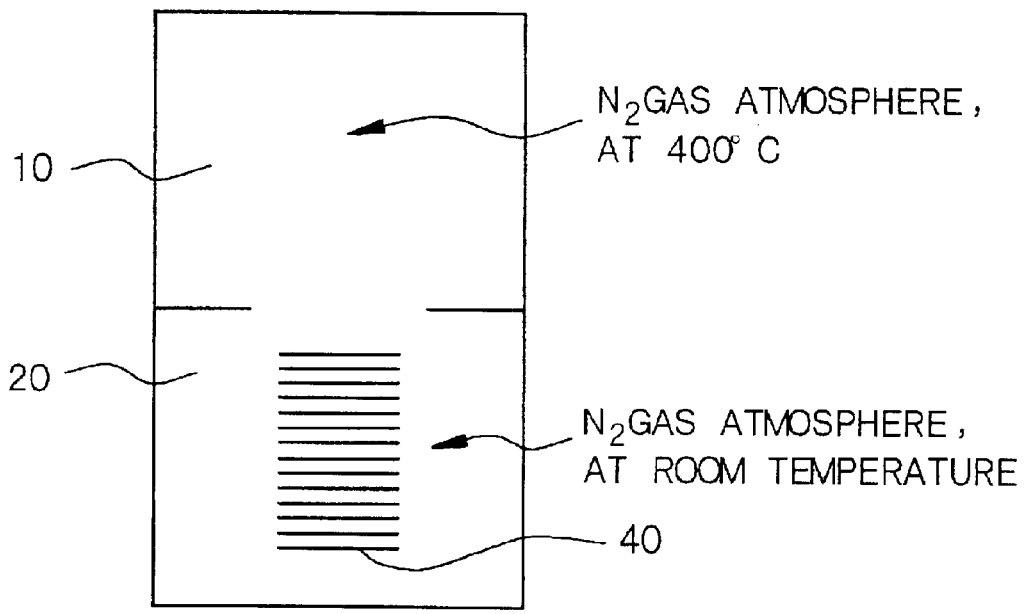
Figure 16A:
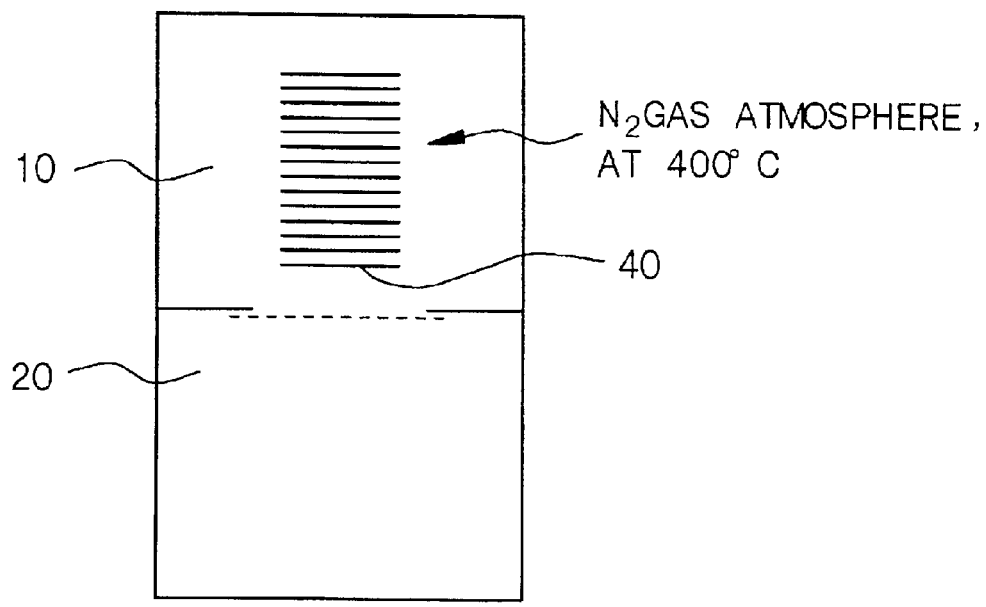
FIGS. 16A and 16B subsequent to FIG. 15B show conceptual cross sections of the vertical-type processing apparatus and so on for explaining the method of forming a silicon oxide layer in Example 1.
Figure 16B:
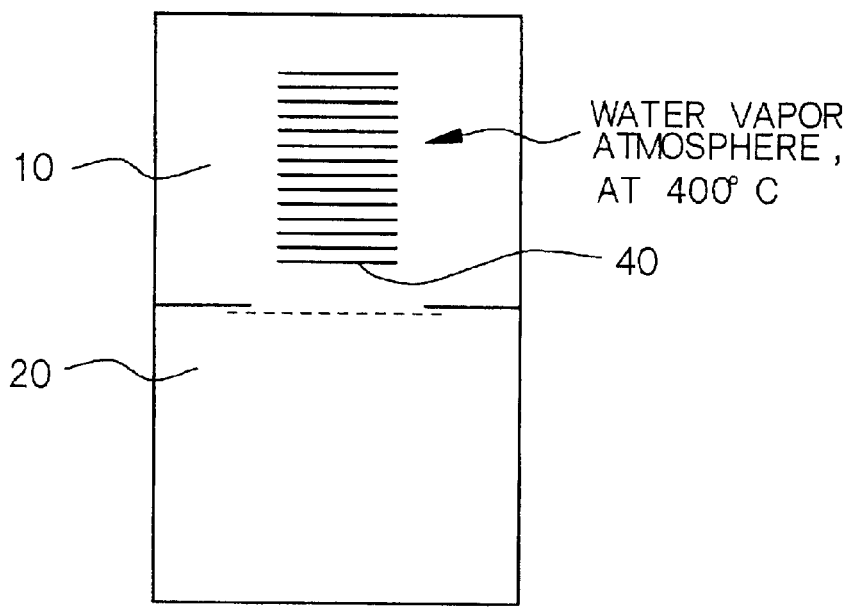

Then, the silicon semiconductor substrates 40 were transferred into the substrate transfer portion 20 of the vertical-type processing apparatus shown in FIG. 13 through a door (not shown), and were placed on the fused quartz boat 24 (see FIG. 15A). In addition, nitrogen gas was introduced into the process chamber 10 through the gas inlet port 12 to form an inert gas atmosphere of nitrogen gas in the process chamber 10 (an atmosphere under reduced pressure may be used), and the ambient temperature in the process chamber 10 was maintained at 400° C. by heating with the heater 14 through the liner tube 16. In this state, the shutter 15 was kept closed.

[Step-120]

After the transfer of the silicon semiconductor substrates 40 into the substrate transfer portion 20 was completed, the door (not shown) was closed, and nitrogen gas was introduced into the substrate transfer portion 20 through the gas introducing portion 21 to purge atmosphere in the substrate transfer portion 20 through the gas exhaust portion 22, so that a nitrogen gas atmosphere was formed in the substrate transfer portion 20. The oxygen gas concentration in the substrate transfer portion 20 was monitored, and when the oxygen gas concentration became, for example, 100 ppm or less, it was determined that a sufficient nitrogen atmosphere was formed in the substrate transfer portion 20. Then, the shutter 15 was opened (see FIG. 15B), the elevator unit 23 was actuated to elevate the fused quartz boat 24 at an elevation rate of 250 mm/minute, whereby the silicon semiconductor substrates 40 were transferred into the double-tubular structured process chamber 10 made of fused quartz (see FIG. 16A). When the elevator unit 23 reached the uppermost position, the bottom portion of the fused quartz boat 24 worked to terminate the communication between the process chamber 10 and the substrate transfer portion 20. Since the ambient temperature in the process chamber 10 was maintained at 400° C. with the heater 14, that is, maintained at a temperature at which no silicon atom was eliminated from the surface of the silicon layer, the occurrence of surface roughening of the silicon semiconductor substrate 40 was prevented.

[Step-130]

At the ambient temperature at which no silicon atom was eliminated from the surface of the silicon layer, the formation of a silicon oxide layer on the surface of each silicon layer was initiated by an oxidation method using wet gas. Or, at an ambient temperature equivalent to, or higher than a temperature at which no wet gas underwent condensation on the surface of the silicon layer and equivalent to, or lower than, 500° C., the formation of a silicon oxide layer an the surface of each silicon layer was initiated by the oxidation method using wet gas. And, after the formation of a silicon oxide layer on the surface of the silicon layer was initiated by an oxidation method using wet gas at the ambient temperature at which no silicon atom was eliminated from the surface of the silicon layer, the atmosphere was maintained in an ambient temperature range in which no silicon atom was eliminated from the surface of the silicon layer, to carry out the first oxidation step. Specifically, while the ambient temperature was set at 400° C. in Example 1, a silicon oxide layer 42 was formed on the surface of the silicon semiconductor substrate 40 by an oxidation method using pyrogenic gas. In Example 1, oxygen gas and hydrogen gas were supplied to the combustion chamber 30 through the pipings 32 and 33, and water vapor generated in the combustion chamber 30 was introduced into the process chamber 10 through the piping 31, the gas passage 11 and the gas inlet port 12. The silicon oxide layer 42 having a thickness of 1.2 nm was formed on the surface of the silicon semiconductor substrate 40 (see FIG. 16B). The above thickness of the silicon oxide layer was equivalent to the thickness of a several $SiO_2$ molecules layer. Even when a STEP on the surface of the silicon semiconductor substrate was taken into consideration, the silicon oxide layer 42 had a thickness sufficient for functioning as a protective layer.

[Step-140]

Figure 17A:
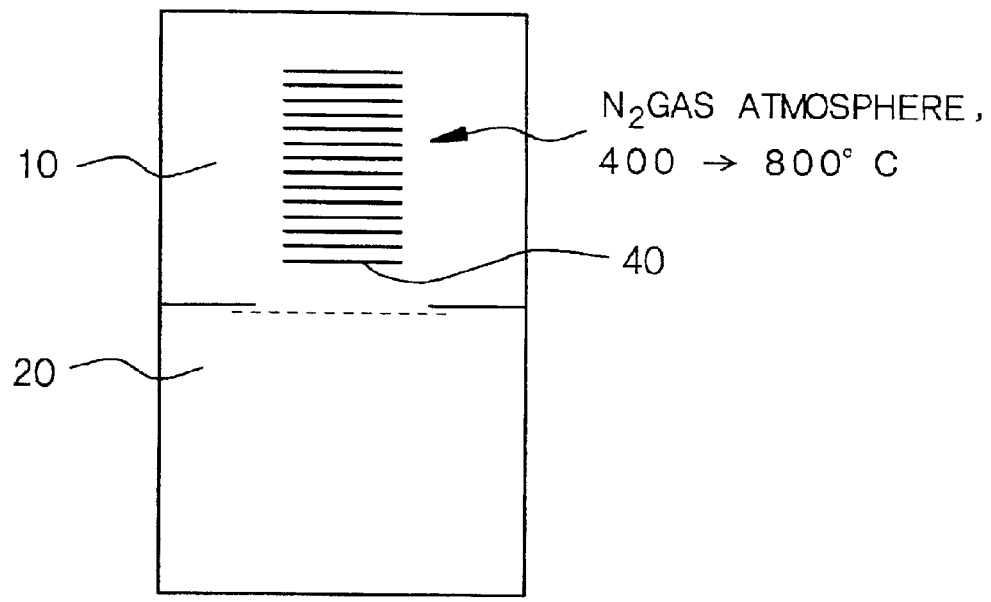
FIGS. 17A and 17B subsequent to FIG. 16B show conceptual cross sections of the vertical-type processing apparatus and so on for explaining the method of forming a silicon oxide layer in Example 1.
Figure 17B:
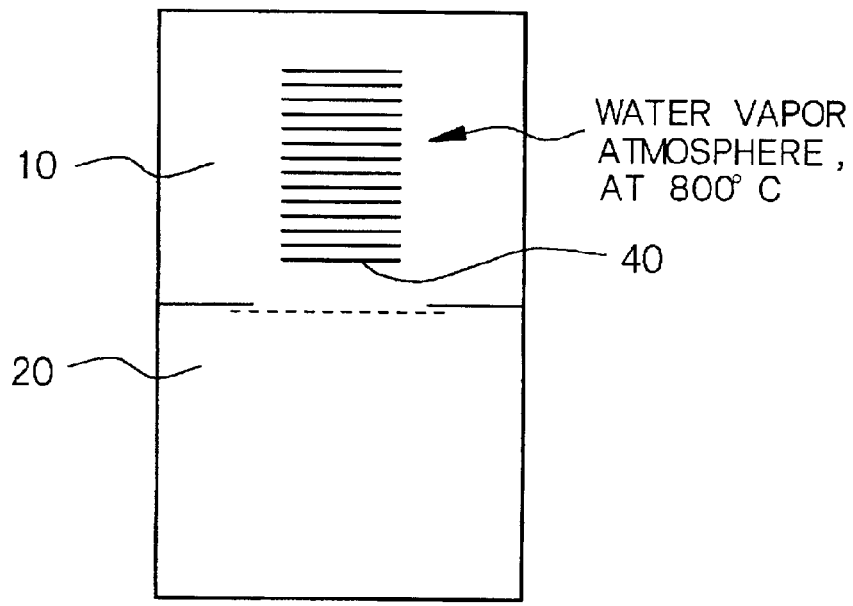

Then, the introduction of the wet gas into the process chamber 10 was terminated, and while inert gas such as nitrogen gas was introduced into the process chamber 10 through the piping 32, the combustion chamber 30, the piping 31, the gas passage 11 and the gas inlet port 12, the ambient temperature in the process chamber was raised up to 800° C. with the heater 14 through the liner tube 16 (see FIG. 17A). The heating-up rate was set at 10° C./minute. Since the silicon oxide layer, which functioned as a protective layer as well, had been already formed on the surface of the silicon layer in [Step-130], surface roughening did not occur on the surface of the silicon layer in [Step-140], either.

[Step-150]

After the ambient temperature in the process chamber 10 reached a temperature (800° C. in Example 1) higher than the ambient temperature range in which no silicon atom was eliminated from the surface of the silicon layer, such a temperature was maintained, and in this state, the second oxidation step was further carried out by an oxidation method using wet gas. Specifically, oxygen gas and hydrogen gas were again supplied to the combustion chamber 30 through the pipings 32 and 33, and water vapor generated in the combustion chamber 30 was introduced into the process chamber 10 through the piping 31, the gas passage 11 and the gas inlet port 12. The silicon oxide layer 42 having a total thickness of 4.2 nm was formed on the surface of each silicon semiconductor substrate 40 by an oxidation method using pyrogenic gas (see FIG. 17B). In addition, the ambient temperature (800° C. in Example 1) at the time of the completion of formation of the silicon oxide layer having a predetermined thickness was higher than the ambient temperature (400° C. in Example 1) at the time of the initiation of formation of the silicon oxide layer on the surface of the silicon layer.

Since the formation of the silicon oxide layer 42 on the surface of the silicon semiconductor substrate 40 is completed by the above procedures, the silicon semiconductor substrates 40 may be transferred out by forming an inert gas atmosphere of nitrogen gas in the process chamber 10, actuating the elevator unit 23 to lower the fused quartz boat 24 and opening the door (not shown). When it is intended to form a silicon oxide layer having further excellent properties, it is referred to carry out the following heat treatment step on the silicon oxide layer.

[Step-160]

The introduction of the wet gas into the process chamber 10 was terminated, and while nitrogen gas was introduced into the process chamber 10 through the gas inlet port 12, the ambient temperature in the process chamber 10 was raised up to 850° C. with the heater 14. Then, nitrogen gas containing 0.1 vol % of hydrogen chloride gas was introduced into the process chamber 10 through the gas inlet port 12, and the silicon oxide layer was heat-treated for 30 minutes.

[Step-170]

Figure 1A:
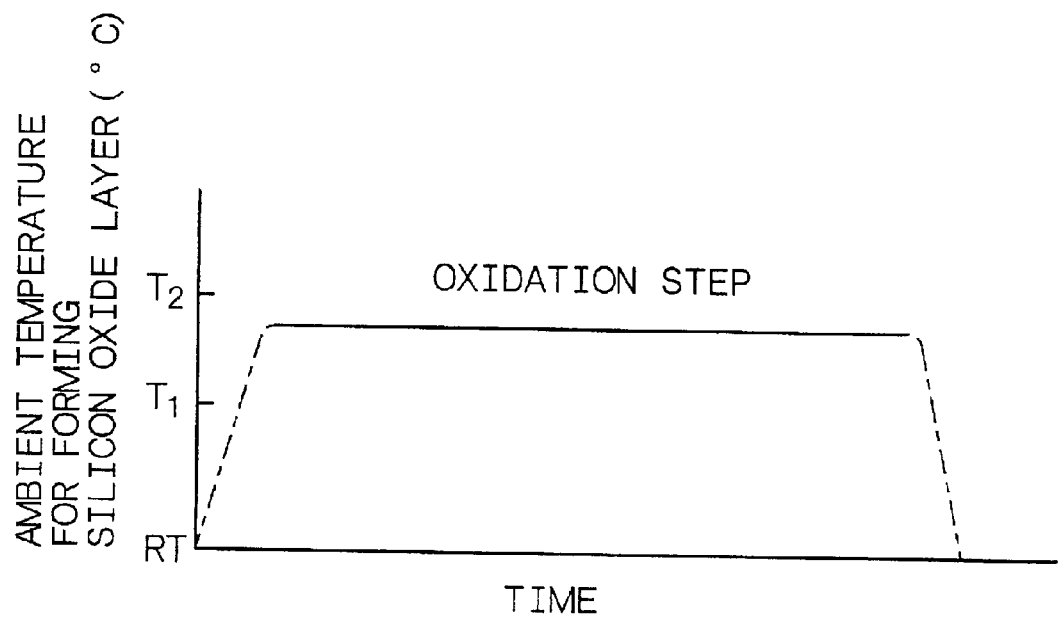
FIGS. 1A and 1B schematically show ambient temperature profiles in the method of forming a silicon oxide layer according to the first or second aspect of the present invention.
Figure 1B:
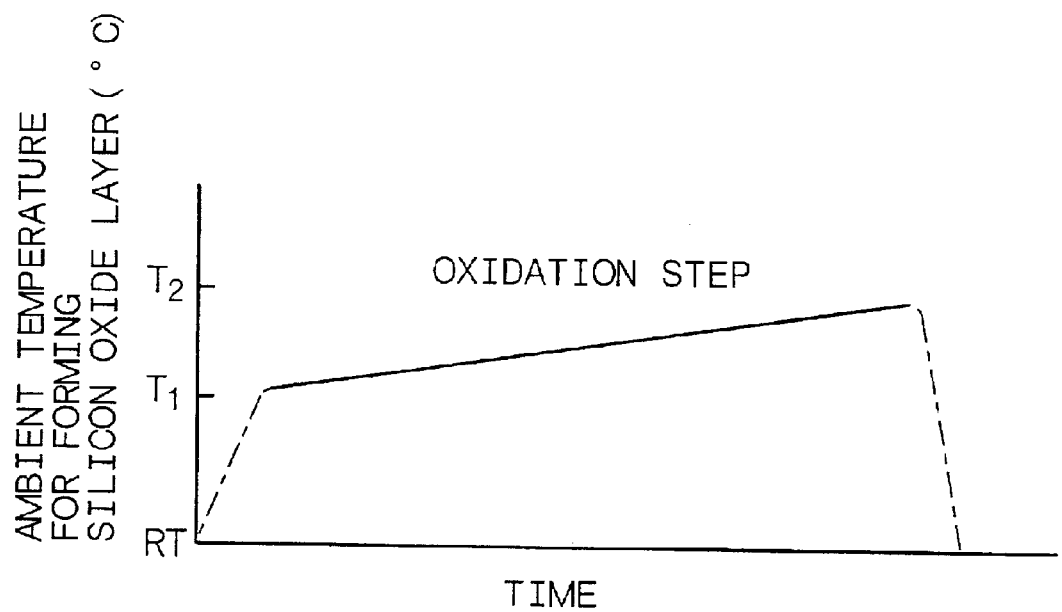
Figure 2A:
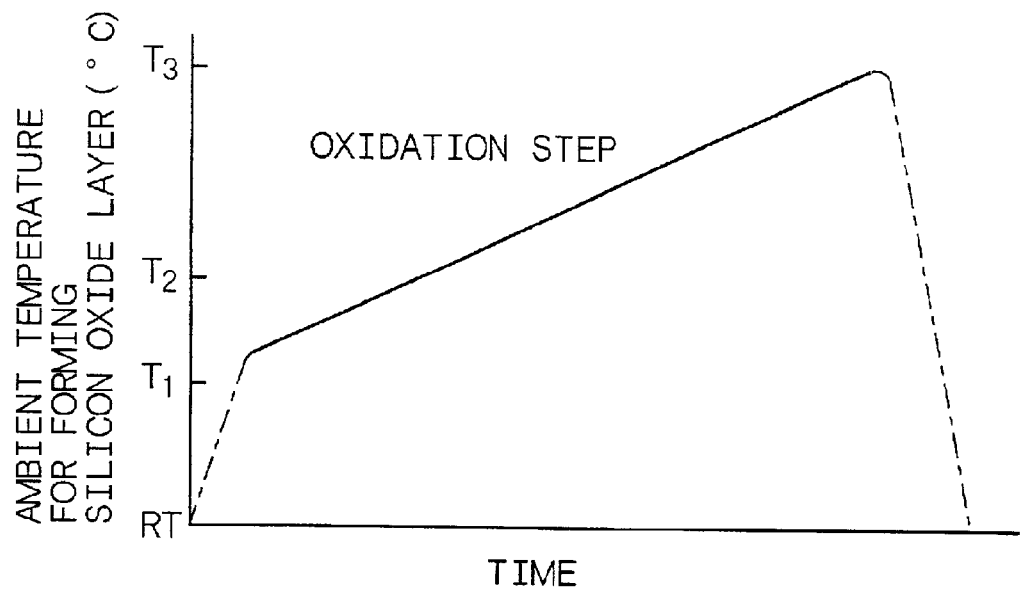
FIGS. 2A and 2B schematically show ambient temperature profiles in the method according to the first or second aspect of the present invention.
Figure 2B:
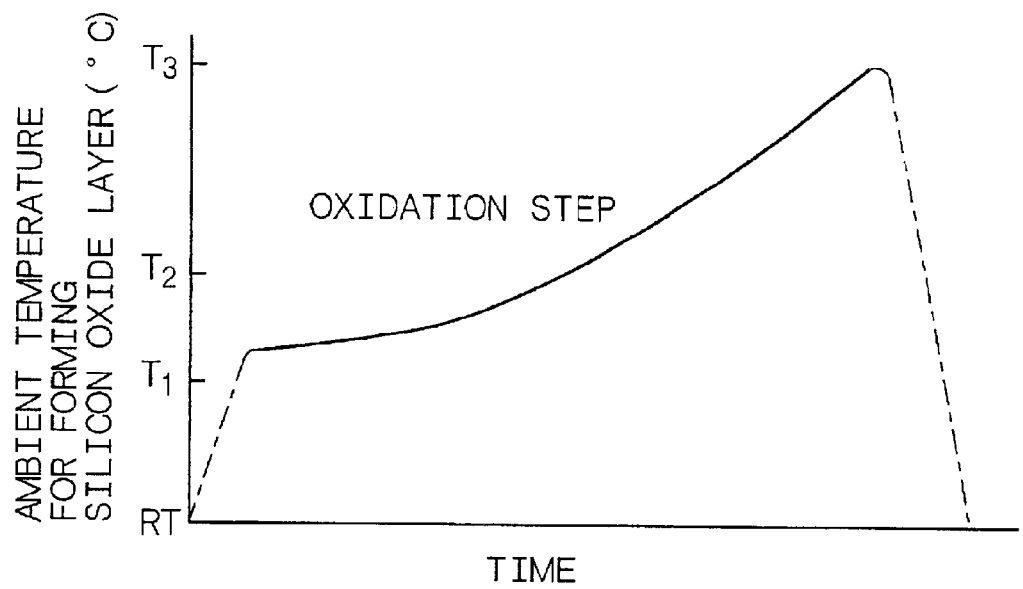
Figure 3A:
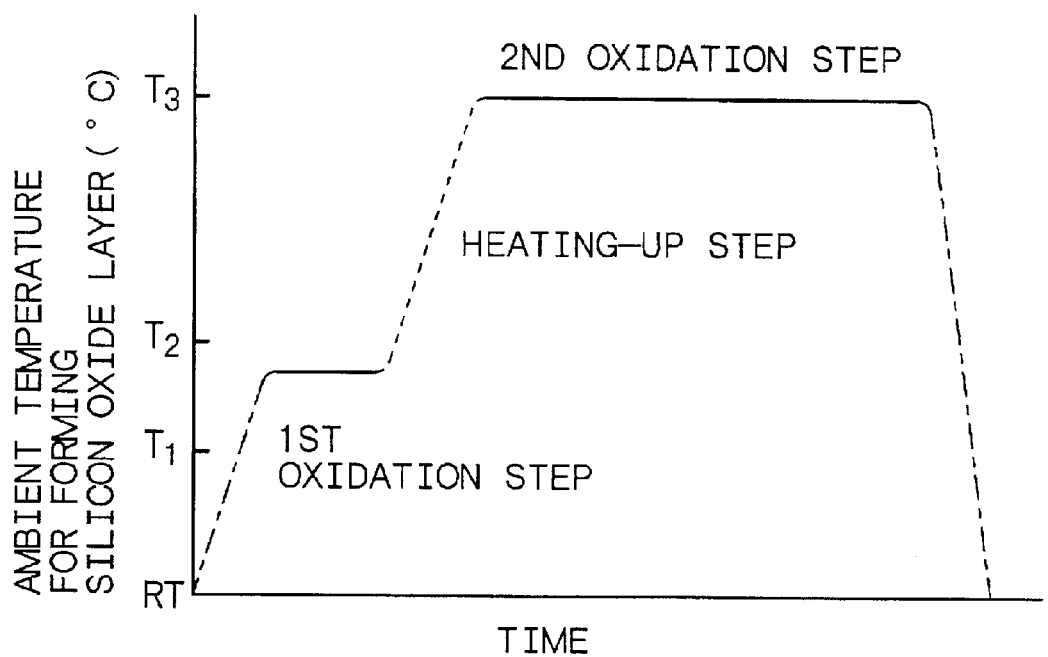
FIGS. 3A and 3B schematically show ambient temperature profiles in the method according to the preferred first embodiment of the present invention.
Figure 3B:
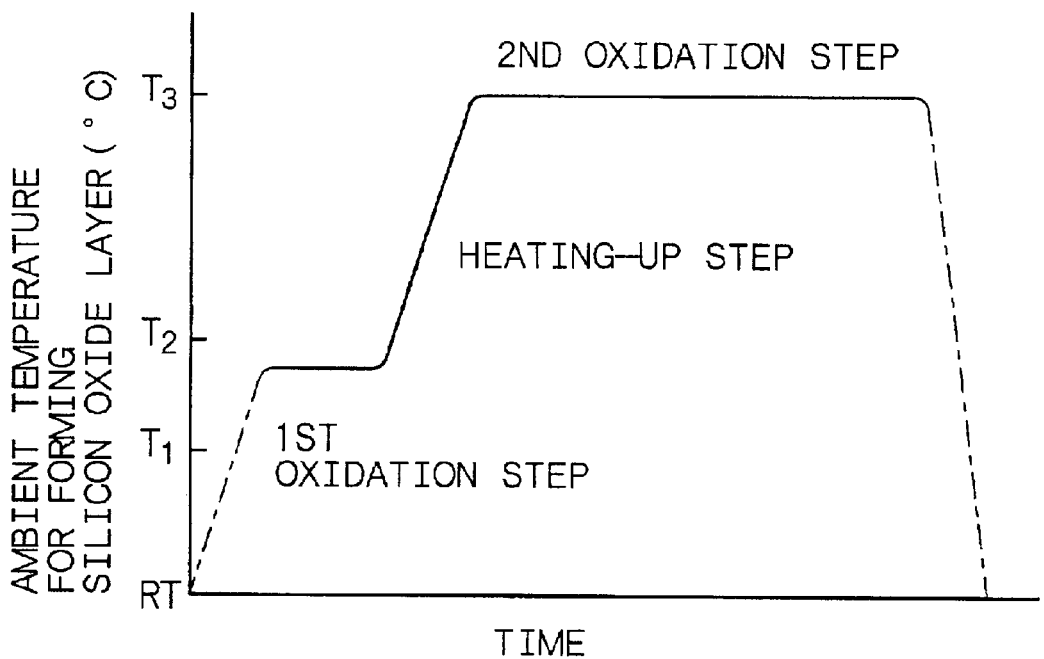
Figure 4A:
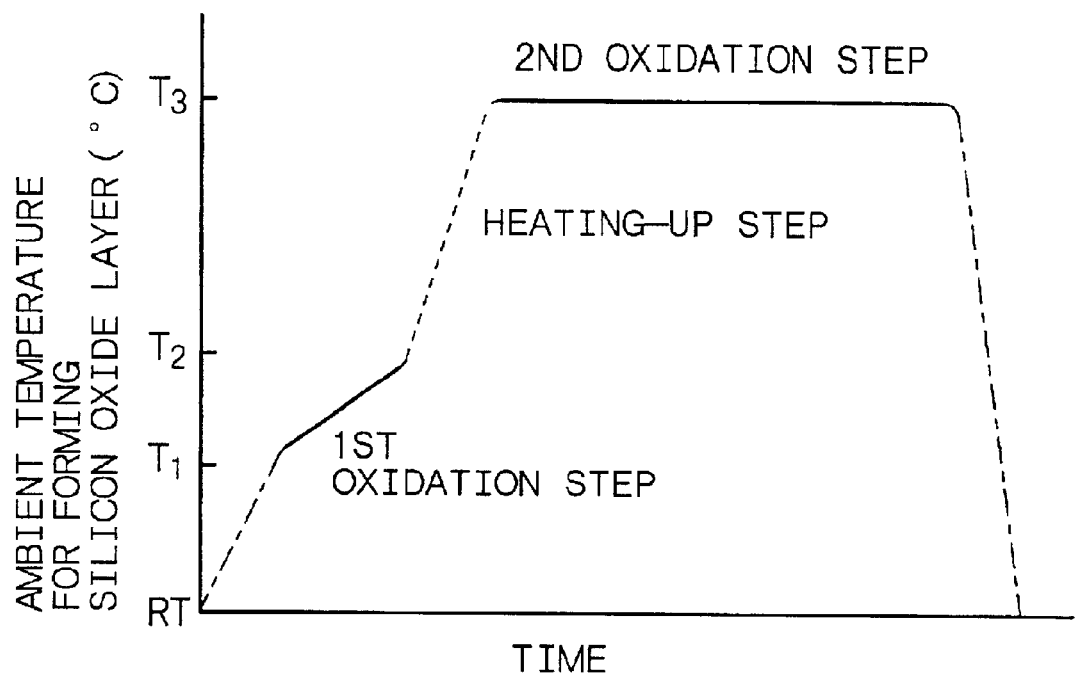
FIGS. 4A and 4B schematically show ambient temperature profiles in the method according to the preferred first embodiment of the present invention.
Figure 4B:
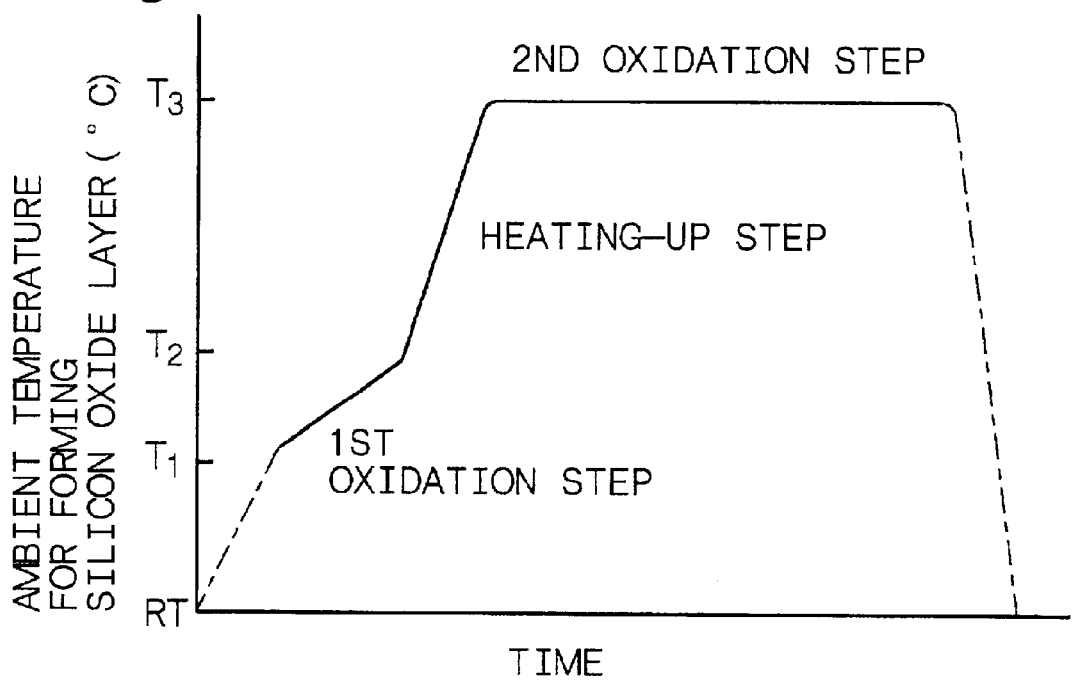
Figure 5A:
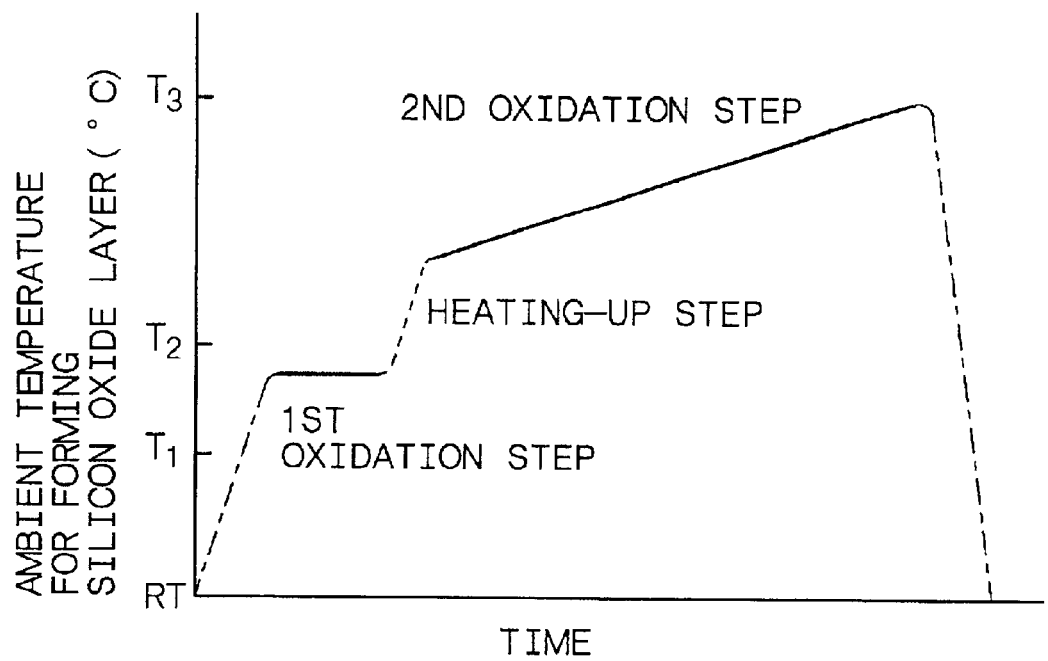
FIGS. 5A and 5B schematically show ambient temperature profiles in the method according to the preferred first embodiment of the present invention.
Figure 5B:
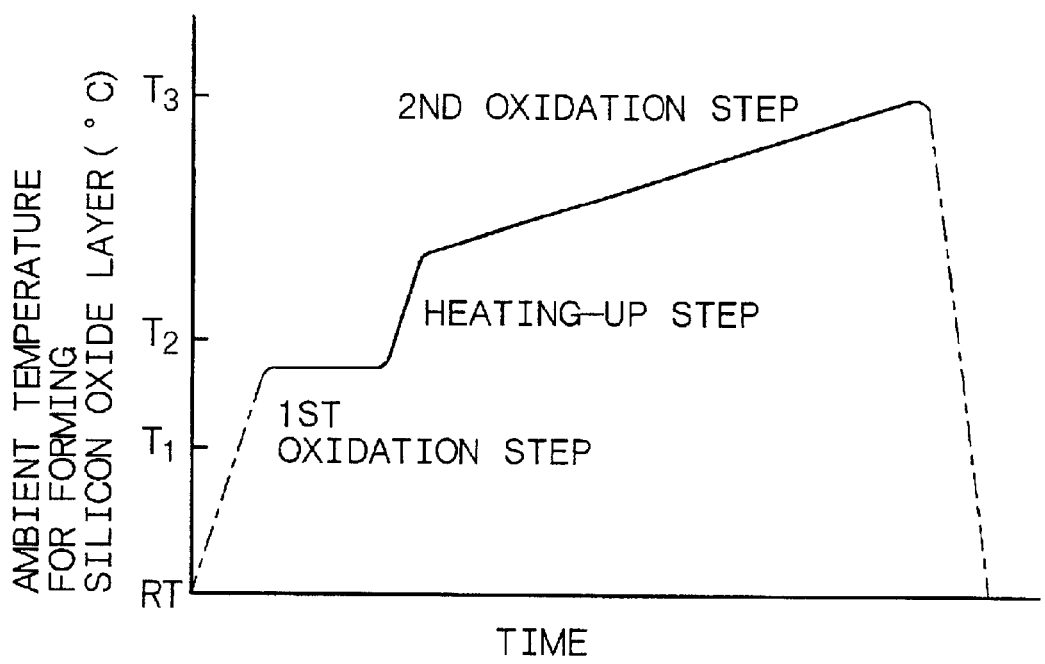
Figure 6A:
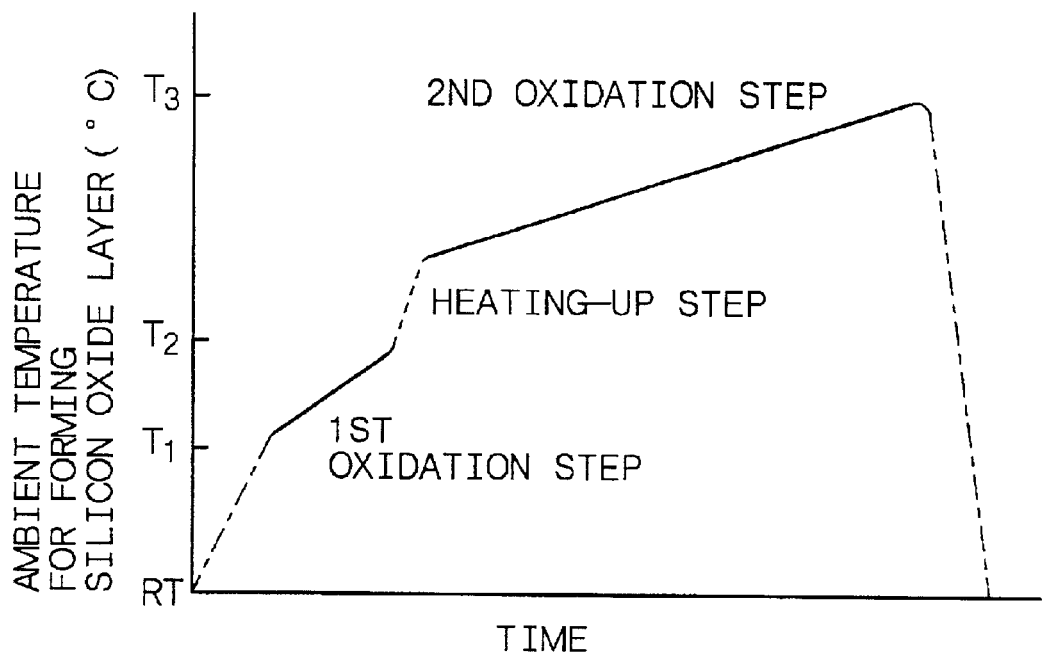
FIGS. 6A and 6B schematically show ambient temperature profiles in the method according to the preferred first embodiment of the present invention.
Figure 6B:
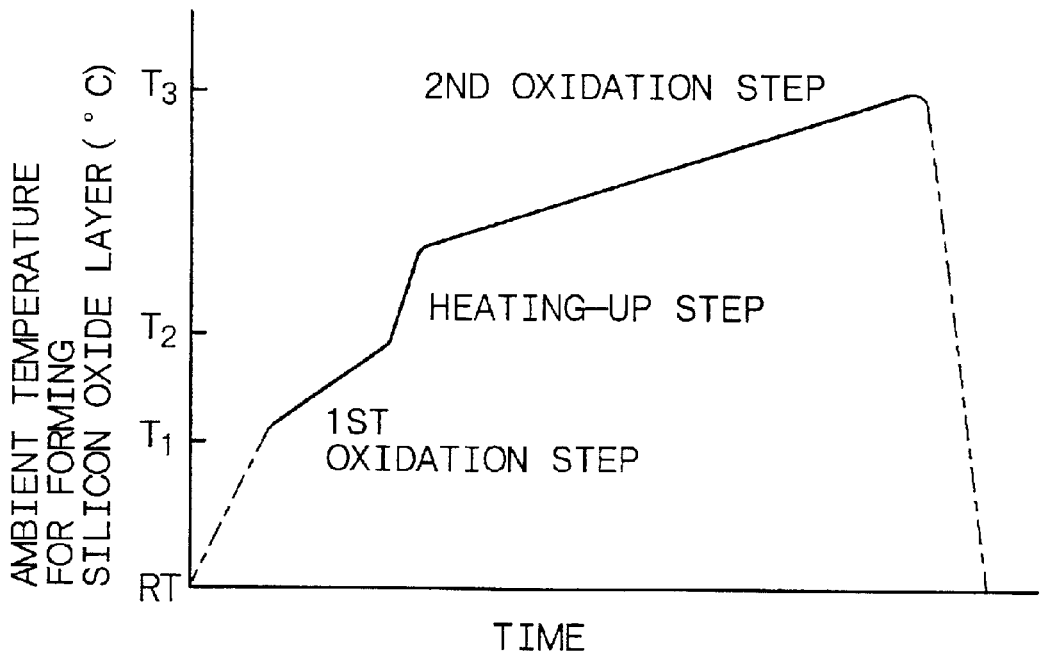
Figure 7A:
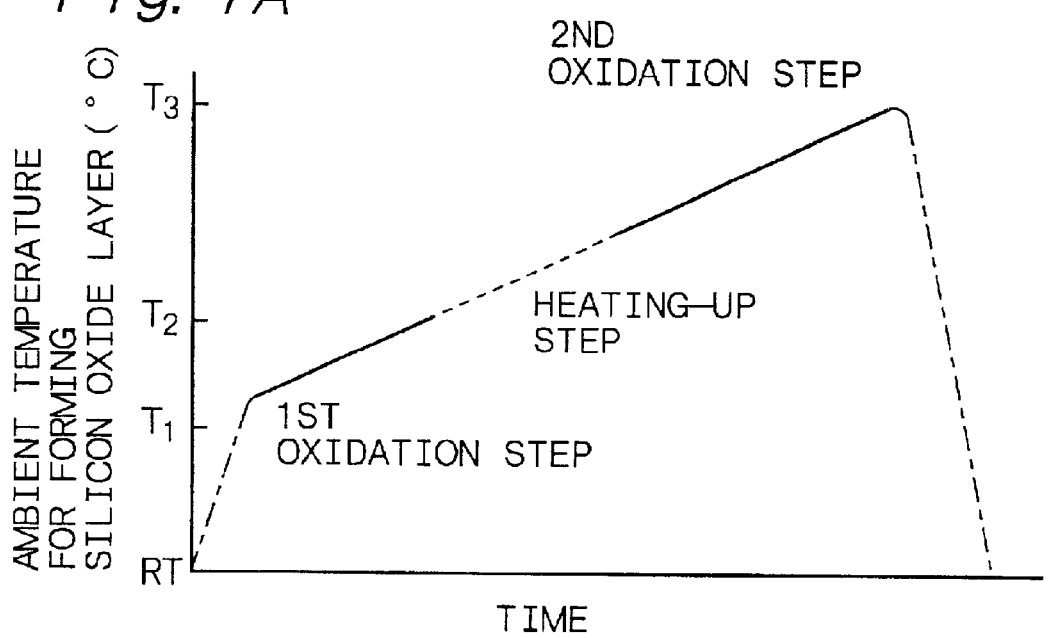
FIGS. 7A and 7B schematically show ambient temperature profiles in the method according to the preferred first embodiment of the present invention.
Figure 7B:
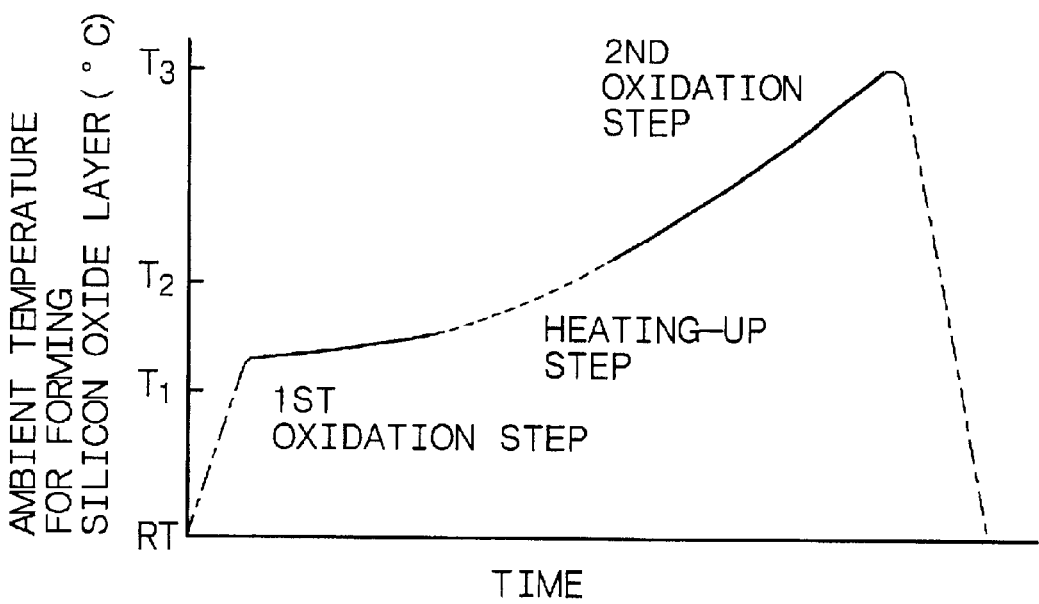
Figure 8A:
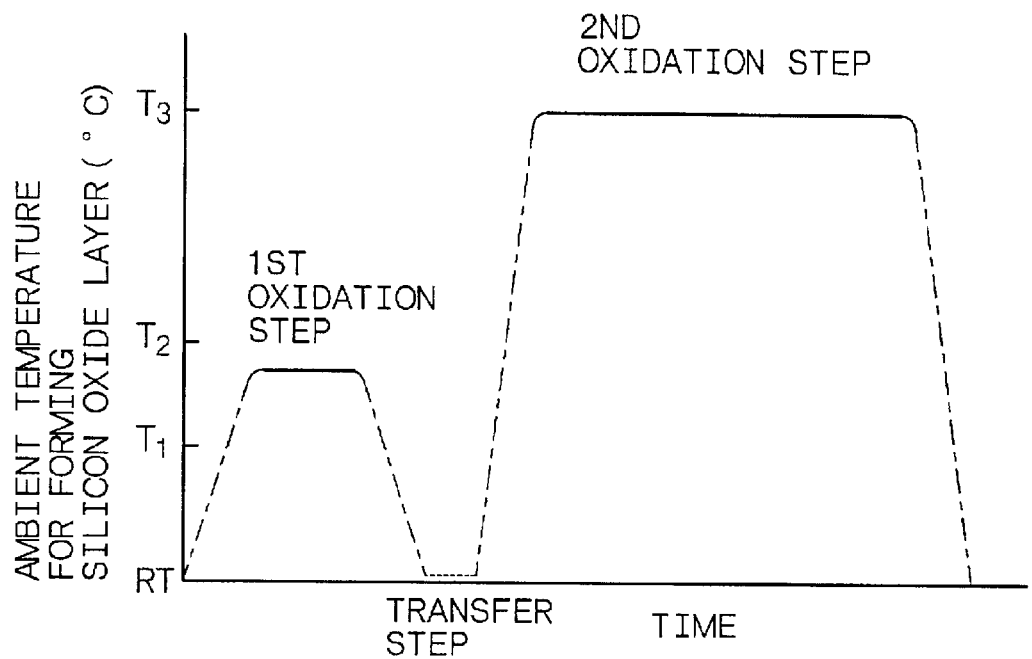
FIGS. 8A and 8B schematically show ambient temperature profiles in the method according to the preferred second embodiment of the present invention.
Figure 8B:
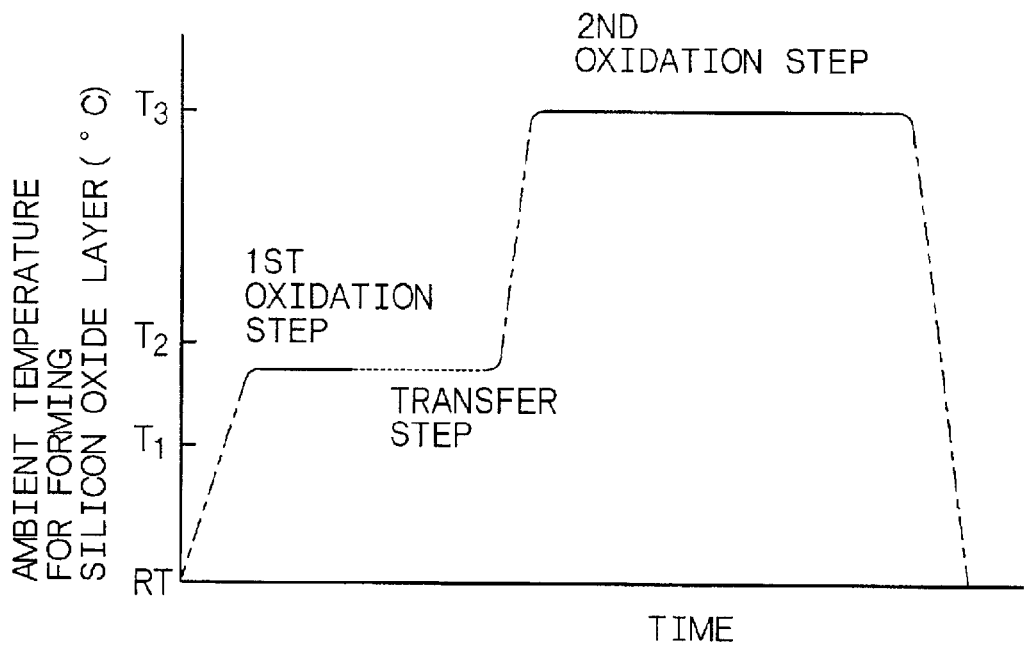
Figure 9A:
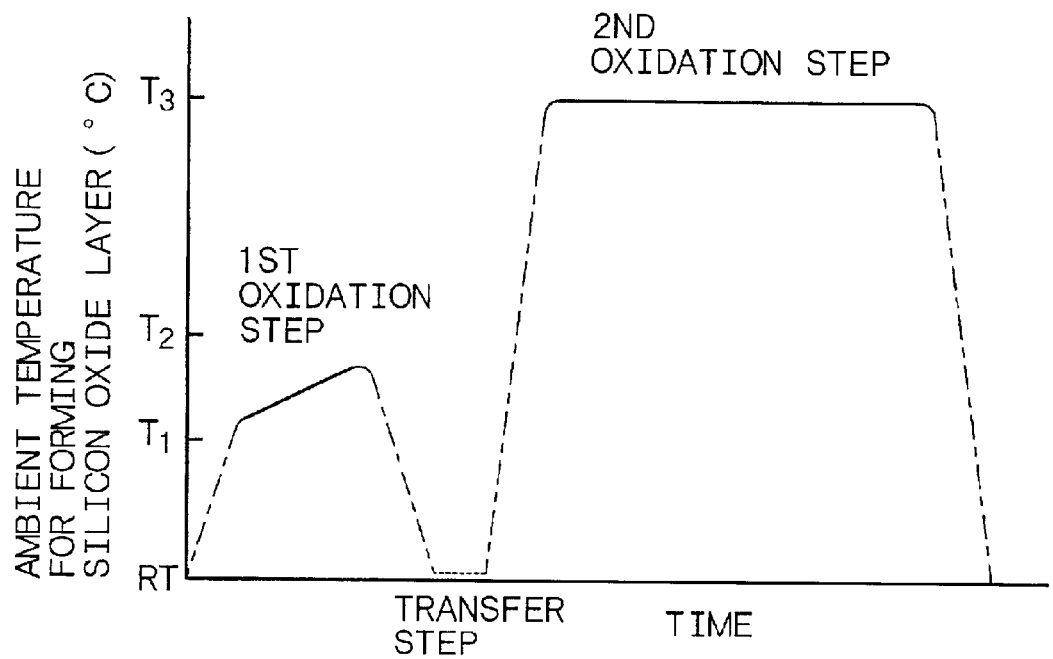
FIGS. 9A and 9B schematically show ambient temperature profiles in the method according to the preferred second embodiment of the present invention.
Figure 9B:
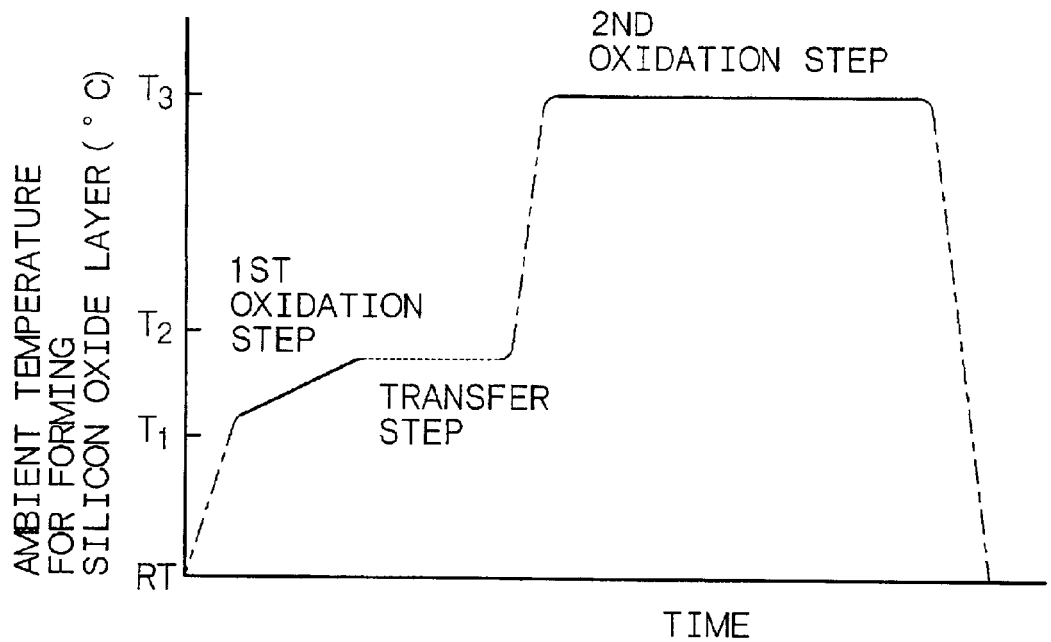
Figure 10A:
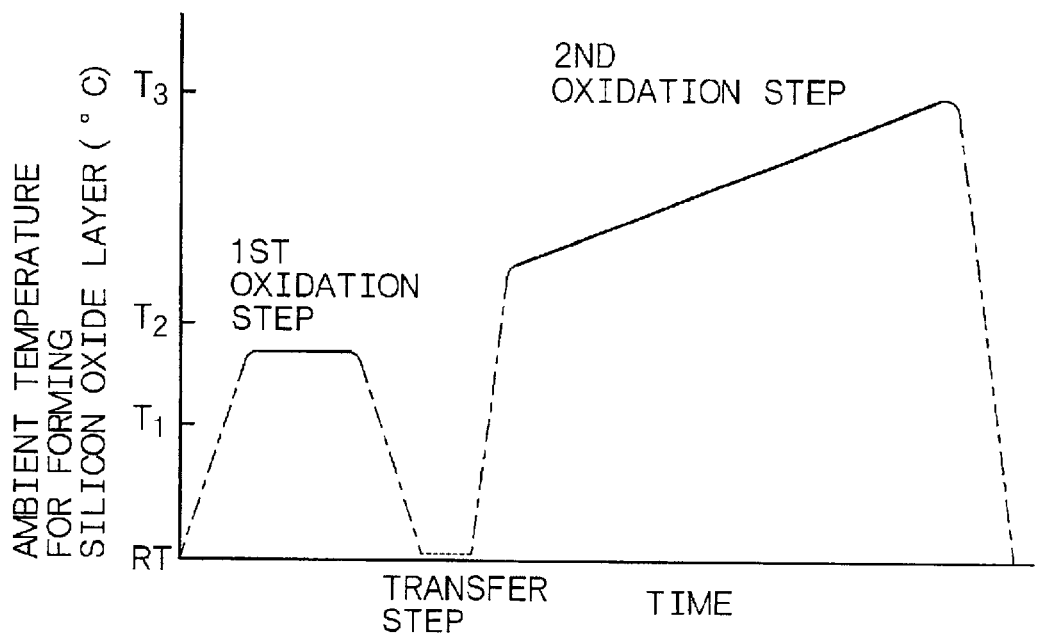
FIGS. 10A and 10B schematically show ambient temperature profiles in the method according to the preferred second embodiment of the present invention.
Figure 10B:
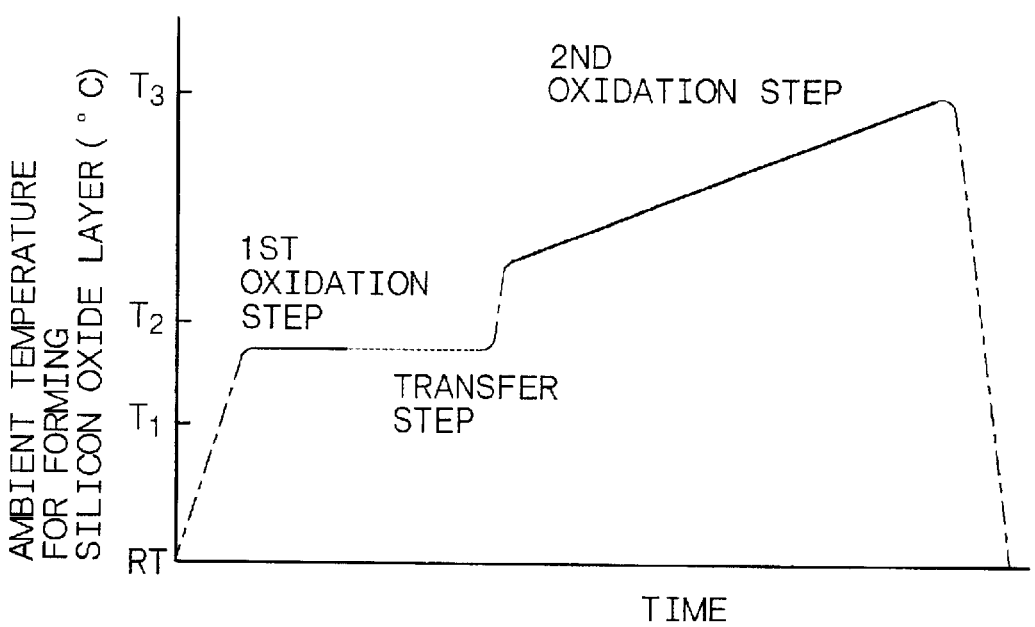
Figure 11A:
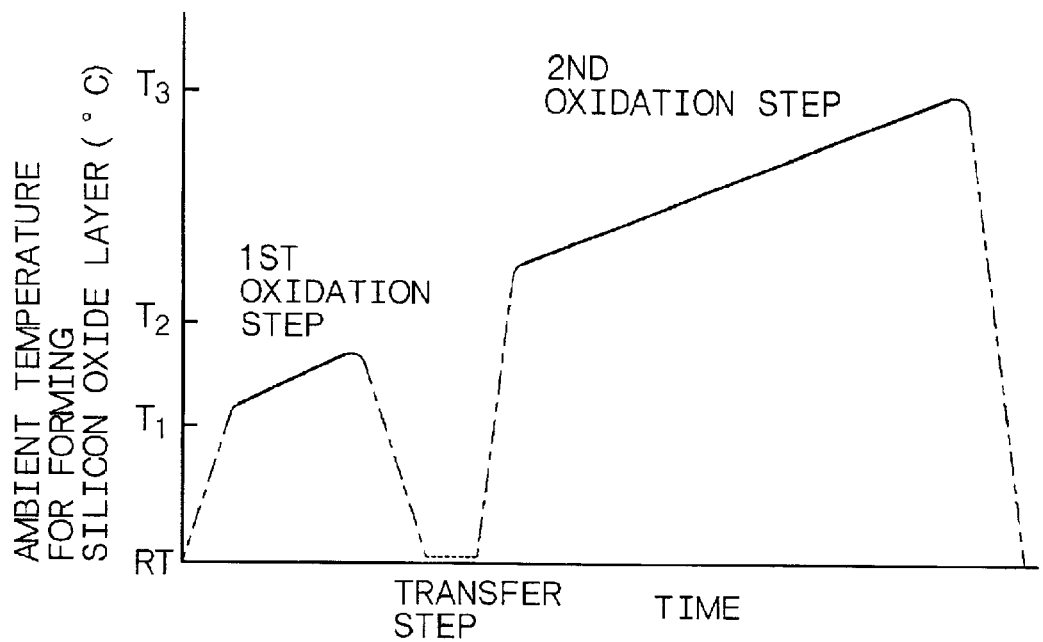
FIGS. 11A and 11B schematically show ambient temperature profiles in the method according to the preferred second embodiment of the present invention.
Figure 11B:
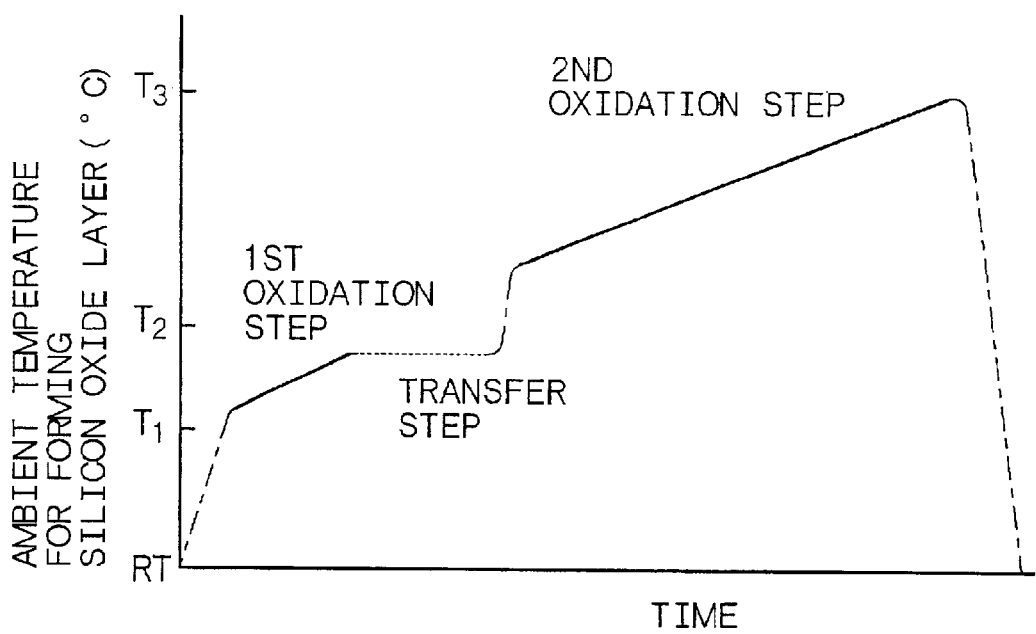
Figure 12A:
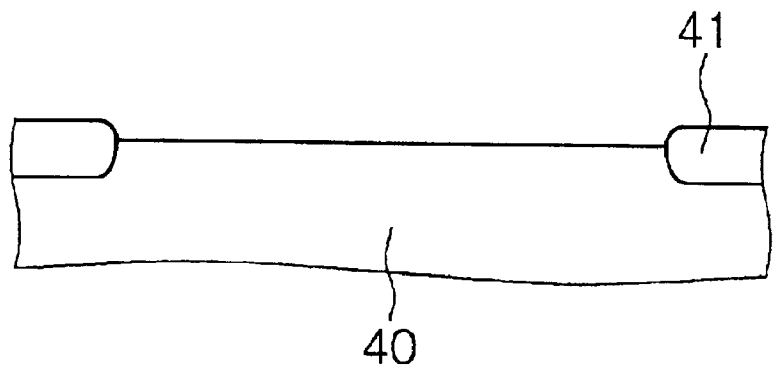
FIGS. 12A, 12B and 12C show schematic partial cross sections of a silicon semiconductor substrate and so on for explaining the method of forming a silicon oxide layer in Example 1.
Figure 12B:
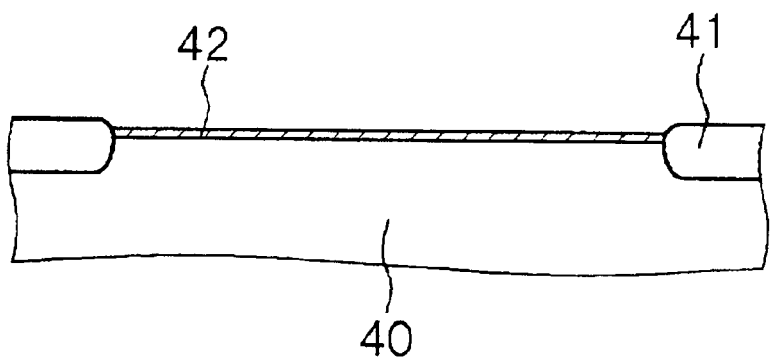

The formation of the silicon oxide layer 42 on the surface of each silicon semiconductor substrate 40 was completed by the above procedure (see FIG. 12B). Thereafter, a nitrogen gas atmosphere was formed in the process chamber 10, the elevator unit 23 was actuated to lower the fused quartz boat 24, and then the silicon semiconductor substrates 40 were transferred out of the substrate transfer portion 20.

[Step-180]

Figure 12C:
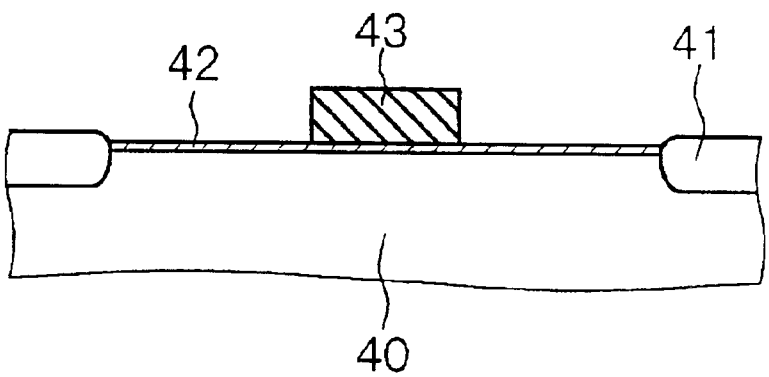

In Example 1, MOS capacitors were produced from the above silicon semiconductor substrate having the above silicon oxide layer, by forming a polyside-structured gate electrode 43 formed of polysilicon and tungsten silicide on the silicon oxide layer 42 by a known CVD method, known photolithography and dry etching process (see FIG. 12C).

EXAMPLE 2

Figure 18:
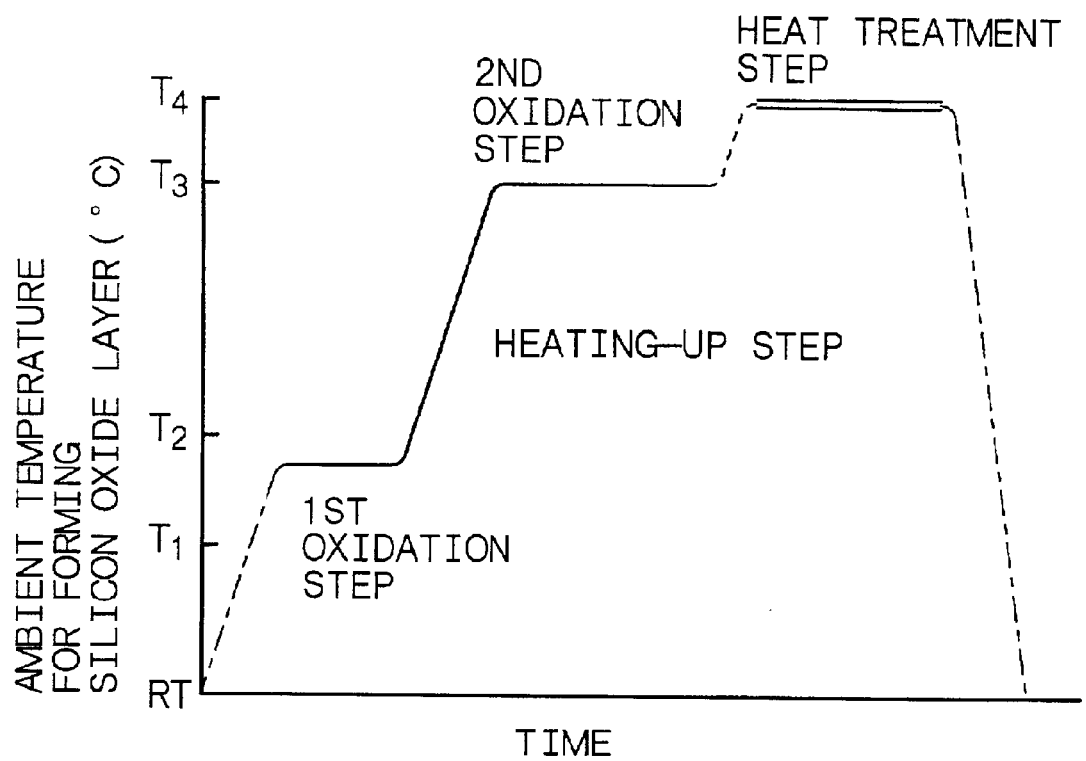
FIG. 18 schematically shows an ambient temperature profile in Example 2.

Example 2 is a variant of Example 1. In Example 2, the ambient temperature in the process chamber 10 was raised up to 800° C. with the heater 14 through the liner tube 16 without terminating the introduction of the wet gas into the process chamber 10 in place of [Step-140] in Example 1. In Example 2, the formation of a silicon oxide layer was continued in the heating-up step as well. In the step corresponding to [Step-130] in Example 1, a silicon oxide layer having a thickness of 1.0 nm was formed. Any other procedures in Example 2 were the same as those in Example 1. FIG. 18 schematically shows an ambient temperature profile in Example 2.

EXAMPLE 3

Example 3 is also a variant of Example 1. In Example 3, an epitaxial silicon layer having a thickness of 10 μm was formed on a silicon semiconductor substrate by a known method. A silicon oxide layer was formed on the surface of the epitaxial silicon layer, and further, MOS capacitors were formed, in the same manner as in [Step-110] to [Step-180] in Example 1. The silicon oxide layer had a total thickness of 4.0 nm. In the step equivalent to [Step-130], a silicon oxide layer having a thickness of 1.2 nm was formed.

Comparative Example 1

A silicon oxide layer having a thickness of 4.0 nm was formed on a surface of each silicon semiconductor substrate by a conventional method of forming a silicon oxide layer. That is, the silicon oxide layer was formed on the basis of [Step-10] to [Step-40]. In [Step-20], nitrogen gas containing 0.5 vol % of oxygen gas was introduced into the process chamber 10 through the gas inlet port 12 before the shutter 15 was opened, to form a nitrogen gas atmosphere containing 0.5 vol % of oxygen gas in the process chamber 10. The ambient temperature in the process chamber 10 was adjusted to 800° C., and a silicon oxide layer was formed on the surface of each silicon semiconductor substrate by an oxidation method using pyrogenic gas. MOS capacitors were prepared from the above silicon semiconductor substrate having the silicon oxide layer formed above, in the same manner as in Example 1. As a result of the transfer of the silicon semiconductor substrate into the process chamber 10 having a nitrogen gas atmosphere containing 0.5 vol % of oxygen gas prior to the formation of a silicon oxide layer on the silicon semiconductor substrate by an oxidation method using pyrogenic gas, a dry oxide layer having a thickness of 2.3 nm was formed on the surface of the silicon semiconductor substrate.

Comparative Example 2

In Comparative Example 2, the ambient temperature in the step corresponding to [Step-130] in Example 1 was maintained at a temperature at which no silicon atom was eliminated from a surface of a silicon semiconductor substrate. Specifically, the ambient temperature in the process chamber 10 was maintained at 400° C. The atmosphere in the process chamber 10 was a nitrogen atmosphere containing 0.5 vol % of oxygen gas. As a result, a dry oxide layer having a thickness of 1.2 nm was formed. Any other steps were the same as those in Example 1.

For evaluating the silicon oxide layers of the MOS capacitors obtained in Examples 1 to 3 and Comparative Examples 1 and 2 for long-term reliability, the capacitors were measured for time dependent dielectric breakdown (TDDB) properties. The "time dependent dielectric breakdown" refers to a phenomenon in which a silicon oxide layer is not broken at a time when a current stress or a voltage stress begins to be applied, but in which the silicon oxide layer undergoes a dielectric breakdown when a certain period of time passes after the application of the stress.

Figure 19:
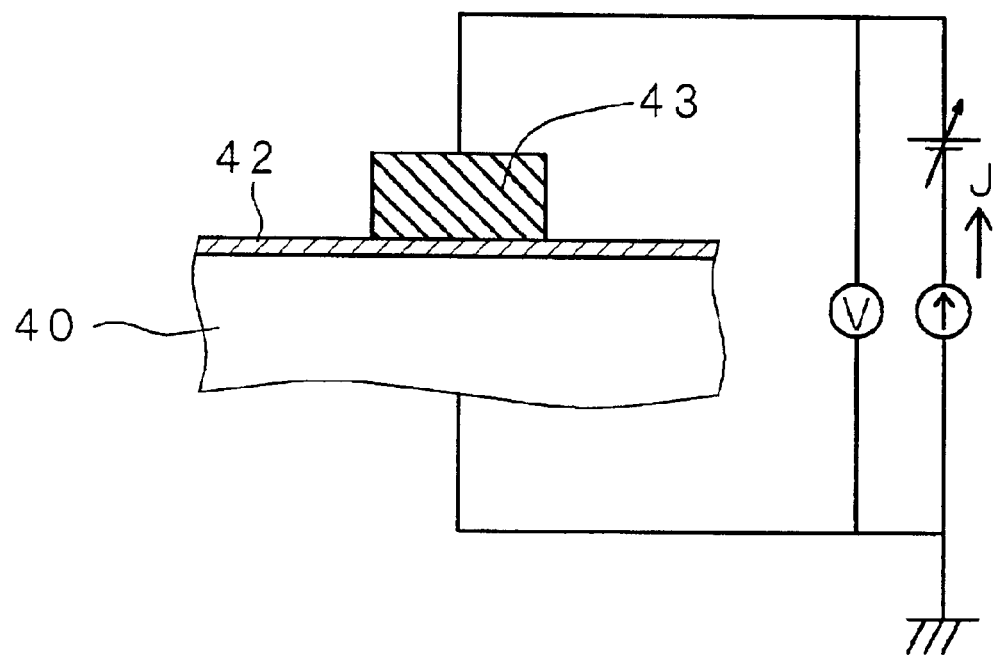
FIG. 19 schematically shows a circuit for measuring a time dependent dielectric breakdown (TDDB) property.
Figure 20:
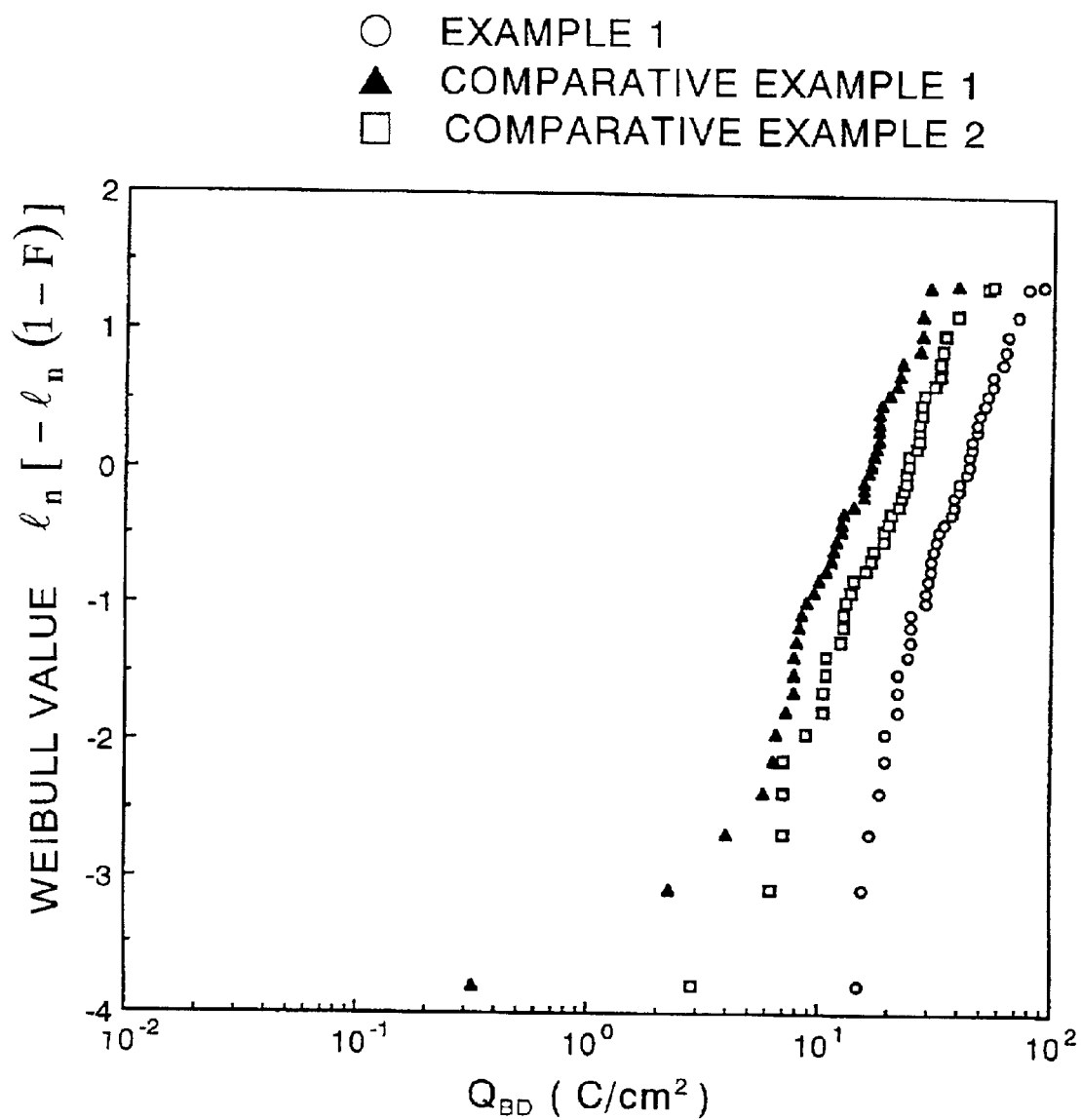
FIG. 20 shows Weibull distributions showing the results of evaluation of time dependent dielectric breakdown (TDDB) properties of silicon oxide layers obtained by methods explained in Example 1 and Comparative Examples 1 and 2.
Figure 21:
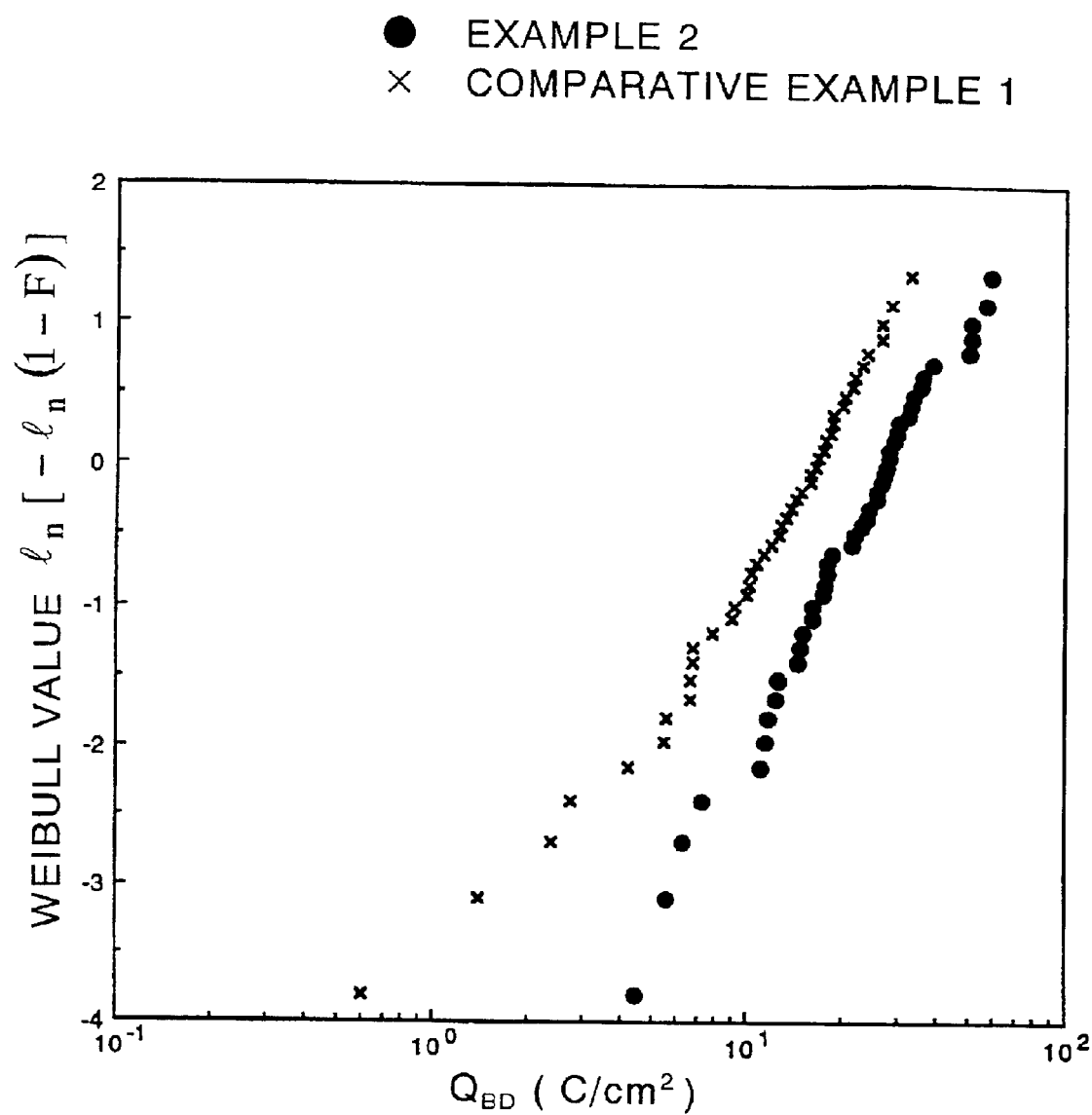
FIG. 21 shows Weibull distributions showing the results of evaluation of time dependent dielectric breakdown (TDDB) properties of silicon oxide layers obtained by methods explained in Example 2 and Comparative Example 1.
Figure 22:
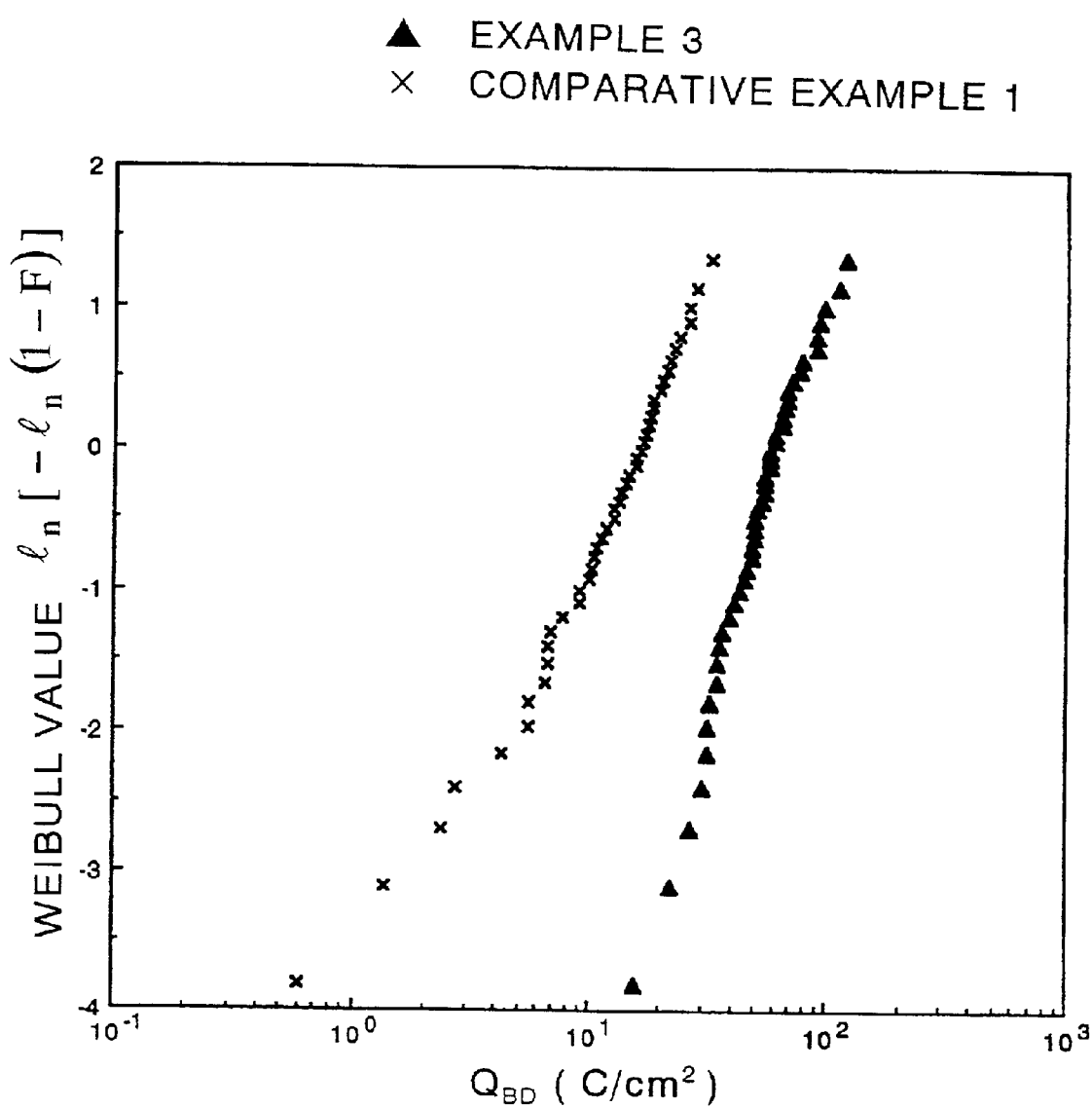
FIG. 22 shows Weibull distributions showing the results of evaluation of time dependent dielectric breakdown (TDDB) properties of silicon oxide layers obtained by methods explained in Example 3 and Comparative Example 1.

The capacitors were evaluated for time dependent dielectric breakdown (TDDB) properties by the following method. Fifty MOS capacitors were formed on one silicon semiconductor substrate 40, and each MOS capacitor had a gate area of 0.1 mm². Two silicon semiconductor substrates were used for the evaluation. A circuit schematically shown in FIG. 19 was prepared, and the MOS capacitor was measured for a so-called Coulomb breakdown ($Q_{DB}$) by a constant current stress method in which a constant current (J=0.1 A/cm²) was applied to the gate electrode 43. The above $Q_{DB}$ is expressed by a product of J (A/cm²) and a time, $t_{DB}$, taken until a dielectric breakdown occurs. FIGS. 20, 21 and 22 show Weibull distributions showing relationships between cumulative failure P and $Q_{DB}$. In FIG. 20, circles show evaluation results of the silicon oxide layer obtained in Example 1, solid triangles show evaluation results of the silicon oxide layer obtained in Comparative Example 1, and squares show evaluation results of the silicon oxide layer in Comparative Example 2. In FIG. 21, solid circles show evaluation results of the silicon oxide layer obtained in Example 2, and "X" marks show evaluation results of the silicon oxide layer obtained in the same manner as in Comparative Example 1. In FIG. 22, solid triangles show evaluation results of the silicon oxide layer obtained in Example 3, and "X" marks show evaluation results of the silicon oxide layer obtained in the same manner as in Comparative Example 1. As shown in FIG. 20, the silicon oxide layer obtained in Example 1 had improved long-term reliability, since the amount of charges injected into the silicon oxide layer obtained in Example 1 until the silicon oxide layer underwent a dielectric breakdown was more than double the amount of charges injected into the silicon oxide layer obtained in Comparative Example 1. The silicon oxide layer obtained in Example 3, i.e., the silicon oxide layer formed on the surface of the epitaxial silicon layer, was more improved in long-term reliability than the silicon oxide layer obtained in Example 1.

EXAMPLE 4

Figure 23:
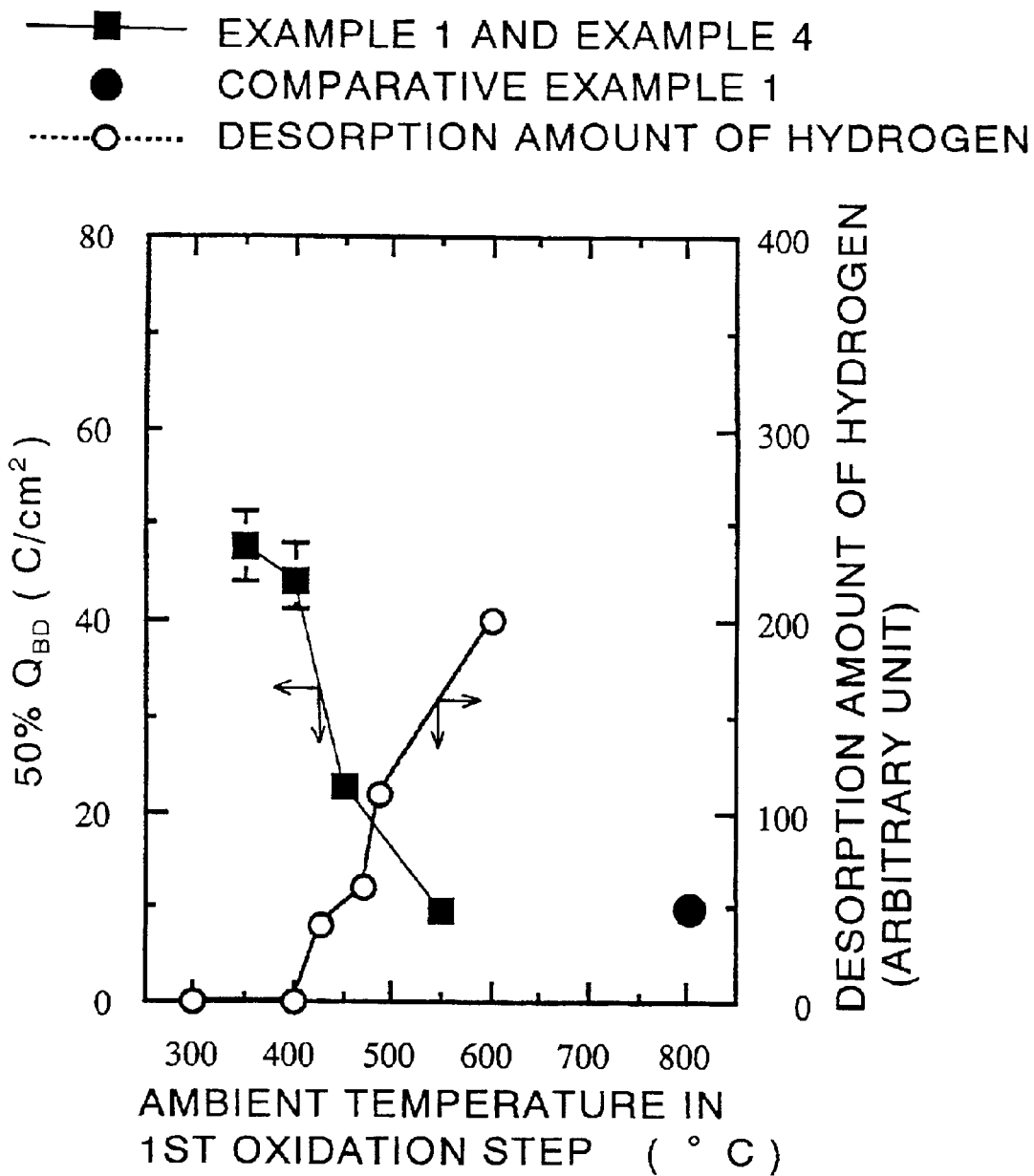
FIG. 23 is a graph showing $Q_{BD}$ values of MOS capacitors prepared in Example 1, Example 4 and Comparative Example 1 at a cumulative failure of 50%, and a relationship between the amount of hydrogen atoms eliminated from a surface of a silicon semiconductor substrate and an ambient temperature in the first oxidation step.

Example 4 is also a variant of Example 1. The first oxidation step was carried out in the same manner as in Example 1 except that the ambient temperature at which no silicon atom was eliminated from the surface of the silicon layer in the first oxidation step was changed to 350° C. or 450° C. For comparison, further, a silicon oxide layer was formed while the ambient temperature in the first oxidation step was set at 550° C. Any other steps were carried out in the same manner as in Example 1. Fifty MOS capacitors were formed on one silicon semiconductor substrate 40 in the same manner as in Example 1. In FIG. 23, solid squares show relationships between $Q_{BD}$ values at cumulative failure of 50% of the MOS capacitors prepared in Examples 1 and 4 and the ambient temperatures employed in the first oxidation step. In FIG. 23, further, circles show relationships between amounts (arbitrary unit) of hydrogen atoms eliminated from the surface of the silicon semiconductor substrate and the ambient temperatures employed in the first oxidation step. FIG. 23 shows the following. When the ambient temperature in the first oxidation step exceeds 500° C., the amount of eliminated hydrogen atoms sharply increases, and further, the $Q_{BD}$ value at cumulative failure of 50% of the MOS capacitors decreased nearly to the level of MOS capacitors produced according to a conventional oxidation method. For example, the $Q_{DB}$ value at cumulative failure of 50% of the MOS capacitors obtained in Example 1 was improved by about double as compared with that in Comparative Example 1. When the ambient temperature in the first oxidation step was 350° C., the $Q_{DB}$ value at cumulative failure of 50% of the MOS capacitors was further improved.

EXAMPLE 5

Figure 24:
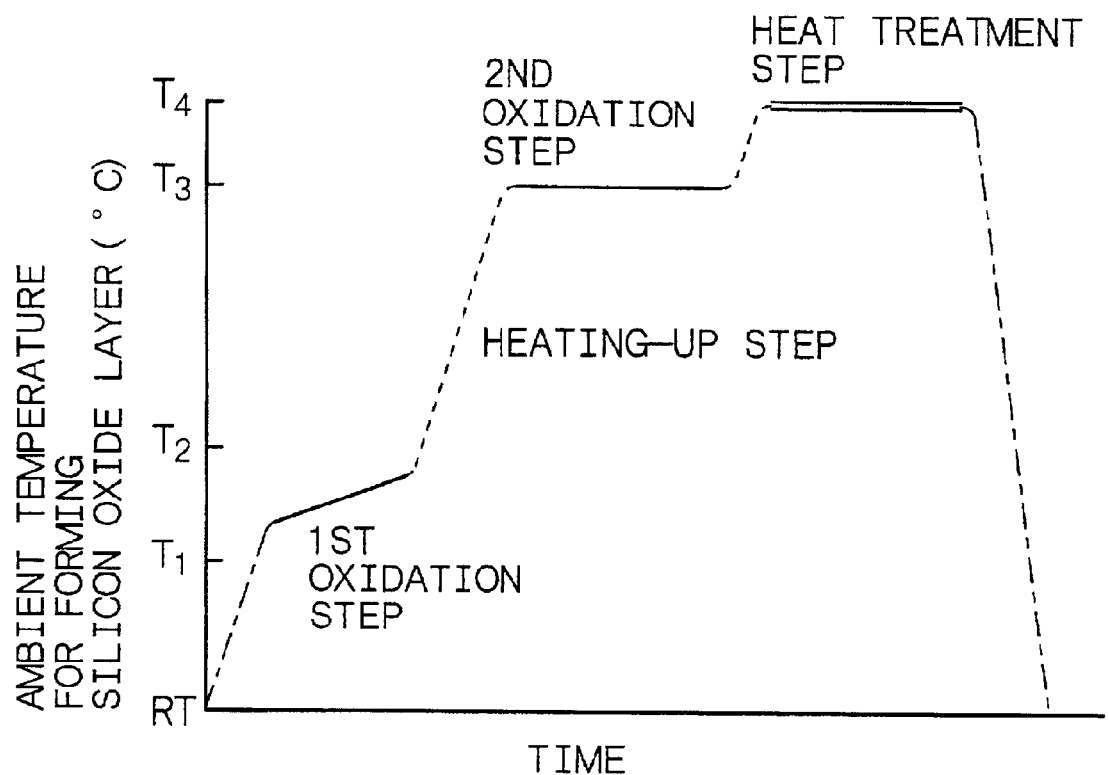
FIG. 24 schematically shows an ambient temperature profile in Example 5.

Example 5 is also a variant of Example 1. Example 5 differs from Example 1 in an ambient temperature profile in the first oxidation step, the heating-up step and the second oxidation step. FIG. 24 schematically shows an ambient temperature profile in Example 5. The method of forming a silicon oxide layer in Example 5 will be explained below.

[Step-500]

First, isolation regions, etc., were formed on a silicon semiconductor substrate in the same manner as in Example 1. Then, fine particles and metal impurities were removed from the surface of the silicon semiconductor substrate by RCA cleaning, and the surface of the silicon semiconductor substrate was cleaned with a 0.1% hydrofluoric acid aqueous solution and then with pure water, to expose the surface of the silicon semiconductor substrate.

[Step-510]

Figure 25A:
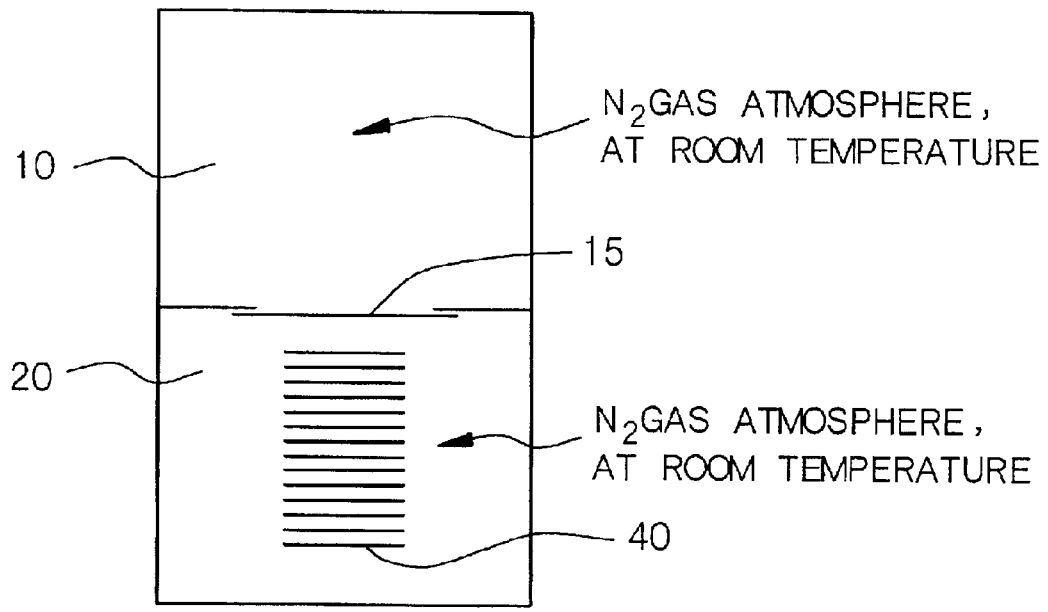
FIGS. 25A and 25B show conceptual cross sections of the vertical-type processing apparatus and so on for explaining the method of forming a silicon oxide layer in Example 5.

Then, the silicon semiconductor substrates were transferred into the substrate transfer portion 20 of the vertical-type processing apparatus shown in FIG. 13 through the door (not shown), and were placed on the fused quartz boat 24 (see FIG. 25A). In addition, nitrogen gas was introduced into the process chamber 10 through the gas inlet port 12 to form an inert gas atmosphere of nitrogen gas in the process chamber 10 (an atmosphere under reduced pressure may be used). The ambient temperature in the process chamber 10 was room temperature.

[Step-520]

Figure 25B:
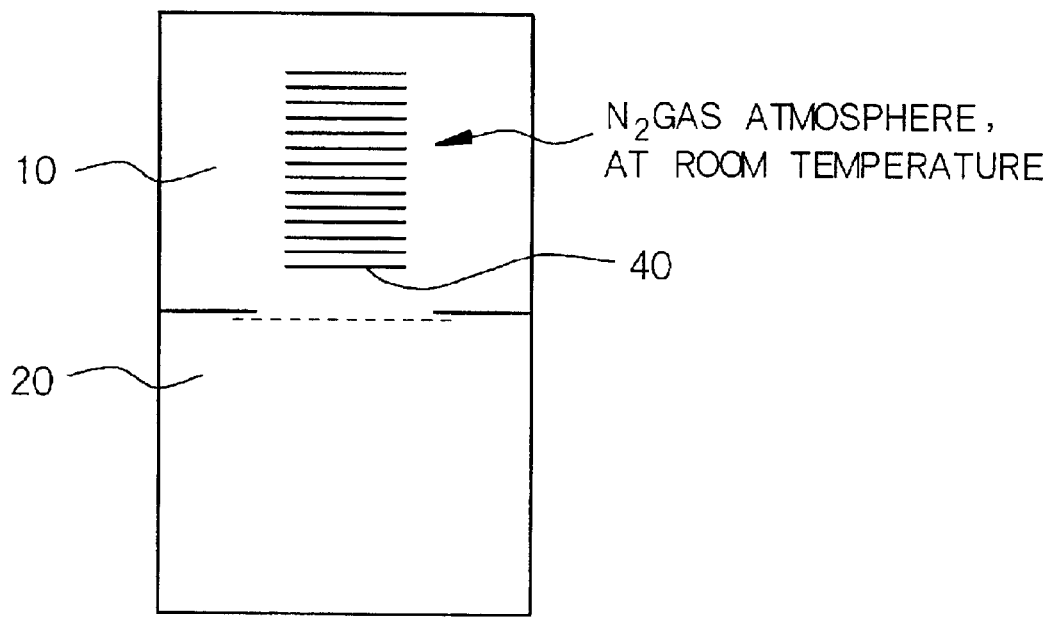

After the transfer of the silicon semiconductor substrates 40 into the substrate transfer portion 20 was completed, the door (not shown) was closed, and nitrogen gas was introduced into the substrate transfer portion 20 through the gas introducing portion 21 to purge atmosphere in the substrate transfer portion 20 through the gas exhaust portion 22, so that a nitrogen gas atmosphere was formed in the substrate transfer portion 20. The oxygen gas concentration in the substrate transfer portion 20 was monitored, and when the oxygen gas concentration became, for example, 100 ppm or less, it was determined that a sufficient nitrogen atmosphere was formed in the substrate transfer portion 20. Then, the shutter 15 was opened, the elevator unit 23 was actuated to elevate the fused quartz boat 24, whereby the silicon semiconductor substrates 40 were transferred into the double-tubular structured process chamber 10 made of fused quartz (see FIG. 25B). The elevation rate of the elevator unit 23 was set at 500 mm/minute.

[Step-530]

Figure 26A:
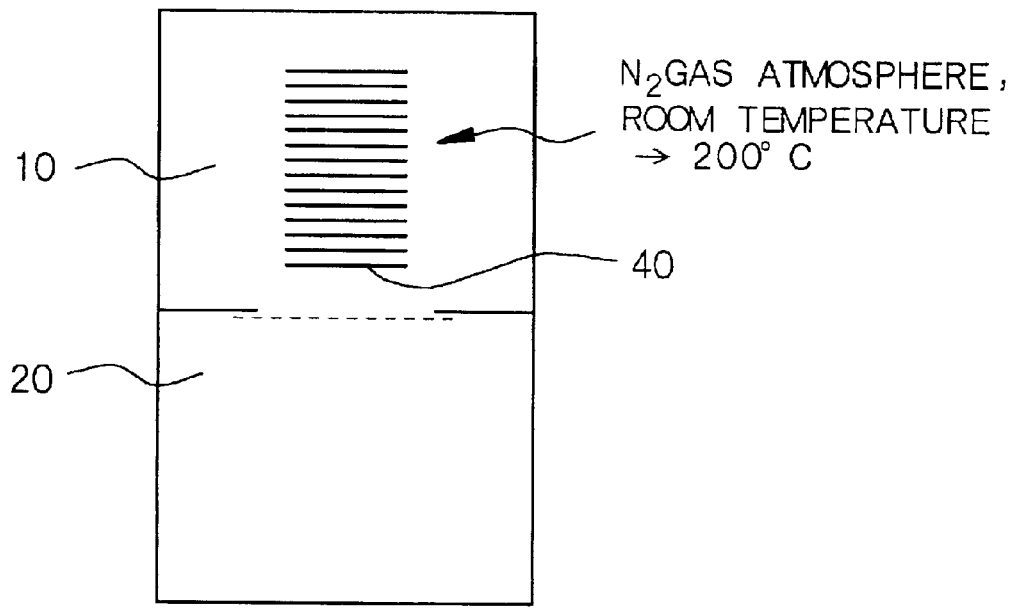
FIGS. 26A and 26B subsequent to FIG. 25B show conceptual cross sections of the vertical-type processing apparatus and so on for explaining the method of forming a silicon oxide layer in Example 5.
Figure 26B:
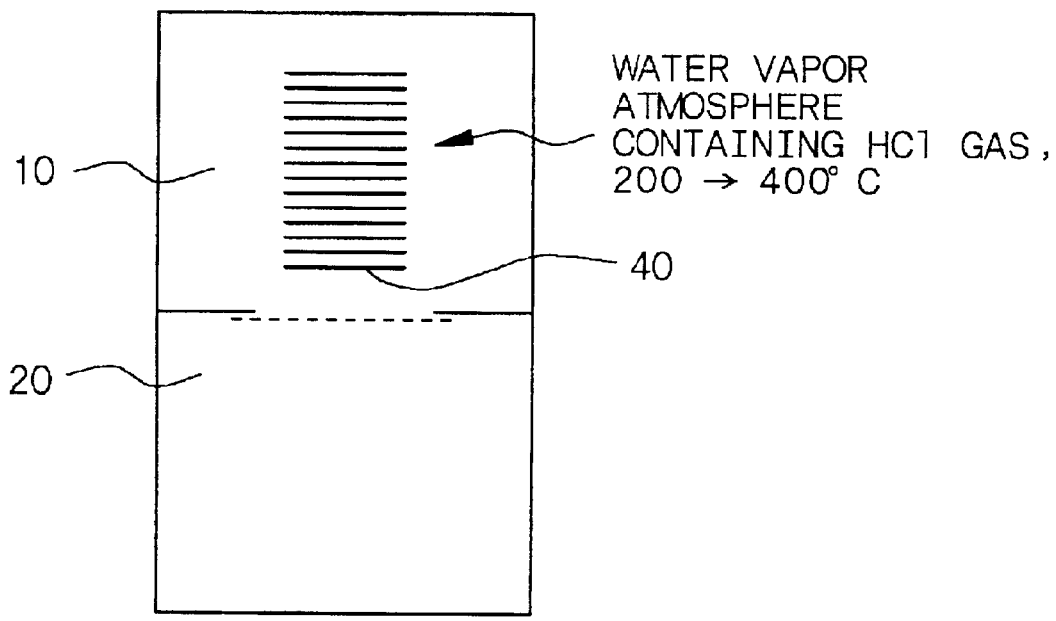

The ambient temperature in the process chamber 10 was increased up to 200° C. with the heater 14 through the liner tube 16 (see FIG. 26A). After the ambient temperature in the process chamber 10 was stabilized at 200° C., that is, after the ambient temperature was adjusted to a temperature (specifically, 200° C. in Example 5) at which no silicon atom was eliminated from the surface of the silicon layer (silicon semiconductor substrate in Example 5), the formation of a silicon oxide layer on the surface of the silicon layer was initiated by the oxidation method using wet gas. The wet gas may contain, for example, 0.1 vol % of hydrogen chloride gas. Specifically, water vapor generated in the combustion chamber 30 and hydrogen chloride gas were introduced into the process chamber 10 through the piping 31, the gas passage 11 and the gas inlet port 12, and the formation of a silicon oxide layer on the surface of the silicon semiconductor substrate was initiated by an oxidation method using pyrogenic gas. Then, while forming the silicon oxide layer, the ambient temperature in the process chamber 10 was raised up to 400° C. with the heater 14 through the liner tube 16 (see FIG. 26B), so that the silicon oxide layer having a thickness of about 1 nm was formed.

[Step-540]

Figure 27A:
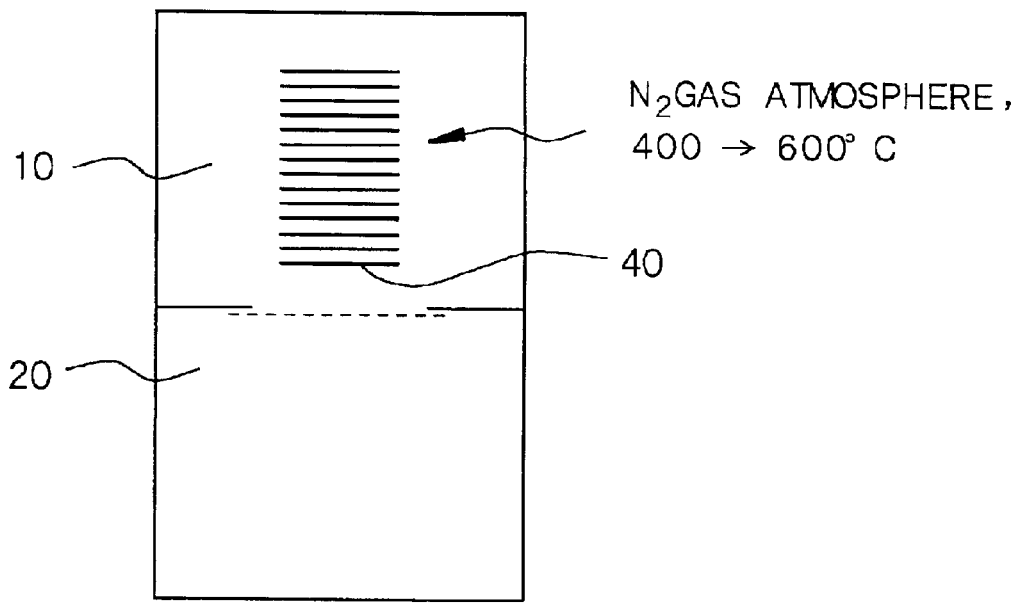
FIGS. 27A and 27B subsequent to FIG. 26B show conceptual cross sections of the vertical-type processing apparatus and so on for explaining the method of forming a silicon oxide layer in Example 5.

Then, the introduction of the wet gas into the process chamber 10 was terminated, and while the inert gas, which may contain or may not contain a halogen element, was introduced into the process chamber 10 through the gas inlet port 12, the ambient temperature in the process chamber 10 was raised up to 600° C. with the heater 14 through the liner tube 16 (see FIG. 27A). Since the silicon oxide layer which worked as a protective layer as well was already formed on the surface of the silicon layer in [Step-530], the silicon layer such as a silicon semiconductor substrate underwent no surface roughening. The introduction of the wet gas, which may contain or may not contain a halogen element, into the process chamber 10 may be continued, while the ambient temperature in the process chamber 10 may be raised up to an ambient temperature (600° C.) higher than the ambient temperature range in which no silicon atom is eliminated from the surface of the silicon layer.

[Step-550]

Figure 27B:
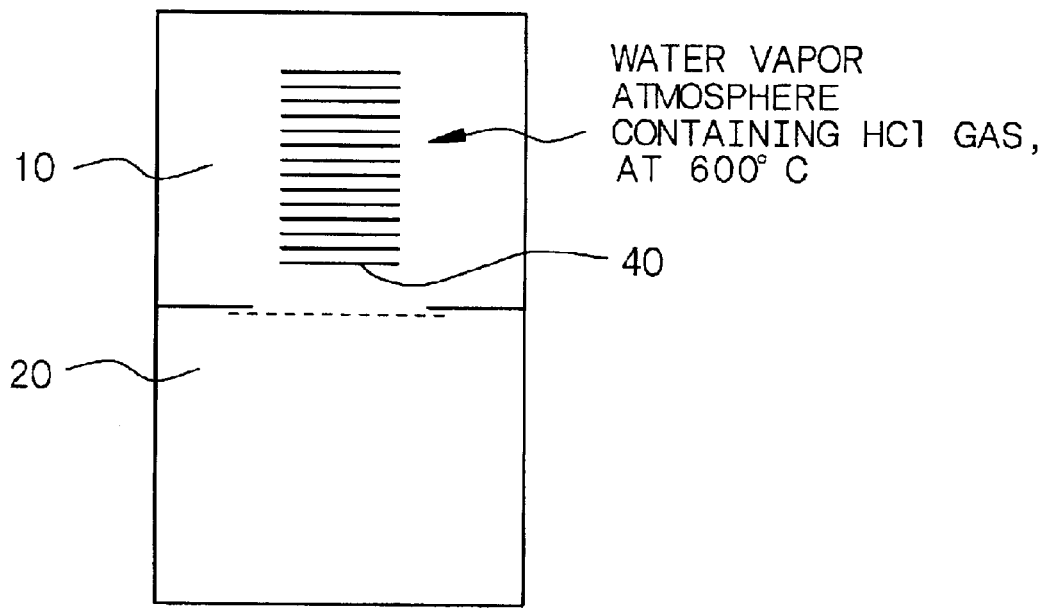

After the ambient temperature in the process chamber 10 reached 600° C., the silicon oxide layer was further formed on the surface of the silicon layer by an oxidation method using wet gas while the above ambient temperature was maintained (see FIG. 27B). The wet gas may contain, for example, 0.1 vol % of hydrogen chloride gas. Specifically, the silicon oxide layer having a total thickness of 3.5 nm was formed on the surface of the silicon semiconductor substrate by an oxidation method using pyrogenic gas in which water vapor generated in the combustion chamber 30 was introduced into the process chamber 10 through the piping 31, the gas passage 11 and the gas inlet port 12.

Since formation of the silicon oxide layer on the surface of the silicon semiconductor substrate 40 is completed by the above procedures, the silicon semiconductor substrates may be transferred out by forming an inert gas atmosphere of nitrogen gas in the process chamber 10, actuating the elevator unit 23 to lower the fused quartz boat 24, and opening the door (not shown). When it is intended to form a silicon oxide layer having further excellent properties, it is preferred to carry out the following heat treatment step on the silicon oxide layer.

[Step-560]

The introduction of the wet gas into the process chamber 10 was terminated, and while nitrogen gas was introduced into the process chamber 10 through the gas inlet port 12, the ambient temperature in the process chamber 10 was raised up to 850° C. with the heater 14. Then, nitrogen gas containing 0.1 vol % of hydrogen chloride gas was introduced into the process chamber 10 through the gas inlet port 12, and the silicon oxide layer was heat-treated for 30 minutes.

[Step-570]

The formation of the silicon oxide layer on the surface of the silicon semiconductor substrate was completed by the above procedure. Thereafter, a nitrogen gas atmosphere was formed in the process chamber 10, the elevator unit 23 was actuated to lower the fused quartz boat 24, the door was opened, and then silicon semiconductor substrates were transferred out of the substrate transfer portion 20.

EXAMPLE 6

Example 6 is also a variant of Example 1. Example 6 differs from Example 1 in that the wet gas in each of the first and second oxidation steps contains a halogen element, specifically, chlorine. Chlorine was introduced as hydrogen chloride gas, and the concentration of hydrogen chloride gas in the wet gas was 0.1 vol %. Example 6 also used the vertical-type processing-apparatus as shown in FIG. 13. In Example 6, further, a silicon semiconductor substrate was used as a silicon layer. The formed silicon oxide layer was to work as a gate oxide. An atmosphere in the heating-up step was an inert gas atmosphere. After the silicon oxide layer was formed in the second oxidation step, the formed silicon oxide layer was heat-treated in an inert gas atmosphere containing a halogen element, that is, in a nitrogen gas atmosphere containing hydrogen chloride gas. The method of forming a silicon oxide layer in Example 6 will be explained with reference to FIGS. 28 to 30 hereinafter. The ambient temperature profile in Example 6 was the same as that shown in FIG. 14.

[Step-600]

First, isolation regions, etc., were formed on a silicon semiconductor substrate in the same manner as in Example 1. Then, fine particles and metal impurities were removed from the surface of the silicon semiconductor substrate by RCA cleaning, and the surface of the silicon semiconductor substrate was cleaned with a 0.1% hydrofluoric acid aqueous solution and then with pure water, to expose the surface of the silicon semiconductor substrate.

[Step-610]

Figure 28A:
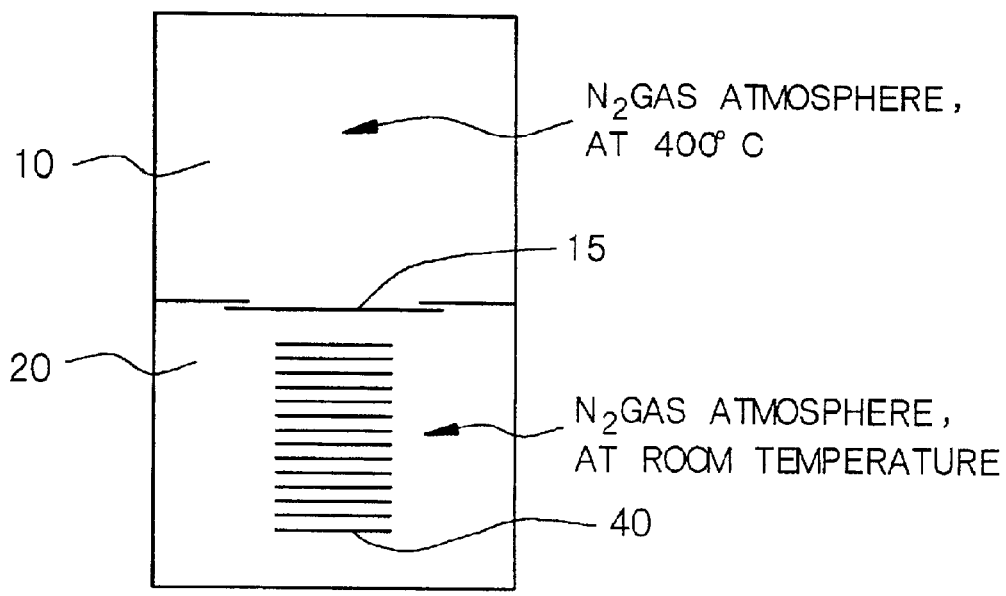
FIGS. 28A and 28B subsequent to FIG. 27B show conceptual cross sections of the vertical-type processing apparatus and so on for explaining the method of forming a silicon oxide layer in Example 6.
Figure 28B:
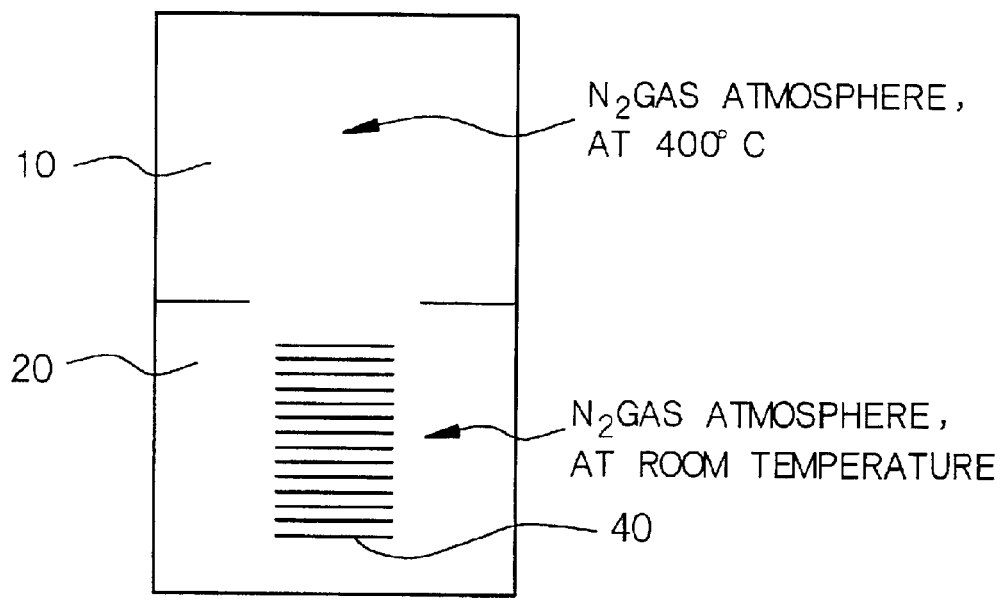
Figures 29A, 29B:
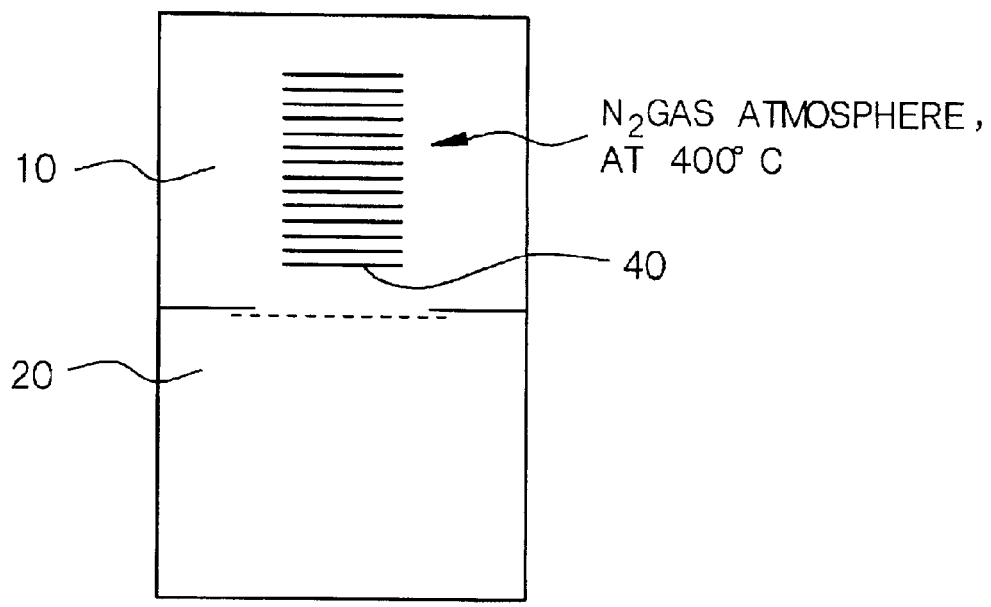
FIGS. 29A and 29B subsequent to FIG. 28B show conceptual cross sections of the vertical-type processing apparatus and so on for explaining the method of forming a silicon oxide layer in Example 6.

Then, the silicon semiconductor substrates were transferred into the substrate transfer portion 20 of the vertical-type processing apparatus shown in FIG. 13 through the door (not shown), and were placed on the fused quartz boat 24 (see FIG. 28A). In addition, nitrogen gas was introduced into the process chamber 10 through the gas inlet port 12 to form an inert gas atmosphere of nitrogen gas in the process chamber 10 (an atmosphere under reduced pressure may be used). The ambient temperature in the process chamber 10 was maintained at 400° C. with the heater 14 through the liner tube 16. In this state, the shutter 15 was kept closed.

[Step-620]

After the transfer of the silicon semiconductor substrates into the substrate transfer portion 20 was completed, the door (not shown) was closed, and nitrogen gas was introduced into the substrate transfer portion 20 through the gas introducing portion 21 to purge atmosphere through the gas exhaust portion 22, so that a nitrogen gas atmosphere was formed in the substrate transfer portion 20. The oxygen gas concentration in the substrate transfer portion 20 was monitored, and when the oxygen gas concentration became, for example, 100 ppm or less, it was determined that a sufficient nitrogen atmosphere was formed in the substrate transfer portion 20. Then, the shutter 15 was opened (see FIG. 28B), the elevator unit 23 was actuated to elevate the fused quartz boat 24, whereby the silicon semiconductor substrates were transferred into the double-tubular structured process chamber 10 made of fused quartz (see FIG. 29A). When the elevator unit reached its uppermost position, the bottom portion of the fused quartz boat 24 prevents the communication between the process chamber 10 and the substrate transfer portion 20. Since the ambient temperature in the process chamber 10 was maintained at 400° C. with the heater 14, surface roughening of the silicon semiconductor substrate was prevented.

[Step-630]

Then, while the atmosphere was maintained at a temperature at which no silicon atom was eliminated from the surface of the silicon layer (the silicon semiconductor substrate in Example 6) and specifically, the ambient temperature was maintained at 400° C. in Example 61, a silicon oxide layer was formed on the surface of the silicon layer by an oxidation method using wet gas. The wet gas contained 0.1 vol % of hydrogen chloride gas. Specifically, water vapor generated in the combustion chamber 30 and hydrogen chloride gas were introduced into the process chamber 10 through the piping 31, the gas passage 11 and the gas inlet port 12, and a silicon oxide layer having a thickness of about 1 nm was formed on the surface of the silicon semiconductor substrate by an oxidation method using pyrogenic gas (see FIG. 29B).

[Step-640]

Figure 30A:
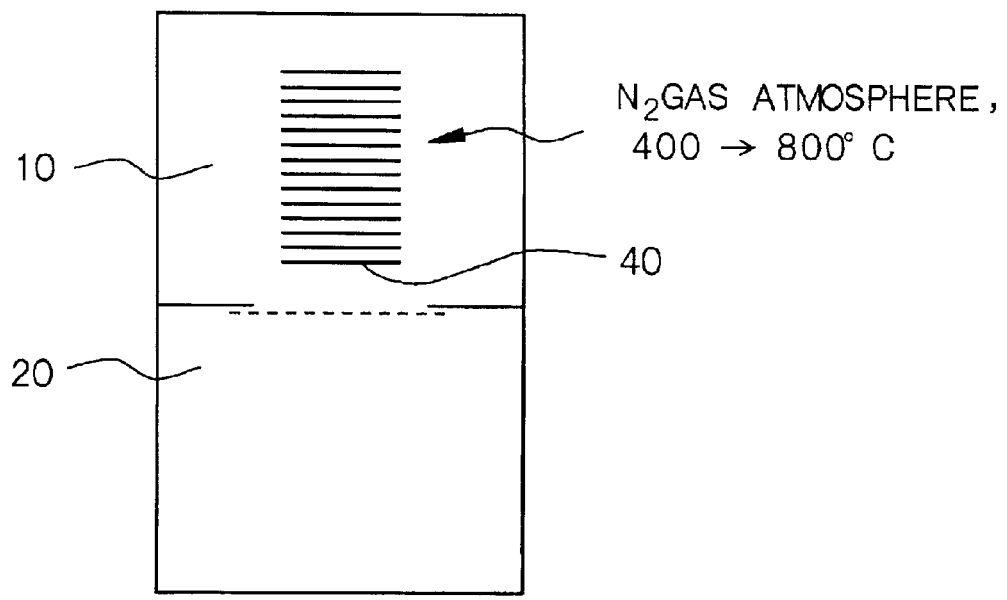
FIGS. 30A and 30B subsequent to FIG. 29B show conceptual cross sections of the vertical-type processing apparatus and so on for explaining the method of forming a silicon oxide layer in Example 6.
Figure 30B:
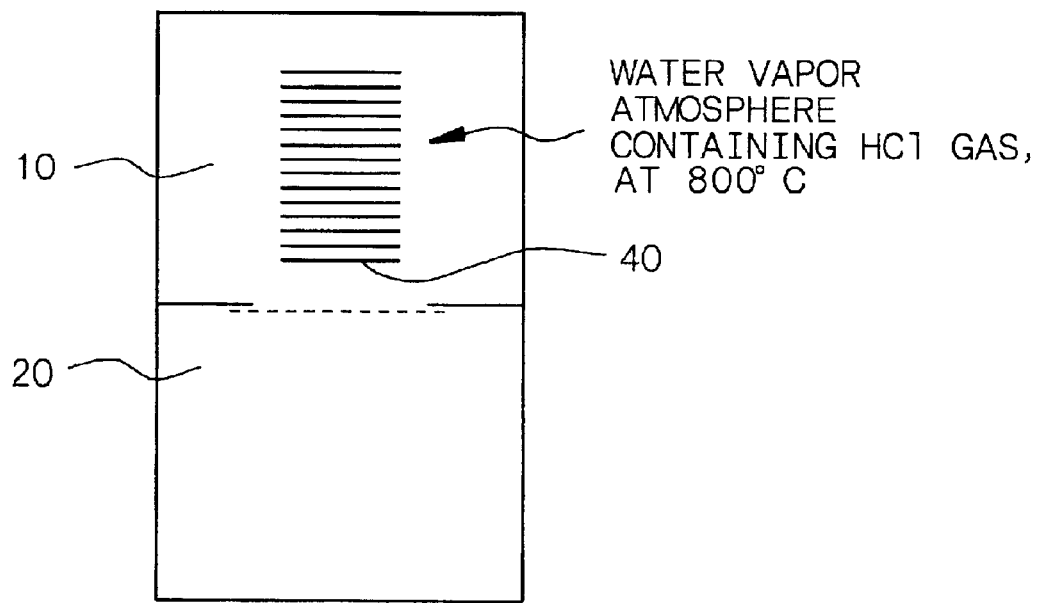

Then, the introduction of the wet gas into the process chamber 10 was terminated, and while inert gas such as nitrogen gas, in which a halogen element may be or may not be contained, was introduced into the process chamber 10 through the gas inlet port 12, the ambient temperature in the process chamber 10 was raised up to 800° C. with the heater 14 through the liner tube 16 (see FIG. 30A). Since the silicon oxide layer which also worked as a protective layer was already formed on the surface of the silicon layer in [Step-630], no surface roughening occurred on the silicon layer in this [Step-640]. Alternatively, while the introduction of the wet gas, which may contain or may not contain a halogen element, into the process chamber 10 may be continued, the ambient temperature in the process chamber 10 may be raised up to an ambient temperature (e.g., 800° C.) higher than the ambient temperature range in which no silicon atom is eliminated from the surface of the silicon layer.

[Step-650]

After the ambient temperature in the process chamber 10 reached 800° C., while the atmosphere was maintained at this temperature, the silicon oxide layer was further formed by an oxidation method using wet gas containing 0.1 vol % of hydrogen chloride gas. Specifically, water vapor generated in the combustion chamber 30 and hydrogen chloride gas were introduced into the process chamber 10 through the piping 31, the gas passage 11 and the gas inlet port 12, and the silicon oxide layer having a total thickness of 4.0 nm was formed on the surface of the silicon semiconductor substrate by an oxidation method using pyrogenic gas (see FIG. 30B).

Since the formation of the silicon oxide layer on the surface of the silicon semiconductor substrate is completed by the above procedures. The semiconductor substrates may be transferred out by forming an inert gas atmosphere of nitrogen gas in the process chamber 10, actuating the elevator unit 23 to lower the fused quartz boat 24, opening the door (not shown). When it is intended to form a silicon oxide layer having further excellent properties, it is preferred to carry out the following heat treatment step on the silicon oxide layer.

[Step-660]

Then, the introduction of the wet gas into the process chamber 10 was terminated, and while nitrogen gas was introduced into the process chamber 10 through the gas inlet port 12, the ambient temperature in the process chamber 10 was raised up to 850° C. with the heater 14. Then, nitrogen gas containing 0.1 vol % of hydrogen chloride gas was introduced into the process chamber 10 through the gas inlet port 12, and the silicon oxide layer was heat-treated for 30 minutes.

[Step-670]

The formation of the silicon oxide layer on the surface of the silicon semiconductor substrate was completed by the above procedure. Thereafter, a nitrogen gas atmosphere was formed in the process chamber 10, the elevator unit 23 was actuated to lower the fused quartz boat 24, the door was opened, and then, the silicon semiconductor substrates were transferred out of the substrate transfer portion 20.

EXAMPLE 7

Example 7 is concerned with the preferred first embodiment B in the method of forming a silicon oxide layer according to the first aspect of the present invention, and further with the method of forming a silicon oxide layer according to the second aspect of the present invention. In Example 7, the process chamber is provided with heating means for heating a silicon layer, which means is arranged outside the process chamber and nearly in parallel with the surface of the silicon layer. The first oxidation step and the second oxidation step are carried out with a single wafer processing.

Figure 31:
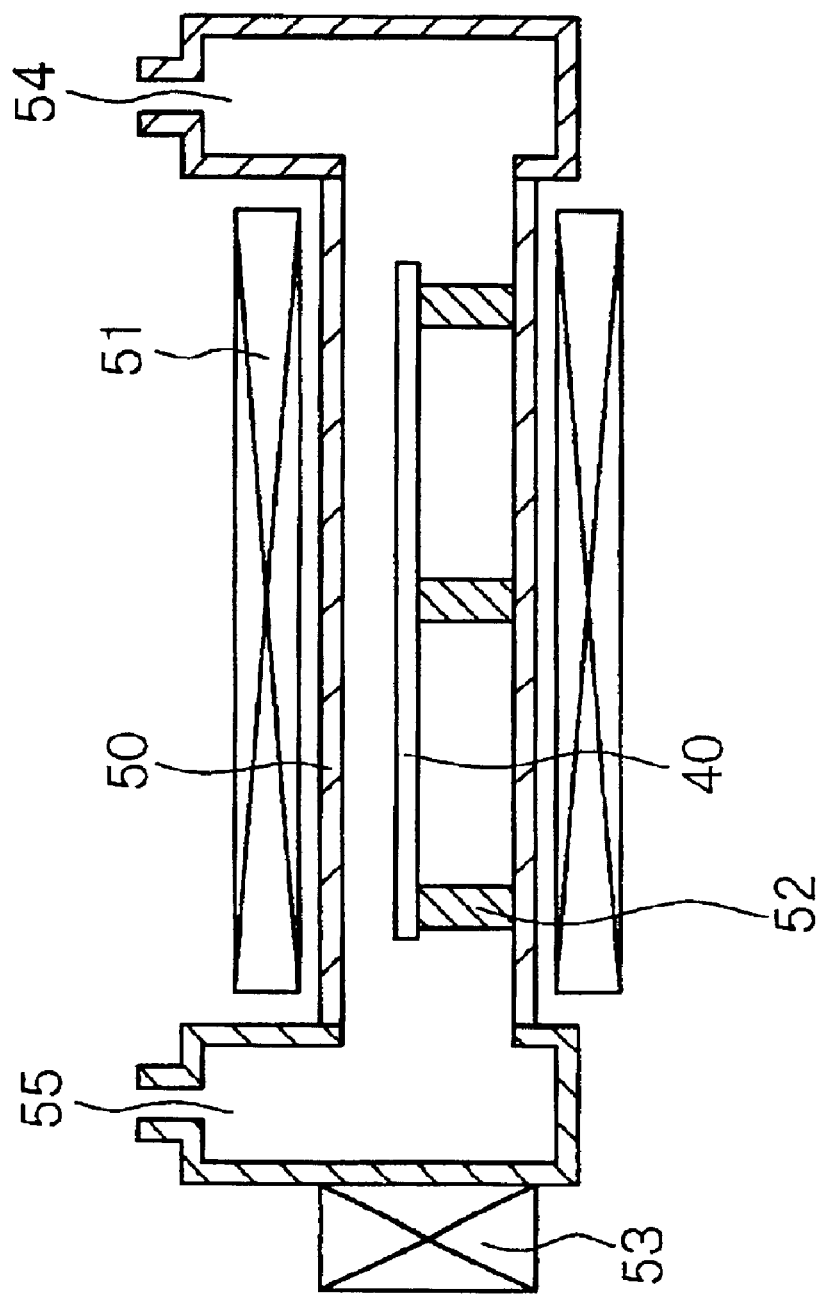
FIG. 31 schematically shows a cross section of a horizontal-type processing apparatus suitable for carrying out the method according to the preferred first embodiment B of the present invention.

FIG. 31 shows one example of a horizontal-type processing apparatus, suitable for use in Example 7. The horizontal-type processing apparatus has a process chamber 50 and a resistance heater 51 as heating means for heating a silicon layer. The process chamber 50 is formed of a fused quartz furnace tube, inside which a silicon layer, for example, a silicon semiconductor substrate is placed for forming a silicon oxide layer on its surface. The resistance heater 51 as heating means is arranged outside the process chamber 50, and it is also disposed nearly in parallel with the surface of the silicon layer. A silicon layer, for example, a silicon semiconductor substrate 40 is placed on a wafer carrier 52, and is transferred into and out of the process chamber 50 through a gate valve 53 provided in one end of the process chamber 50. The horizontal-type processing apparatus has a gas inlet port 54 for introducing water vapor and/or gas into the process chamber 50 and a gas exhaust port 55 for exhausting the water vapor and/or the gas from the process chamber 50. A silicon layer can be measured for a temperature with a thermocouple (not shown). Like Example 1, water vapor is generated by mixing hydrogen gas with oxygen gas at a high temperature and combusting the hydrogen gas with oxygen gas in the combustion chamber. The water vapor is introduced into the process chamber 50 through a piping and the gas inlet port 54. The showing of the combustion chamber and the piping is omitted.

Figure 32:
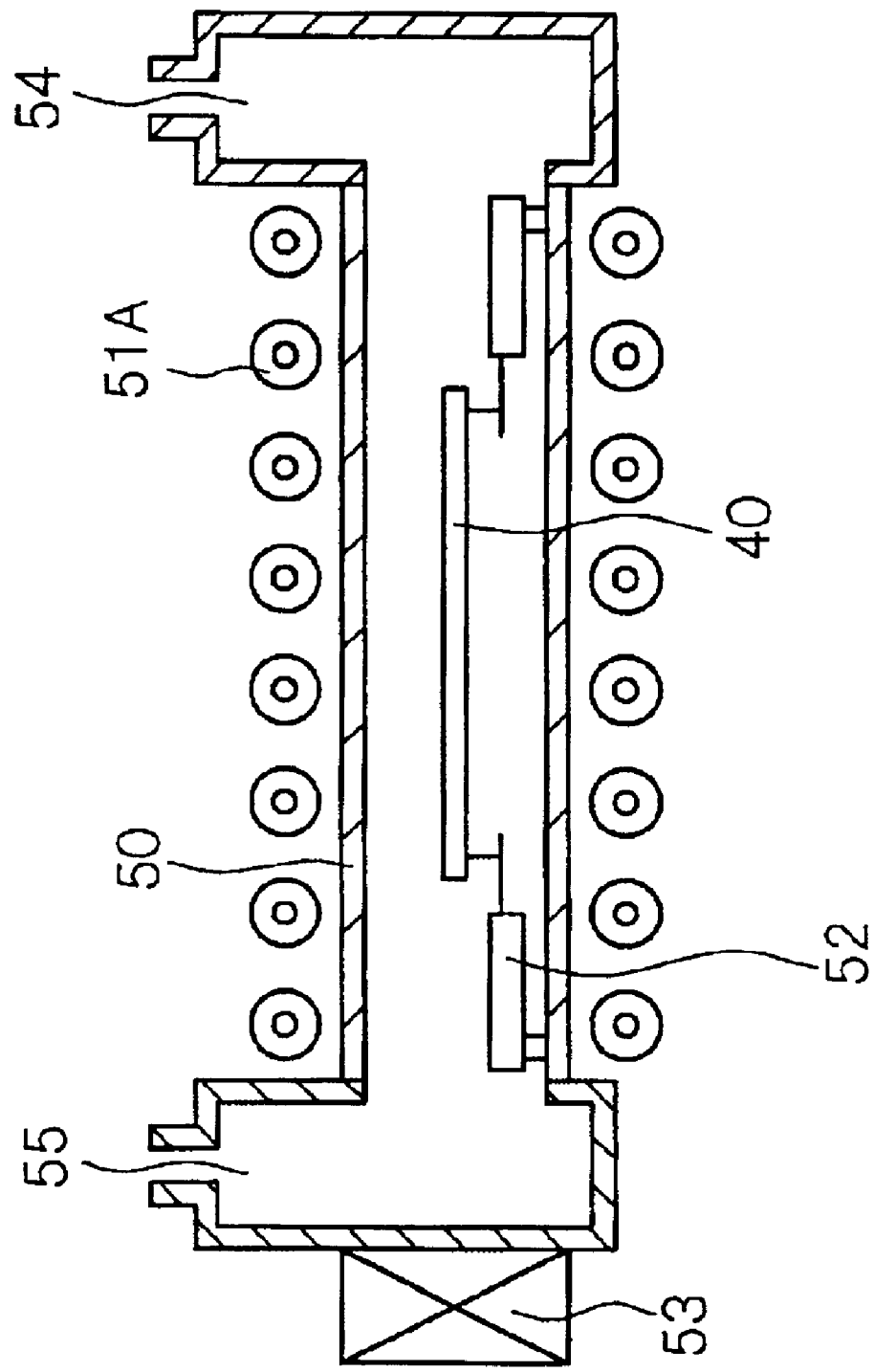
FIG. 32 schematically shows a cross section of a horizontal-type processing apparatus different from that in FIG. 31 to some extent and suitable for carrying out the method according to the preferred first embodiment B of the present invention.

Alternatively, a horizontal-type processing apparatus schematically shown in FIG. 32 may be used. In the horizontal-type processing apparatus shown in FIG. 32, the heating means is composed of a plurality of lamps 51A which emit infrared light or visible light. Further, a silicon layer is measured for a temperature with a pyrometer (not shown). Since any other structures of the horizontal-type processing apparatus can be basically the same as those of the horizontal-type processing apparatus shown in FIG. 31, their detailed explanations are omitted.

The method of forming a silicon oxide layer in Example 7 will be explained below. An ambient temperature profile in Example 7 was the same as that shown in FIG. 14.

[Step-700]

Isolation regions, etc., were formed on a silicon semiconductor substrate in the same manner as in Example 1, and fine particles and metal impurities were removed from the surface of the silicon semiconductor substrate by RCA cleaning. The silicon semiconductor substrate was cleaned with a 0.1% hydrofluoric acid aqueous solution and then with pure water to expose the surface of the silicon semiconductor substrate.

[Step-710]

Then, the gate valve 53 of the horizontal-type processing apparatus shown in FIG. 31 or FIG. 32 was opened, and the silicon semiconductor substrate 40 placed on the wafer carrier 52 was transferred into the process chamber 50. Then, the gate valve 53 was closed. In this case, the atmosphere in the process chamber 50 was kept in an inert gas atmosphere heated approximately at 400 20 C. with the heating means. When the atmosphere in the process chamber 50 was set under this condition, the occurrence of surface roughening on the silicon semiconductor substrate 40 could be prevented.

[Step-720]

Then, while the atmosphere was maintained at a temperature at which no silicon atom was eliminated from the surface of the silicon layer, for example, the silicon semiconductor substrate 40 in Example 7, that is, specifically, the ambient temperature was set at 400° C. in Example 7, a silicon oxide layer 42 was formed on the surface of the silicon layer by an oxidation method using wet gas. Specifically, in Example 7, water vapor generated in the combustion chamber (not shown) was introduced into the process chamber 50 through the piping (not shown) and the gas inlet port 54, and a silicon oxide layer having a thickness of 1.2 nm was formed on the surface of the silicon semiconductor substrate 40 by an oxidation method using pyrogenic gas.

[Step-730]

Then, while the introduction of the wet gas into the process chamber 50 was continued, the ambient temperature in the process chamber 50 was raised up to 800° C. with the heating means. Since the heating means is disposed nearly in parallel with the surface of the silicon layer in Example 7, the in-plane variability of temperature on the silicon semiconductor substrate can be prevented when the silicon semiconductor substrate is heated up. As a result, the in-plane variability of the silicon oxide layer in thickness, caused during the heating-up step, can be effectively prevented.

[Step-740]

After the ambient temperature in the process chamber 50 reached 800° C., while the atmosphere was maintained at this temperature, the silicon oxide layer was further formed by an oxidation method using wet gas. Specifically, water vapor generated in the combustion chamber was introduced into the process chamber 50 through the piping and the gas inlet port 54, and the silicon oxide layer 42 having a total thickness of 4.0 nm was formed on the surface of the silicon semiconductor substrate 40 by an oxidation method using pyrogenic gas.

The formation of the silicon oxide layer on the surface of the silicon semiconductor substrate 40 is completed by the above procedures. The silicon semiconductor substrate 40 placed on the wafer carrier 52 may be transferred out of by forming an atmosphere of inert gas such as nitrogen gas in the process chamber 50, and opening the gate valve 53. However, when it is intended to form a silicon oxide layer having further excellent properties, it is preferred to carry out the following heat treatment step on the silicon oxide layer.

[Step-750]

Then, the introduction of the wet gas was terminated, and while nitrogen gas was introduced into the process chamber 50 through the gas inlet port 54, the ambient temperature in the process chamber 50 was raised up to 850° C. with the heating means. Then, nitrogen gas containing 0.1 vol % of hydrogen chloride gas was introduced into the process chamber 50 through the gas inlet port 54, and the silicon oxide layer was heat-treated for 5 minutes.

[Step-760]

The formation of the silicon oxide layer on the surface of the silicon semiconductor substrate 40 was completed by the above procedure. Thereafter, a nitrogen gas atmosphere was formed in the process chamber 50, the gate valve 53 was opened, and the silicon semiconductor substrate 40 placed on the wafer carrier 52 was transferred out of the process chamber 50.

The formation of a silicon oxide layer explained in Examples 1 and 3 to 6 can be also carried out by means of the horizontal-type processing apparatus explained in Example 7.

EXAMPLE 8

Example 8 is concerned with the preferred second embodiment of the method of forming a silicon oxide layer according to the first aspect of the present invention, and further with the method of forming a silicon oxide layer according to the second aspect of the present invention. Example 8 uses a vertical-type processing apparatus having a first process chamber and a second process chamber for forming a silicon oxide layer and a transfer passage connecting the first process chamber and the second process chamber. The first oxidation step is carried out in the first process chamber, then the silicon layer is transferred from the first process chamber to the second process chamber through the transfer passage, and the second oxidation step is carried out in the second process chamber. In Example 8, further, the silicon layer is transferred to the second process chamber from the first process chamber through the transfer passage without exposing the silicon layer to atmosphere. That is, the transfer passage from the first process chamber to the second process chamber has an inert gas atmosphere. The ambient temperature in the transfer passage from the first process chamber to the second process chamber is nearly the same as the ambient temperature in the first process chamber used for carrying out the first oxidation step. In Example 8, further, the first oxidation step and the second oxidation step are carried out with a batch processing.

Figure 33A:
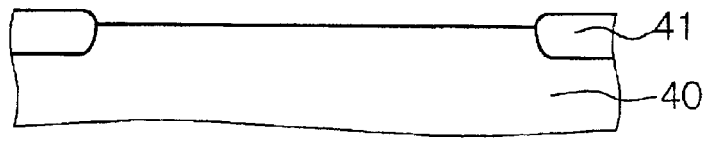
FIGS. 33A, 33B, 33C and 33D show schematic partial cross sections of a silicon semiconductor substrate and so on for explaining the method of forming a silicon oxide layer in Example 8.
Figure 33B:
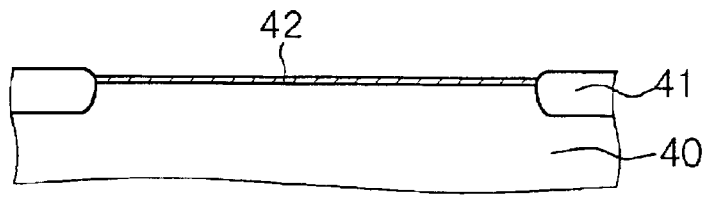
Figure 33C:
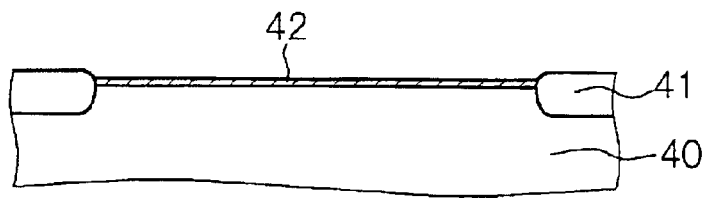
Figure 33D:
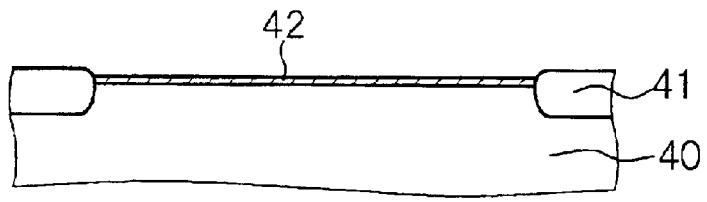
Figure 34:
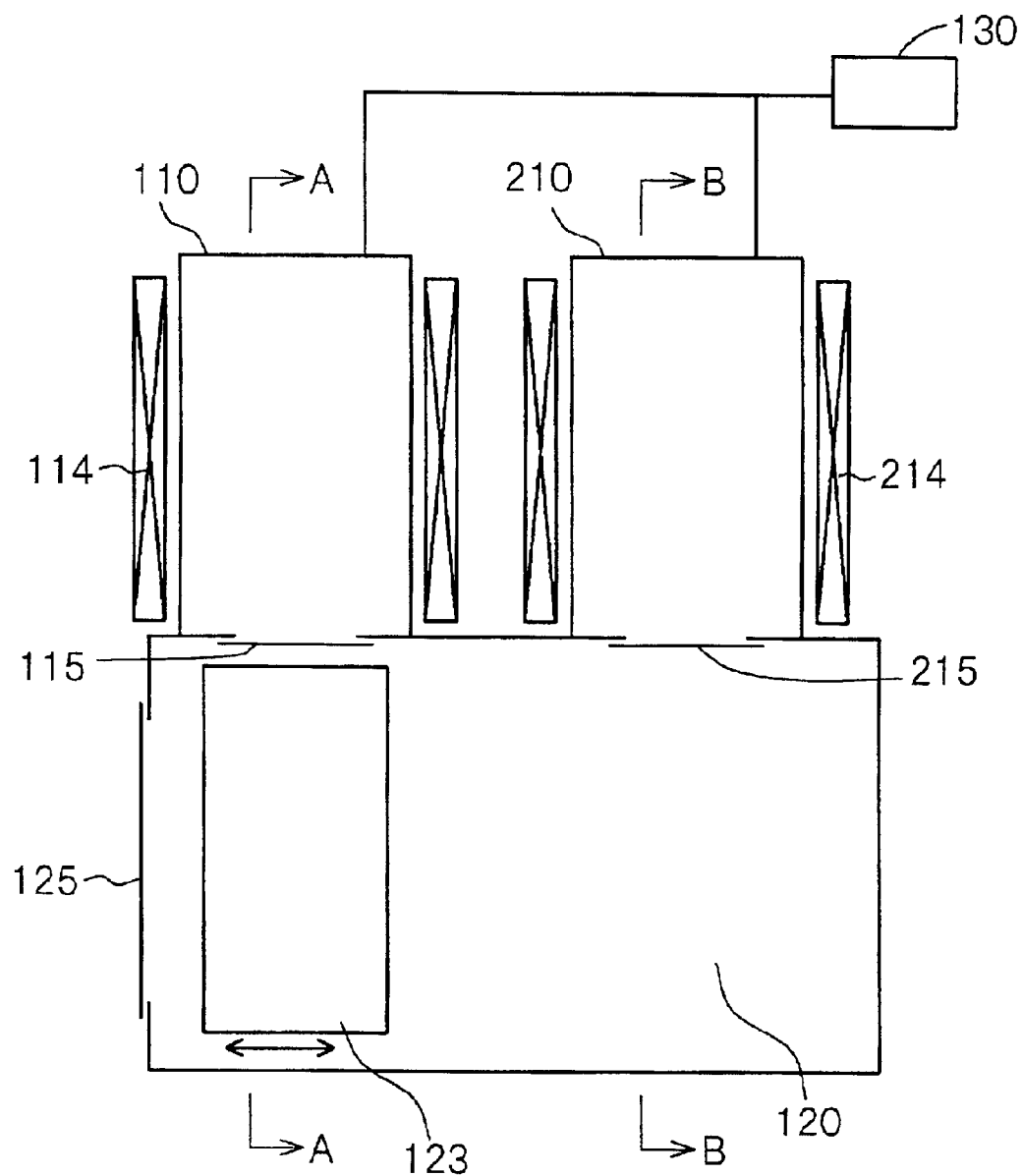
FIG. 34 conceptually shows a vertical-type processing apparatus with a batch processing, suitable for use in Example 8.
Figure 35:
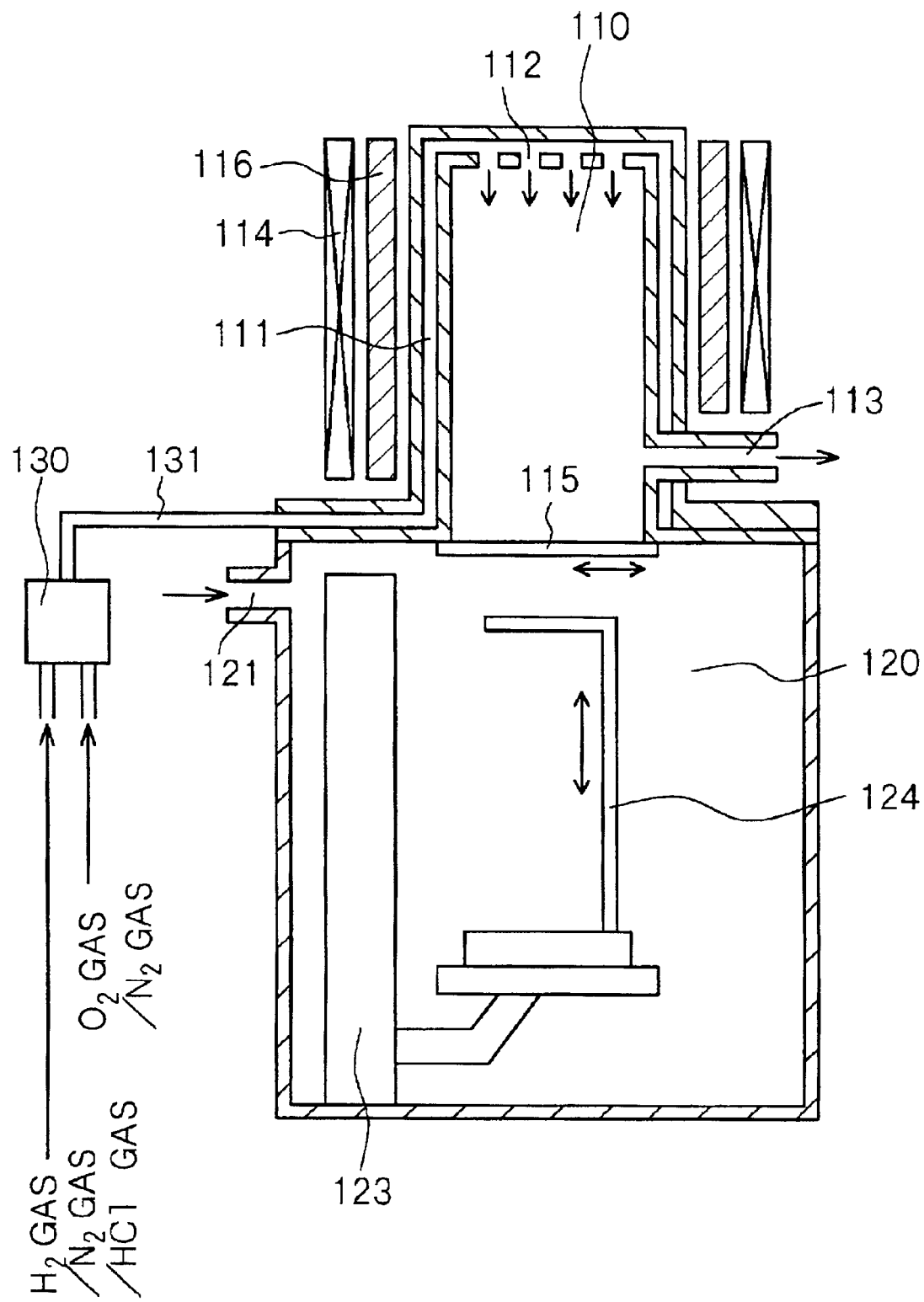
FIG. 35 schematically shows a cross section of a first process chamber portion and so on of the vertical-type processing apparatus shown in FIG. 34.
Figure 36:
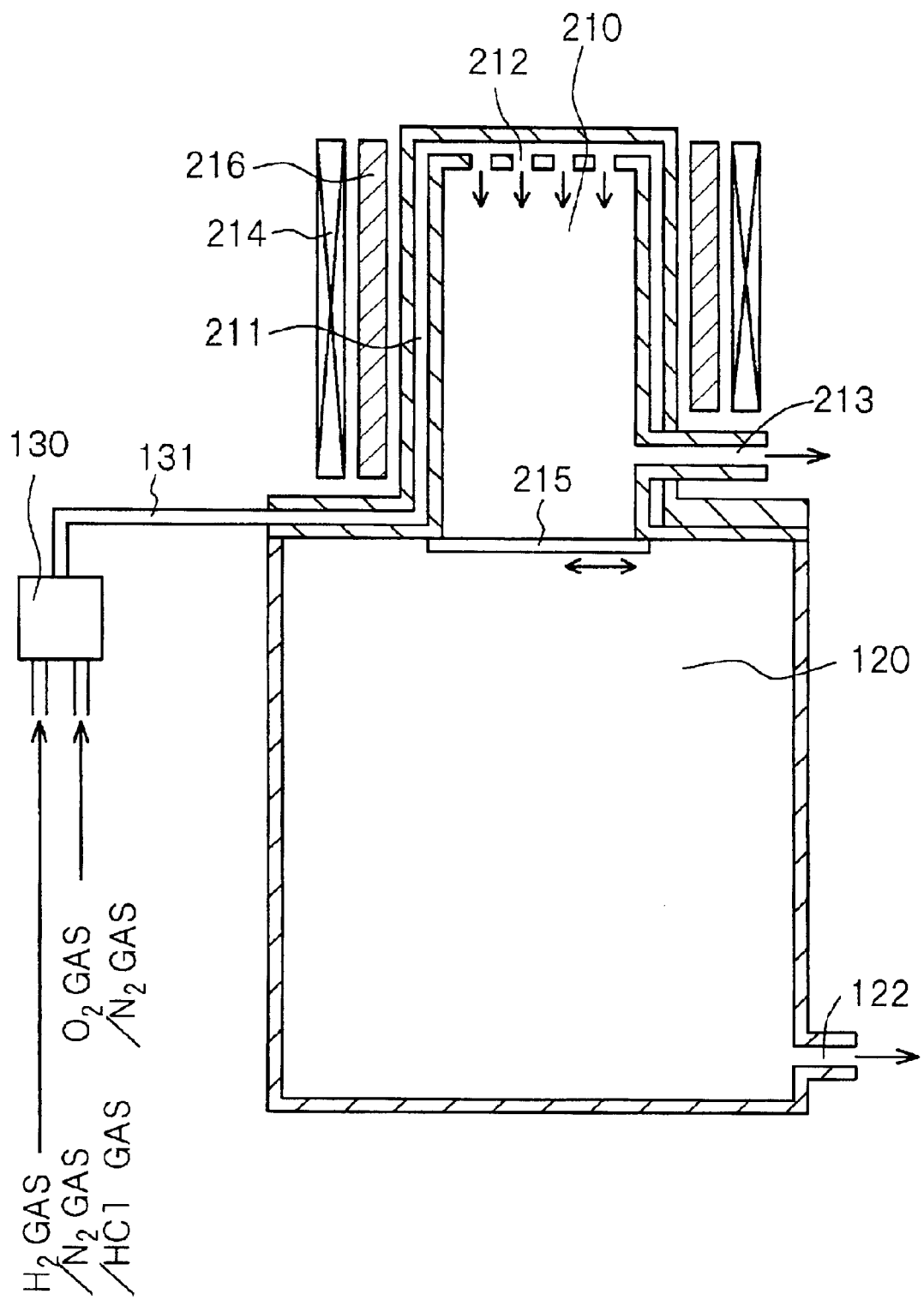
FIG. 36 schematically shows a cross section of a second process chamber and so on of the vertical-type processing apparatus shown in FIG. 34.
Figure 37:
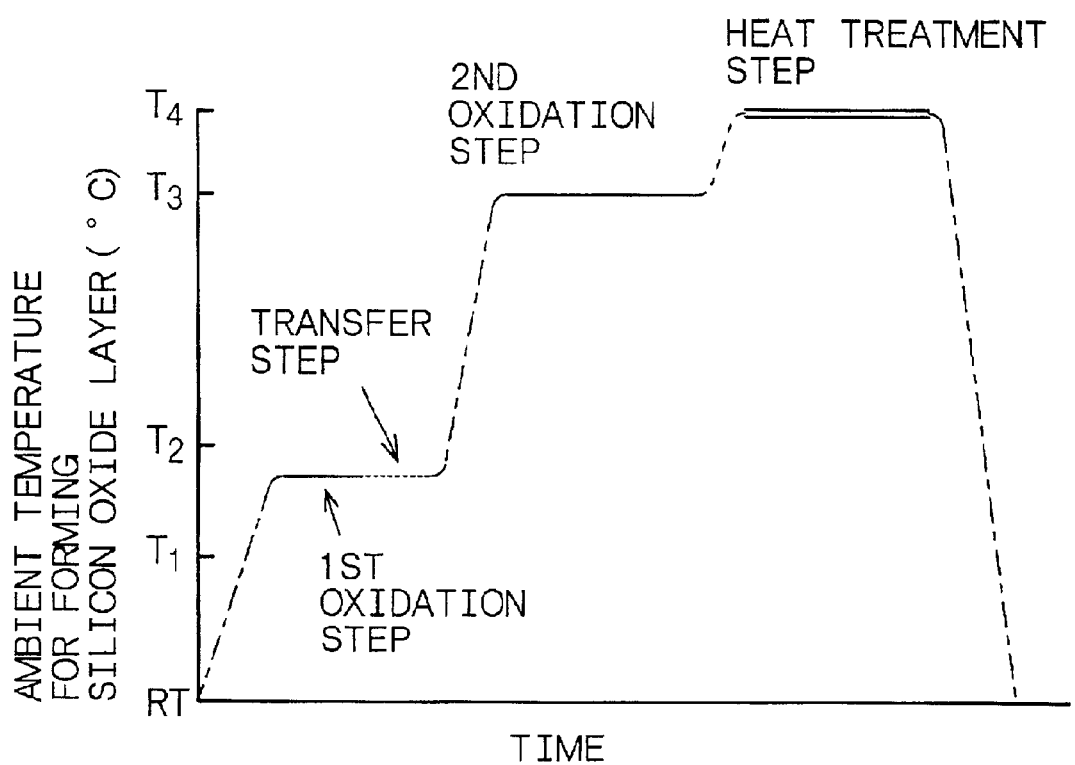
FIG. 37 schematically shows an ambient temperature profile in Example 8.
Figure 38:
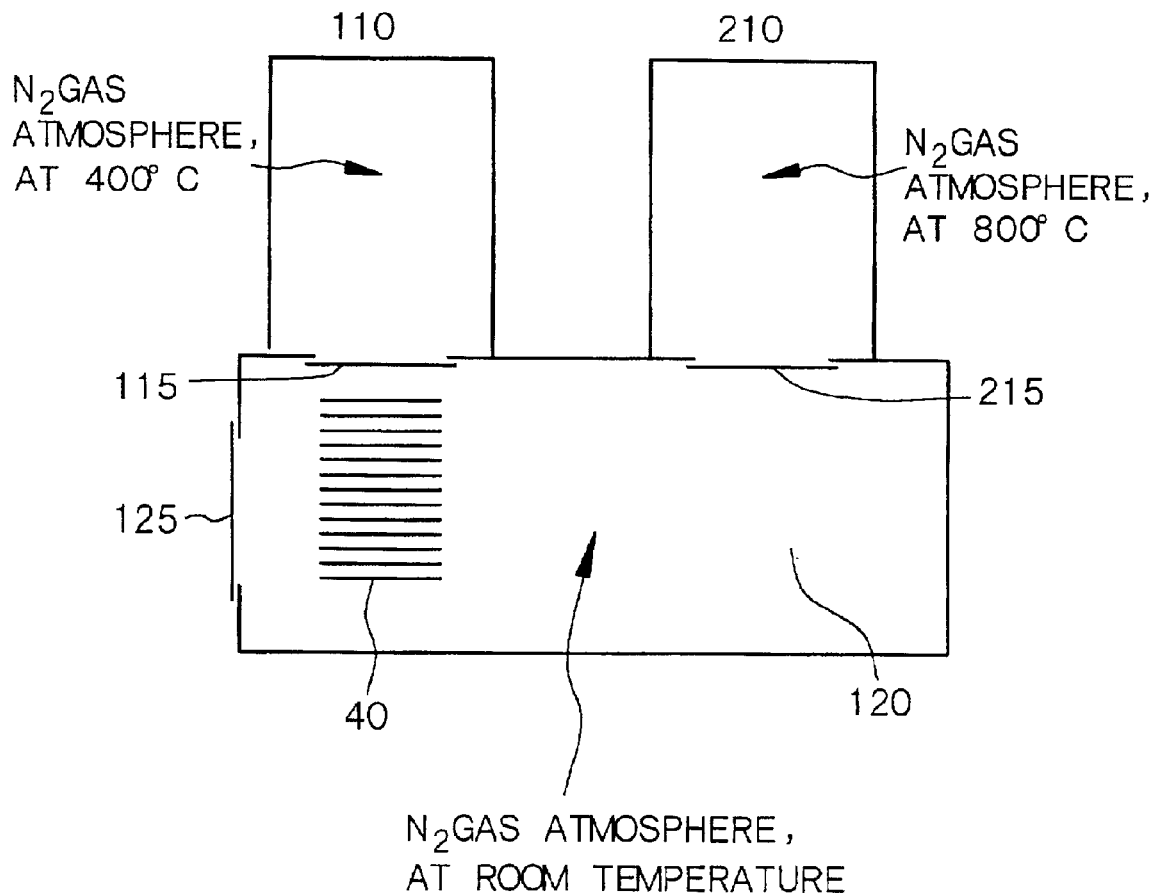
FIG. 38 shows a conceptual cross section of the vertical-type processing apparatus and so on for explaining the method of forming a silicon oxide layer in Example 8.
Figure 39:
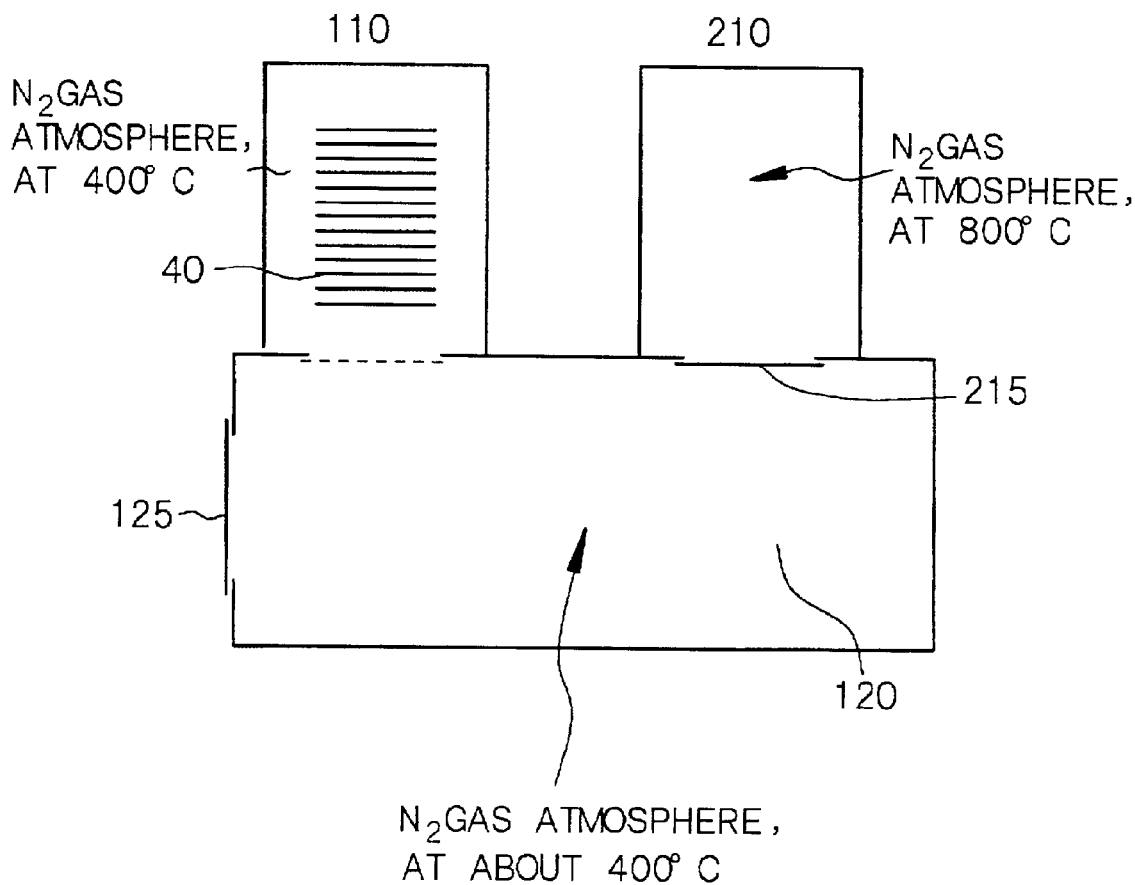
FIG. 39 subsequent to FIG. 38 shows a conceptual cross section of the vertical-type processing apparatus and so on for explaining the method of forming a silicon oxide layer in Example 8.

Example 8 uses a vertical-type processing apparatus which is conceptually shown in FIG. 34 and schematically shown in FIGS. 35 and 36. In Example 8, the silicon oxide layer is a silicon semiconductor substrate itself. The formed silicon oxide layer functions as a gate oxide. Example 8 uses an oxidation method using pyrogenic gas as an oxidation method using wet gas in the first and second oxidation steps. After the silicon oxide layer is formed in the second oxidation step, the formed silicon oxide layer is heat-treated in an inert gas atmosphere containing a halogen element (specifically, a nitrogen gas atmosphere containing hydrogen chloride gas). The heat treatment is carried out in the second process chamber with a batch processing. The method of forming a silicon oxide layer in Example 8 will be explained below with reference to FIGS. 33 to 36, and FIGS. 38 to 46 showing conceptual views of the vertical-type processing apparatus and so on. FIG. 37 shows an ambient temperature profile in Example 8.

The vertical-type processing apparatus shown in FIGS. 34 to 36 has the first process chamber 110, the second process chamber 210 and the transfer passage 120. FIG. 35 shows a schematic cross section of that part of the vertical-type processing apparatus shown in FIG. 34 which includes the process chamber 110, taken along arrows A—A, and FIG. 36 shows a schematic cross section of that part of the vertical-type processing apparatus shown in FIG. 34 which includes the second process chamber 210, taken along arrows B—B. The vertical-type processing apparatus has the double-tubular structured process chambers 110 and 210 made of fused quartz, gas inlet ports 112 and 212 for introducing water vapor and/or gas into the process chambers 110 and 210, gas exhaust ports 113 and 213 for exhausting the water vapor and/or the gas from the process chambers 110 and 210, and heaters 114 and 214 for maintaining atmospheres in the process chambers 110 and 210 at predetermined ambient temperatures through cylindrical liner tubes 116 and 216 made of SiC. The heaters 114 and 214 are controlled with temperature controller(s) not shown. Further, the vertical-type processing apparatus has the transfer passage 120 disposed below the first process chamber 110 and the second process chamber 210, a gas introducing portion 121 for introducing inert gas such as nitrogen gas into the transfer passage 120, a gas exhaust portion 122 for exhausting the gas from the transfer passage 120, shutters 115 and 215 for partitioning the first process chamber 110 and the transfer passage 120 and partitioning the second process chamber 210 and the transfer passage 120, and an elevator unit 123 for transfer silicon semiconductor substrates into and out of the first process chamber 110 and the second process chamber 210. Attached to the elevator unit 123 is a fused quartz boat 124 for placing a plurality of silicon semiconductor substrates thereon. The elevator unit 123 is movable leftward and rightward in FIG. 34. The transfer passage 120 has a door 125 for transferring silicon semiconductor substrates into and out of the transfer passage 120. Further, water vapor is generated by mixing hydrogen gas with oxygen gas at a high temperature and combusting the hydrogen gas with the oxygen gas in the combustion chamber 130. The water vapor is introduced into the first process chamber 110 and the second process chamber 210 through a piping 131, gas passages 111 and 211 and the gas inlet ports 112 and 212. The gas passage 111 or 211 corresponds to a space between an inner wall and an outer wall of the double-tubular structured first process chamber 110 or second process chamber 210. One combustion chamber 130 and one piping 131 may be provided to the first process chamber 110, and another combustion chamber 130 and another piping 131 may be provided to the second process chamber 210. Alternatively, water vapor may be introduced into the first process chamber 110 and the second process chamber 210 from one combustion chamber 130 through a branched piping 131.

[Step-800]

First, isolation regions, etc., are formed on a silicon semiconductor substrate 40 in the same manner as in Example 1, and then fine particles and metal impurities are removed from the surface of the silicon semiconductor substrate 40 by RCA cleaning. Then, the surface of the silicon semiconductor substrate 40 is cleaned with a 0.1% hydrofluoric acid aqueous solution and then with pure water to expose the surface of the silicon semiconductor substrate 40 (see FIG. 33A).

[Step-810]

A plurality of silicon semiconductor substrates 40 are transferred into the transfer passage 120 of the vertical-type processing apparatus shown in FIG. 34 through the door 125 and are placed on the fused quartz boat 124. Inert gas such as nitrogen gas is introduced into the first process chamber 110 through the gas inlet port 112 to form an inert gas atmosphere, which may be an atmosphere under reduced pressure, in the first process chamber 110, and the ambient temperature in the first process chamber 110 is maintained at 400° C. with the heater 114 through the liner tube 116. In this state, the shutter 115 is kept closed. On the other hand, inert gas such as nitrogen gas is introduced into the second process chamber 210 through the gas inlet port 212 to form an inert gas atmosphere, which may be an atmosphere under reduced pressure, in the second process chamber 210, and the ambient temperature in the second process chamber 210 is maintained at 800° C. with the heater 214 through the liner tube 216. In this state, the shutter 215 is kept closed.

[Step-820]

After the transfer of the silicon semiconductor substrates 40 into the transfer passage 120 is completed, the door 125 is closed. Then, inert gas such as nitrogen gas is introduced into the transfer passage 120 through the gas introducing portion 121 to purge atmosphere in the transfer passage 120 through the gas exhaust portion 122, and an inert gas atmosphere having room temperature is formed in the transfer passage 120 (see FIG. 38). The oxygen gas concentration in the transfer passage 120 is monitored, and when the oxygen gas concentration becomes, for example, 100 ppm or lower, it is determined that the a sufficient inert gas atmosphere is formed in the transfer passage 120. Then, the shutter 115 is opened, and the elevator unit 123 is actuated to elevate the fused quartz boat 124, so that the silicon semiconductor substrates 40 are transferred into the double-tubular structured first process chamber 110 made of fused quartz (see FIG. 39). When the elevator unit 123 reaches its uppermost position, the base portion of the fused quartz boat 124 prevents the communication between the first process chamber 110 and the transfer passage 120. Since the temperature of the inert gas atmosphere in the first process chamber 110 is maintained at 400° C., surface roughening of each silicon semiconductor substrate 40 can be prevented. After the transfer of the silicon semiconductor substrates 40 into the first process chamber 110, preferably, the inert gas atmosphere in the transfer passage 120 is heated approximately up to 400° C. and maintained at this temperature with a heater (not shown).

[Step-830]

Figure 40:
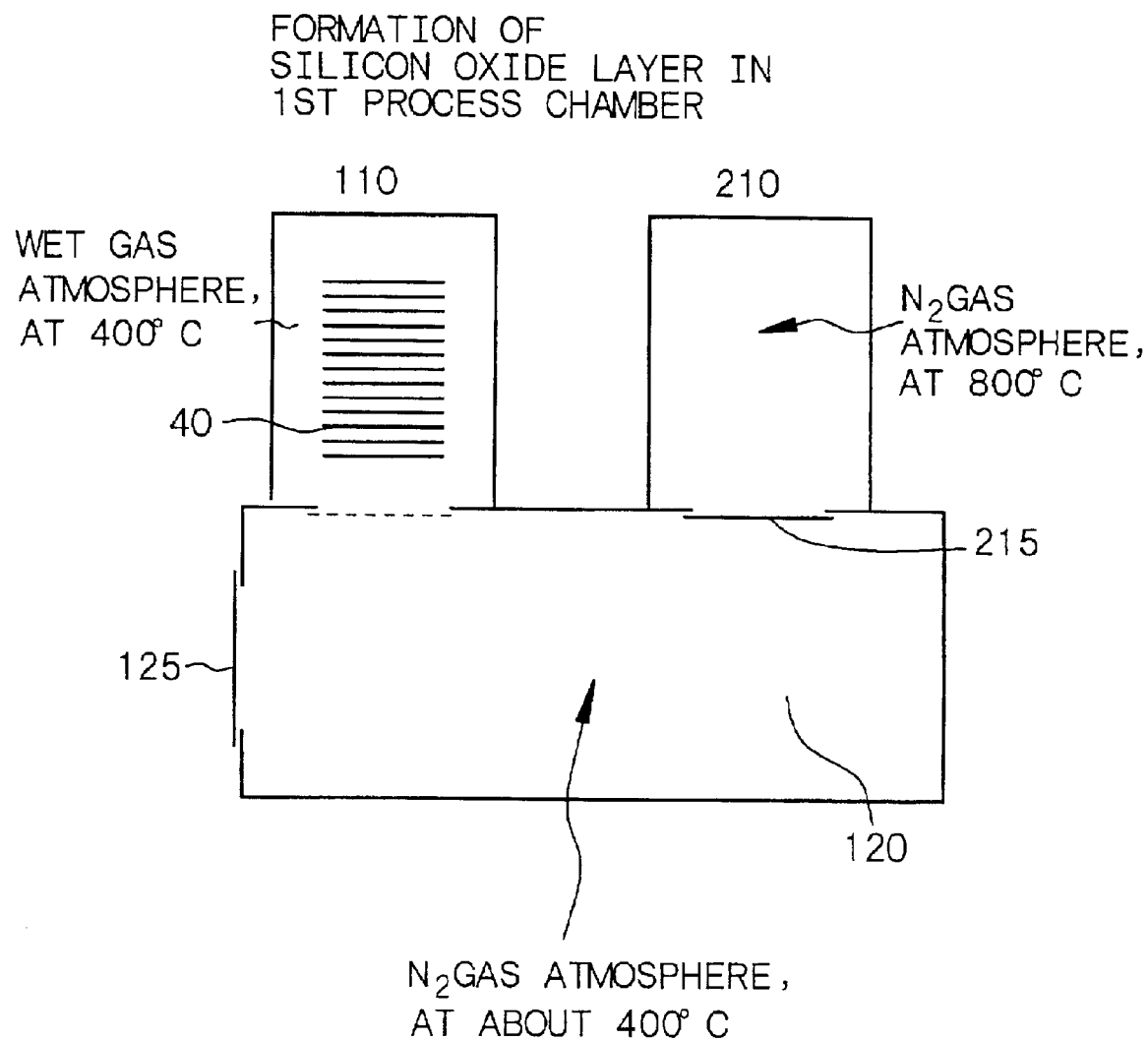
FIG. 40 subsequent to FIG. 39 shows a conceptual cross section of the vertical-type processing apparatus and so on for explaining the method of forming a silicon oxide layer in Example 8.
Figure 41:
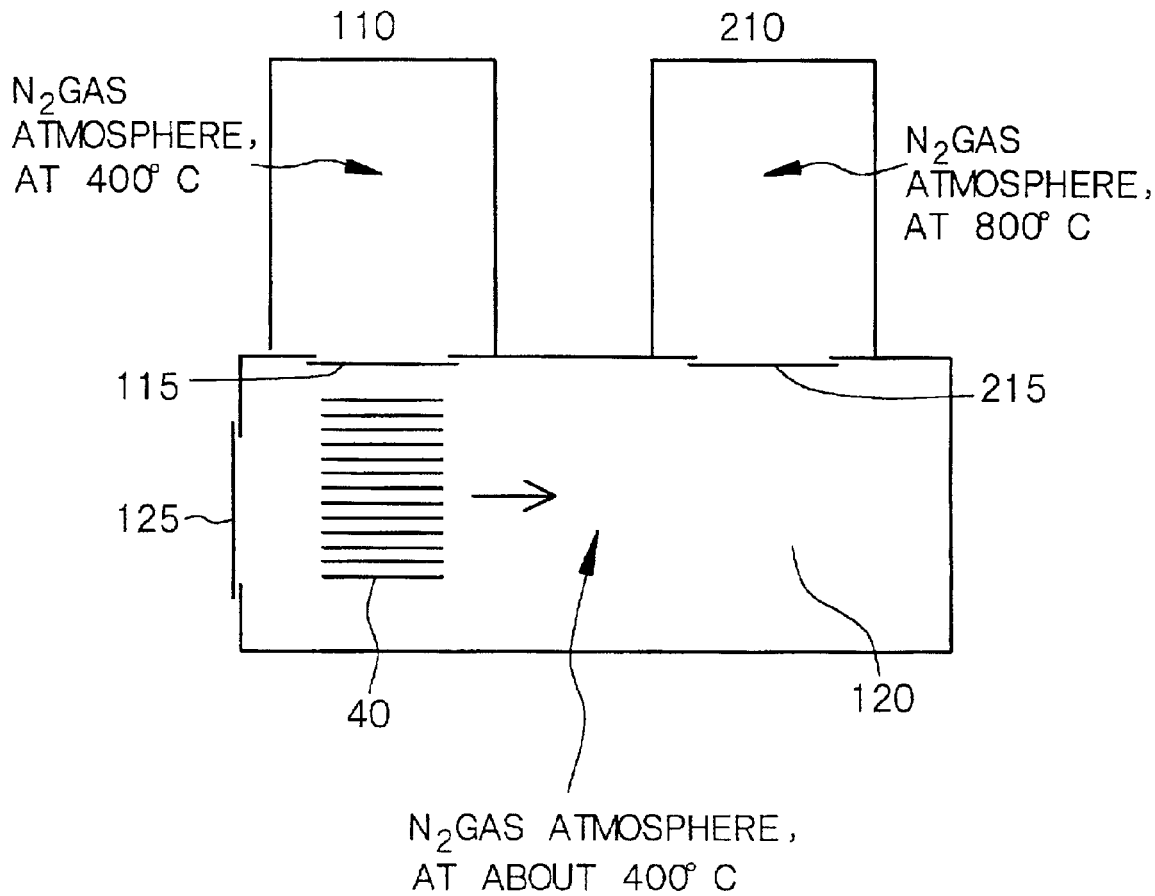
FIG. 41 subsequent to FIG. 40 shows a conceptual cross section of the vertical-type processing apparatus and so on for explaining the method of forming a silicon oxide layer in Example 8.
Figure 42:
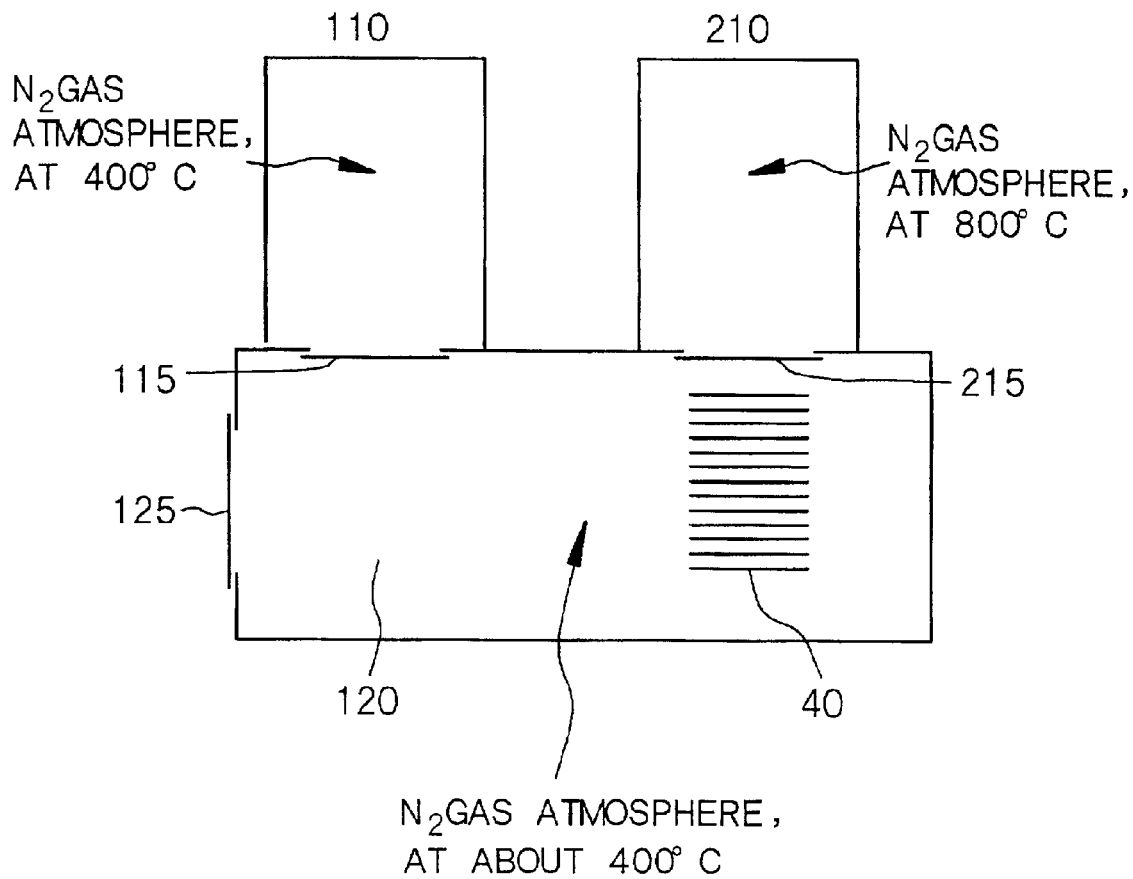
FIG. 42 subsequent to FIG. 41 shows a conceptual cross section of the vertical-type processing apparatus and so on for explaining the method of forming a silicon oxide layer in Example 8.

Then, while the atmosphere in the first process chamber 110 is maintained at a temperature (specifically, maintained at 400° C. in Example 8) at which no silicon atom is eliminated from the surface of the silicon layer such as silicon semiconductor substrates in Example 8, a silicon oxide layer 42 is formed on the surface of each silicon semiconductor substrate by an oxidation method using wet gas (see FIGS. 33B and 40). Specifically, in Example 8, hydrogen gas is combusted by introducing the hydrogen gas and oxygen gas into the combustion chamber 130 maintained at 750° C., and water vapor formed in the combustion chamber 130 is introduced into the first process chamber 110 through the piping 131, the gas passage 111 and the gas inlet port 112. As a result, a silicon oxide layer having a thickness of 1.2 nm is formed on the surface of each silicon semiconductor substrate 40 by an oxidation method using pyrogenic gas. The wet gas may contain, for example, 1.0 vol % of hydrogen chloride gas.

[Step-840]

Then, the silicon layers (specifically, the silicon semiconductor substrates 40) are transferred into the second process chamber 210 from the first process chamber 110 through the transfer passage 120. Specifically, the introduction of the wet gas into the first process chamber 110 is terminated, and inert gas such as nitrogen gas is introduced into the first process chamber 110 through the gas inlet port 112. After the first process chamber 110 is purged with the inert gas such as nitrogen gas, the elevator unit 123 is actuated to transfer the silicon semiconductor substrates 40 to the transfer passage 120 (see FIG. 41). The transfer passage 120 has an inert gas atmosphere inside, and is maintained approximately at 400° C. That is, when the silicon layers (specifically, the silicon semiconductor substrates 40) are transferred from the first process chamber 110 to the second process chamber 210 through the transfer passage 120, the temperature in the transfer passage 120 is nearly equivalent to the temperature employed during the formation of the silicon oxide layers 42 on the surface of each silicon semiconductor substrates 40 in the first process chamber 110. When the elevator unit 123 reaches its lowermost position, the shutter 115 is closed, and the elevator unit 123 is moved to a position below the second process chamber 210 (see FIG. 42).

[Step-850]

Figure 43:
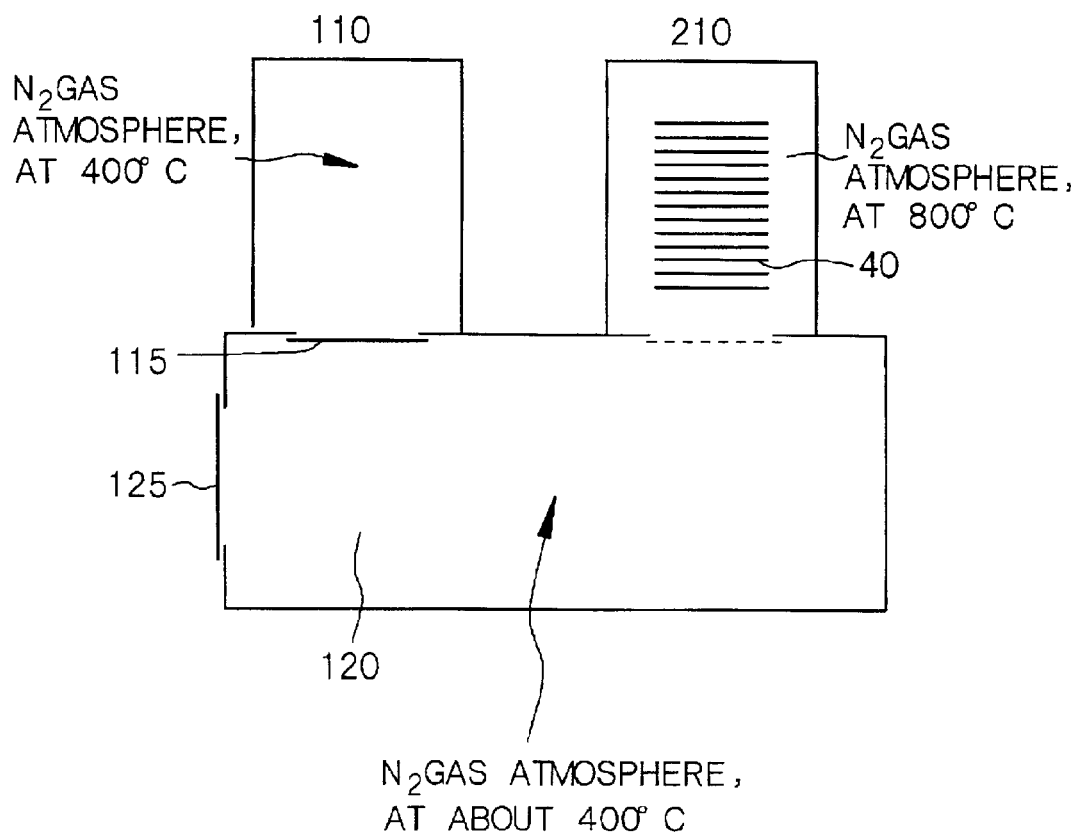
FIG. 43 subsequent to FIG. 42 shows a conceptual cross section of the vertical-type processing apparatus and so on for explaining the method of forming a silicon oxide layer in Example 8.
Figure 44:
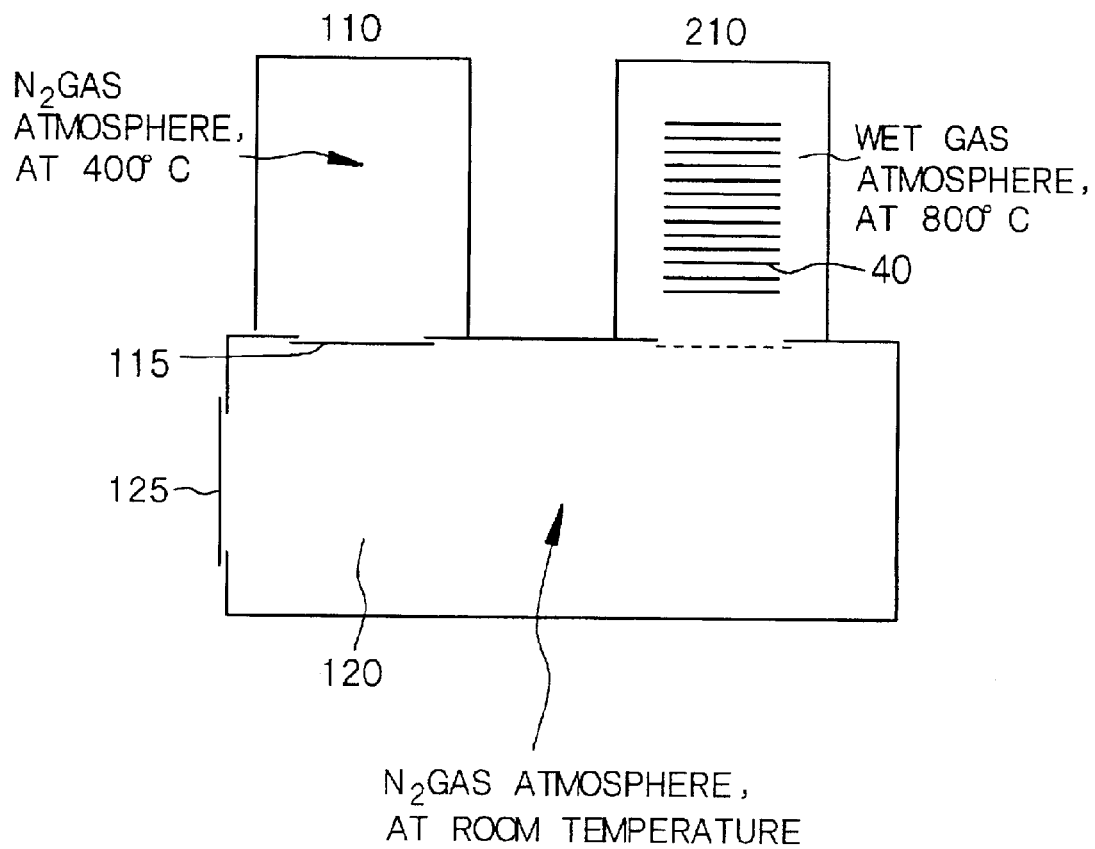
FIG. 44 subsequent to FIG. 43 shows a conceptual cross section of the vertical-type processing apparatus and so on for explaining the method of forming a silicon oxide layer in Example 8.

Then, the shutter 215 is opened, and the elevator unit 123 is actuated to elevate the fused quartz boat 124 to transfer the silicon semiconductor substrates 40 into the double-tubular structured second process chamber 210 made of fused quartz (see FIG. 43). When the elevator unit 123 reaches its uppermost position, the base portion of the fused quartz boat 124 prevents the communication between the second process chamber 210 and the transfer passage 120. The temperature of the inert gas atmosphere in the second process chamber 210 is maintained at 800° C. in advance, while surface roughening of the silicon layers (silicon semiconductor substrates 40) does not take place since the silicon oxide layer 42 which functions as a protective layer is already formed on the surface of each silicon semiconductor substrate 40. After the transfer of the silicon semiconductor substrates 40 into the second process chamber 210, preferably, the temperature of the inert gas atmosphere in the transfer passage 120 is adjusted to room temperature.

[Step-860]

Then, while the temperature in the second process chamber 210 is maintained at 800° C., the silicon oxide layer is further formed by an oxidation method using wet gas. Specifically, hydrogen gas is combusted by introducing the hydrogen gas and oxygen gas into the combustion chamber 130 maintained at 750° C., water vapor formed in the combustion chamber 130 is introduced into the second process chamber 210 through the piping 131, the gas passage 211 and the gas inlet port 212, and the silicon oxide layer 42 having a total thickness of 4.0 nm is formed on the surface of each silicon semiconductor substrate 40 by an oxidation method using pyrogenic gas (see FIGS. 33C and FIG. 44). The wet gas may contain, for example, 1.0 vol % of hydrogen chloride gas.

The formation of the silicon oxide layer 42 on the surface of each silicon semiconductor substrate 40 is completed by the above procedures. The silicon semiconductor substrates may be transferred out of by forming an atmosphere of inert gas such as nitrogen gas in the second process chamber 120, actuating the elevator unit 123 to lower the fused quartz boat 124, opening the door 125. When it is intended to form a silicon oxide layer having further excellent properties, it is preferred to carry out the following heat treatment step on the silicon oxide layer.

[Step-870]

Figure 45:
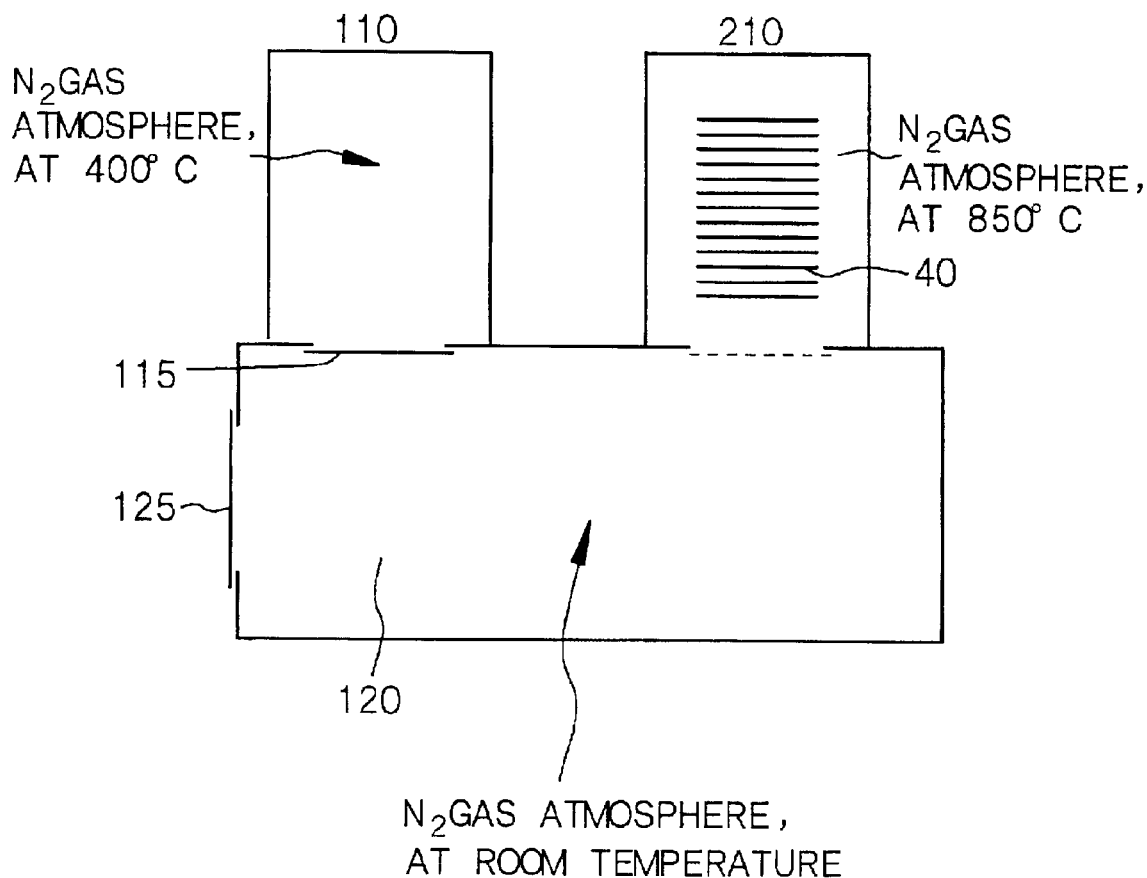
FIG. 45 subsequent to FIG. 44 shows a conceptual cross section of the vertical-type processing apparatus and so on for explaining the method of forming a silicon oxide layer in Example 8.
Figure 46:
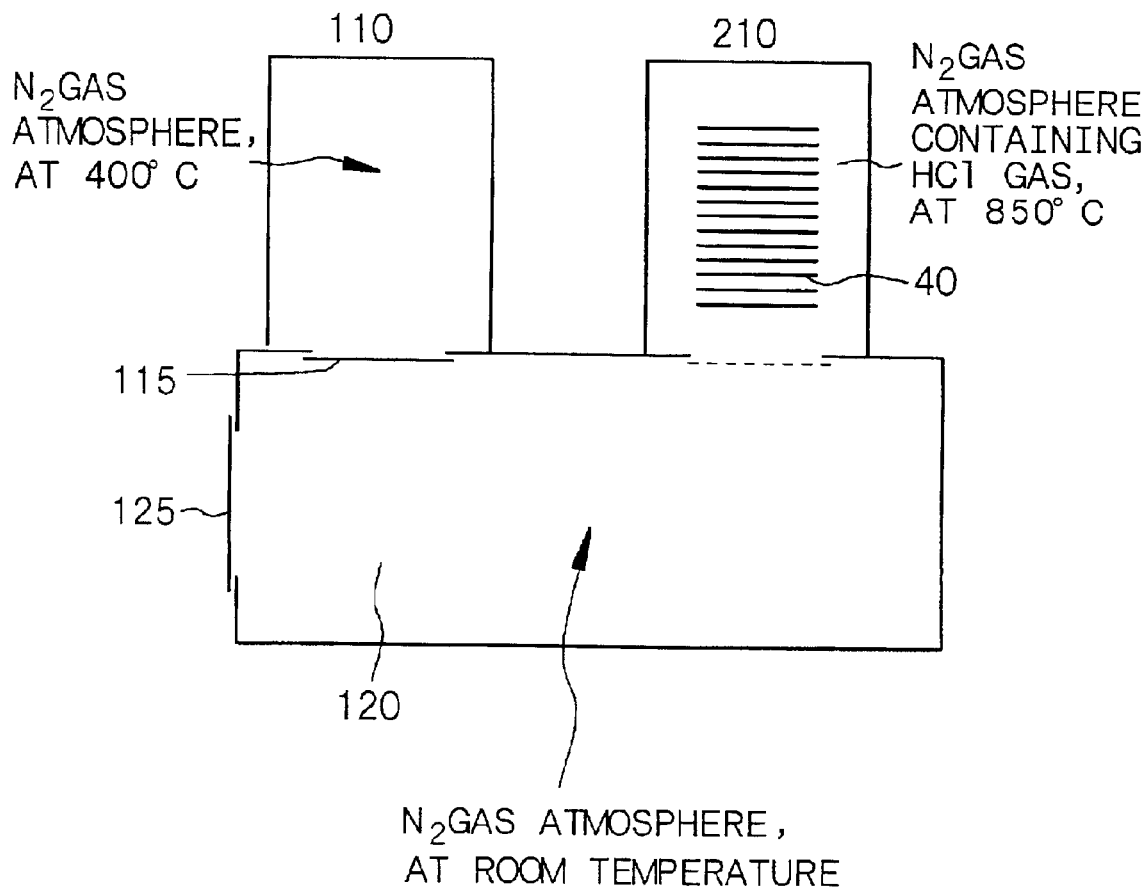
FIG. 46 subsequent to FIG. 45 shows a conceptual cross section of the vertical-type processing apparatus and so on for explaining the method of forming a silicon oxide layer in Example 8.

That is, after [Step-860], the introduction of the wet gas into the second process chamber 210 is terminated, and while inert gas such as nitrogen gas is introduced into the second process chamber 210 through the gas inlet port 212, the ambient temperature in the second process chamber 210 is raised up to 850° C. with the heater 214 (see FIG. 45). Then, for example, nitrogen gas containing 0.1 vol % of hydrogen chloride gas is introduced into the second process chamber 210 through the gas inlet port 212, and the silicon oxide layers are heat-treated for thirty minutes (see FIGS. 33D and 46). The heat treatment of the silicon oxide layers 42 are completed by the above procedure. Thereafter, an atmosphere of inert gas such as nitrogen gas is formed in the second process chamber 210, the elevator unit 123 is actuated to lower the fused quartz boat 124, the door 125 is opened, and then, the silicon semiconductor substrates 40 are transferred out of the transfer passage 120.

EXAMPLE 9

Example 9 is a variant of Example 8. Example 9 uses the vertical-type processing apparatus with a batch processing which is schematically shown in FIGS. 35 and 36 and conceptually shown in FIG. 47. The vertical-type processing apparatus used in Example 9 differs from the vertical-type processing apparatus used in Example 8 in that a shutter 126 is disposed between a transfer passage portion 120A communicating with the first process chamber 110 and a transfer passage portion 120B communicating with the second process chamber 210 and that each of the transfer passage portions 120A and 120B is independently provided with a gas introducing portion (not shown in FIG. 47) for introducing inert gas such as nitrogen gas and a gas exhaust portion (not shown in FIG. 47) for exhausting the gas. When the transfer passage 120 is separated into two portions 120A and 120B with the shutter 126, the formation of a silicon oxide layer in the first process chamber 110 and the formation of a silicon oxide layer in the second process chamber 210 can be independently carried out, that is, concurrently carried out. A throughput in the formation of a silicon oxide layer can be therefore improved. Preferably, one combustion chamber 130 and one piping 131 are provided for the first process chamber 110, and another combustion chamber 130 and another piping 131 are provided for the second process chamber 210. The method of forming a silicon oxide layer in Example 9 will be explained below with reference to FIGS. 48 to 57 which conceptually show the vertical-type processing apparatus and so on. The method of forming a silicon oxide layer in Example 9 is basically the same as the method of forming a silicon oxide layer in Example 8. Further, the ambient temperature profile in Example 9 is the same as that shown in FIG. 37.

[Step-900]

First, isolation regions, etc., are formed on a silicon semiconductor substrate 40 in the same manner as in Example 1, and then fine particles and metal impurities are removed from the surface of the silicon semiconductor substrate 40 by RCA cleaning. Then, the surface of the silicon semiconductor substrate 40 is cleaned with a 0.1% hydrofluoric acid aqueous solution and then with pure water to expose the surface of the silicon semiconductor substrate.

[Step-910]

Figure 47:
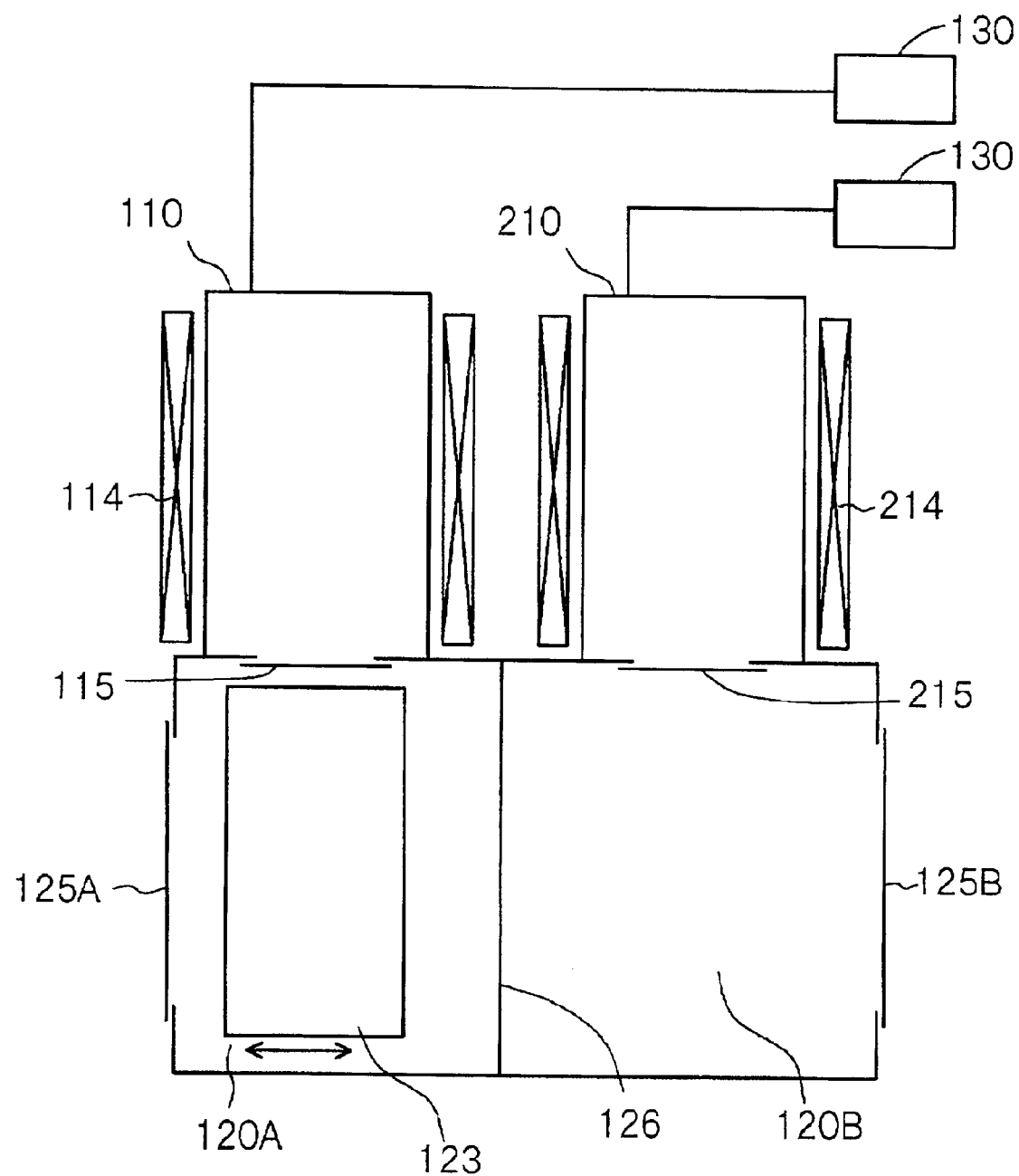
FIG. 47 conceptually shows a vertical-type processing apparatus, suitable for use in Example 9.

A plurality of silicon semiconductor substrates 40 are transferred into the transfer passage 120A of the vertical-type processing apparatus shown in FIG. 47 through a door 125A and are placed on the fused quartz boat 124. Inert gas such as nitrogen gas is introduced into the first process chamber 110 through the gas inlet port 112 to form an inert gas atmosphere, which may be an atmosphere under reduced pressure, in the first process chamber 110, and the ambient temperature in the first process chamber 110 is maintained at 400° C. with the heater 114 through the liner tube 116 (see FIG. 35). In this state, the shutter 115 is kept closed. On the other hand, inert gas such as nitrogen gas is introduced into the second process chamber 210 through the gas inlet port 212 to form an inert gas atmosphere, which may be an atmosphere under reduced pressure, in the second process chamber 210, and the ambient temperature in the second process chamber 210 is maintained at 800° C. with the heater 214 through the liner tube 216 (see FIG. 36). In this state, the shutter 215 is kept closed. Further, the shutter 126 disposed between the transfer passage portion 120A and the transfer passage portion 120B is also kept closed.

[Step-920]

Figure 48:
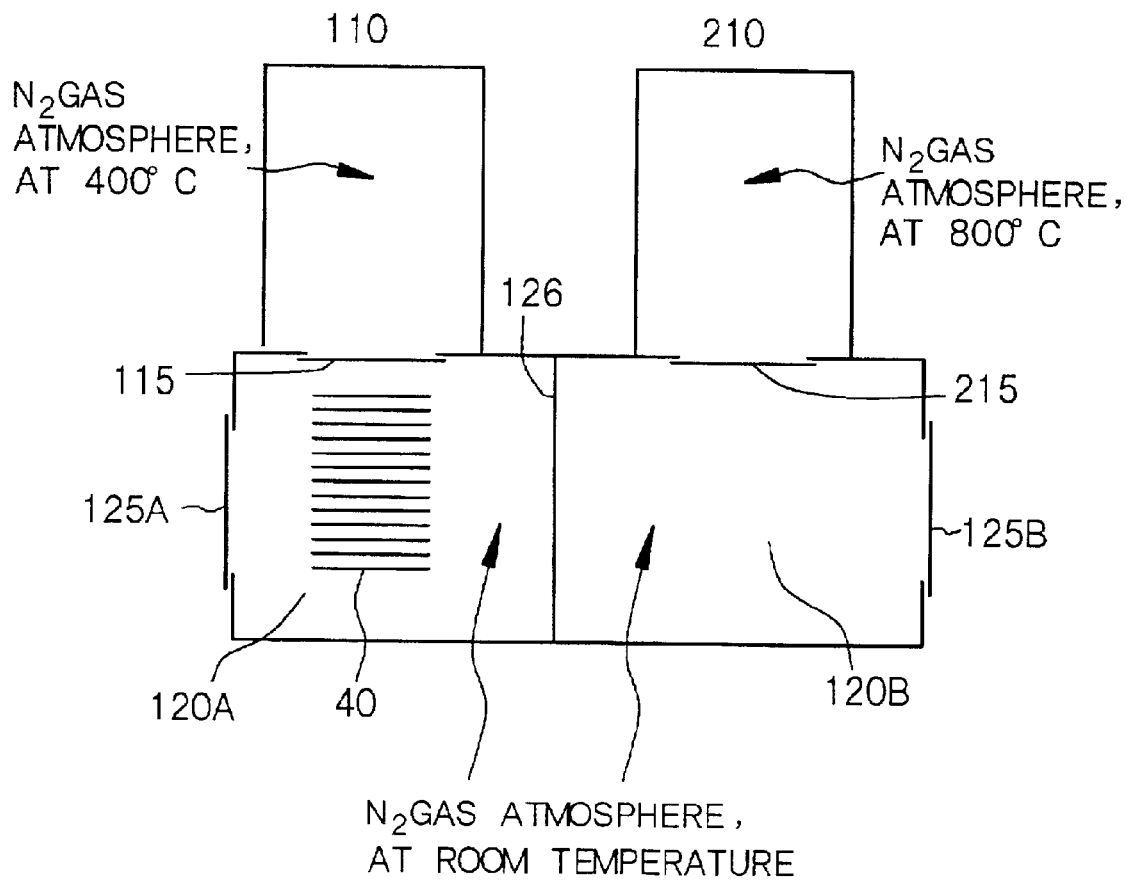
FIG. 48 shows a conceptual cross section of the vertical-type processing apparatus and so on for explaining the method of forming a silicon oxide layer in Example 9.
Figure 49:
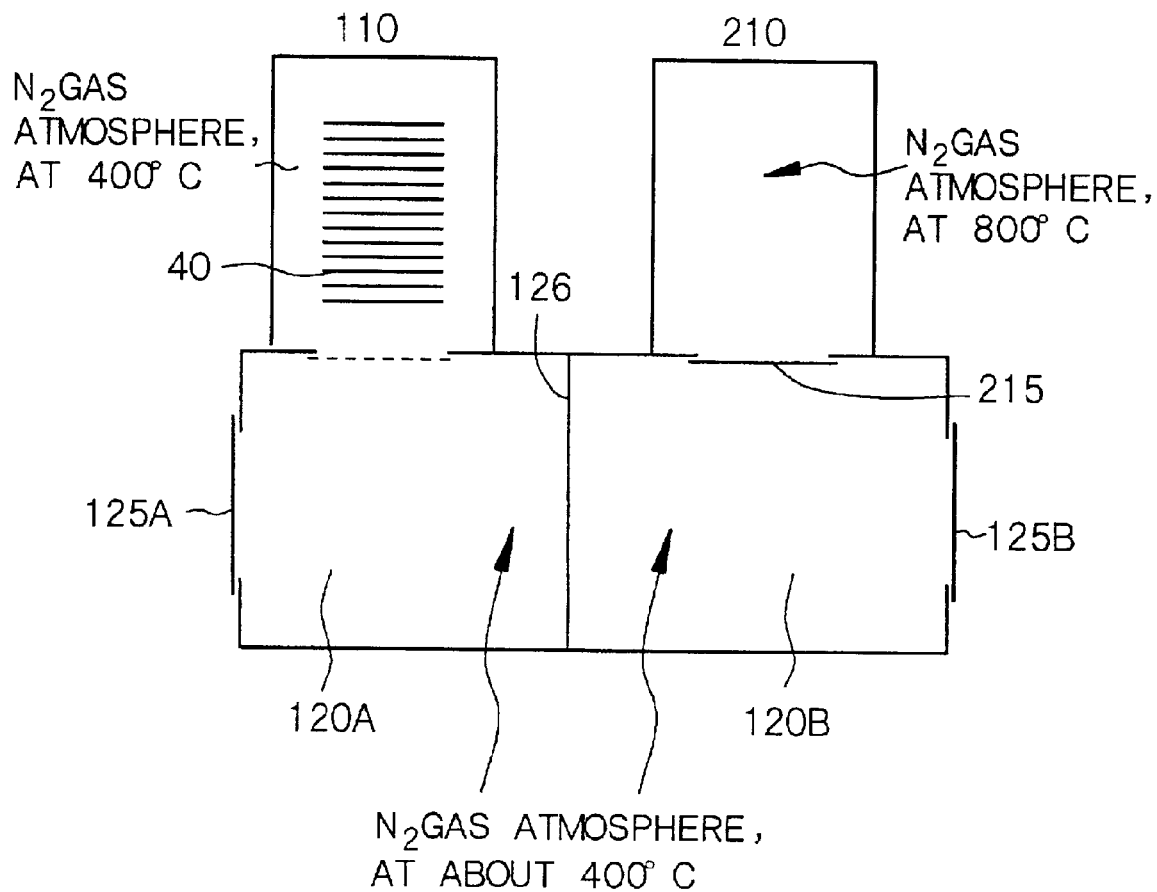
FIG. 49 subsequent to FIG. 48 shows a conceptual cross section of the vertical-type processing apparatus and so on for explaining the method of forming a silicon oxide layer in Example 9.
Figure 50:
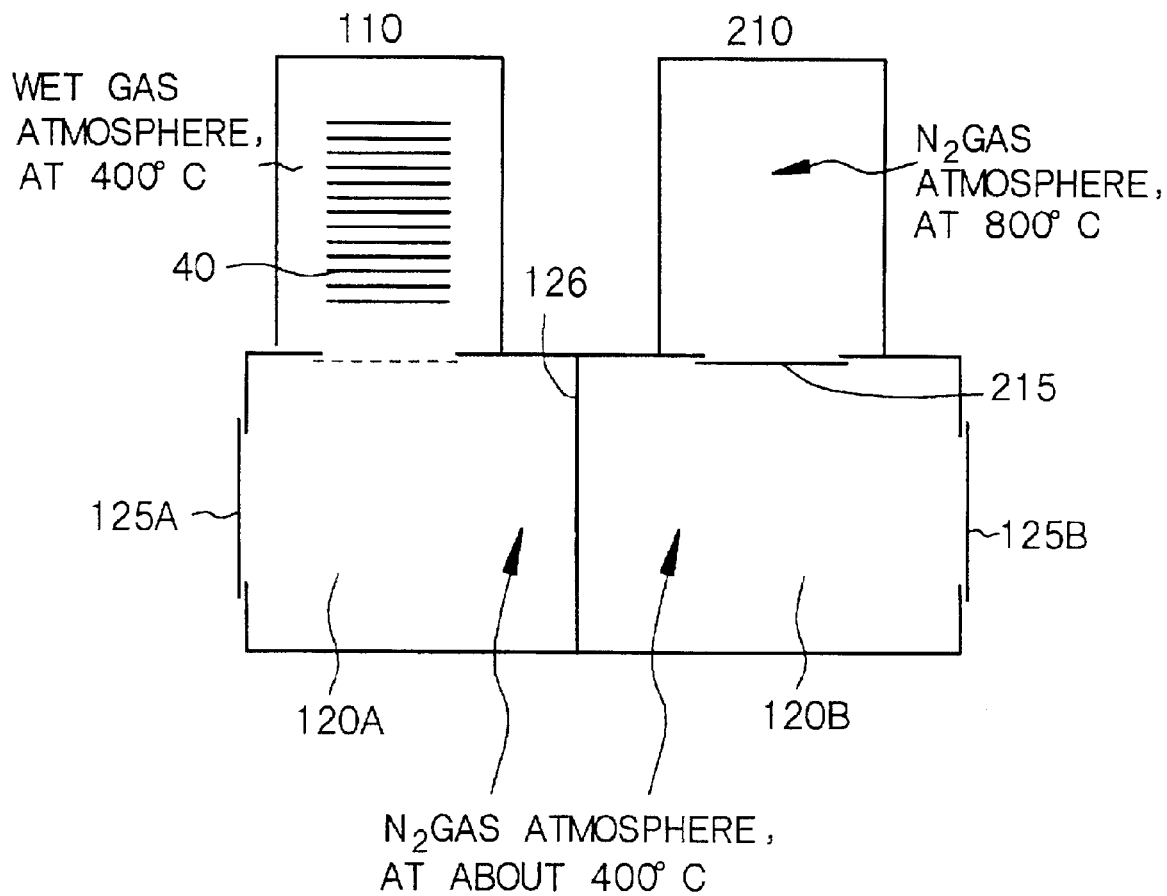
FIG. 50 subsequent to FIG. 49 shows a conceptual cross section of the vertical-type processing apparatus and so on for explaining the method of forming a silicon oxide layer in Example 9.
Figure 51:
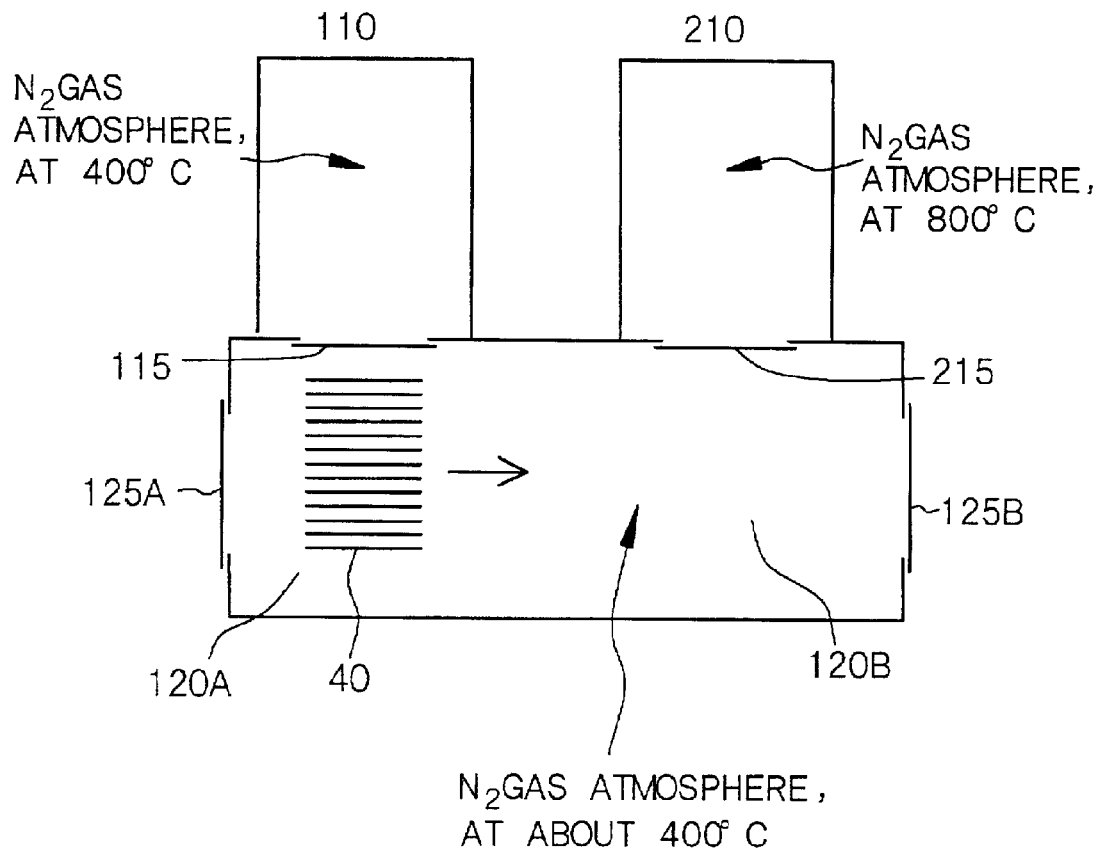
FIG. 51 subsequent to FIG. 50 shows a conceptual cross section of the vertical-type processing apparatus and so on for explaining the method of forming a silicon oxide layer in Example 9.
Figure 52:
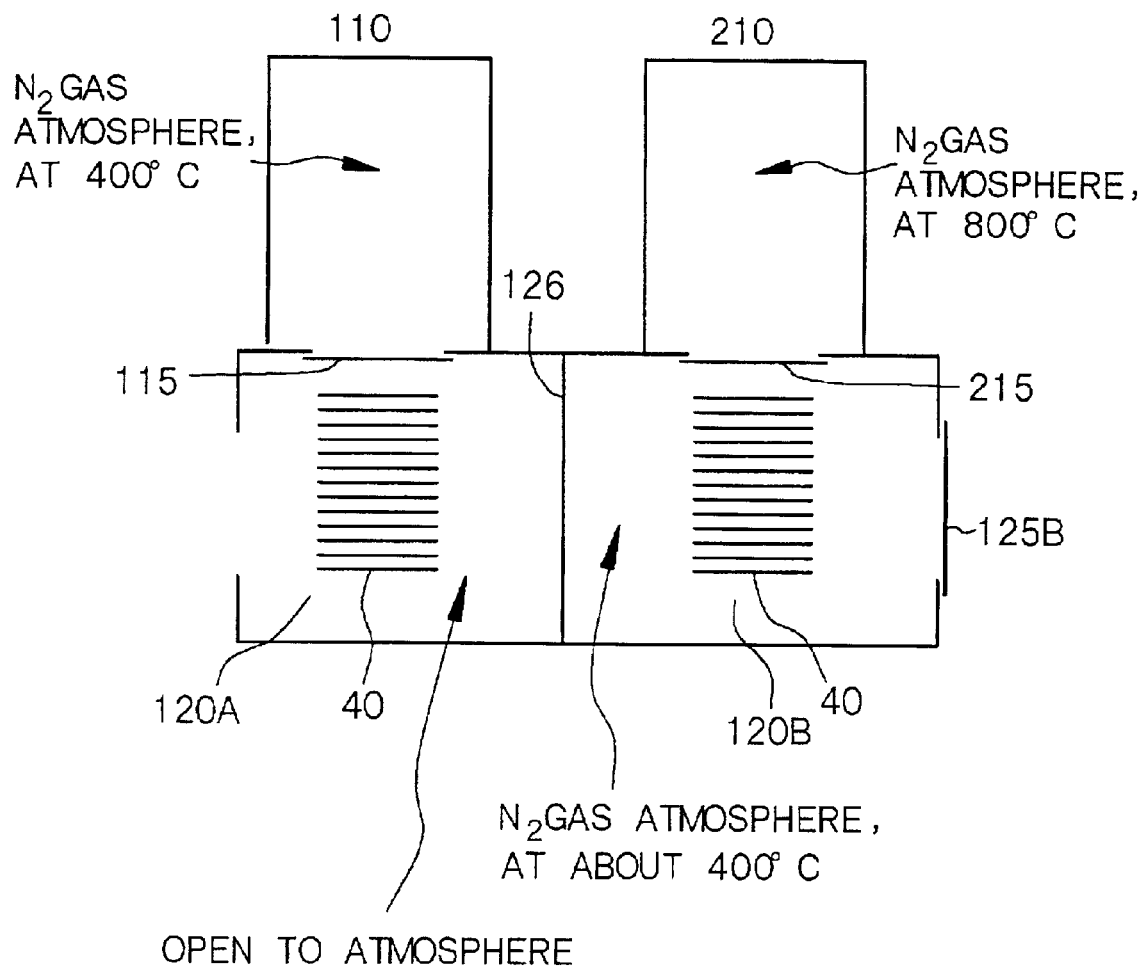
FIG. 52 subsequent to FIG. 51 shows a conceptual cross section of the vertical-type processing apparatus and so on for explaining the method of forming a silicon oxide layer in Example 9.

After the transfer of the silicon semiconductor substrates 40 into the transfer passage 120 is completed, the door 125A is closed, inert gas such as nitrogen gas is introduced into each of the transfer passage portions 120A and 120B through gas introducing portions to purge atmosphere in each transfer passage portion 120A, 120B through gas exhaust portions, and an inert gas atmosphere having room temperature is formed in each of the transfer passage portions 120A and 120B (see FIG. 48). The oxygen gas concentration in the transfer passage portion 120A is monitored, and when the oxygen gas concentration becomes, for example, 100 ppm or lower, it is determined that a sufficient inert gas atmosphere is formed in the transfer passage portion 120A. Then, the shutter 115 is opened, and the elevator unit 123 is actuated to elevate the fused quartz boat 124, whereby the silicon semiconductor substrates 40 are transferred into the double-tubular structured first process chamber 110 made of fused quartz (see FIG. 49). Since the ambient temperature of the inert gas atmosphere in the first process chamber 110 is maintained at 400° C., surface roughening of each silicon semiconductor substrate 40 can be prevented. After the transfer of the silicon semiconductor substrates 40 into the first process chamber 110, preferably, the inert gas atmosphere in each of the transfer passage portions 120A and 120B is heated approximately up to 400° C. and maintained at this temperature with a heater (not shown).

[Step-930]

Then, while the atmosphere in the first process chamber 110 is maintained at a temperature at which no silicon atom is eliminated from the surface of each silicon layer (silicon semiconductor substrates in Example 9), that is, specifically, while the ambient temperature is maintained at 400° C. in Example 9, a silicon oxide layer having a thickness of 1.2 nm is formed on the surface of each silicon layer by an oxidation method using pyrogenic gas (see FIG. 50) in the same manner as in [Step-830]. The wet gas may contain, for example, 1.0 vol % of hydrogen chloride gas.

[Step-940]

Then, the silicon layers (specifically, silicon layer surfaces 40) are transferred from the first process chamber 110 to the second process chamber 210 through the transfer passage portions 120A and 120B. Specifically, the introduction of the wet gas into the first process chamber 110 is terminated, and inert gas such as nitrogen gas is introduced into the first process chamber 110 through the gas inlet port 112. The first process chamber 110 is purged with the inert gas, and then the elevator unit 123 is actuated to transfer the silicon semiconductor substrates 40 to the transfer passage portion 120A. Each of the transfer passage portions 120A and 120B has an inert gas atmosphere, and further, each transfer passage portion 120A, 120B is maintained approximately at 400° C. That is, when the silicon layers (specifically, silicon semiconductor substrates) are transferred from the first process chamber 110 to the second process chamber 210 through the transfer passage portions 120A and 120B, the temperature in each of the transfer passages 120A and 120B is nearly equivalent to the temperature employed for forming the silicon oxide layer on the surface of each silicon semiconductor substrate 40 in the first process chamber 110. When the elevator unit 123 reaches its lowermost portion, the shutter 115 is closed, the shutter 126 is opened (see FIG. 51), the elevator unit 123 is moved to a position below the second process chamber 210, and then the shutter 126 is closed. Then, for forming a silicon oxide layer on each silicon semiconductor substrate to come as a next lot, the door 125A is opened, and other silicon semiconductor substrates 40 are transferred into the transfer passage portion 120A (see FIG. 52).

[Step-950]

Figure 53:
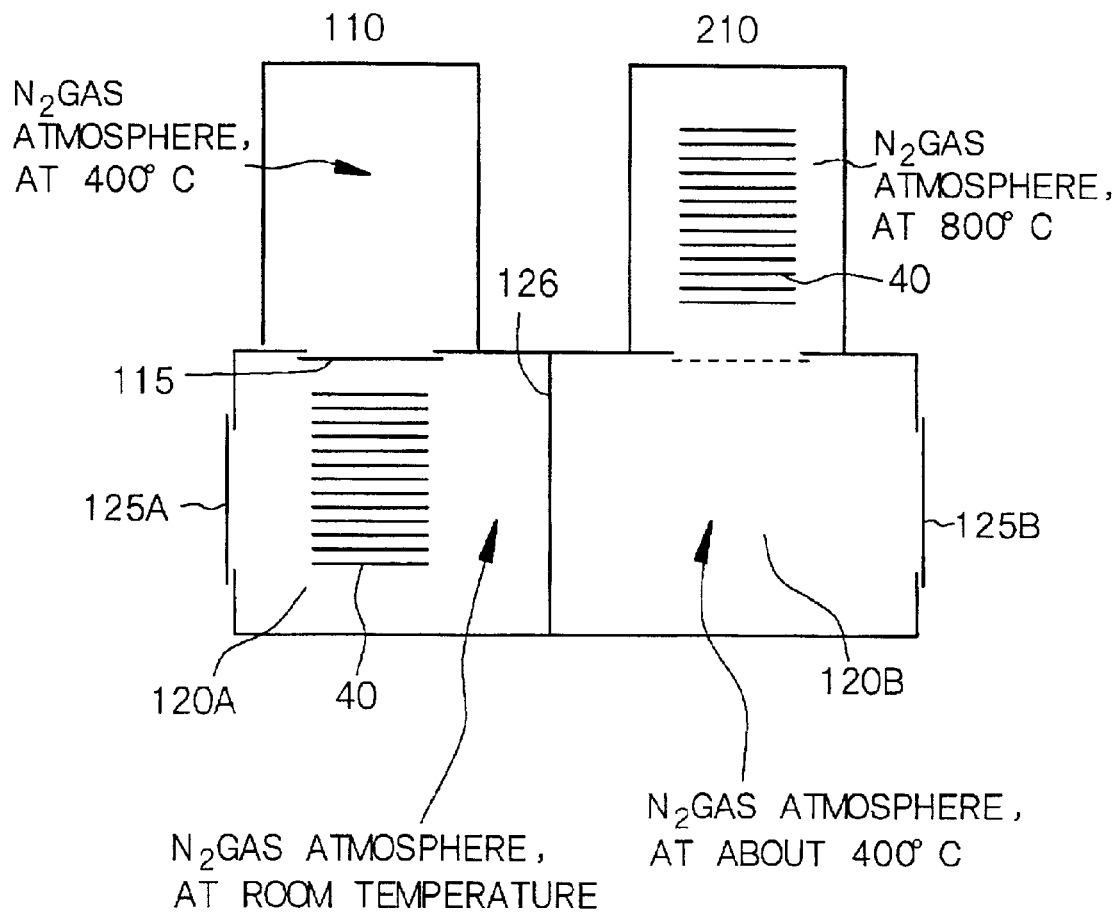
FIG. 53 subsequent to FIG. 52 shows a conceptual cross section of the vertical-type processing apparatus and so on for explaining the method of forming a silicon oxide layer in Example 9.

Then, the shutter 215 is opened, and the elevator unit 123 is actuated to elevate the fused quartz boat 124, whereby the silicon semiconductor substrates 40 are transferred into the double-tubular structured second process chamber 210 made of fused quartz (see FIG. 53). The temperature of the inert gas atmosphere in the second process chamber 210 is maintained at 800° C. in advance. Since, however, the silicon oxide layer 42 which also functions as a protective layer is already formed on the surface of each silicon semiconductor substrate 40, surface roughening of each silicon layer (silicon semiconductor substrate 40) does not occur. After the transfer of the silicon semiconductor substrates 40 into the second process chamber 210, preferably, the temperature of the inert gas atmosphere in the transfer passage portion 120B is adjusted to room temperature. In the transfer passage portion 120A and the first process chamber 110, in the same manner as in [Step-920], the door 125A is closed, inert gas such as nitrogen gas is introduced into the transfer passage portion 120A through the gas introducing portion to purge atmosphere in the transfer passage portion 120A through the gas exhaust portion, and an inert gas atmosphere is formed in the transfer passage portion 120A (see a state of the transfer passage portion 120A on the left in FIG. 48).

[Step-960]

Figure 54:
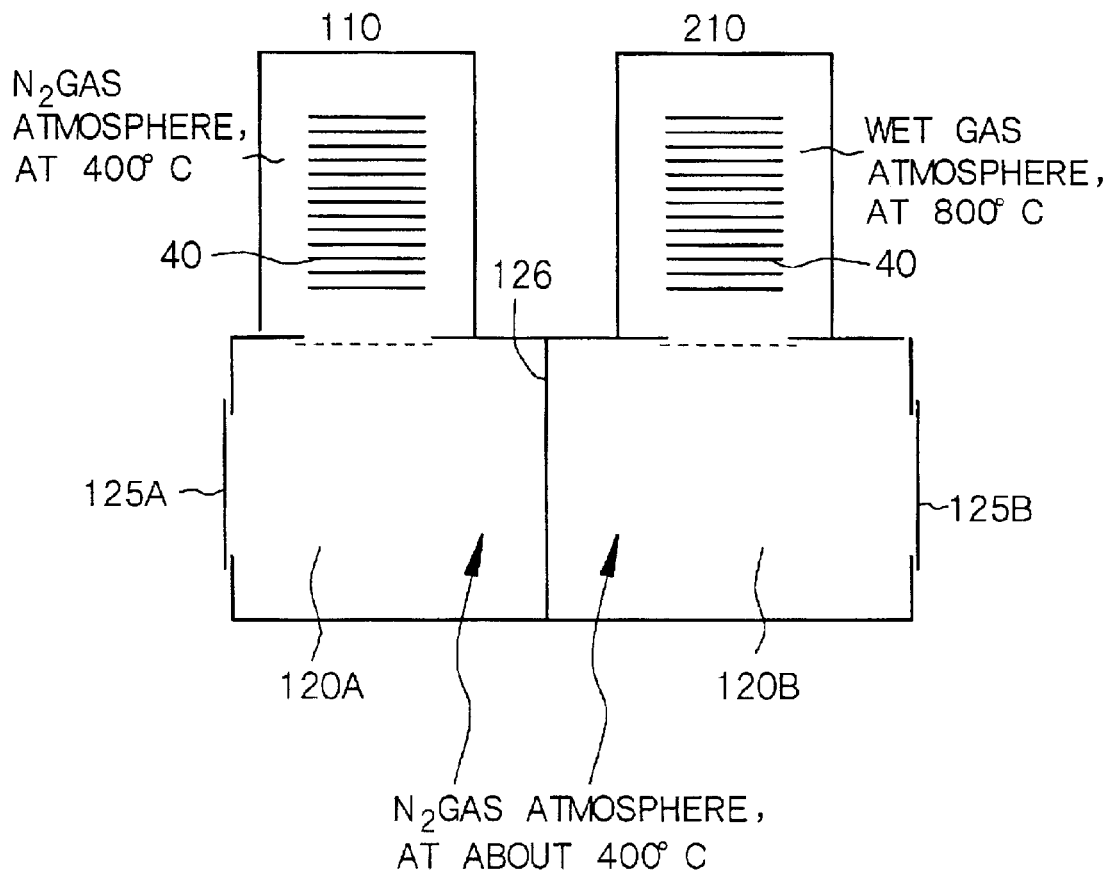
FIG. 54 subsequent to FIG. 53 shows a conceptual cross section of the vertical-type processing apparatus and so on for explaining the method of forming a silicon oxide layer in Example 9.

Then, while the temperature in the second process chamber 210 is maintained at 800° C., the silicon oxide layer is further formed by an oxidation method using pyrogenic gas in the same manner as in [Step-860] (see FIG. 54). The wet gas may contain, for example, 1.0 vol % of hydrogen chloride gas. In the transfer passage portion 120A and the first process chamber 110, in the same manner as in [Step-920], the shutter 115 is opened, and the elevator unit 123 is actuated to elevate the fused quartz boat 124, whereby the silicon semiconductor substrates 40 are transferred into the first process chamber 110 (see a state of the transfer passage portion 120A on the left in FIG. 49).

Since the formation of the silicon oxide layer 42 on the surface of each silicon semiconductor substrate 40 is completed by the above procedures in the second process chamber 210, the silicon semiconductor substrates may be transferred out of the transfer passage 120B by forming an atmosphere of inert gas such as nitrogen gas in the second process chamber 210, actuating the elevator unit 123 to lower the fused quartz boat 124 and opening the door 125B. When it is intended to form a silicon oxide layer having further excellent properties, it is preferred to carry out the following heat treatment step on the silicon oxide layer. In addition, the silicon semiconductor substrates transferred into the first process chamber 110 go through procedures in [Step-930] and thereafter.

[Step-970]

Figure 55:
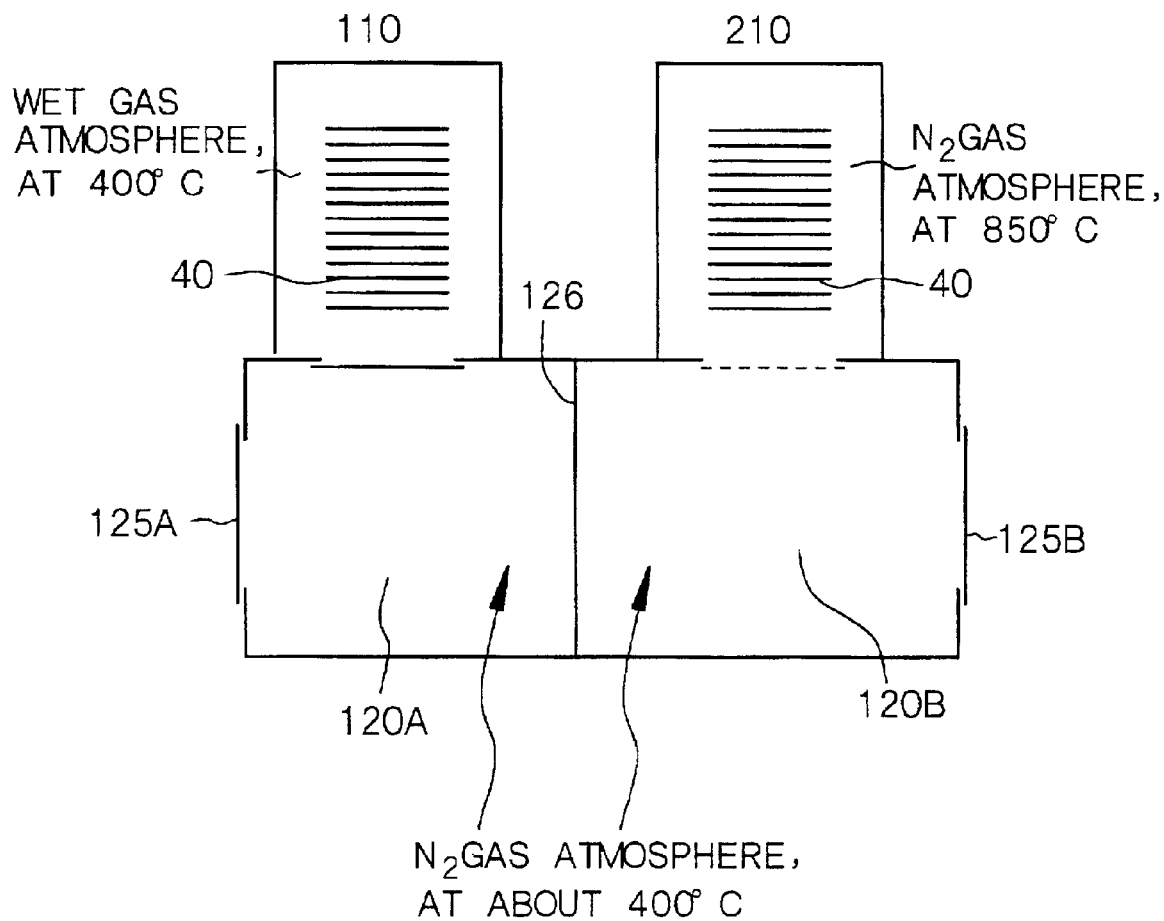
FIG. 55 subsequent to FIG. 54 shows a conceptual cross section of the vertical-type processing apparatus and so on for explaining the method of forming a silicon oxide layer in Example 9.
Figure 56:
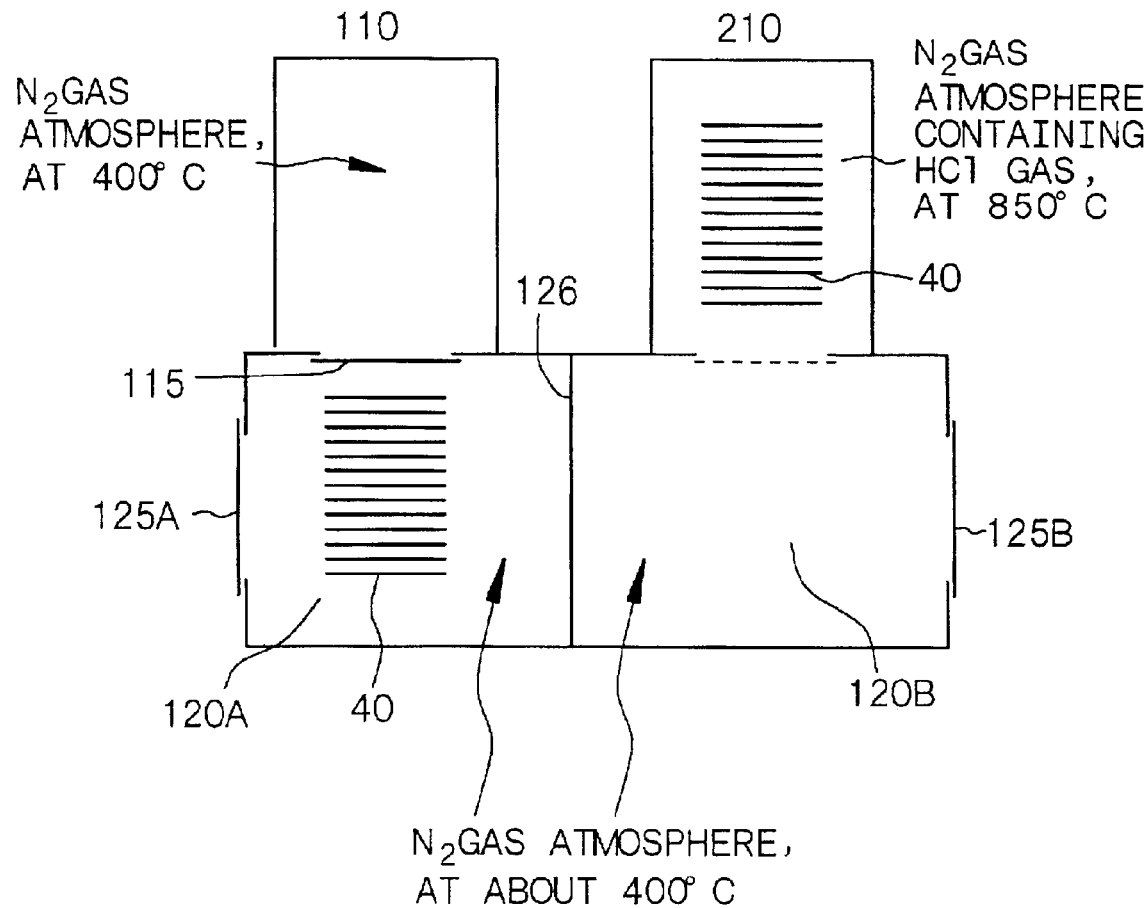
FIG. 56 subsequent to FIG. 55 shows a conceptual cross section of the vertical-type processing apparatus and so on for explaining the method of forming a silicon oxide layer in Example 9.
Figure 57:
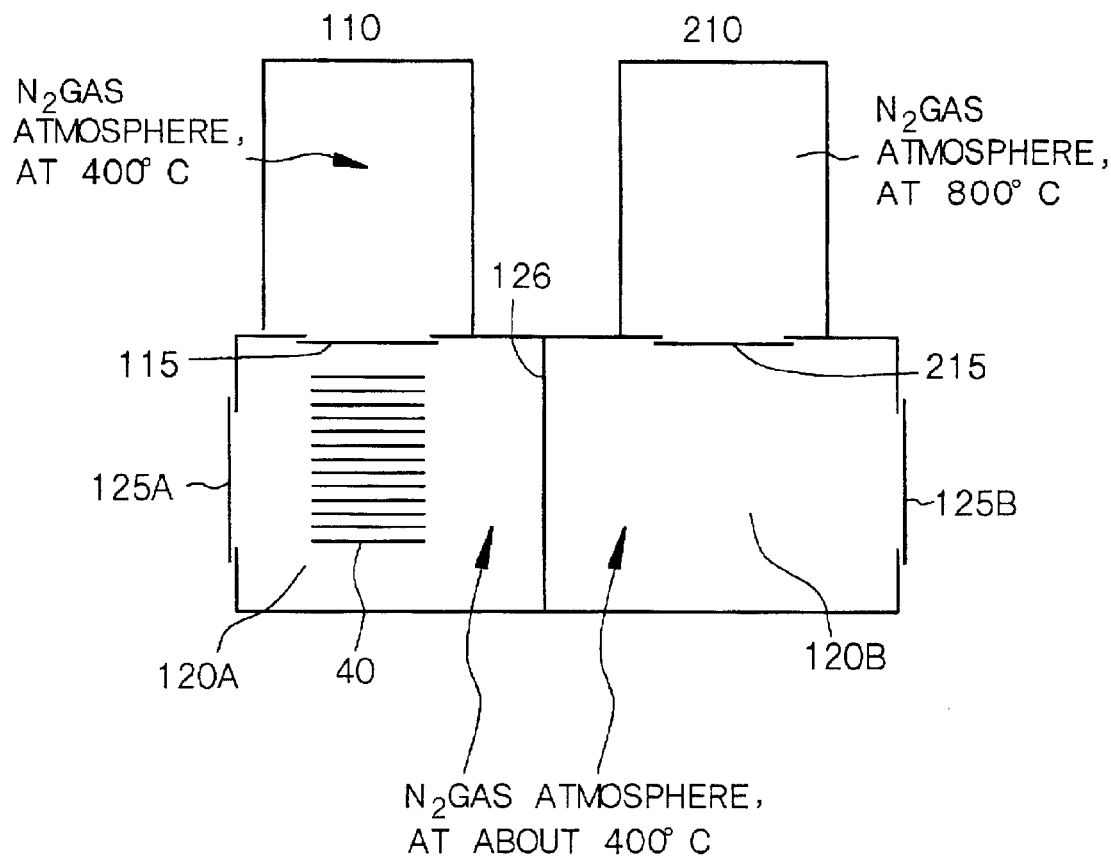
FIG. 57 subsequent to FIG. 56 shows a conceptual cross section of the vertical-type processing apparatus and so on for explaining the method of forming a silicon oxide layer in Example 9.

That is, in the same manner as in [Step-870], after [Step-960], the introduction of the wet gas into the second process chamber 210 is terminated, and while inert gas such as nitrogen gas is introduced into the second process chamber 210 through the gas inlet port 212, the ambient temperature in the second process chamber 210 is raised up to 850° C. with the heater 214 (see FIG. 55). Then, for example, nitrogen gas containing 0.1 vol % of hydrogen chloride gas is introduced into the second process chamber 210 through the gas inlet port 212, and the silicon oxide layers are heat-treated for thirty minutes (see FIG. 56). The heat treatment of the silicon oxide layers 42 are completed by the above procedure. Thereafter, an atmosphere of inert gas such as nitrogen gas is formed in the second process chamber 210, the elevator unit 123 is actuated to lower the fused quartz boat 124, then the door 125B is opened, and the silicon semiconductor substrates 40 are transferred out of the transfer passage portion 120B. Thereafter, the door 125B is closed, inert gas such as nitrogen gas is introduced into the transfer passage portion 120B, and the ambient temperature in the transfer passage portion 120B is adjusted approximately 400° C. (see FIG. 57).

In Example 9, the timing of formation of the silicon oxide layer on the surface of each silicon semiconductor substrate to come as a next lot is an example, and can be modified as required.

EXAMPLE 10

Example 10 is a variant of Example 8. Example 10 differs from Example 8 in that the first oxidation step and the second oxidation step are carried out in a horizontal-type processing apparatus with a single wafer processing. That is, in the first process chamber and the second process chamber, a silicon oxide layer is formed on a surface of one silicon semiconductor substrate with a single wafer processing. In Example 10, the heat treatment is carried out by furnace annealing with a batch processing, while it may be carried out with a single wafer processing.

Figure 58:
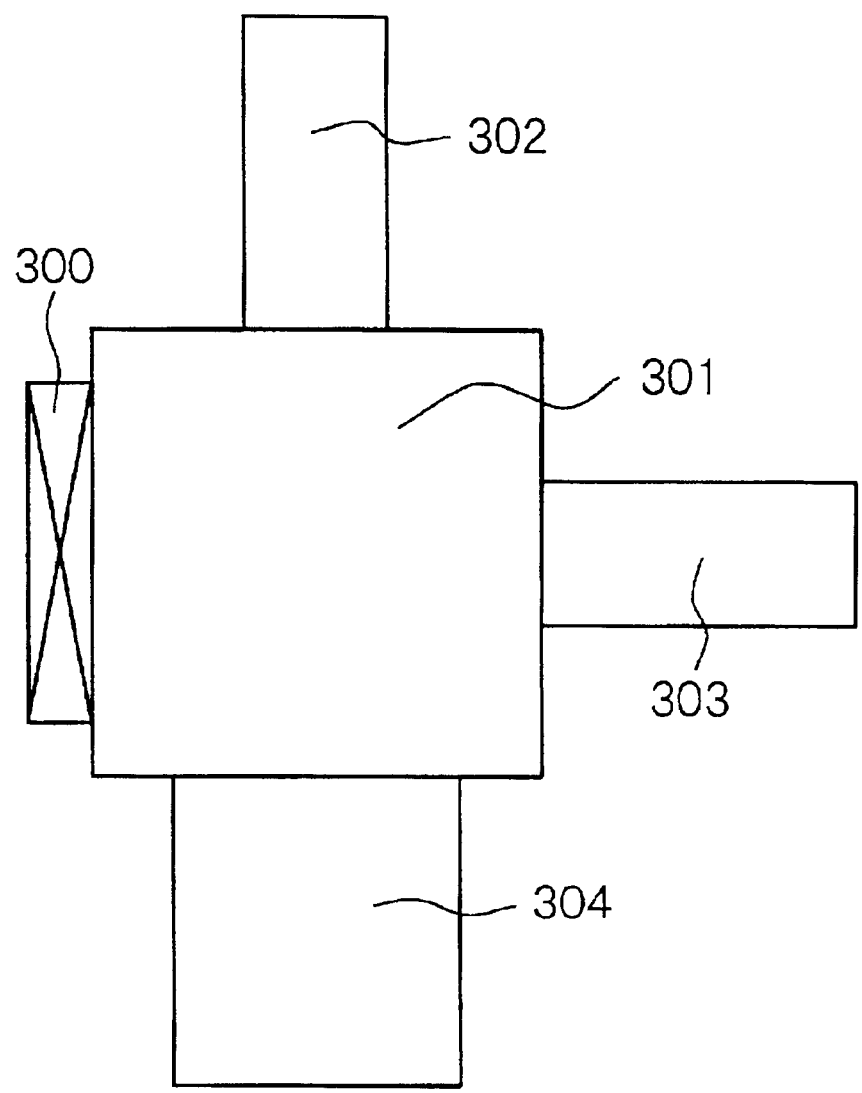
FIG. 58 conceptually shows an equipment for the formation of a silicon oxide layer, suitable for use in Example 10.
Figure 59:
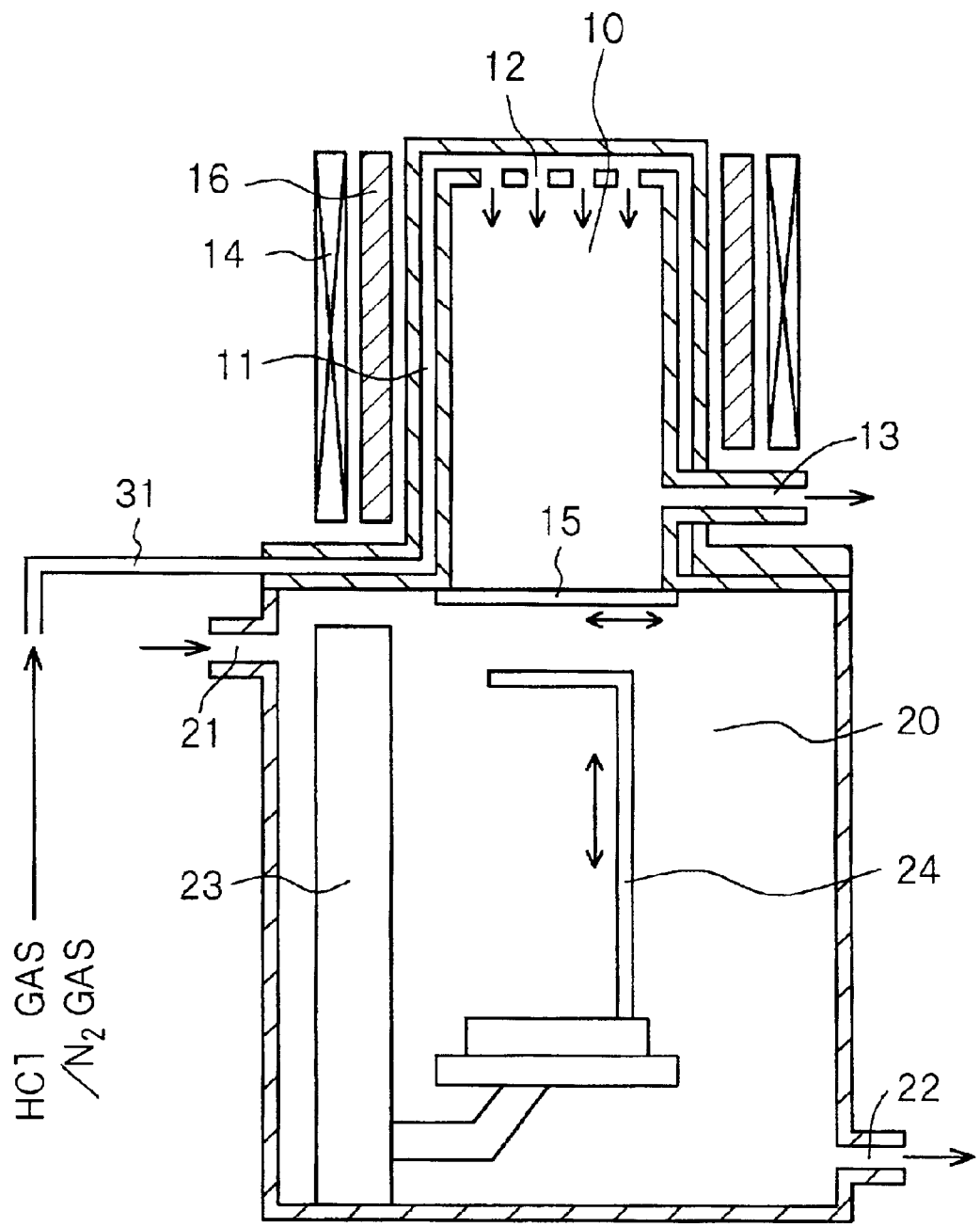
FIG. 59 schematically shows a furnace annealer with a batch processing in the equipment for forming a silicon oxide layer, suitable for use in Example 10.

Example 10 uses an equipment for the formation of a silicon oxide layer of which the conceptual plan view is shown in FIG. 58. The equipment has a loader/unloader 300, a transfer passage 301, a first horizontal-type processing apparatus 302, a second horizontal-type processing apparatus 303 and a furnace annealer 304. As shown in FIG. 59, the furnace annealer 304 has almost the same structure as that of the vertical-type processing apparatus shown in FIG. 13 except that the furnace annealer 304 is not provided with a combustion chamber. In the furnace annealer 304, the same members as those of the vertical-type processing apparatus shown in FIG. 13 are shown by the same reference numerals. The first horizontal-type processing apparatus 302 and the second horizontal-type processing apparatus 303 may be structured similarly to those of the horizontal-type processing apparatus shown in FIG. 31 or FIG. 32.

Examples 8 and 9 use the vertical-type processing apparatus having process chambers (oxidation chamber). When the vertical-type processing apparatus is used, the heaters 114 and 214 are disposed outside a silicon layer such as a silicon semiconductor substrate in its circumferential direction and the peripheral portion of the silicon layer is always more temperature-increased than the central portion during the heating-up of the silicon layer. As a result, when the silicon oxide layer is formed during the heating-up step, the silicon oxide layer in the peripheral portion of the silicon layer such as a silicon semiconductor substrate may have a larger thickness than that in the central portion thereof. In Example 10, the silicon layer is heated with heating means disposed nearly in parallel with the surface of the silicon layer, and the in-plane variability of temperature of the silicon layer can be therefore decreased. As a result, the occurrence of the in-plane variability of the formed silicon oxide layer in thickness can be prevented.

The method of forming a silicon oxide layer in Example 10 will be explained below with reference to FIGS. 31 and 59.

[Step-1000]

First, isolation regions, etc., are formed on a silicon semiconductor substrate in the same manner as in Example 1, and fine particles and metal impurities are removed from the surface of the silicon semiconductor substrate 40 by RCA cleaning. Then, the surface of the silicon semiconductor substrate 40 is cleaned with a 0.1% hydrofluoric acid aqueous solution and then with pure water to expose the surface of the silicon semiconductor substrate.

[Step-1010]

An atmosphere of inert gas such as nitrogen gas is formed in the transfer passage 301, and the process chamber 50 of each of the first horizontal-type processing apparatus 302 and the second horizontal-type processing apparatus 303, and in the substrate transfer portion 20 and the process chamber 10 of the furnace annealer 304. Preferably, the temperature of the inert gas atmosphere in the process chamber 50 of the first horizontal-type processing apparatus 302 is increased to, and maintained at, 400° C., the temperature of the inert gas atmosphere in the process chamber 50 of the second horizontal-type processing apparatus 303 is increased to, and maintained at, 800° C., and the temperature of the inert gas atmosphere in the process chamber 10 of the furnace annealer 304 is increased to, and maintained at, 850° C. A silicon layer (specifically, a silicon semiconductor substrate 40) is transferred into the transfer passage 301 through the loader/unloader 300, and further, the silicon semiconductor substrate is placed on the wafer carrier 52. Then, the gate valve 53 of the first horizontal-type processing apparatus 302 shown in FIG. 31 (or FIG. 32) is opened, and after the silicon semiconductor substrate is transferred into the process chamber 50 corresponding to the first process chamber, the gate valve 53 is closed. Since the ambient temperature in the process chamber 50 is maintained approximately at 400° C., surface roughening of the silicon semiconductor substrate 40 can be prevented.

[Step-1020]

Then, while the atmosphere is maintained at a temperature at which no silicon atom is eliminated from the surface of the silicon layer (silicon semiconductor substrate 40 in Example 10), that is, specifically, while the ambient temperature is set at 400° C., a silicon oxide layer is formed on the surface of the silicon layer by an oxidation method using wet gas. In Example 10, specifically, water vapor formed in a combustion chamber (not shown) is introduced into the process chamber 50 through a piping (not shown) and the gas inlet port 54, and a silicon oxide layer having a thickness of 1.2 nm is formed on the surface of the silicon semiconductor substrate 40 by an oxidation method using pyrogenic gas, in the same manner as in Example 8. The wet gas may contain, for example, 1.0 vol % of hydrogen chloride gas. Further, preferably, the ambient temperature of the inert gas atmosphere in the transfer passage 301 is increased to, and maintained at, approximately 400° C. by heating the inert gas in the transfer passage 301.

[Step-1030]

Then, the introduction of the wet gas into the process chamber 50 is terminated, an atmosphere of inert gas such as nitrogen gas at 400° C. is formed in the process chamber 50, the gate valve 53 is opened, and the silicon semiconductor substrate 40 placed on the wafer carrier 52 is transferred to the transfer passage 301 from the process chamber 50 corresponding to the first process chamber. The gate valve 53 in the second horizontal-type processing apparatus 303 shown in FIG. 31 (or FIG. 32) is opened, the silicon semiconductor substrate 40 is transferred into the process chamber 50 of the second horizontal-type processing apparatus 303 corresponding to the second process chamber, and then the gate valve 53 is closed. At this time, the atmosphere in the process chamber 50 corresponding to the second process chamber is an inert gas atmosphere heated approximately at 800° C. with the heating means. Since, however, the silicon layer (e.g., silicon semiconductor substrate 40) is transferred from the first horizontal-type processing apparatus 302 into the second horizontal-type processing apparatus 303 through the transfer passage 301 in a state where the silicon oxide layer which also functions as a protective layer is already formed on the surface of the silicon layer, surface roughening (a concave or convex shape) of the silicon layer does not occur even if the transfer passage 301 and the second horizontal-type processing apparatus 303 have a non-oxidative atmosphere.

[Step-1040]

Then, while the ambient temperature in the process chamber 50 corresponding to the second process chamber is maintained at 800° C., the silicon oxide layer is further formed on the surface of the silicon layer by an oxidation method using wet gas in the same manner as in Example 8. In Example 10, specifically, water vapor formed in a combustion chamber (not shown) is introduced into the process chamber 50 corresponding to the second process chamber through a piping (not shown) and the gas inlet port 54, and the silicon oxide layer having a total thickness of 4.0 nm is formed on the surface of the silicon semiconductor substrate 40 by an oxidation method using pyrogenic gas, in the same manner as in Example 8. The wet gas may contain, for example, 1.0 vol % of hydrogen chloride gas. Further, the temperature of the inert gas atmosphere in the transfer passage 301 may be room temperature.

Since the formation of the silicon oxide layer on the surface of the semiconductor substrate is completed by the above procedures, the silicon semiconductor substrate may be transferred out of the equipment through the loader/unloader 300 by forming an atmosphere of inert gas such as nitrogen gas in the second process chamber 303, opening the gate value 53 and transferring the silicon semiconductor substrate 40 placed on the wafer carrier 52 from the process chamber 50 to the transfer passage 301. When it is intended to form a silicon oxide layer having further excellent properties, it is preferred to carry out the following heat treatment step on the silicon oxide layer.

[Step-1050]

That is, the silicon layers such as silicon semiconductor substrates 40 are consecutively transferred into the substrate transfer portion 20 of the furnace annealer 304 shown in FIG. 59 through a door (not shown). When the fused quartz boat 24 is full of the silicon semiconductor substrates, the door (not shown) is closed, and the elevator unit 23 is actuated to elevate the fused quartz boat 24, whereby the silicon semiconductor substrates 40 are transferred into the process chamber 10. Then, nitrogen gas containing, for example, 0.1 vol % of hydrogen chloride gas is introduced into the process chamber 10 through the gas inlet port 12, and the silicon oxide layers are heat-treated at an ambient temperature of 850° C. for 30 minutes. The heat treatment of the silicon oxide layers is completed by the above procedure. Then, an atmosphere of inert gas such as nitrogen gas is formed in the process chamber 10, the elevator unit 23 is actuated to lower the fused quartz boat 24, then, the door (not shown) is opened, and the silicon semiconductor substrates 40 are transferred into the transfer passage 301 and transferred out of the equipment through the loader/unloader 300.

The silicon oxide layer may be heat-treated in the process chamber 50 corresponding to the second process chamber, or the silicon semiconductor substrate may be transferred into an annealing apparatus having a structure as shown in FIG. 31 or FIG. 32 and the formed silicon oxide layer may be heated treated, in place of using the furnace annealer shown in FIG. 59. For example, when the heat treatment is carried out in the process chamber 50 corresponding to the second process chamber, in [Step-1040], the introduction of the wet gas is terminated, inert gas such as nitrogen gas is introduced into the process chamber 50 through the gas inlet port 54, and the ambient temperature in the process chamber 50 is raised up to 850° C. with heating means. Then, inert gas such as nitrogen gas containing, for example, 0.1 vol % of hydrogen chloride gas is introduced into the process chamber 50, and the heat treatment is carried out for 5 minutes.

Further, in the equipment shown in FIG. 58, a shutter may be provided between a transfer passage portion communicating with the first horizontal-type processing apparatus 302 and a transfer passage portion communicating with the second horizontal-type processing apparatus 303. Furthermore, the first oxidation step may be carried out in the process chamber 50 shown in FIG. 31 or FIG. 32, and the second oxidation step may be carried out by means of the vertical-type processing apparatus shown in FIG. 13 with a batch processing.

EXAMPLE 11

Example 11 is a variant of Example 7. Example 11 uses a silicon layer which is an epitaxial silicon layer formed by a selectively epitaxial growth. The epitaxial silicon layer is formed by selectively forming a silicon layer on a region of a substrate not covered with an insulating layer. In Example 11, a silicon oxide layer is formed on the surface of the silicon layer without exposing the formed silicon layer to atmosphere.

Figure 62:
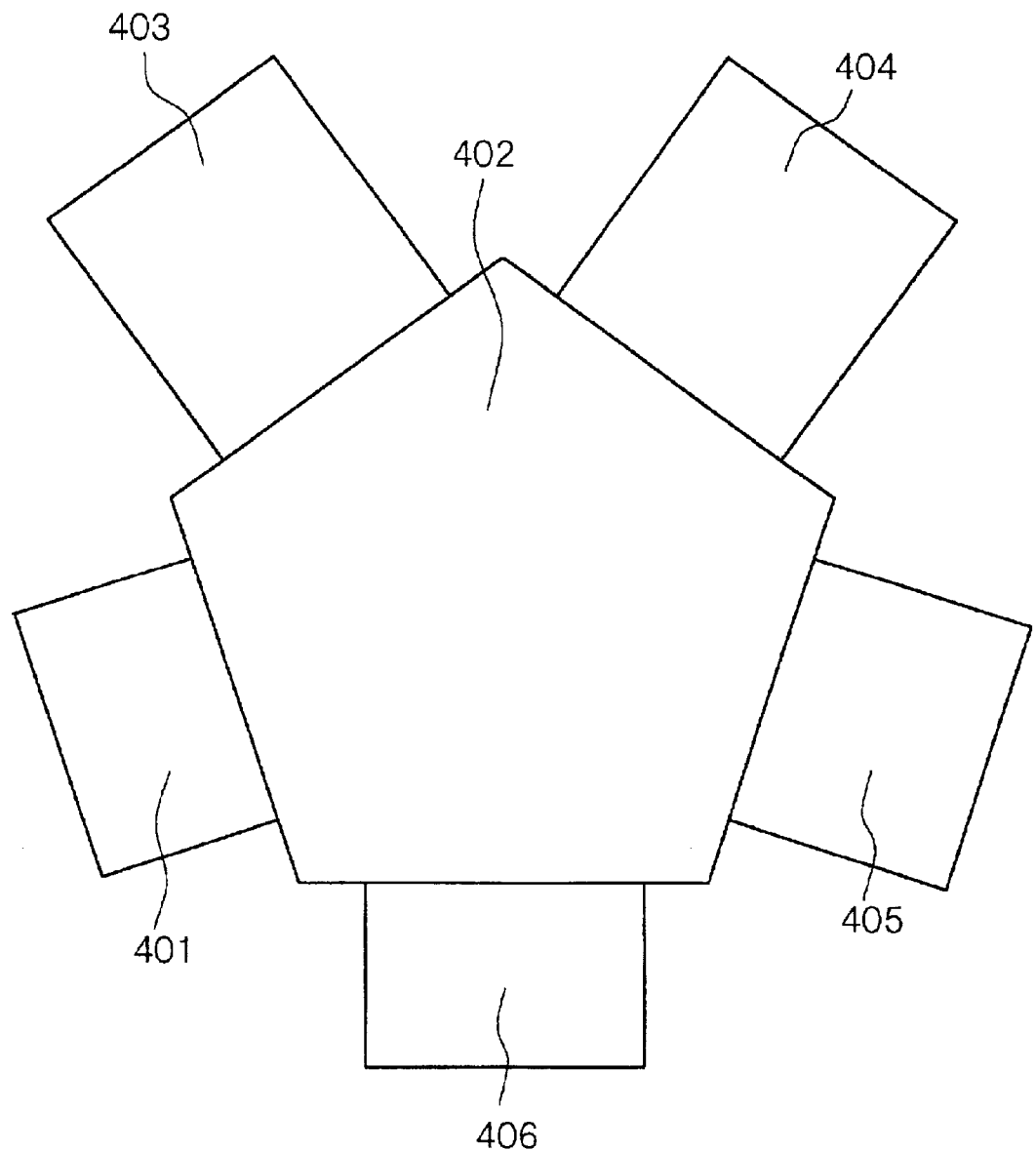
FIG. 62 is a conceptual plan view of an equipment for the formation of a silicon oxide layer, suitable for use in Example 11.

Example 11 uses an equipment shown in FIG. 62. Further, in Example 11, a silicon semiconductor substrate is used as a substrate, an isolation region is used as an insulating layer, and a silicon layer is formed by a selectively epitaxial growth. A formed silicon oxide layer functions as a gate oxide. The formation of a silicon oxide layer is carried out by an oxidation method using wet gas, more specifically, an oxidation method using pyrogenic gas. The formed silicon oxide layer is heat-treated in an inert gas atmosphere containing a halogen element, for example, a nitrogen gas atmosphere containing hydrogen chloride gas.

As conceptually shown in FIG. 62, the equipment used in Example 11 has a loader 401, a transfer passage 402, a first processing unit 403, a second processing unit 404, a third processing unit 405 and an unloader 406. The first processing unit 403 is a known apparatus for removing an oxide layer by a dry method with a single wafer processing. The second processing unit 404 is a known CVD apparatus with a single wafer processing. Further, the third processing unit 405 is the horizontal-type processing apparatus as shown in FIG. 31 or FIG. 32. In Example 11, the first oxidation step, the second oxidation step and the heat treatment step are carried out in the process chamber 50 of the third processing unit 405.

The method of forming a silicon oxide layer in Example 11 will be explained below with reference to FIGS. 60 to 62 and FIG. 31 or FIG. 32.

[Step-1100]

First, isolation regions 41 corresponding to an insulating layer and having an LOCOS structure are formed on a surface of a silicon semiconductor substrate 40 as a substrate, and well ion implantation and channel stop ion implantation are carried out. The isolation region may have a trench isolation structure or a combination of a LOCOS structure and a trench isolation structure. Then, fine particles and metal impurities are removed from the surface of the silicon semiconductor substrate 40 by RCA cleaning.

[Step-1110]

Then, the silicon semiconductor substrate 40 as a substrate is transferred into the transfer passage 402 through the loader 401. The transfer passage 402 is kept vacuumed inside in advance. Then, the silicon semiconductor substrate 40 is transferred into the first processing unit 403 which is a known apparatus for removing an oxide layer by a dry method with a single wafer processing. Then, inside the first processing unit 403, an oxide layer formed on the exposed surface of the silicon semiconductor substrate 40 is removed under conditions shown in the following Table 2.

TABLE 2

| | |
|---|---|
| Anhydrous hydrogen fluoride gas: | 1 slm |
| Nitrogen gas for methanol-bubbling: | 7 slm |
| Carrier nitrogen gas: | 5 slm |

[Step-1120]

Figure 60A:
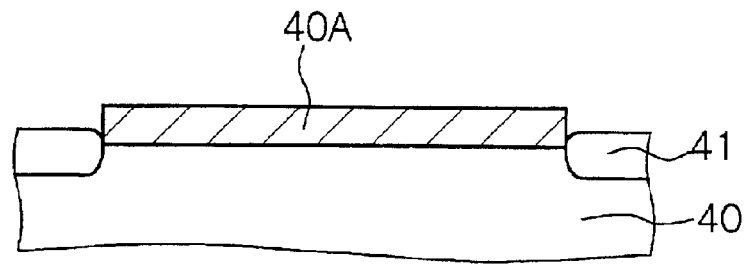
FIGS. 60A, 60B and 60C show schematic partial cross sections of a silicon semiconductor substrate and so on for explaining the method of producing a semiconductor device based on the present invention.
Figure 60B:
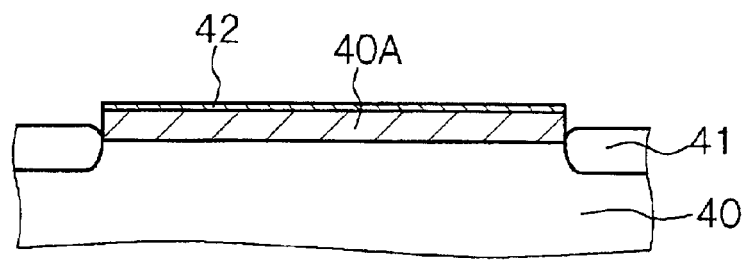
Figure 60C:
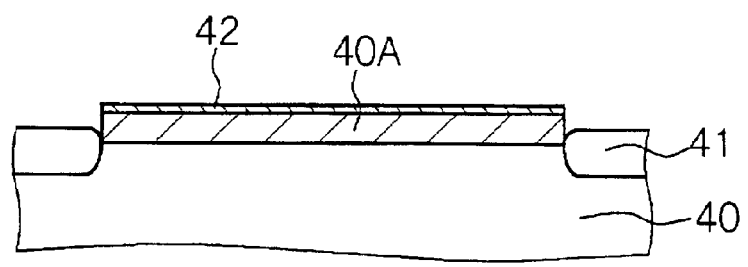

Then, the silicon semiconductor substrate 40 is transferred from the first processing unit 403 to the transfer passage 402, and then transferred to the second processing unit 404 which is a known CVD apparatus with a single wafer processing. A silicon layer 40A is selectively formed on a region not covered with the insulating layer (to which the isolation region corresponds) on the silicon semiconductor substrate. Specifically, the silicon layer 40A which is a single crystal layer is formed by the selectively epitaxial growth under CVD conditions shown in the following Table 3. Under the CVD conditions shown in Table 3, no silicon layer grows on the insulating layer, and in this manner, a structure of which the partial cross section is schematically shown in FIG. 60A can be obtained.

TABLE 3

| Gases | |
|---|---|
| $H_2$: | 50 slm |
| $SiH_2Cl_2$: | 100 sccm |
| $B_2H_6/H_2$: | 0.1 vol % - 100 sccm |
| HCl: | 50 sccm |
| Temperature: | 750° C. |
| Pressure: | $5.3 \times 10^3$ Pa (40 Torr) |
| Thickness: | 30 nm |

[Step-1130]

Then, the silicon semiconductor substrate 40 is transferred to the transfer passage 402 from the second processing unit 404 and placed on the wafer carrier 52, and the silicon semiconductor substrate 40 is transferred into the process chamber 50 through the gate valve 53 of the third processing unit 405 which is the horizontal-type processing apparatus shown in FIG. 31 or FIG. 32. Since the transfer passage 402 is kept vacuumed, the formed silicon layer 40A cannot be exposed to atmosphere. Preferably, an atmosphere of inert gas such as nitrogen gas at 400° C. is formed in the process chamber 50 of the third processing unit 405 in advance. At this ambient temperature, surface roughening of the silicon layer 40A transferred into the process chamber 50 does not occur.

Then, a silicon oxide layer 42 is formed on the surface of the silicon layer 40A. Like Example 7, the step of forming the silicon oxide layer 42 in Example 11 includes the first oxidation step, the heating-up step and the second oxidation step. The first and second oxidation steps are carried out in the process chamber 50 of the third processing unit 405.

[Step-1140]

Specifically, while the ambient temperature in the process chamber 50 is maintained at 400° C., the silicon oxide layer 42 is formed on the surface of the silicon layer 40A by an oxidation method using wet gas such as an oxidation method using pyrogenic gas. That is, water vapor is formed by supplying 5 slm of hydrogen gas and 5 slm of oxygen gas to the combustion chamber (not shown), mixing the hydrogen gas with the oxygen gas at a high temperature and combusting the hydrogen gas with the oxygen gas in the combustion chamber. The wet gas containing the above water vapor is introduced into the process chamber 50 through a piping (not shown) and the gas inlet port 54, so that a silicon oxide layer 42 having a thickness of 1 nm is formed on the surface of the silicon layer 40A (see FIG. 60B). The wet gas may contain, for example, 1.0 vol % of hydrogen chloride gas.

[Step-1150]

Then, the introduction of the wet gas into the process chamber 50 is terminated, an atmosphere of inert gas such as nitrogen gas is formed in the process chamber 50, and the ambient temperature in the process chamber 50 is raised up to 800° C. with the heating means. Since the silicon oxide layer is already formed on the surface of the silicon layer 40A in [Step-1140], surface roughening of the silicon layer 40A does not occur in this [Step-1150].

[Step-1160]

After the ambient temperature in the process chamber 50 reaches 800° C., while the atmosphere in the process chamber 50 is maintained at this temperature, the silicon oxide layer is further formed by an oxidation method using wet gas. Specifically, while the ambient temperature in the process chamber 50 is maintained at 800° C., the silicon oxide layer 42 is further formed on the surface of the silicon layer 40A by an oxidation method using wet gas such as an oxidation method using pyrogenic gas. That is, water vapor is formed by supplying 5 slm of hydrogen gas and 5 slm of oxygen gas to the combustion chamber (not shown), mixing the hydrogen gas with the oxygen gas at a high temperature and combusting the hydrogen gas with the oxygen gas in the combustion chamber. The wet gas containing the above water vapor is introduced into the process chamber 50 through a piping (not shown) and the gas inlet port 54 (see FIG. 60C), so that the silicon oxide layer 42 having a total thickness of 3 nm is formed on the surface of the silicon layer 40A. The wet gas may contain, for example, 1.0 vol % of hydrogen chloride gas.

Since the formation of the silicon oxide layer on the surface of the silicon layer is completed by the above procedures, the silicon semiconductor substrate may be transferred out of the equipment through the unloader 406 by forming an atmosphere of inert gas such as nitrogen gas in the process chamber 50 and transferring the silicon semiconductor substrate 40 from the process chamber 50 to the transfer passage 402. When it is intended to form a silicon oxide layer having further excellent properties, it is preferred to carry out the following heat treatment step on the silicon oxide layer.

[Step-1170]

That is, after the formation of the silicon oxide layer, the silicon oxide layer is heat-treated in the process chamber 50. Specifically, after [Step-1160], the introduction of the wet gas into the process chamber 50 is terminated, and while nitrogen gas is introduced into the process chamber 50 through the gas inlet port 54, the ambient temperature in the process chamber 50 is raised up to 850° C. with the heating means. Then, nitrogen gas containing, for example, 0.1 vol % of hydrogen chloride gas (for example, hydrogen chloride gas/nitrogen gas=10 sccm/10 slm) is introduced into the process chamber 50 through the gas inlet port 54, and the heat treatment is carried out for 5 minutes.

[Step-1180]

Figure 61A:
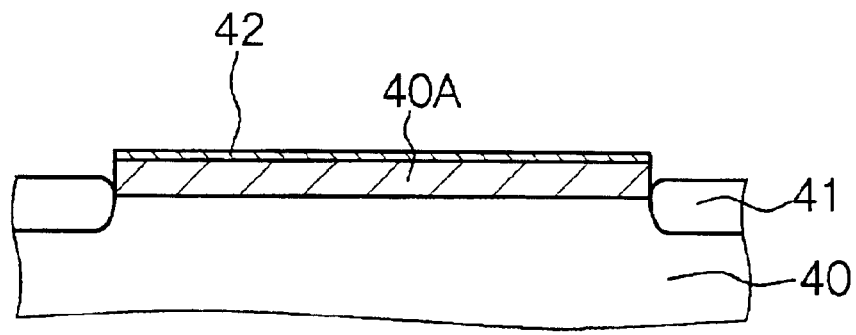
FIGS. 61A and 61B subsequent to FIG. 60C show schematic partial cross sections of a silicon semiconductor substrate and so on for explaining the method of producing a semiconductor device based on the present invention.
Figure 61B:
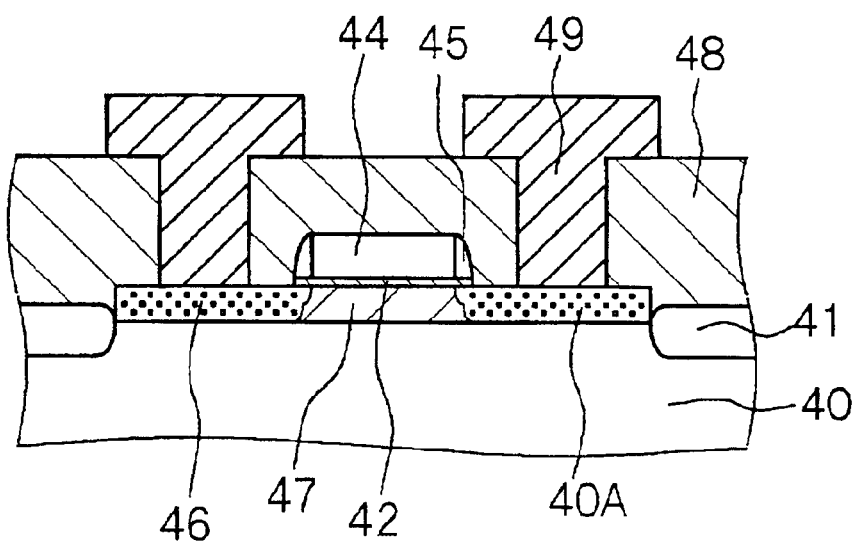

Then, an atmosphere of inert gas such as nitrogen gas is formed in the process chamber 50, and the silicon semiconductor substrate 40 is transferred from the process chamber 50 to the transfer passage 402 through the gate valve 53 and transferred out of the equipment through the unloader 406. And, a MOS type field effect transistor (FET) is completed by a general process. That is, for example, a doped polysilicon layer is formed on the formed silicon oxide layer 42 by a CVD method, and the polysilicon layer is patterned to form a gate electrode 44. Then, for forming an LDD structure, the silicon layer 40A is implanted with dopant ion. Then, an SiN layer is formed on the entire surface and then etched to form a side wall 45 on a side wall of the gate electrode 44. Then, the silicon layer 40A is implanted with dopant ion, and subjected to activating anneal treatment to form a source/drain region 46 in the silicon layer 40A. The silicon layer 40A beneath the gate electrode 44 corresponds to a channel region 47. Then, a dielectric interlayer 48 is formed on the entire surface, an opening portion is formed in the dielectric interlayer 48 above the source/drain region 46, and then a wiring material layer is formed on the dielectric interlayer 48 including the interior of the opening portion, for example, by a sputtering method. The wiring material layer on the dielectric interlayer 48 is then patterned to complete a wiring 49, whereby a MOS type FET of which the schematic partial cross section is shown in FIG. 61B can be obtained.

In place of [Step-1150] in Example 11, the ambient temperature in the process chamber 50 of the third processing unit 405 as an apparatus for the formation of a silicon oxide layer may be raised up to 800° C. with the heating means without terminating the introduction of the wet gas into the process chamber 50.

EXAMPLE 12

Figure 63:
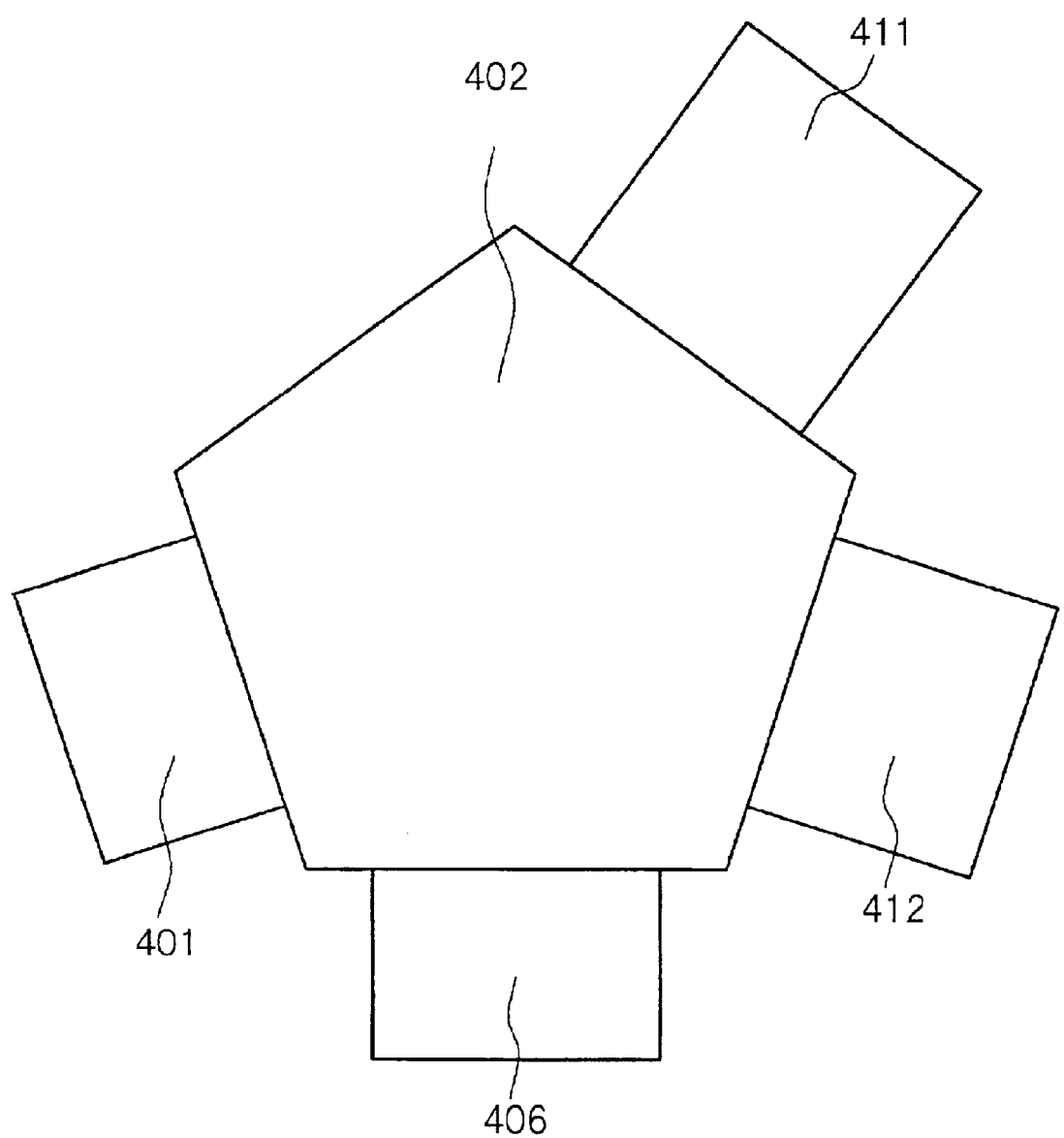
FIG. 63 is a conceptual plan view of an equipment for the formation of a silicon oxide layer, suitable for use in Example 12.

Example 12 is a variant of Example 11. Example 12 uses an equipment of which the conceptual plan view is shown in FIG. 63. The equipment has a loader 401, a transfer passage 402, a first processing unit 411, a second processing unit 412 and an unloader 406. The first processing unit 411 is a combination of a known apparatus for removing an oxide layer by a dry method with a single wafer processing and a CVD apparatus with a single wafer processing. The second processing unit 412 has the same structure as that of the processing unit 405 which is the horizontal-type processing apparatus with a single wafer processing and is explained in Example 11. In Example 12, the first and second oxidation steps and the heat treatment step are carried out in the process chamber 50 of the second processing unit 412. The method of forming a silicon oxide layer in Example 12 will be explained below.

[Step-1200]

First, isolation regions 41 corresponding to an insulating layer and having an LOCOS structure are formed on a surface of a silicon semiconductor substrate 40 corresponding to a substrate, in the same manner as in [Step-1100] in Example 11, and well ion implantation and channel stop ion implantation are carried out. Then, fine particles and metal impurities are removed from the surface of the silicon semiconductor substrate 40 by RCA cleaning.
[Step-1210]
Then, the silicon semiconductor substrate 40 as a substrate is transferred into the transfer passage 402 through the loader 401. The transfer passage 402 is kept vacuumed inside in advance. Then, inside the first processing unit 411, an oxide layer formed on the exposed surface of the silicon semiconductor substrate 40 is removed by a hydrogen gas baking method under conditions shown in the following Table 4.

TABLE 4

| Hydrogen gas: | 20 slm |
| Pressure: | 6.7 × 10³ Pa (50 Torr) |
| Substrate temperature: | 850° C. |

[Step-1220]
Then, in the processing unit 411, a silicon layer 40A is selectively formed on a region to which an exposed portion of the silicon semiconductor substrate 40 corresponds and which is not covered with isolation regions, under the same conditions as those in [Step-1120] in Example 11.
[Step-1230]
Then, the silicon semiconductor substrate 40 is transferred from the first processing unit 411 to the transfer passage 402, and is transferred into the process chamber 50 of the second processing unit 412 which is the horizontal-type processing apparatus with a single wafer processing shown in FIG. 31 or FIG. 32. And, the procedures from [Step-1130] to [Step-1180] in Example 11 are carried out to produce a semiconductor device.

In Examples 11 and 12, the heat treatment is carried out in the process chamber 50, while the heat treatment may be carried out in the vertical-type furnace annealer with a batch processing which is schematically shown in FIG. 59. That is, after [Step-1160] in Example 11 is completed, the silicon semiconductor substrate 40 is transferred from the process chamber 50 to the transfer passage 402 through the gate valve 53, is transferred into the substrate transfer portion 20 of the furnace annealer and placed on the fused quartz boat 24. The substrate transfer portion 20 is kept vacuumed in advance. The shutter 15 of the furnace annealer is kept closed in advance. The inert gas such as nitrogen gas is introduced into the process chamber 10 through the piping 31, the gas passage 11 and the gas inlet port 12 to form an inert gas atmosphere in the process chamber 10. Further, the atmosphere in the process chamber 10 is maintained at 850° C. in advance with the heater 14 through the liner tube 16. When the placement of a plurality of the silicon semiconductor substrates 40 on the fused quartz boat 24 is completed, the door (not shown) of the furnace annealer is closed, the shutter 15 is opened, and the elevator unit 23 is actuated to elevate the fused quartz boat 24, so that the silicon semiconductor substrates 40 are transferred into the double-tubular structured process chamber 10 made of fused quartz. Then, nitrogen gas containing, for example, 0.1 vol % of hydrogen chloride gas is introduced into the process chamber 10 through the piping 31, the gas passage 11 and the gas inlet port 12, and the heat treatment is carried out at 850° C. for 30 minutes. The heat treatment of the silicon oxide layers is completed by the above procedures. Thereafter, an atmosphere of inert gas such as nitrogen gas is formed in the process chamber 10, and the elevator unit 23 is actuated to lower the fused quartz boat 24. The shutter 15 is closed, the substrate transfer portion 20 is vacuumed, the door (not shown) is opened, and the silicon semiconductor substrates 40 are transferred out of the equipment through the unloader 406.

Alternatively, the first and second oxidation steps may be carried out in the same manner as in [Step-110] to [Step-170] in Example 1 using the vertical-type processing apparatus which is schematically shown in FIG. 13.

The step of selectively forming the silicon layer on the region not covered with an insulating layer on the substrate may be carried out by means of a CVD apparatus with a batch processing in place of the CVD apparatus with a single wafer processing.

Further, alternatively, the first step may be carried out by means of the horizontal-type processing apparatus shown in FIG. 31 or FIG. 32, and the second oxidation step and the heat treatment step may be carried out by means of the vertical-type processing apparatus shown in FIG. 13. That is, [Step-1100] to [Step-1140] in Example 11 are carried out, and then, a plurality of the silicon semiconductor substrates 40 are placed on the fused quartz boat 24 shown in FIG. 13. Then, the door (not shown) of the vertical-type processing apparatus is closed, the shutter 15 is opened, and the elevator unit 23 is actuated to elevate the fused quartz boat 24, so that the silicon semiconductor substrates 40 are transferred into the double-tubular structured process chamber 10 made of fused quartz. In addition, an inert gas atmosphere is formed in the process chamber 10 in advance, and the ambient temperature is maintained at 800° C. with the heater 14 in advance. Since, the silicon oxide layer is already formed on each silicon layer, surface roughening of the silicon layers can be prevented. Then, [Step-150] and [Step-160] in Example 1 can be carried out.

The following Table 5 shows preferred embodiments of processing of the selectively epitaxial growth (to which Table 5 refers as "Processing"), the first oxidation step, the second oxidation step and the heat treatment step.

TABLE 5

| Processing | First Oxidation step | Second oxidation step | Heat treatment step |
|---|---|---|---|
| Single | Single | Single | Single |
| Single | Single | Single | Batch |
| Single | Single | Batch | Batch |
| Single | Batch | Batch | Batch |
| Batch | Batch | Batch | Batch |
| Batch | Batch | Batch | Single |
| Batch | Batch | Single | Single |
| Batch | Single | Single | Single |

The substrate in Examples 11 and 12 includes substrates such as not only a silicon semiconductor substrate but also an underlayer on which a silicon layer is to be selectively formed. The silicon layer includes not only a single crystal silicon layer but also others such as a polysilicon layer and an amorphous silicon layer.

In the method of forming a silicon oxide layer in the Example 11 or 12, a silicon layer is selectively formed on a region not covered with an insulating layer, and then a silicon oxide layer is formed on the silicon layer without exposing the formed silicon layer to atmosphere. That is, a silicon layer is freshly formed on a surface of a substrate which may be contaminated or may include defects in many cases. As a result, the occurrence or the inclusion of contamination and defects in the formed silicon oxide layer can be effectively prevented. Further, since the formed silicon layer is not exposed to atmosphere, the occurrence of contamination on the surface of the silicon layer can be reliably prevented. Generally, a silicon oxide layer on a silicon single crystal layer epitaxially grown, for example, on a surface of a silicon semiconductor substrate has excellent properties, compared with a silicon oxide layer on the surface of a silicon semiconductor substrate produced, for example, by a pulling method, in the reliability of a silicon oxide layer. Further, for example, since a silicon layer is selectively formed on a region not covered with an insulating layer on a substrate after the formation of isolation regions and well ion implantation and channel stop ion implantation are carried out, the silicon layer is not at all affected by the contamination and defects caused when the isolation regions are formed and when the well ion implantation and the channel stop ion implantation are carried out, and the silicon oxide layer does not cause a decrease in reliability.

Meanwhile, since a very clean surface of a silicon layer which is selectively formed on a region not covered with an insulating layer on a substrate is susceptible, surface roughening (a concave or convex shape) may occur on the surface of silicon layer when a silicon oxide layer is formed on the silicon layer without any preparation. In the method of forming a silicon oxide layer in the present invention, while the atmosphere is maintained at a temperature at which no silicon atom is eliminated from the surface of the silicon layer, a silicon oxide layer is formed on the surface of the silicon layer. As a result, the occurrence of a concave or convex shape (roughening) on the silicon layer surface can be reliably prevented. Furthermore, when a silicon oxide layer is formed on a surface of a silicon layer by an oxidation method using wet gas, the finally formed silicon oxide layer contains no dry oxide layer, and such a silicon oxide layer has further superior properties.

The present invention has been explained with reference to preferred Examples, while the present invention shall not be limited to these Examples. Those various conditions and the structures of the apparatus for the formation of a silicon oxide layer explained in Examples have been given for illustrating examples and can be modified as required. The formation of a silicon oxide layer can use not only an oxidation method using pyrogenic gas, but also any one of an oxidation method using water vapor formed by heating pure water, an oxidation method using water vapor generated by bubbling hot pure water with oxygen gas or inert gas and a combination of these methods. The oxidation method in the first oxidation step and the oxidation method in the second oxidation step may be different. The oxidation method in the first process chamber and the oxidation method in the second process chamber may be different.

In [Step-140] in Example 1, for example, while inert gas such as nitrogen gas is introduced into the process chamber 10 through the gas inlet port 12, the ambient temperature in the process chamber 10 of the vertical-type processing apparatus is raised, with the heater 14, up to an ambient temperature for carrying out the second oxidation step. The above procedures may be replaced by the following procedures. That is, while inert gas such as nitrogen gas containing, for example, 0.1 vol % of hydrogen chloride gas is introduced into the process chamber 10 through the gas inlet port 12, the ambient temperature in the process chamber 10 may be raised, with the heater 14, up to an ambient temperature for carrying out the second oxidation step. Further, in [Step-730] in Example 7, while the introduction of wet gas into the process chamber 50 is continued, the ambient temperature in the process chamber 50 is raised, with the heating means, up to an ambient temperature for carrying out the second oxidation step. The above procedures may be replaced with the following procedures. That is, while wet gas containing, for example, 0.1 vol % of hydrogen chloride gas is introduced into the process chamber 50, the ambient temperature in the process chamber 50 is raised, with the heating means, up to an ambient temperature for carrying out the second oxidation step.

In Examples 1 to 10, while inert gas such as nitrogen gas is introduced into the process chamber through the gas inlet port, the ambient temperature in the process chamber is raised up to 850° C. with the heating means such as a heater. The above procedures may be replaced with the following procedures. That is, while inert gas such as nitrogen gas containing 0.1 vol % of hydrogen chloride gas is introduced into the process chamber through the gas inlet port, the ambient temperature in the process chamber is raised up to 850° C. with the heating means such as a heater.

In Examples, mostly, a silicon oxide layer is formed on a surface of a silicon semiconductor substrate, or a silicon oxide layer is formed on an epitaxial silicon layer which formed on a silicon semiconductor substrate by selectively epitaxial growth, while a silicon oxide layer may be formed on the surface of a polysilicon layer or an amorphous silicon layer which is formed on an insulating layer formed on a substrate. Alternatively, a silicon oxide layer may be formed on a surface of a silicon layer in an SOI structure, or it may be formed on a surface of a substrate on which a semiconductor device or a semiconductor device component has been formed, or a surface of a silicon layer formed thereon. Further, a silicon oxide layer may be formed on a surface of a silicon layer formed on a substrate on which a semiconductor device or a semiconductor device component has been formed, or formed on an insulating underlayer formed thereon. The heat treatment after the formation of a silicon oxide layer is not essential, and may be omitted in some cases.

Figure 64:
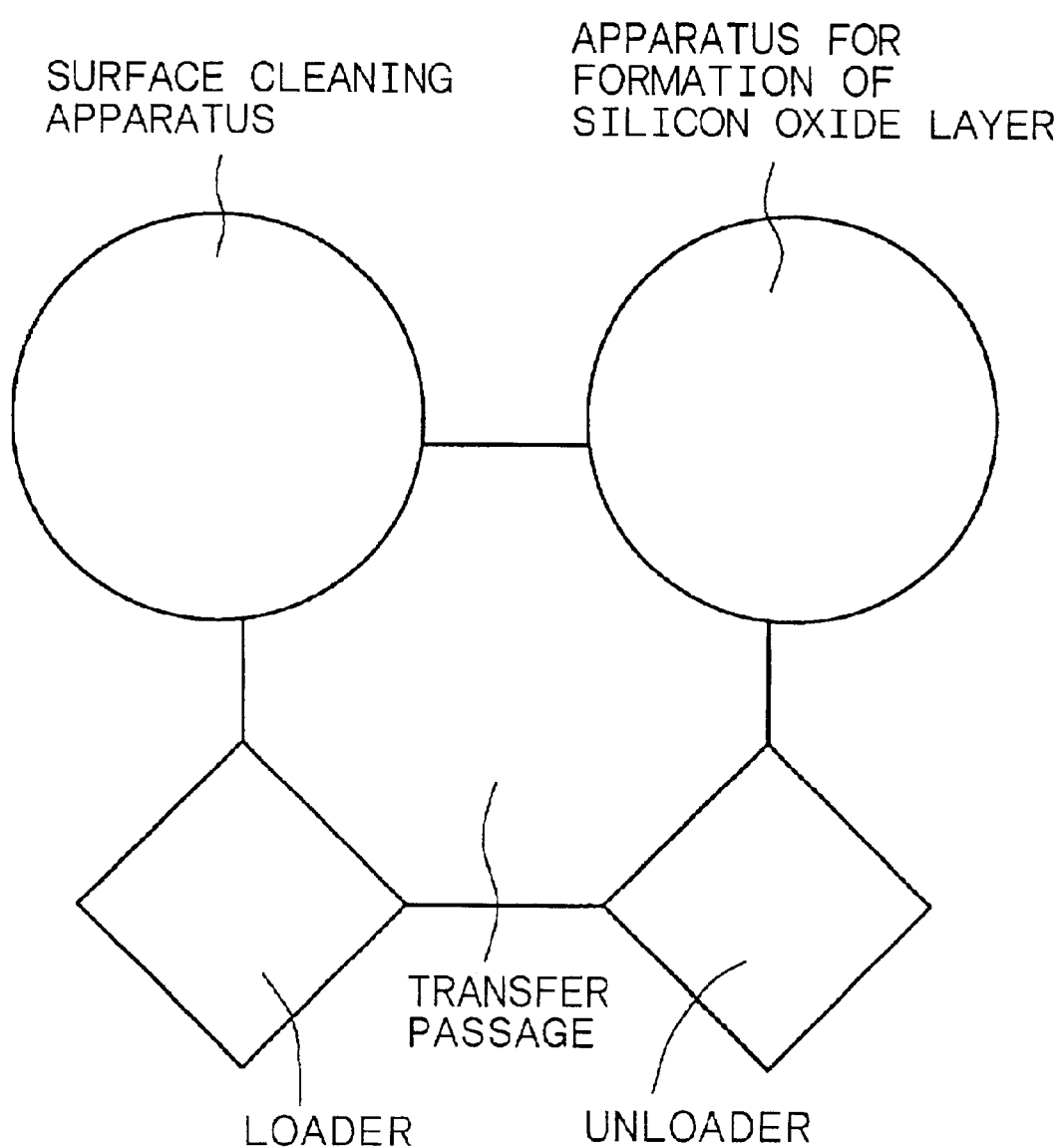
FIG. 64 conceptually shows a multichamber cluster.

In Examples 1 to 10, a silicon semiconductor substrate 40 is transferred into the apparatus for the formation of a silicon oxide layer after the silicon semiconductor substrate 40 is surface-cleaned with a 0.1% hydrofluoric acid aqueous solution and then with pure water, while the atmosphere from the surface cleaning of the silicon semiconductor substrate 40 to the transfer thereof into the apparatus for the formation of a silicon oxide layer may be an atmosphere of inert gas such as nitrogen gas. The above atmosphere can be attained, for example, by a method in which the silicon semiconductor substrate is surface-cleaned in an inert gas atmosphere, is encased in a transfer box filled with inert gas, and then is transferred into the substrate transfer portion 20 or the process chamber 50, or by a method in which, as conceptually shown in FIG. 64, a multichamber cluster having a surface cleaning apparatus, an apparatus for the formation of a silicon oxide layer, a transfer passage, a loader and an unloader is used. In this case, the surface cleaning apparatus for a silicon semiconductor substrate and the substrate transfer portion 20 or the process chamber 50 are connected with the transfer passage and the surface cleaning apparatus and the transfer passage are arranged to have an inert gas atmosphere.

Further, in place of cleaning a surface of a silicon layer with the 0.1% hydrofluoric acid aqueous solution and then with pure water, a silicon layer may be surface-cleaned by a gaseous phase cleaning method using an anhydrous hydrogen fluoride gas under conditions shown in Table 6. Methanol is added for preventing the occurrence of particles in the anhydrous hydrogen fluoride gas. Alternatively, a silicon layer may be surface-cleaned by a gaseous phase cleaning method using hydrogen chloride gas under conditions shown in Table 7. The atmosphere in the surface cleaning apparatus and the atmosphere in the transfer passage before the initiation, or after the completion, of surface cleaning of the silicon layer may be an inert gas atmosphere or an atmosphere under vacuum, for example, of about $1.3 \times 10^{-1}$ Pa ($10^{-3}$ Torr). When the atmosphere in the transfer passage is an atmosphere under vacuum, the atmosphere in the substrate transfer portion 20 or the process chamber 50 is an atmosphere under vacuum, for example, of about $1.3 \times 10^{-1}$ Pa ($10^{-3}$ Torr) when the silicon layer is introduced thereinto. After the transfer of the silicon layer thereinto is completed, the atmosphere in the substrate transfer portion 20 or the process chamber 50 may be adjusted to an atmosphere of inert gas such as nitrogen gas under atmospheric pressure.

TABLE 6

| Anhydrous hydrogen fluoride gas: | 300 sccm |
| Methanol vapor: | 80 sccm |
| Nitrogen gas: | 1,000 sccm |
| Pressure: | 0.3 Pa |
| Temperature: | 60° C. |

TABLE 7

| Hydrogen chloride gas/nitrogen gas: | 1 vol % |
| Temperature: | 800° C. |

As an apparatus for the formation of a silicon oxide layer in the above cases, there may be used the apparatus shown in FIGS. 13, 31 or 32 or FIGS. 65 or 66 to be described later. The surface of the silicon layer terminated with hydrogen and fluorine can be therefore maintained in a state free of contamination, etc., before the formation of a silicon oxide layer, and as a result, the degradation of properties of the formed silicon oxide layer and occurrence of a defective portion therein, caused by including water, an organic substance or Si—OH, can be effectively prevented.

Figure 65:
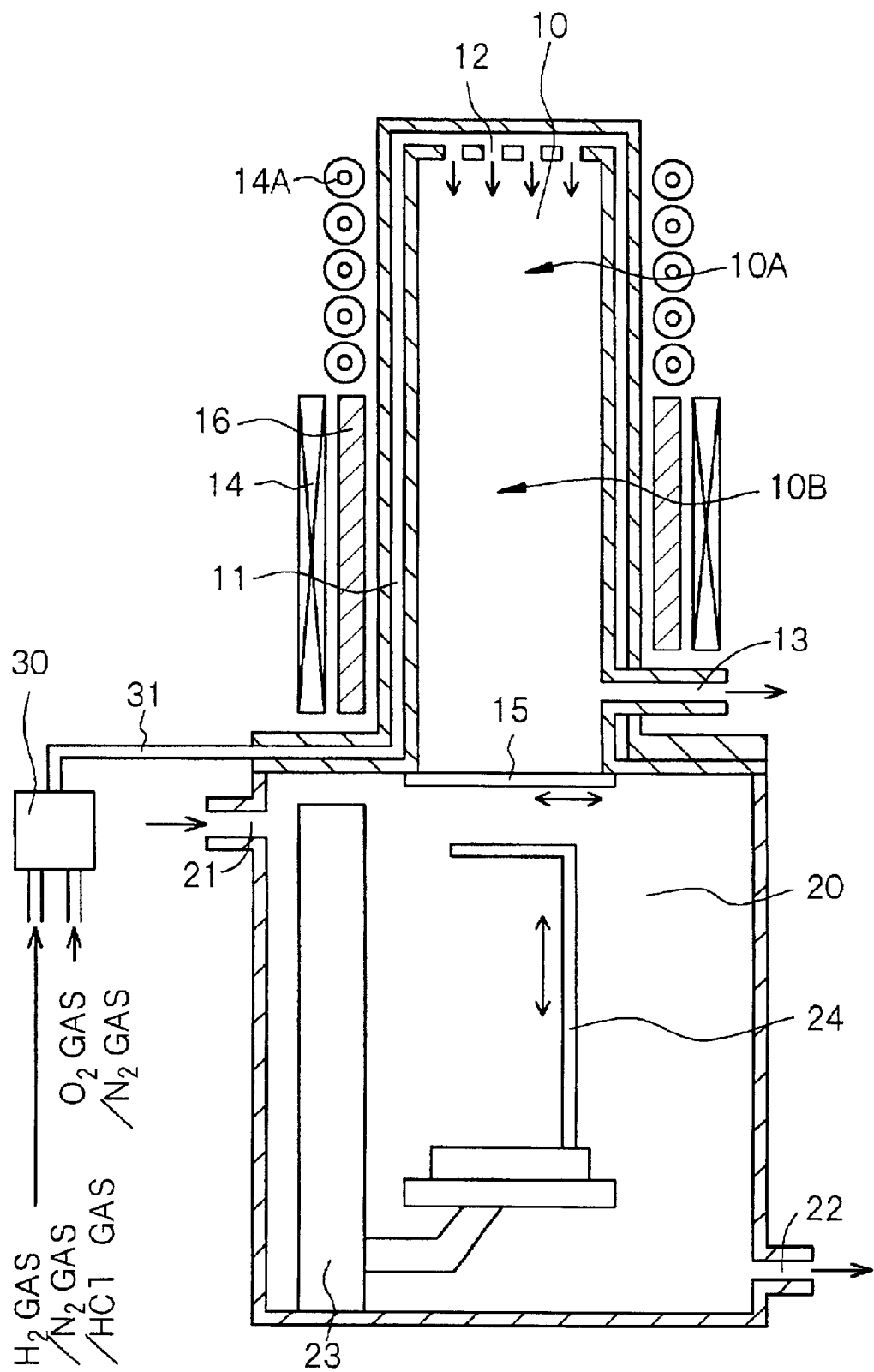
FIG. 65 shows a schematic cross section of a vertical-type processing apparatus, which is different, to some extent, from the vertical-type processing apparatus shown in FIG. 13.

FIG. 65 shows a schematic cross section of a vertical-type processing apparatus having somewhat different structure from that of the vertical-type processing apparatus shown in FIG. 13. As shown in FIG. 65, the process chamber 10 has an upper region 10A and a lower region 10B. The ambient temperature in the lower region 10B is controlled with a heater 14. On the other hand, disposed outside the upper region 10A are a plurality of lamps 14A which emit infrared light or visible light. And, in a step similar to [Step-130] in Example 1, the first oxidation step by an oxidation method using wet gas is carried out, while the atmosphere is maintained at a temperature at which no silicon atom is eliminated from the surface of the silicon layer. This formation of the silicon oxide layer is carried out in the lower region 10B of the process chamber 10. At this time, the ambient temperature in the upper region 10A is maintained at 400° C. with the lamps 14A. Then, in a step similar to [Step-140] in Example 1, the introduction of the wet gas into the process chamber 10 is terminated, and while inert gas such as nitrogen gas is introduced into the process chamber 10 through the gas inlet port 12, the ambient temperature in the upper region 10A of the process chamber 10 is raised, with the lamps 14A, up to an ambient temperature for the second oxidation step. Then, the elevator unit 23 is actuated to elevate the fused quartz boat 24, so that silicon semiconductor substrates 40 are transferred to the upper region 10A of the process chamber 10. And, in a step similar to [Step-150] in Example 1, the second oxidation step by an oxidation method using pyrogenic gas is carried out. Then, in a step similar to [Step-160] in Example 1, the introduction of the wet gas is terminated, and while inert gas such as nitrogen gas is introduced into the process chamber 10 through the gas inlet port 12, the ambient temperature in the upper region 10A of the process chamber 10 is raised up to 850° C. with the lamps 14A. Then, inert gas such as nitrogen gas containing 0.1 vol % of hydrogen chloride gas is introduced into the process chamber 10 through the gas inlet port 12, and the heat treatment is carried out in the upper region 10A of the process chamber 10 for 30 minutes.

Figure 66:
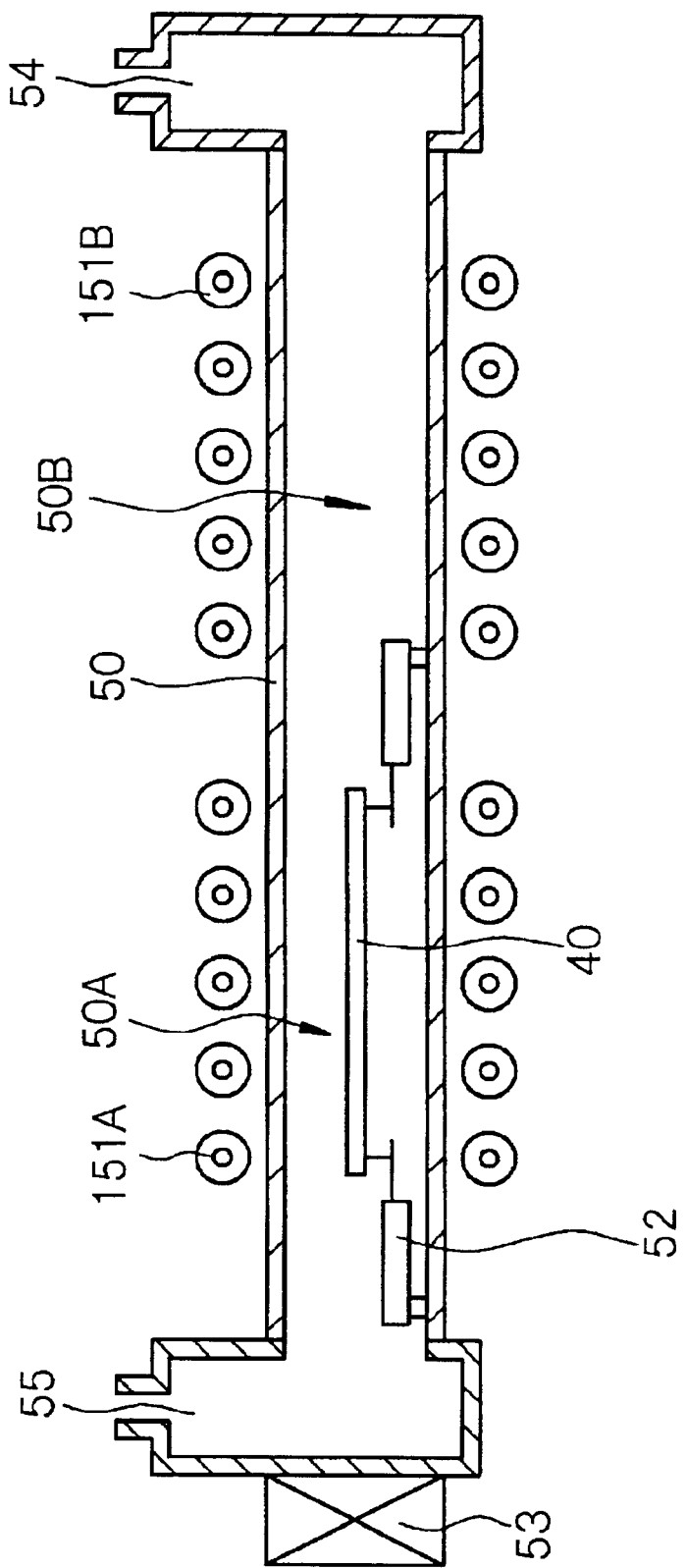
FIG. 66 shows a schematic cross section of a horizontal-type processing apparatus, which is different, to some extent, from the horizontal-type processing apparatus shown in FIG. 32.

FIG. 66 shows a horizontal-type processing apparatus having a structure somewhat different from that of the horizontal-type processing apparatus shown in FIG. 32. As shown in FIG. 66, the process chamber 50 has a first region 50A and a second region 50B, and the ambient temperatures of the first region 50A and the second region 50B are controlled with lamps 151A and lamps 151B, respectively. And, in a step similar to [Step-720] in Example 7, the first oxidation step is carried out by an oxidation method using wet gas in the first region 50A of the process chamber 50 in a state in which the atmosphere is maintained at a temperature at which no silicon atom is eliminated from the surface of the silicon layer. The ambient temperature in the first region 50A is controlled with the lamps 151A, and at this time, the ambient temperature in the second region 50B is maintained at 400° C. with the lamps 151B. Then, in a step similar to the [Step-730] in Example 7, while wet gas is introduced into the process chamber 50, the ambient temperature in the second region 50B of the process chamber 50 is raised, with the lamps 151B, up to an ambient temperature for the second oxidation step, and the silicon layer, for example, the silicon semiconductor substrate is transferred to the second region 50B. Then, in a step similar to [Step-740], while the ambient temperature in the second region 50B of the process chamber 50 is maintained at the above temperature with the lamps 151B, the second oxidation step is further carried out by an oxidation method using wet gas. Then, in a step similar to [Step-750], the introduction of the wet gas is terminated, and while inert gas such as nitrogen gas is introduced into the process chamber 50 through the gas inlet port 54, the ambient temperature in the second region 50B of the process chamber 50 is raised up to 850° C. with the lamps 151B. Then, inert gas such as nitrogen gas containing 0.1 vol % of hydrogen chloride gas is introduced into the process chamber 50 through the gas inlet port 54, and the heat treatment is carried out for 5 minutes. The lamps used in the processing apparatus shown in FIG. 66 may be replaced with a resistance heating type heater shown in FIG. 31.

With regard to the preferred first embodiment of the present invention, Table 8 shows combinations of the atmosphere in the first oxidation step (to which Table 8 refers as "first oxidation step"), the atmosphere in the heating-up step, the atmosphere in the second oxidation step (to which Table 8 refers as "second oxidation step"), and the atmosphere in the step of raising the ambient temperature for heat-treating the formed silicon oxide layer (to which Table 8 refers as "temperature raising step"). With regard to the preferred second embodiment of the present invention, the atmosphere in the first oxidation step, the atmosphere in the second oxidation step and the atmosphere in the step of raising the ambient temperature for heat-treating the formed silicon oxide layer may be combined as shown in Table 8 except the heating-up step. In Table 8, a wet gas atmosphere is referred to as "wet gas", a wet gas containing a halogen element is referred to as "*wet gas", an inert gas atmosphere is referred to as "inert gas", and an inert gas atmosphere containing a halogen element is referred to as "*inert gas". Various combinations of atmospheres shown in Table 8 can be accomplished by using the apparatus for the formation of a silicon oxide layer shown in FIGS. 13 or 65, the apparatus for the formation of a silicon oxide layer shown in FIGS. 31, 32 or 66 or combining these processing apparatus or by using the multichamber cluster shown in FIGS. 58 or 64. The wet gas atmosphere or the wet gas atmosphere containing a halogen element may be diluted with inert gas.

TABLE 8

| First oxidation step | Heating-up step | Second oxidation step | Temperature raising step |
|---|---|---|---|
| Wet gas | Inert gas | Wet gas | Inert gas |
| Wet gas | Inert gas | Wet gas | *Inert gas |
| Wet gas | Inert gas | *Wet gas | Inert gas |
| Wet gas | Inert gas | *Wet gas | *Inert gas |
| Wet gas | *Inert gas | Wet gas | Inert gas |
| Wet gas | *Inert gas | Wet gas | *Inert gas |
| Wet gas | *Inert gas | *Wet gas | Inert gas |
| Wet gas | *Inert gas | *Wet gas | *Inert gas |
| Wet gas | Wet gas | Wet gas | Inert gas |
| Wet gas | Wet gas | Wet gas | *Inert gas |
| Wet gas | Wet gas | *Wet gas | Inert gas |
| Wet gas | Wet gas | *Wet gas | *Inert gas |
| Wet gas | *Wet gas | Wet gas | Inert gas |
| Wet gas | *Wet gas | Wet gas | *Inert gas |
| Wet gas | *Wet gas | *Wet gas | Inert gas |
| Wet gas | *Wet gas | *Wet gas | *Inert gas |
| *Wet gas | Inert gas | Wet gas | Inert gas |
| *Wet gas | Inert gas | Wet gas | *Inert gas |
| *Wet gas | Inert gas | *Wet gas | Inert gas |
| *Wet gas | Inert gas | *Wet gas | *Inert gas |
| *Wet gas | *Inert gas | Wet gas | Inert gas |
| *Wet gas | *Inert gas | Wet gas | *Inert gas |
| *Wet gas | *Inert gas | *Wet gas | Inert gas |
| *Wet gas | *Inert gas | *Wet gas | *Inert gas |
| *Wet gas | Wet gas | Wet gas | Inert gas |
| *Wet gas | Wet gas | Wet gas | *Inert gas |
| *Wet gas | Wet gas | *Wet gas | Inert gas |
| *Wet gas | Wet gas | *Wet gas | *Inert gas |
| *Wet gas | *Wet gas | Wet gas | Inert gas |
| *Wet gas | *Wet gas | Wet gas | *Inert gas |
| *Wet gas | *Wet gas | *Wet gas | Inert gas |
| *Wet gas | *Wet gas | *Wet gas | *Inert gas |

When inert gas such as nitrogen gas is introduced into the substrate transfer portion 20 shown in FIG. 13 or FIG. 65, the inert gas may be heated up to a temperature, for example, of between 100° C. and 300° C. in advance. Alternatively, heating means may be disposed in or outside the substrate transfer portion 20 for heating the inert gas such as nitrogen gas introduced into the substrate transfer portion 20, for example, up to a temperature of between 100° C. and 300° C. The above arrangement can reliably prevent the condensation of the wet gas on a silicon layer, which wet gas flows into the substrate transfer portion 20 from the process chamber 10 when a silicon semiconductor substrates 40 are transferred into the process chamber 10 from the substrate transfer portion 20. As a result, formation of a water mark or formation of a silicon oxide layer having a non-uniform thickness can be reliably prevented.

Figure 67:
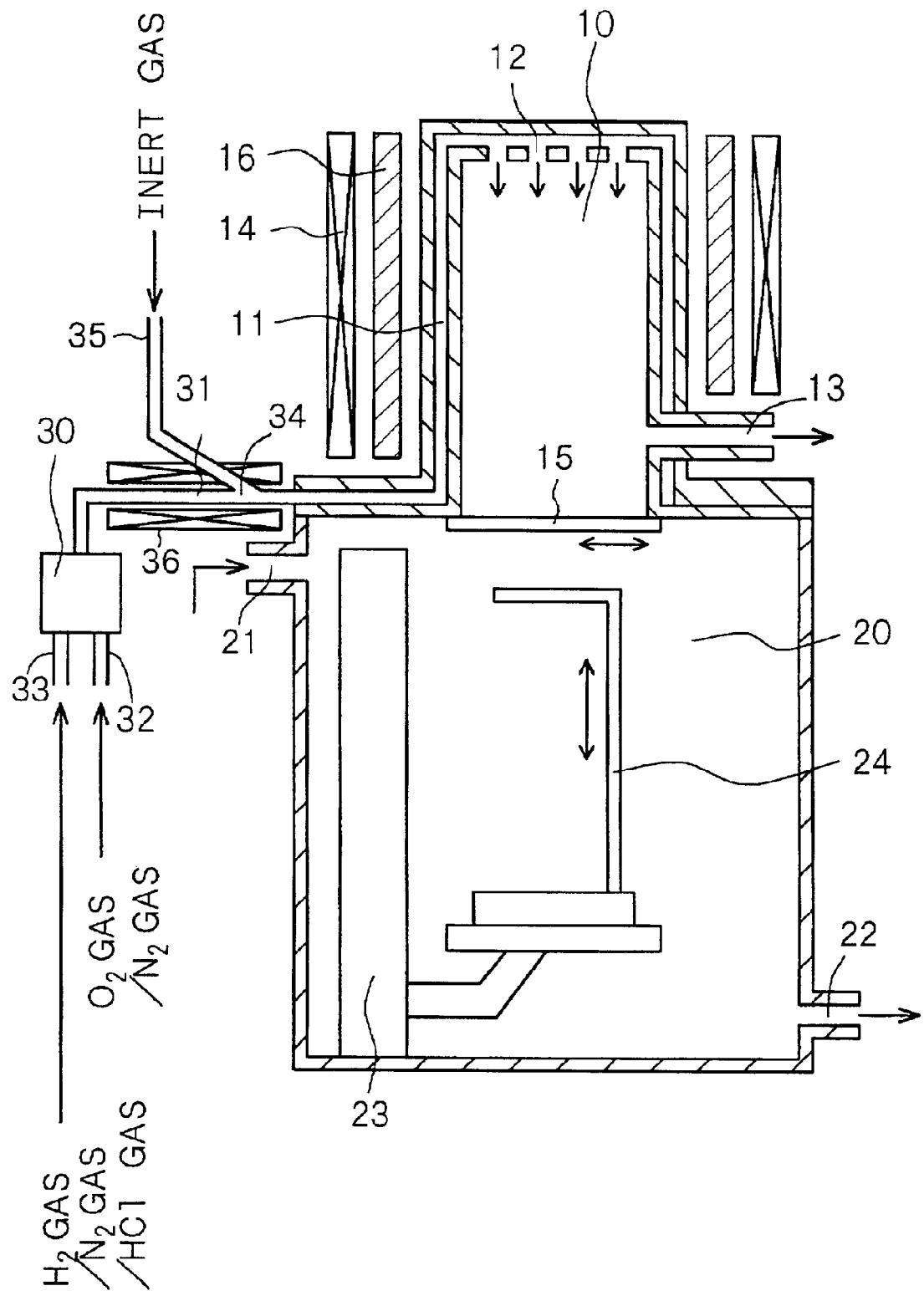
FIG. 67 shows a schematic cross section of a vertical-type processing apparatus, fabricated by modifying the vertical-type processing apparatus shown in FIG. 13.

In the formation of a silicon oxide layer, when the wet gas is diluted with inert gas such as nitrogen gas, the apparatus for the formation of a silicon oxide layer shown in FIG. 13 can be modified to an apparatus for the formation of a silicon oxide layer as shown in FIG. 67 for attaining stable dilution. The dilution of the wet gas with inert gas can serve to prevent the sharp or sudden formation of a silicon oxide layer, and excellent controlling of thickness of a silicon oxide layer can be achieved, so that a silicon oxide layer having a very small thickness can be more reliably formed.

The vertical-type processing apparatus shown in FIG. 67 basically has the same structure as that of the vertical-type processing apparatus shown in FIG. 13. The vertical-type processing apparatus shown in FIG. 67 differs from the vertical-type processing apparatus shown in FIG. 13 in the following point. That is, an inert gas introducing portion 34 is disposed in the piping 31 connecting the combustion chamber 30 and the process chamber 10, and a piping 35 is attached to the inert gas introducing portion 34 for introducing inert gas such as nitrogen gas. Further, the piping 31 including the inert gas introducing portion 34 is provided with a heater 36 as heating means of preventing the condensation of water vapor generated in the combustion chamber 30 before the water vapor reaches the process chamber 10. Preferably, the piping 31 is provided with the inert gas introducing portion 34 so that the inert gas flowing into the piping 31 through the inert gas introducing portion 34 does not flow into the combustion chamber 30 side. Specifically, the flow direction of the inert gas in the inert gas introducing portion 34, which inert gas is flowing in the piping 35, and the flow direction of the gas in the inert gas introducing portion 34, which gas is flowing from the combustion chamber 30, cross each other at an acute angle.

As explained already, in the formation of a silicon oxide layer by an oxidation method using pyrogenic gas, oxygen gas is introduced into the combustion chamber 30 through the piping 32 before the supply of hydrogen gas into the combustion chamber 30 through the piping 33, for preventing the detonating gas reaction caused by the flow of incomplete-combusted hydrogen gas into the process chamber 10 before the introduction of water vapor into the process chamber 10. As a result, the oxygen gas flows into the process chamber 10 through the piping 31, the gas passage 11 and the gas inlet port 12. An undesirable silicon layer may be formed on a surface of a silicon layer due to the above flow of oxygen gas into the process chamber 10.

The above phenomenon can be reliably prevented as follows. For example, before the formation of a silicon oxide layer, inert gas is supplied to the process chamber having an inert gas atmosphere maintained at a temperature at which no silicon atom is eliminated from the surface of the silicon layer, at least before the supply of oxygen gas into the combustion chamber is initiated and until water vapor is generated in the combustion chamber by the supply of hydrogen gas into the combustion chamber and is introduced into the process chamber. The above procedures can sufficiently decrease the concentration of oxygen gas which is to contact the silicon layer before the formation of a silicon oxide layer with the water vapor, and the formation of a dry oxide layer with the oxygen gas can be reliably inhibited.

In the preferred first embodiment of the present invention including the first oxidation step, the heating-up step and the second oxidation step based on an oxidation method using pyrogenic gas, FIGS. 68 to 81 schematically show sequences of the introduction of inert gas into the process chamber before the formation of a silicon oxide layer and sequence of the introduction of oxygen gas, hydrogen gas and inert gas in the formation of a silicon oxide layer. In the Figures, "ON" and "OFF" of each of inert gas, oxygen gas and hydrogen gas stand for the introduction or non-introduction of each gas into the process chamber or the combustion chamber.

Figure 68:
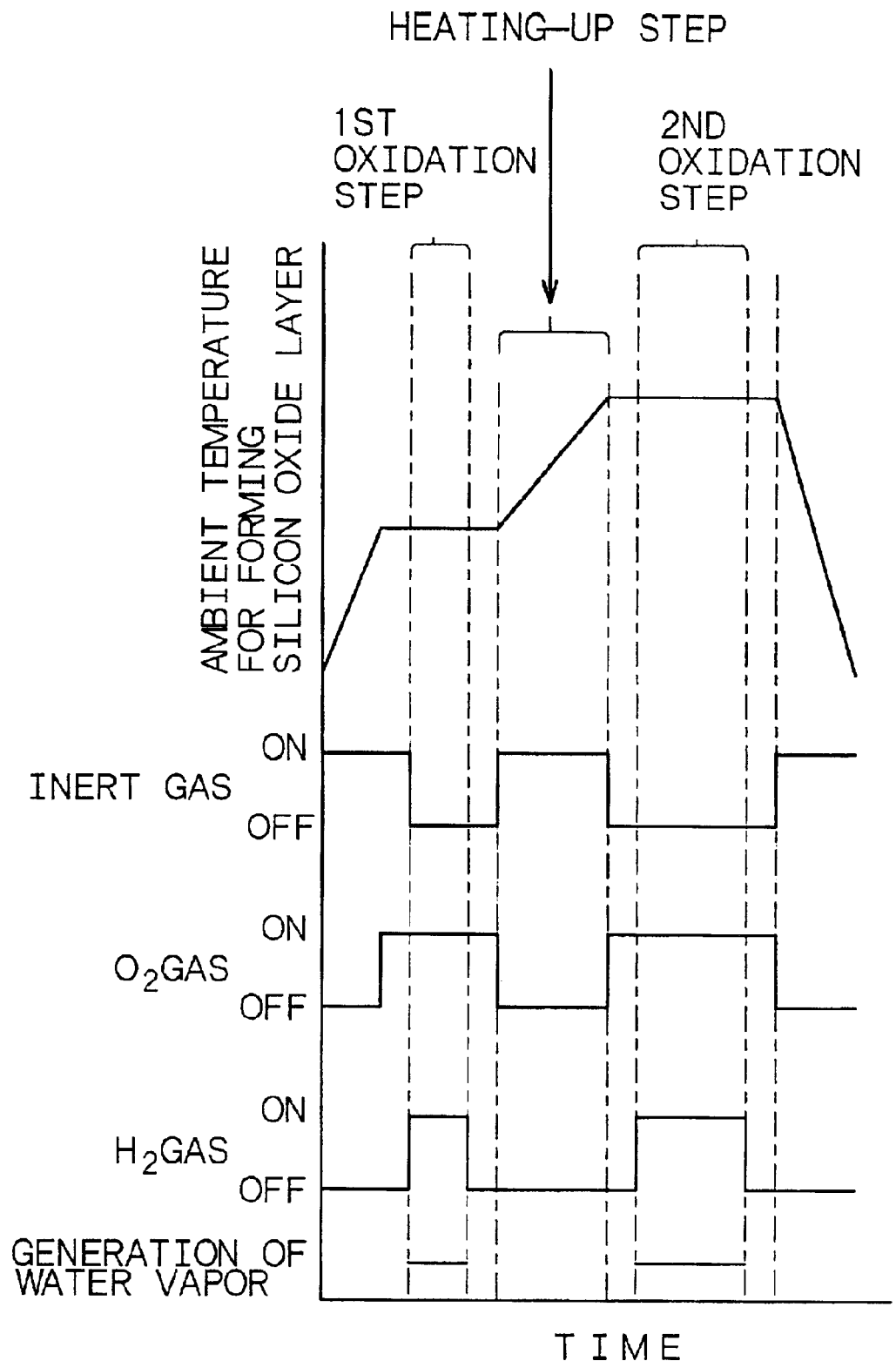
FIG. 68 schematically shows an introduction sequence of inert gas, oxygen gas and hydrogen gas in the method of forming a silicon oxide layer according to the present invention.
Figure 69:
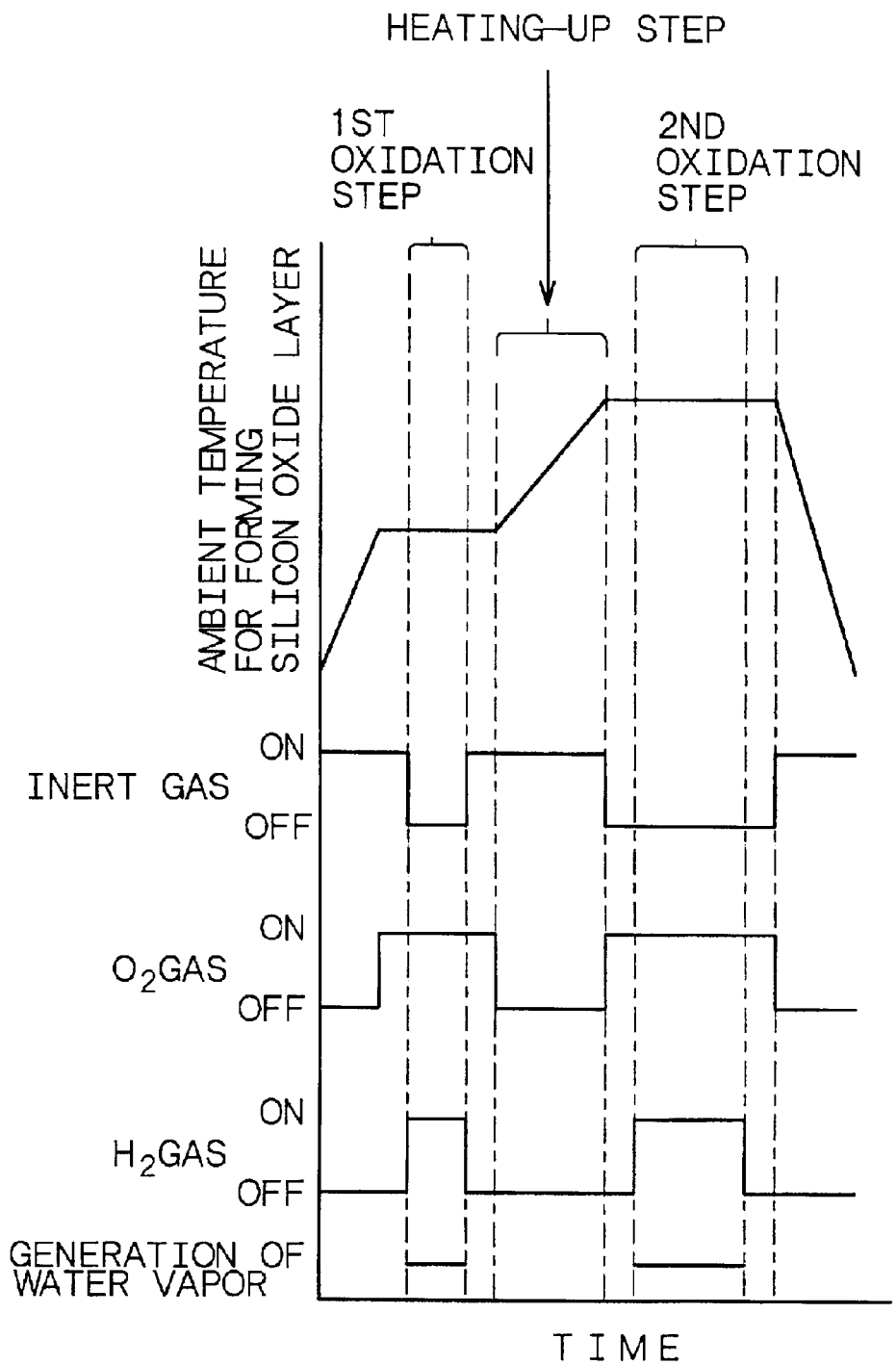
FIG. 69 schematically shows an introduction sequence of inert gas, oxygen gas and hydrogen gas in the method of forming a silicon oxide layer according to the present invention.
Figure 70:
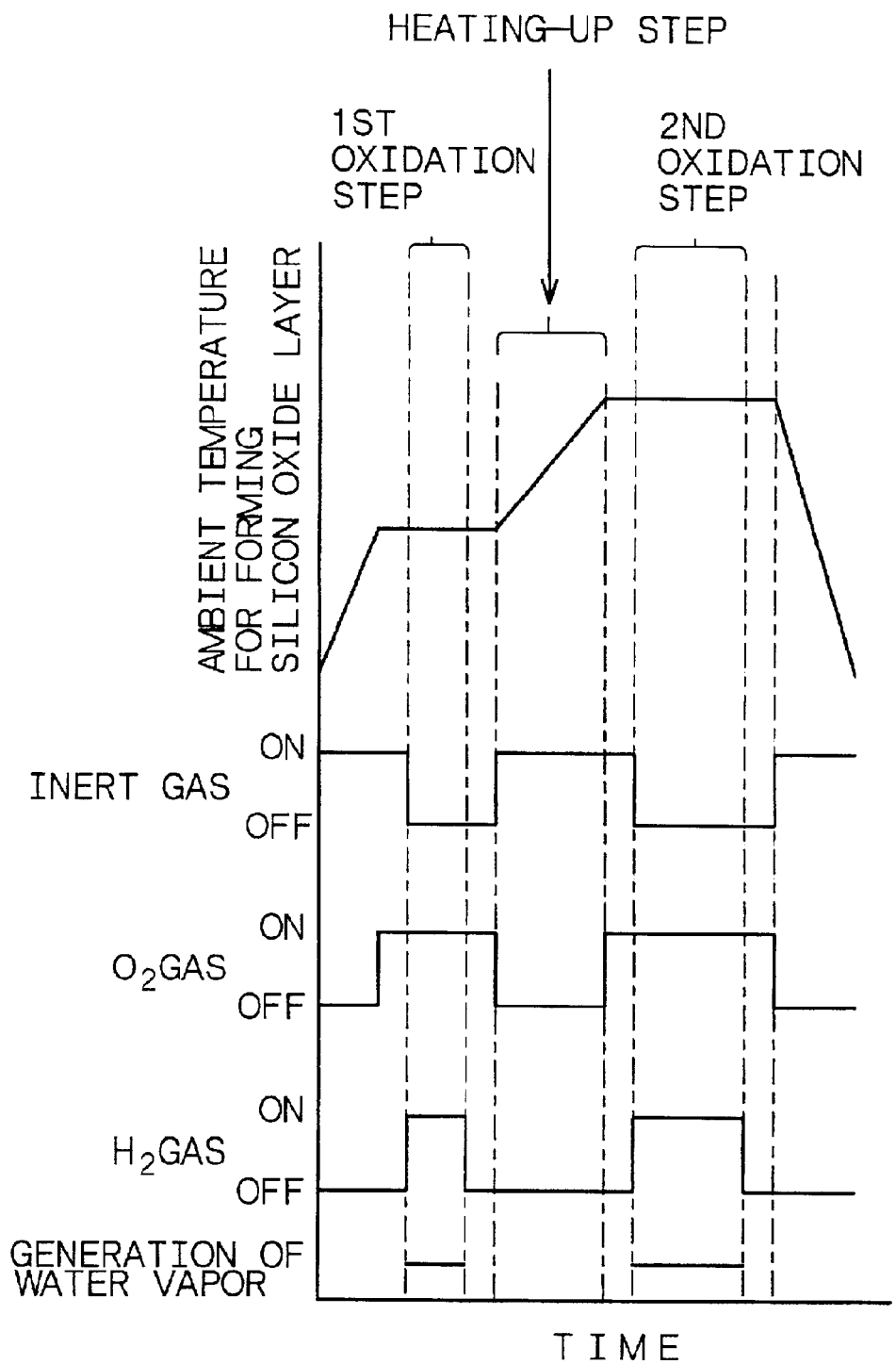
FIG. 70 schematically shows an introduction sequence of inert gas, oxygen gas and hydrogen gas in the method of forming a silicon oxide layer according to the present invention.
Figure 71:
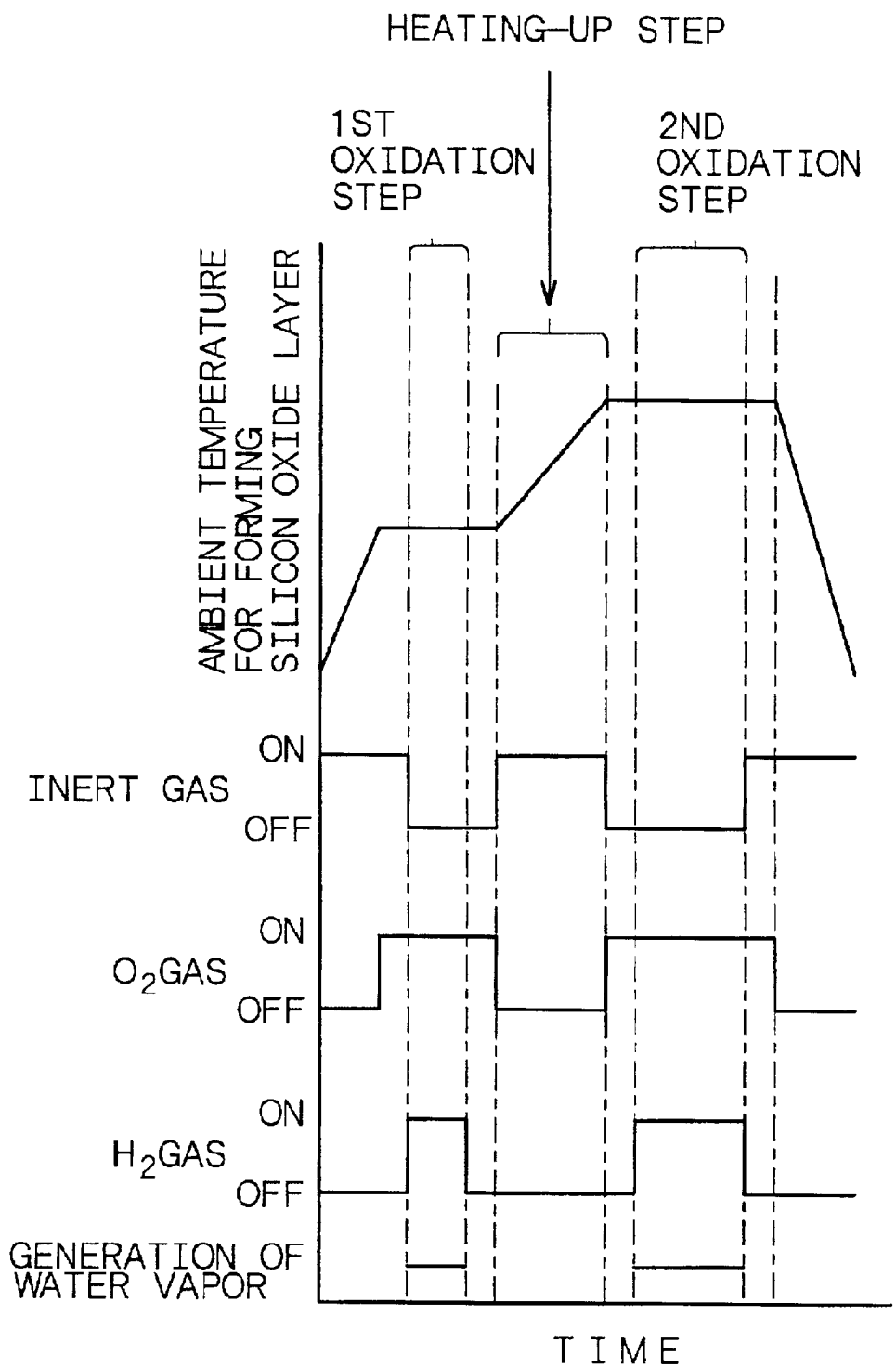
FIG. 71 schematically shows an introduction sequence of inert gas, oxygen gas and hydrogen gas in the method of forming a silicon oxide layer according to the present invention.
Figure 72:
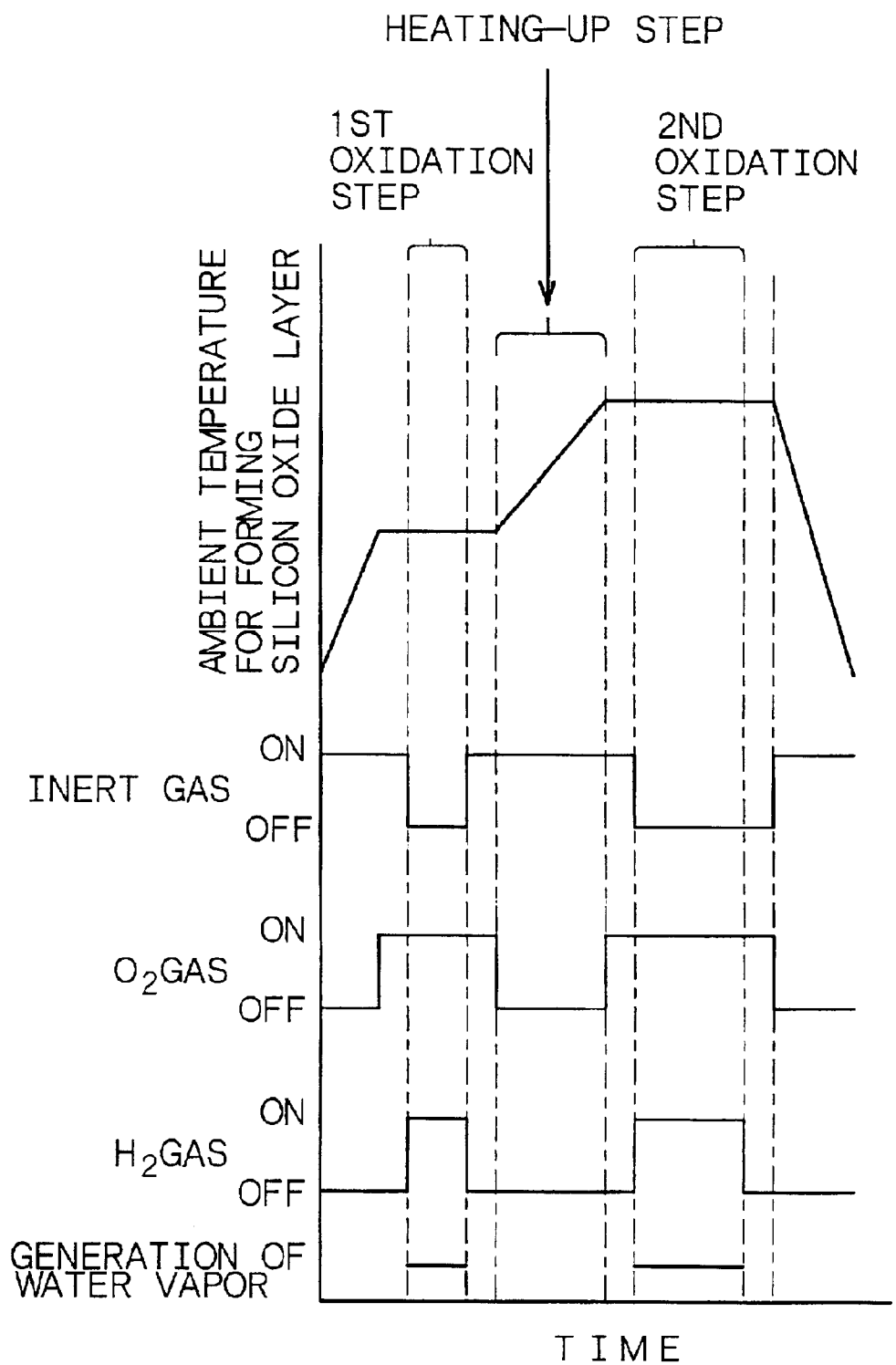
FIG. 72 schematically shows an introduction sequence of inert gas, oxygen gas and hydrogen gas in the method of forming a silicon oxide layer according to the present invention.
Figure 73:
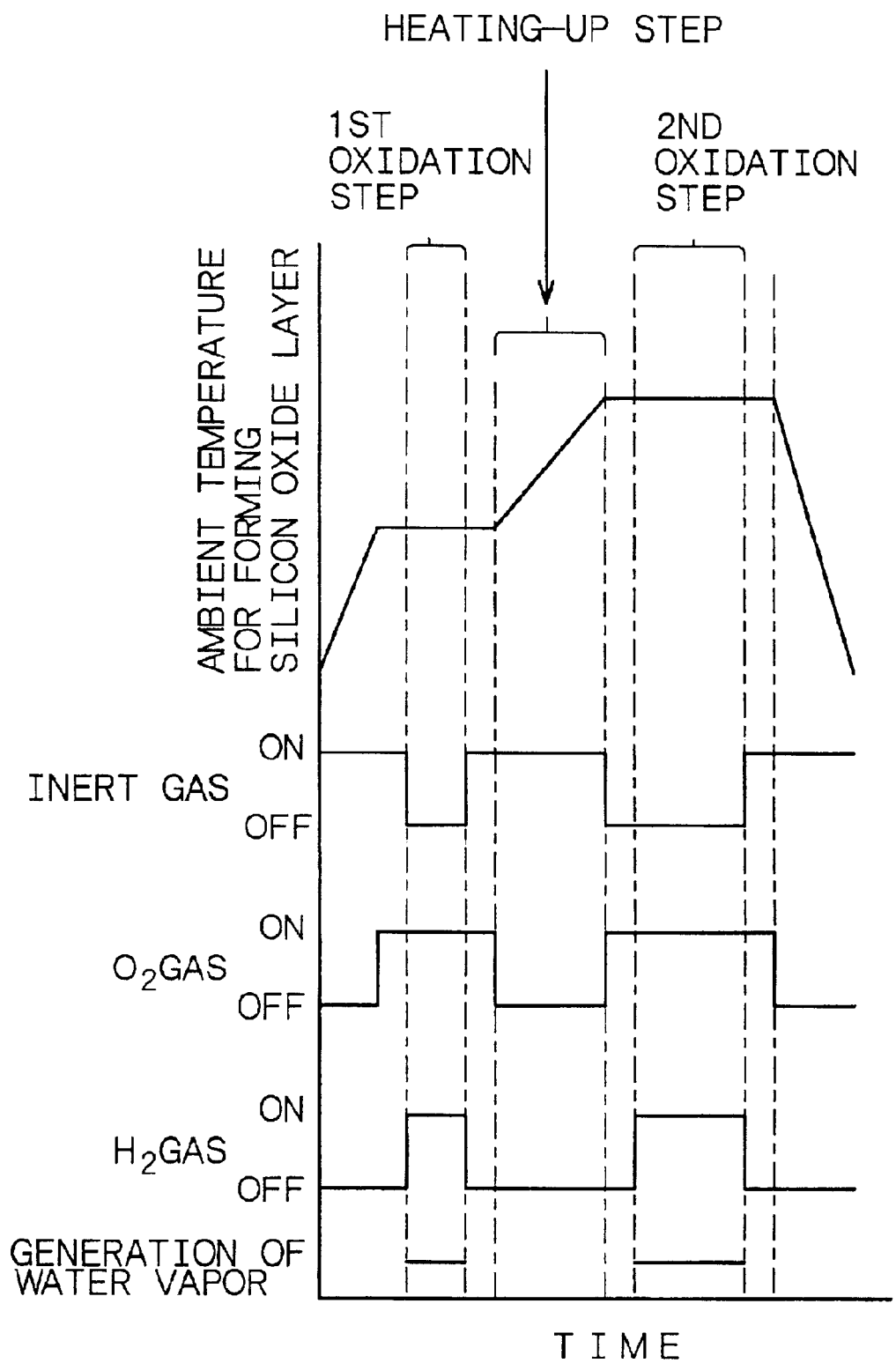
FIG. 73 schematically shows an introduction sequence of inert gas, oxygen gas and hydrogen gas in the method of forming a silicon oxide layer according to the present invention.
Figure 74:
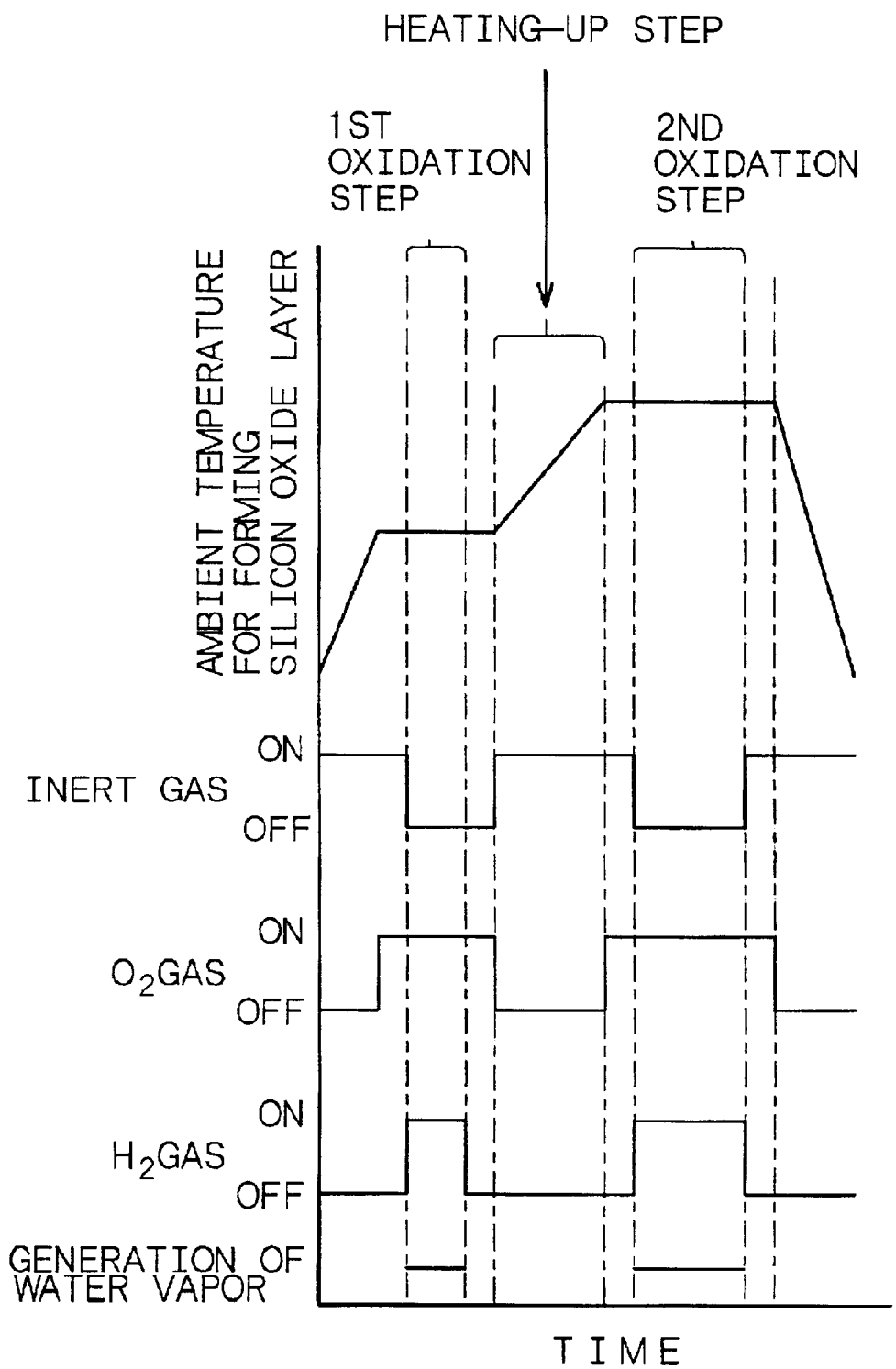
FIG. 74 schematically shows an introduction sequence of inert gas, oxygen gas and hydrogen gas in the method of forming a silicon oxide layer according to the present invention.

In the gas introduction sequence shown in FIG. 68, the inert gas is introduced into the process chamber before the formation of a silicon oxide layer and is also introduced into the process chamber in the heating-up step. In the gas introduction sequence shown in FIG. 69, after the formation of a silicon oxide layer in the first step is completed and after the introduction of hydrogen gas into the combustion chamber is terminated, the inert gas is introduced into the process chamber for a predetermined period of time while oxygen gas is supplied to the combustion chamber. In the gas introduction sequence shown in FIG. 70, before the further formation of the silicon oxide layer with water vapor in the second oxidation step, and at least after the supply of oxygen gas into the combustion chamber is initiated, the inert gas is introduced into the process chamber until water vapor is generated in the combustion chamber by the supply of hydrogen gas to the combustion chamber and is introduced into the process chamber. In the gas introduction sequence shown in FIG. 71, after the silicon oxide layer is formed on the surface of the silicon layer in the second oxidation step and after the supply of hydrogen gas into the combustion chamber is terminated, the inert gas is introduced into the process chamber for a predetermined period of time while oxygen gas is supplied to the combustion chamber. FIG. 72 shows a combination of the gas introduction sequences shown in FIGS. 69 and 70. FIG. 73 also shows a combination of the gas introduction sequences shown in FIGS. 69 and 71. Further, FIG. 74 shows a combination of the gas introduction sequences shown in FIGS. 70 and 71. Further, FIG. 75 shows a combination of the gas introduction sequences shown in FIGS. 69, 70 and 71.

Figure 75:
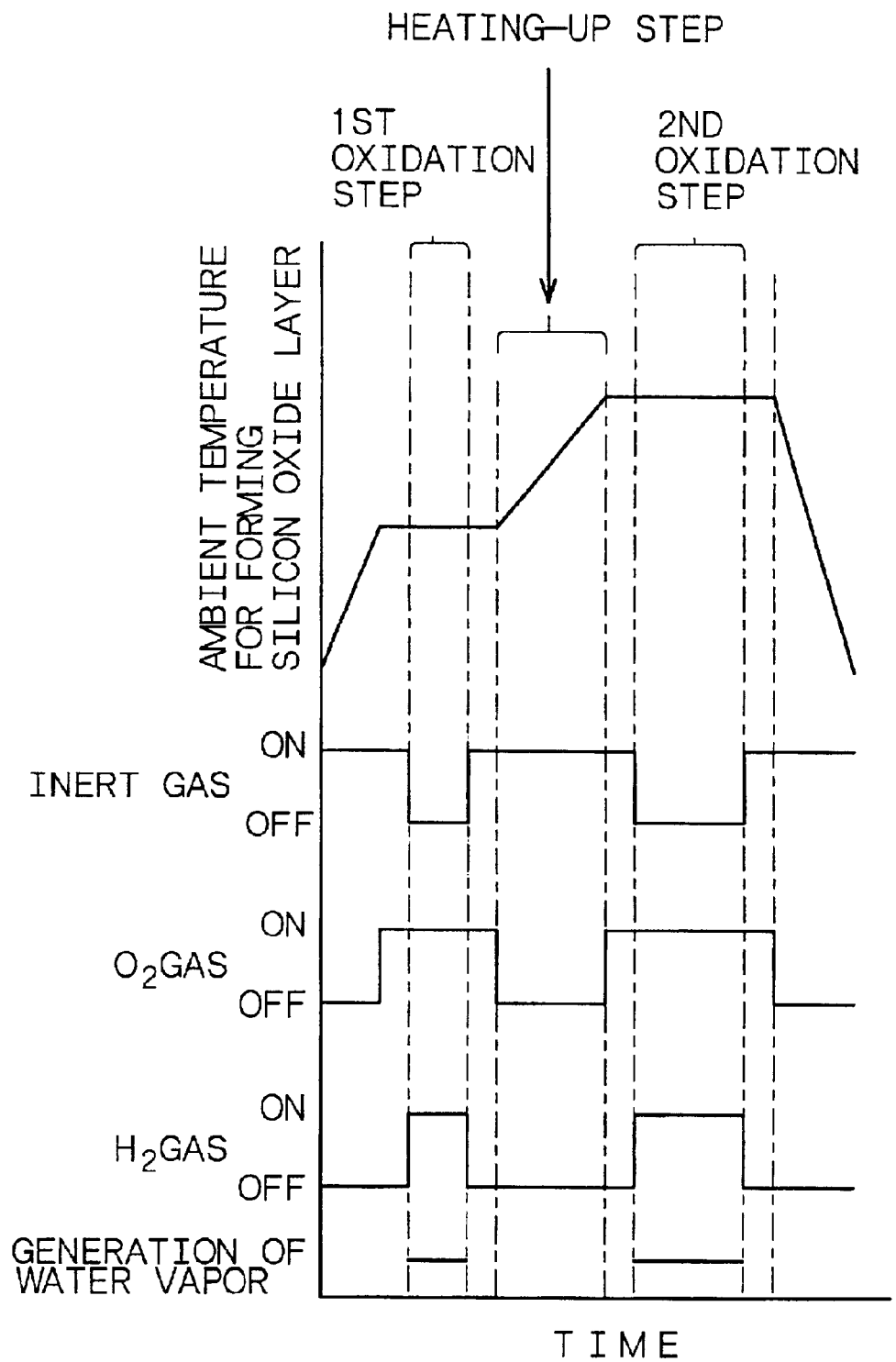
FIG. 75 schematically shows an introduction sequence of inert gas, oxygen gas and hydrogen gas in the method of forming a silicon oxide layer according to the present invention.
Figure 76:
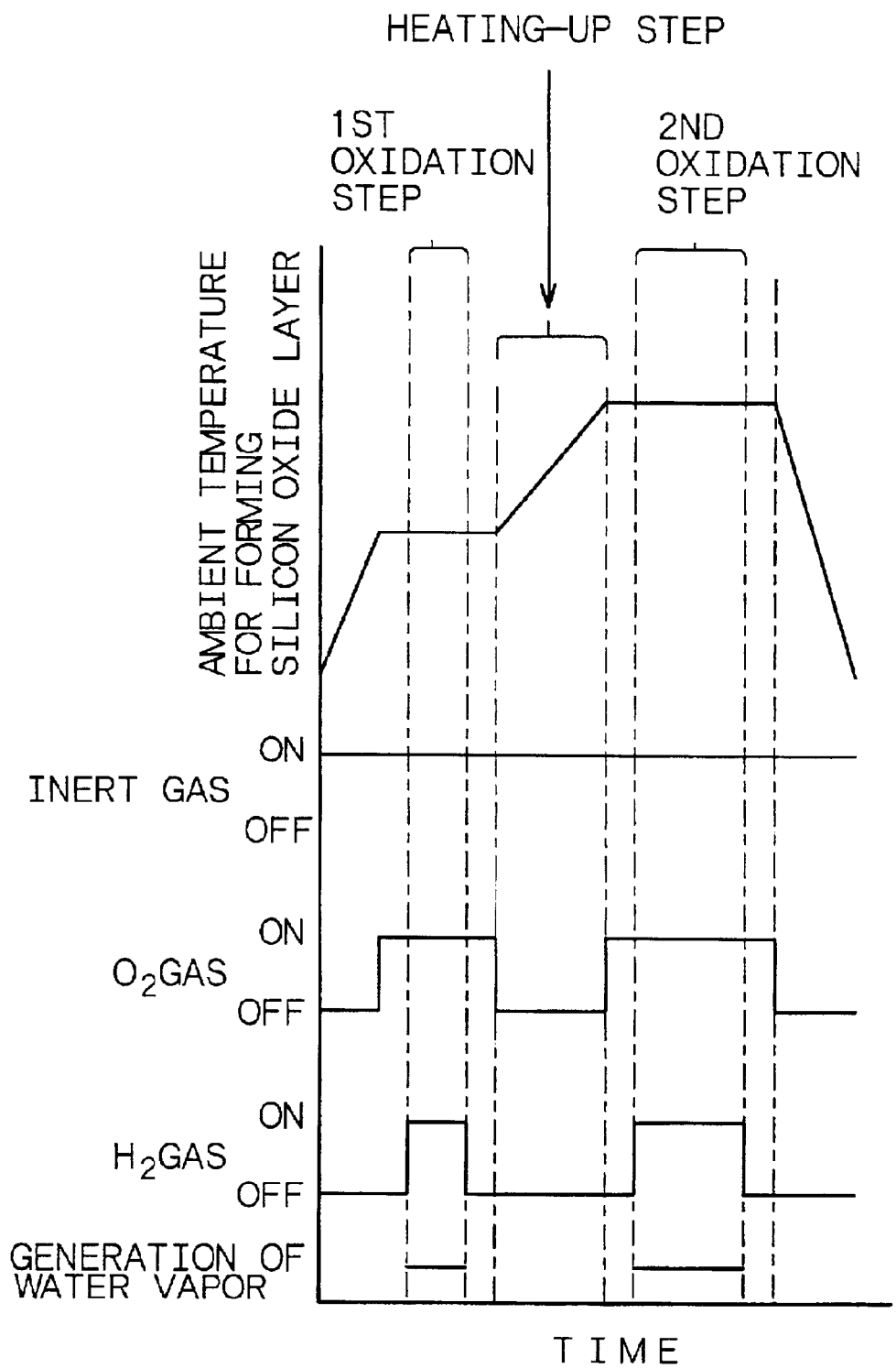
FIG. 76 schematically shows an introduction sequence of inert gas, oxygen gas and hydrogen gas in the method of forming a silicon oxide layer according to the present invention.
Figure 77:
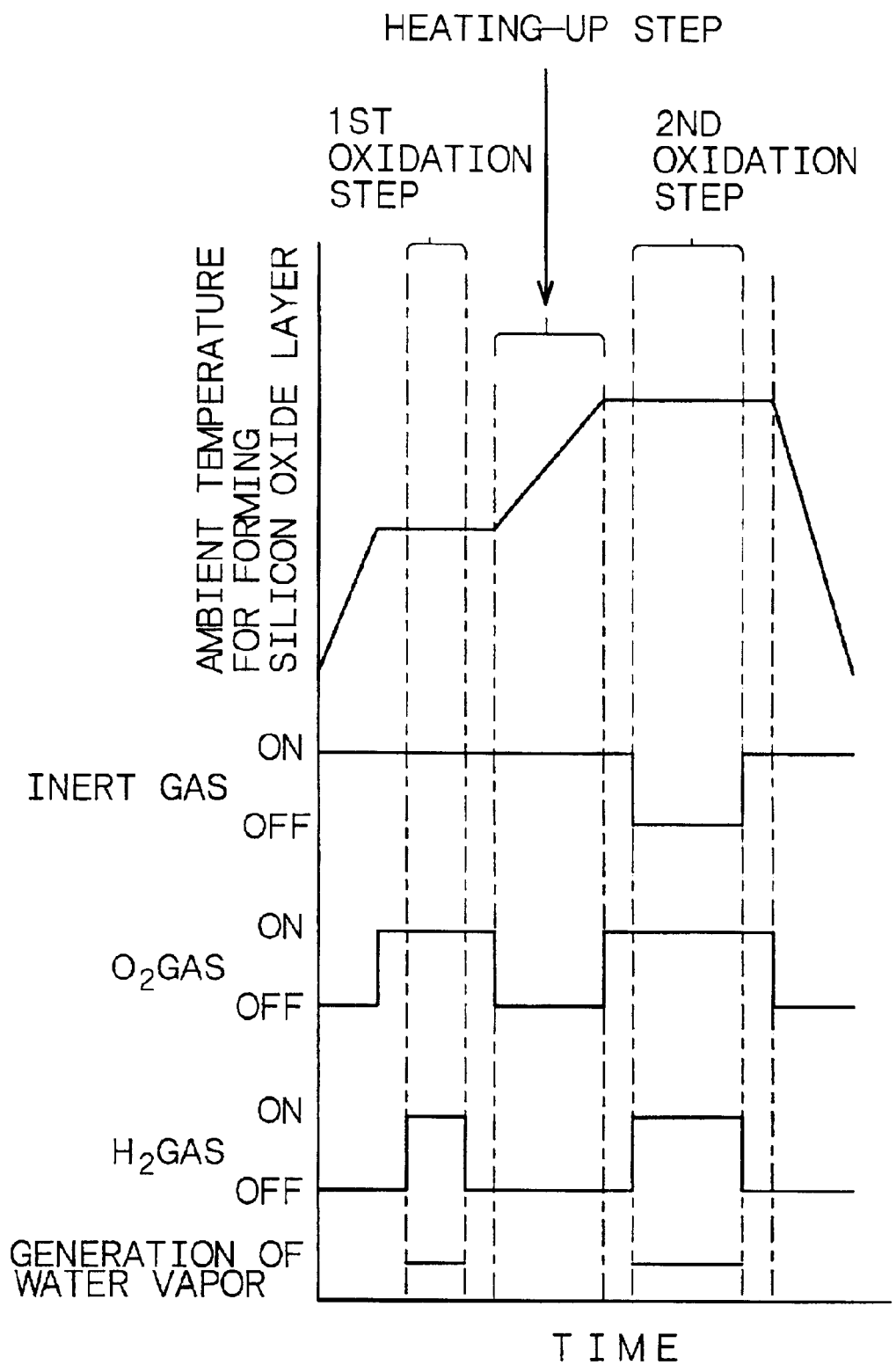
FIG. 77 schematically shows an introduction sequence of inert gas, oxygen gas and hydrogen gas in the method of forming a silicon oxide layer according to the present invention.
Figure 78:
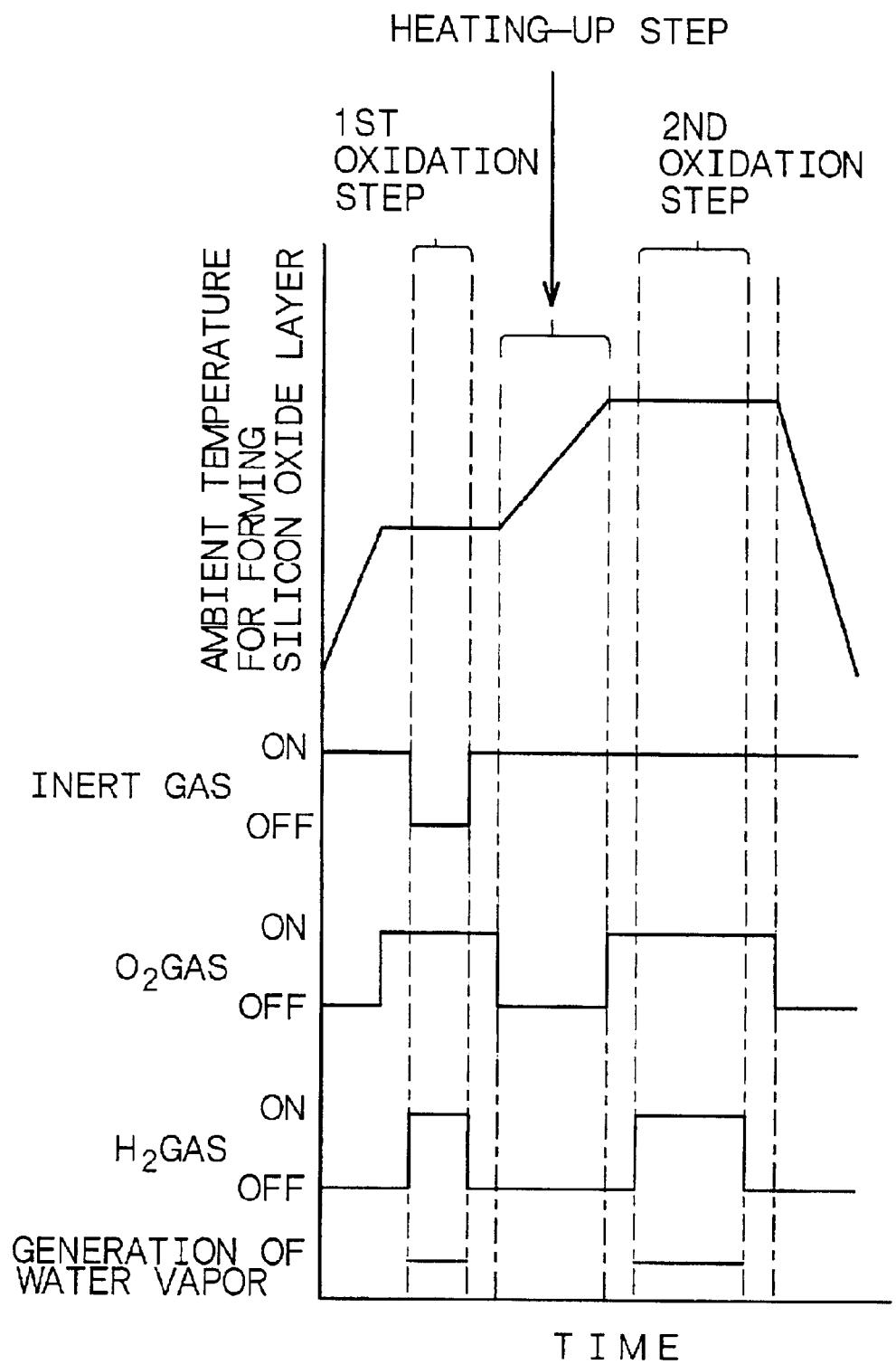
FIG. 78 schematically shows an introduction sequence of inert gas, oxygen gas and hydrogen gas in the method of forming a silicon oxide layer according to the present invention.
Figure 79:
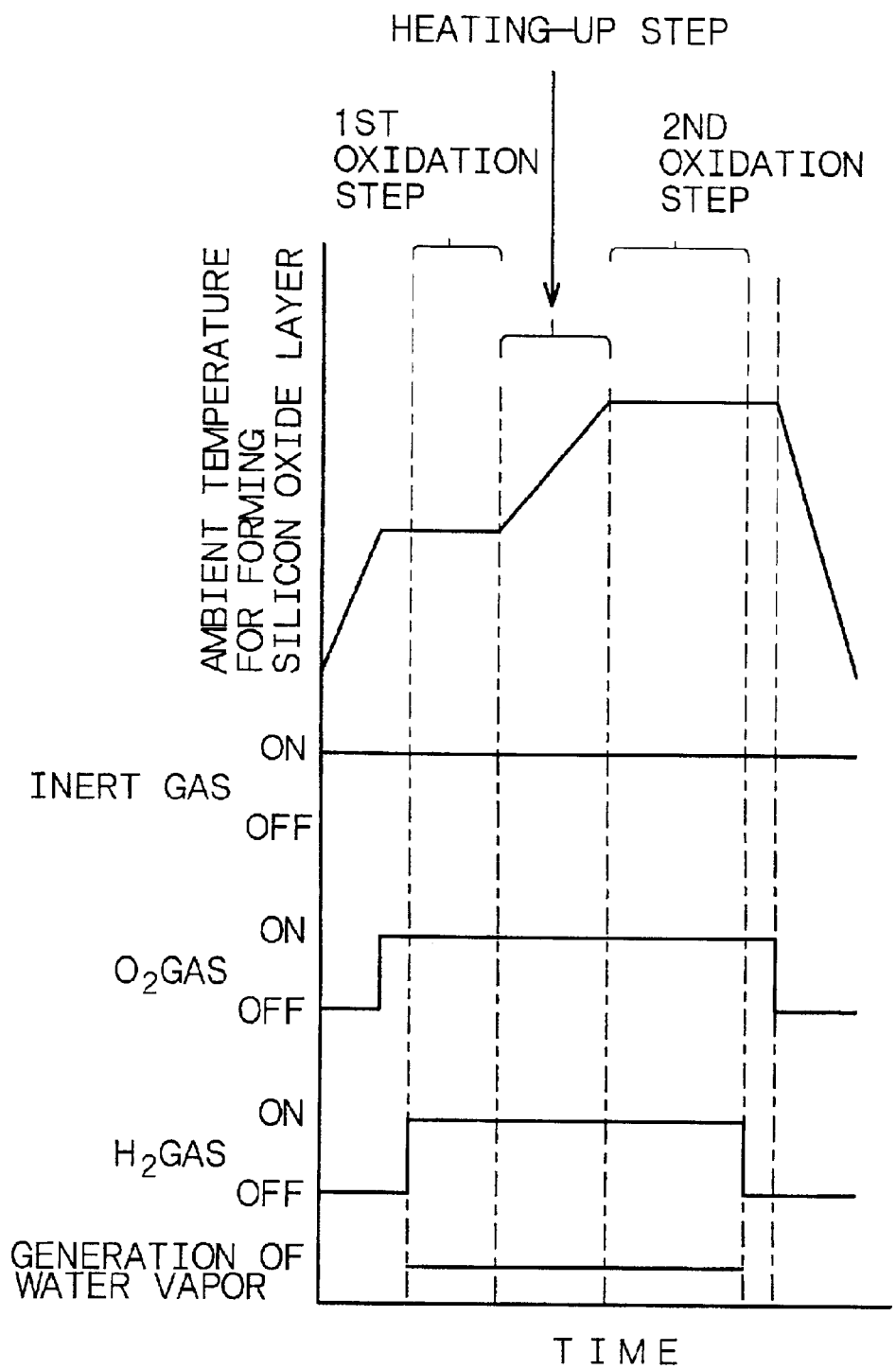
FIG. 79 schematically shows an introduction sequence of inert gas, oxygen gas and hydrogen gas in the method of forming a silicon oxide layer according to the present invention.
Figure 80:
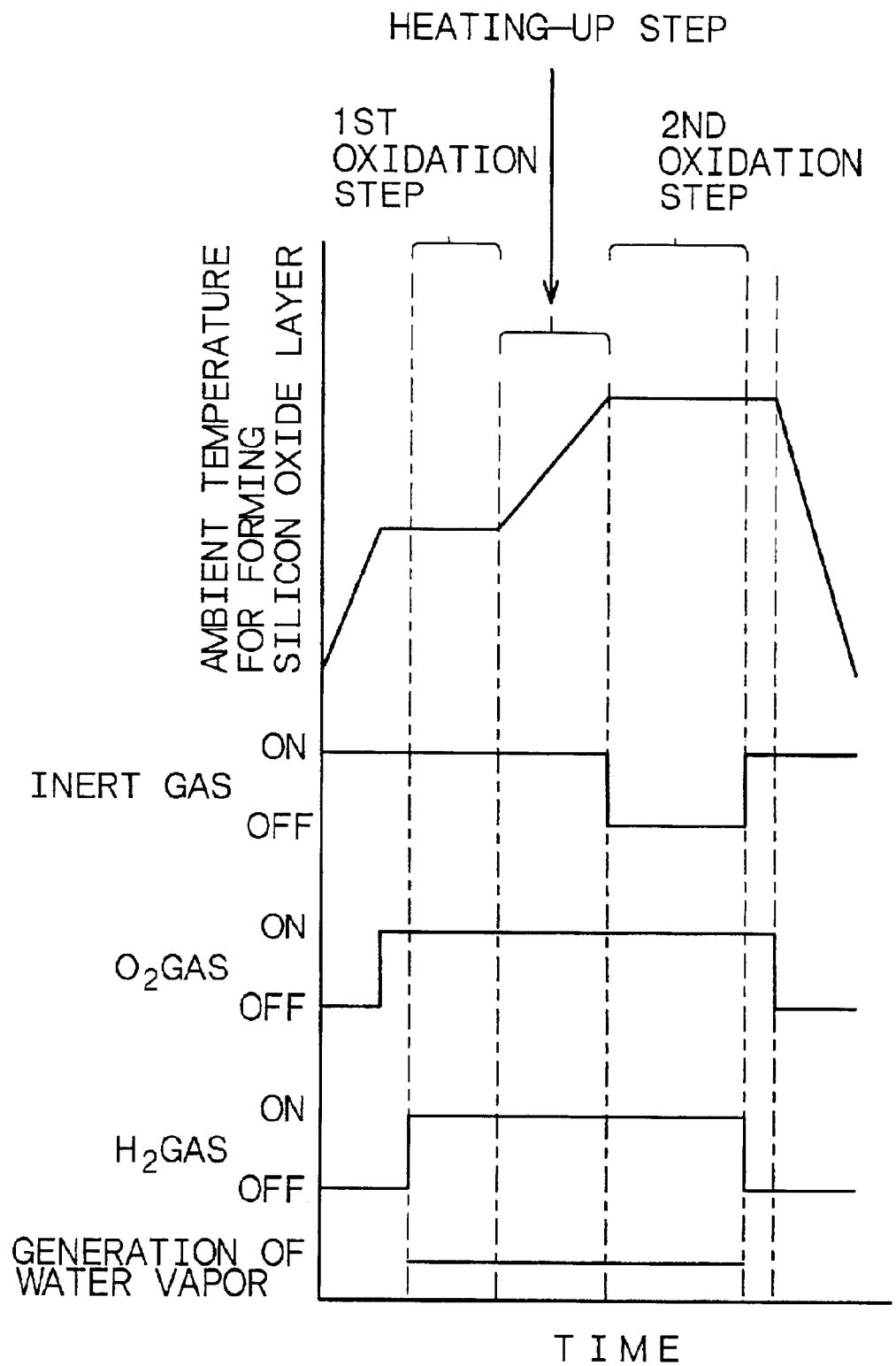
FIG. 80 schematically shows an introduction sequence of inert gas, oxygen gas and hydrogen gas in the method of forming a silicon oxide layer according to the present invention.
Figure 81:
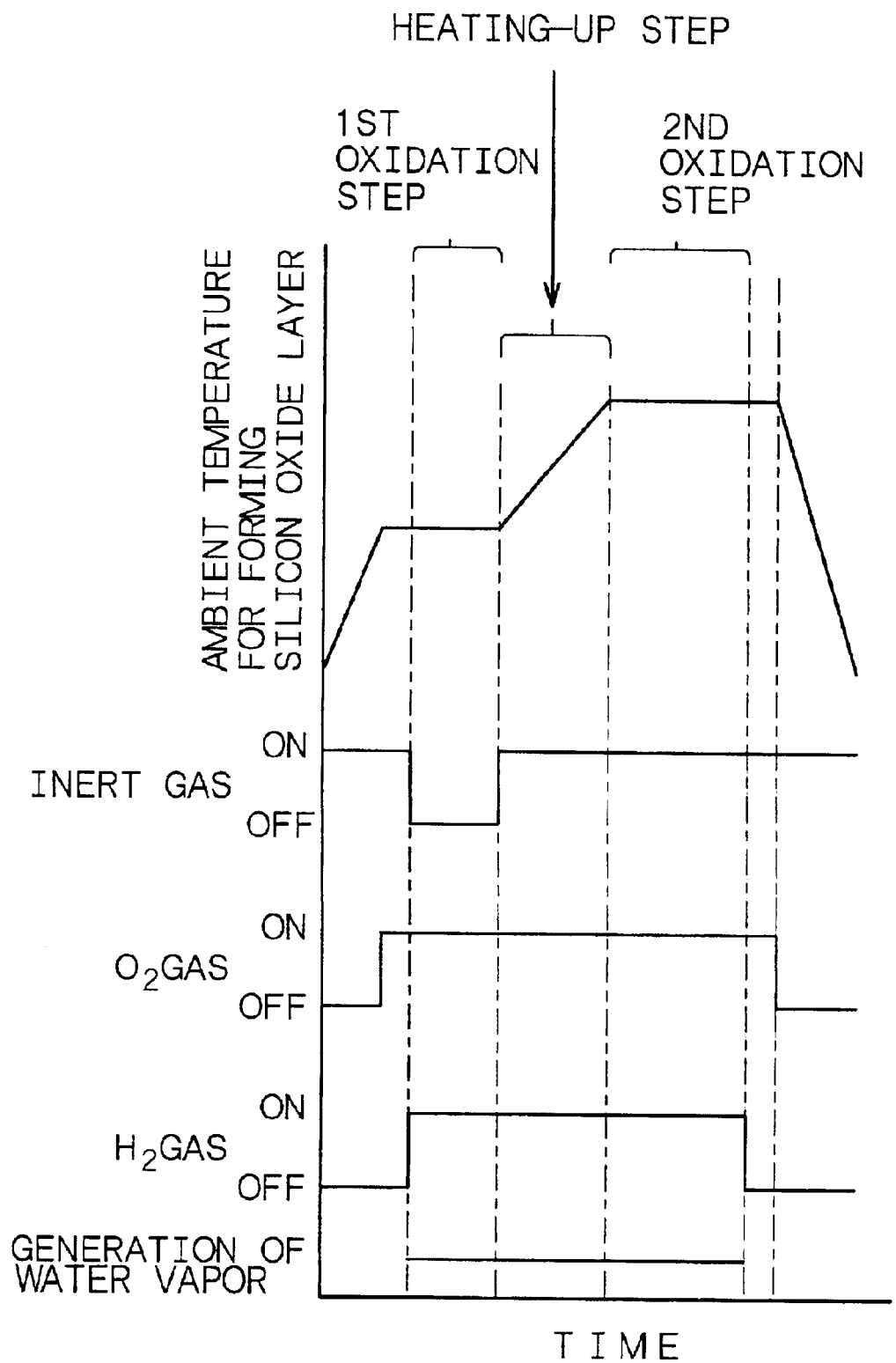
FIG. 81 schematically shows an introduction sequence of inert gas, oxygen gas and hydrogen gas in the method of forming a silicon oxide layer according to the present invention.
Figure 82A:
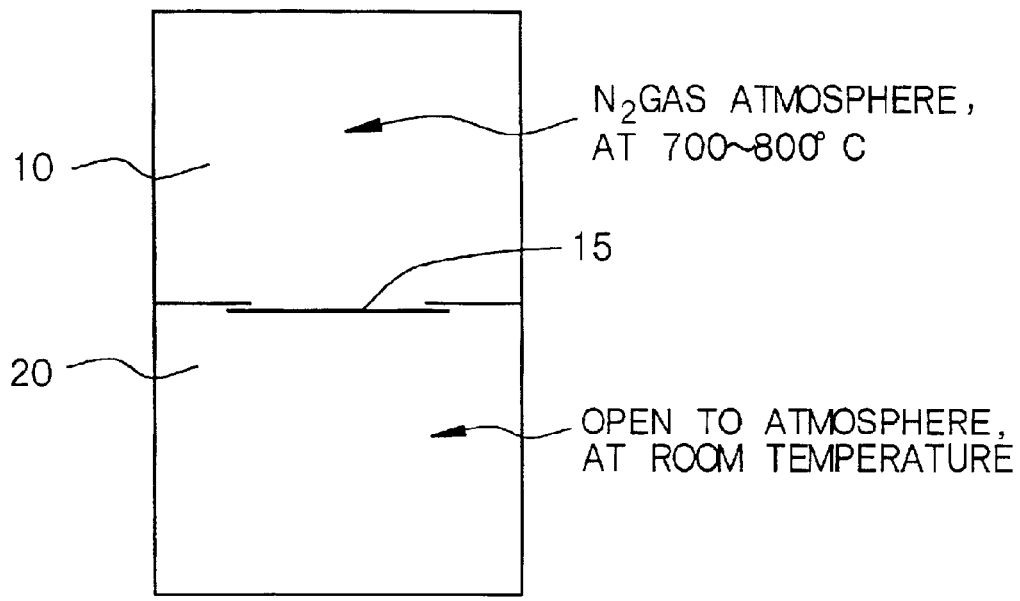
FIGS. 82A and 82B show conceptual cross sections of a vertical-type processing apparatus and so on for explaining a conventional method of forming a silicon oxide layer.
Figure 82B:
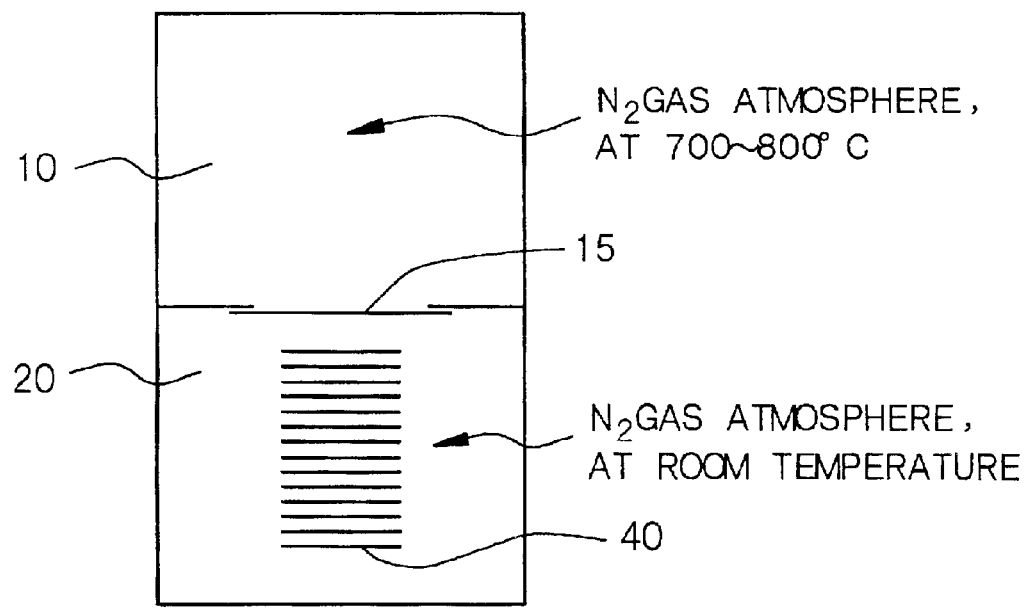
Figure 83A:
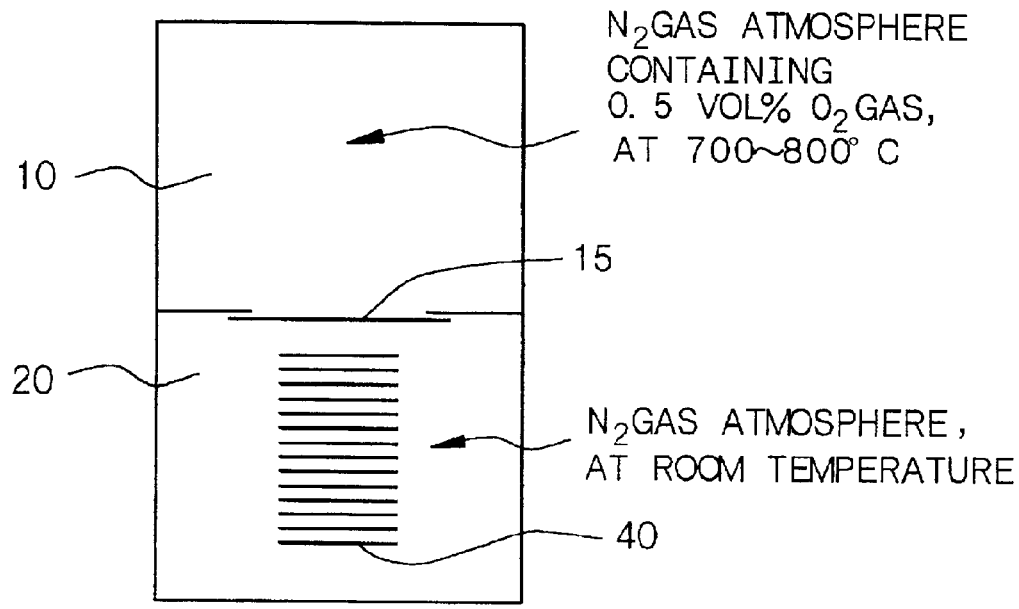
FIGS. 83A and 83B subsequent to FIG. 82C show conceptual cross sections of the vertical-type processing apparatus and so on for explaining the conventional method of forming a silicon oxide layer.
Figure 83B:
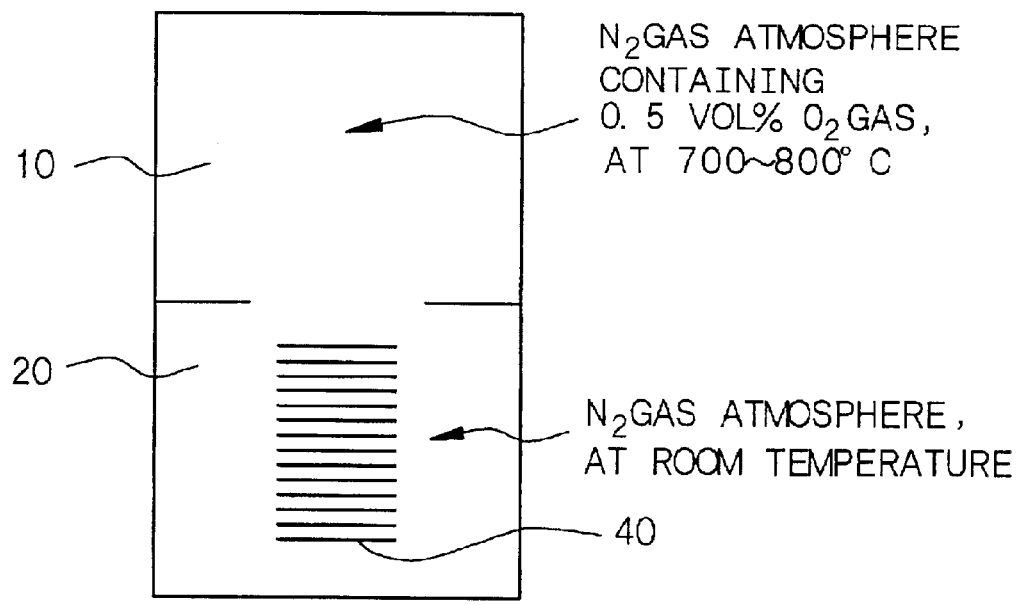
Figure 84A:
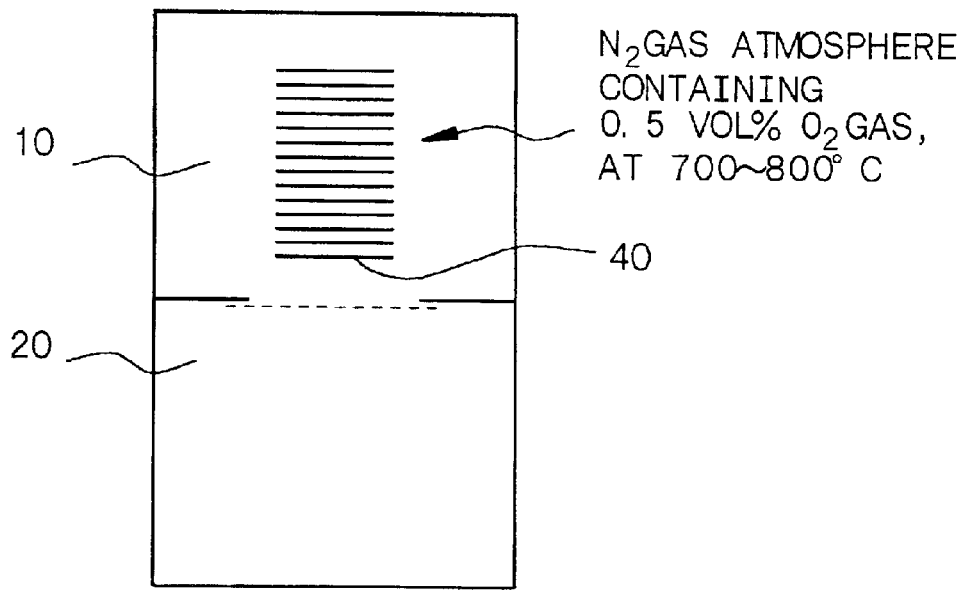
FIGS. 84A and 84B subsequent to FIG. 83B show conceptual cross section of the vertical-type processing apparatus and so on for explaining the conventional method of forming a silicon oxide layer.
Figure 84B:
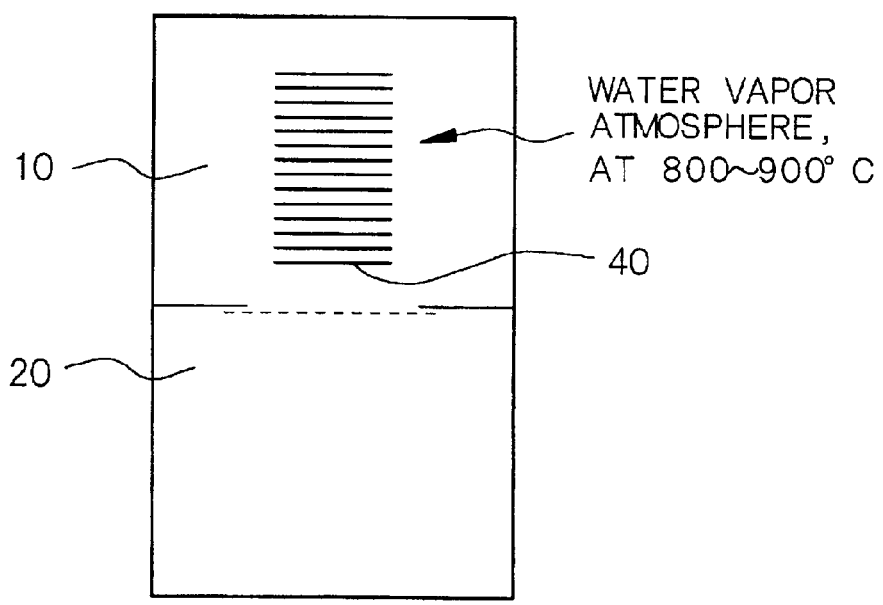

FIG. 76 shows the gas introduction sequence when the dilution of wet gas used for forming a silicon oxide layer, with inert gas in the gas introduction sequence shown in FIG. 75. The wet gas may be diluted with inert gas only in one of the first and second oxidation steps. FIGS. 77 and 78 show the gas introduction sequences in these cases. Further, the wet gas may be diluted with inert gas in the heating-up step. FIG. 79 shows the gas introduction sequence in this case. In the gas introduction sequence shown in FIG. 79, the wet gas may be diluted with inert gas only in one of the first and second oxidation steps. FIGS. 80 and 81 show the gas introduction sequences in these cases.

In the method of forming a silicon oxide layer, provided by the present invention, the formation of a silicon oxide layer on a surface of a silicon layer is initiated at an ambient temperature at which no silicon atom is eliminated from the surface of the silicon layer, or the formation of a silicon oxide layer on a surface of a silicon layer is initiated at an ambient temperature equivalent to, or higher than, a temperature at which the wet gas does not undergo condensation on the surface of the silicon layer and equivalent to, or lower than, 500° C., the occurrence of a concave or convex shape (roughening) on the silicon layer surface can be prevented. Furthermore, the finally formed silicon oxide layer contains no dry oxide layer having poor reliability, and the silicon oxide layer having excellent properties can be formed. Therefore, a decrease in channel electron mobility can be prevented, a MOS type transistor device cannot be degraded in actuation current, the occurrence of a stress induced leak which degrades the data retention characteristic in a flash memory, etc., can be prevented, and for example, a very thin gate oxide having excellent long-term reliability can be formed.

According to the preferred first embodiment A of the present invention, a silicon oxide layer which functions as a protective layer as well is formed on the surface of the silicon layer, and in this sate, after the ambient temperature is raised up to an ambient temperature for the second oxidation step, the silicon oxide layer is further formed by an oxidation method using wet gas. Therefore, the occurrence of a concave or convex shape (roughening) on the silicon layer surface does not occur in the heating-up step, and the silicon oxide layer having excellent properties can be formed. As a consequence, for example, a very thin gate oxide having excellent long-term reliability can be formed. According to the preferred first embodiment B of the present invention, the in-plane variability of temperature on the silicon layer can be decreased. Therefore, even in a case where the silicon oxide layer is formed during the heating-up step, the occurrence of in-plane variability of thickness of the silicon oxide layer can be prevented. Further, according to the preferred second embodiment of the present invention, it is sufficient to maintain the ambient temperatures of the first process chamber and the second process chamber at predetermined temperatures. Therefore, not only the temperature in each process chamber can be more accurately controlled, but also the temperature stability in each process chamber is excellent. As a result, excellent controllability of thickness of the silicon oxide layer can be obtained. Further, a decrease in a throughput is not incurred when the silicon oxide layer is formed.

What is claimed is:

1. A method of forming a silicon oxide layer comprising initiating formation of a silicon oxide layer on a surface of a silicon layer by an oxidation method using wet gas at an ambient temperature at which no silicon atom is eliminated from the surface of the silicon layer, and then forming the silicon oxide layer up to a predetermined thickness by an oxidation method using wet gas.

2. A method according to claim 1, in which the ambient temperature at which no silicon atom is eliminated from the surface of the silicon layer is a temperature at which bond of an atom terminating the surface of the silicon layer and a silicon atom is not broken.

3. A method according to claim 2, in which the temperature at which no silicon atom is eliminated from the surface of the silicon layer is a temperature at which Si—H bond is not broken.

4. A method according to claim 2, in which the temperature at which no silicon atom is eliminated from the surface of the silicon layer is a temperature at which Si—F bond is not broken.

5. A method according to claim 1, in which the oxidation method using wet gas is at least one selected from an oxidation method using pyrogenic gas, an oxidation method using water vapor generated by heating pure water and an oxidation method using water vapor generated by bubbling hot pure water with oxygen gas or inert gas.

6. A method according to claim 1, in which the ambient temperature when the formation of the silicon oxide layer having the predetermined thickness is completed is higher than the ambient temperature at which the formation of a silicon oxide layer is initiated.

7. A method according to claim 1, in which heat treatment of the silicon oxide layer is carried out after the formation of the silicon oxide layer having the predetermined thickness is completed.

8. A method according to claim 7, in which an atmosphere for the heat treatment is an inert gas atmosphere containing a halogen element.

9. A method according to claim 8, in which the halogen element is chlorine.

10. A method according to claim 9, in which chlorine is introduced as hydrogen chloride, and the content of the hydrogen chloride in the inert gas is 0.02 to 10 vol %.

11. A method according to claim 7, in which the heat treatment is carried out at 700 to 950° C.

12. A method according to claim 11, in which the heat treatment is carried out with furnace annealing.

13. A method according to claim 7, in which an ambient temperature for the heat treatment of the formed silicon oxide layer is higher than the ambient temperature at which the formation of the silicon oxide layer having the predetermined thickness is completed.

14. A method according to claim 13, in which after the formation of the silicon oxide layer having the predetermined thickness is completed, the atmosphere is replaced with an inert gas atmosphere containing a halogen element, and then, an ambient temperature is raised to a temperature for the heat treatment.

15. A method according to claim 14, in which the halogen element is chlorine.

16. A method according to claim 15, in which chlorine is introduced as hydrogen chloride, and the content of the hydrogen chloride in the inert gas is 0.02 to 10 vol %.

17. A method according to claim 1, in which an atmosphere, before the formation of a silicon oxide, is an inert gas atmosphere.

18. A method according to claim 1, including a step for cleaning the surface of the silicon layer before forming a silicon oxide layer, and in which the formation of a silicon oxide layer is initiated without exposing the surface-cleaned silicon layer to atmosphere.

19. A method according to claim 1, including a first step of forming a silicon oxide layer and a second step of forming a silicon oxide layer, in which
the first step of forming a silicon oxide layer comprises initiating formation of a silicon oxide layer on the surface of the silicon layer by an oxidation method using wet gas at an ambient temperature at which no silicon atom is eliminated from the surface of the silicon layer, and then maintaining the atmosphere at an ambient temperature range in which no silicon atom is eliminated from the surface of the silicon layer, for a predetermined period of time, to form the silicon oxide layer, and
the second step of forming a silicon oxide layer comprises further forming the silicon oxide layer up to the predetermined thickness by an oxidation method using wet gas at an ambient temperature higher than the ambient temperature range in which no silicon atom is eliminated from the surface of the silicon layer.

20. A method according to claim 19, in which the ambient temperature at which no silicon atom is eliminated from the surface of the silicon layer is a temperature at which bond of an atom terminating the surface of the silicon layer and a silicon atom is not broken.

21. A method according to claim 20, in which the temperature at which no silicon atom is eliminated from the surface of the silicon layer is a temperature at which Si—H bond is not broken.

22. A method according to claim 20, in which the temperature at which no silicon atom is eliminated from the surface of the silicon layer is a temperature at which Si—F bond is not broken.

23. A method according to claim 19, in which in the first step of forming a silicon oxide layer, in the second step of forming a silicon oxide layer or in the first and second steps of forming a silicon oxide layer, the oxidation method using wet gas is at least one selected from an oxidation method using pyrogenic gas, an oxidation method using water vapor generated by heating pure water and an oxidation method using water vapor generated by bubbling hot pure water with oxygen gas or inert gas.

24. A method according to claim 23, in which the wet gas used in the first step of forming a silicon oxide layer, in the second step of forming a silicon oxide layer or in the first and second steps of forming a silicon oxide layer contains a halogen element.

25. A method according to claim 24, in which the halogen element is chlorine.

26. A method according to claim 25, in which chlorine is introduced as hydrogen chloride, and the content of the hydrogen chloride in the wet gas is 0.02 to 10 vol %.

27. A method according to claim 19, in which the wet gas used in the first step of forming a silicon oxide layer, in the second step of forming a silicon oxide layer or in the first and second steps of forming a silicon oxide layer is diluted with inert gas.

28. A method according to claim 19, in which an apparatus for the formation of a silicon oxide layer having one process chamber is used, and the first and second steps of forming a silicon oxide layer are carried out in the process chamber.

29. A method according to claim 28, in which the first and second steps of forming a silicon oxide layer are carried out with a batch processing.

30. A method according to claim 28, in which the process chamber is provided with heating means for heating the silicon layer, the heating means is disposed outside the process chamber and nearly in parallel with the surface of the silicon layer, and the first and second steps of forming a silicon oxide layer are carried out with a single wafer processing.

31. A method according to claim 28, including a heating-up step between the first step of forming a silicon oxide layer and the second step of forming a silicon oxide layer.

32. A method according to claim 31, in which an atmosphere in the heating-up step is an inert gas atmosphere or an oxidative atmosphere containing wet gas.

33. A method according to claim 32, in which the inert gas or the wet gas in the atmosphere in the heating-up step contains a halogen element.

34. A method according to claim 33, in which the halogen element is chlorine.

35. A method according to claim 34, in which chlorine is introduced as hydrogen chloride, and the content of the hydrogen chloride in the inert gas or the wet gas is 0.02 to 10 vol %.

36. A method according to claim 31, in which the atmosphere in the heating-up step is an oxidative atmosphere containing the wet gas diluted with inert gas.

37. A method according to claim 19, in which used is an apparatus for the formation of a silicon oxide layer which has a first process chamber for forming a silicon oxide layer, a second process chamber for forming a silicon oxide layer, and a transfer passage connecting the first process chamber and the second process chamber, and
the first step of forming a silicon oxide layer is carried out in the first process chamber, then the silicon layer is transferred from the first process chamber to the second process chamber through the transfer passage, and then, the second step of forming a silicon oxide layer is carried out in the second process chamber.

38. A method according to claim 37, in which the silicon layer is transferred from the first process chamber to the second process chamber through the transfer passage without exposing the silicon layer to atmosphere.

39. A method according to claim 38, in which an ambient temperature in the transfer passage during the transfer of the silicon layer from the first process chamber to the second process chamber is a temperature nearly equivalent to the ambient temperature at which the silicon oxide layer is formed on the surface of the silicon layer in the first process chamber.

40. A method according to claim 37, in which the first and second steps of forming a silicon oxide layer are carried out with a batch processing.

41. A method according to claim 37, in which the first step of forming a silicon oxide layer is carried out with a single wafer processing and the second step of forming a silicon oxide layer is carried out with a batch processing.

42. A method according to claim 37, in which the first and second steps of forming a silicon oxide layer are carried out with a single wafer processing.

43. A method according to claim 37, in which the apparatus for the formation of a silicon oxide layer is further provided with a shutter which is disposed between that portion of the transfer passage which communicates with the first process chamber and that portion of the transfer passage which communicates with the second process chamber.

44. A method according to claim 19, in which heat treatment of the silicon oxide layer is carried out after the second step of forming a silicon oxide layer is completed.

45. A method according to claim 44, in which an atmosphere for the heat treatment is an inert gas atmosphere containing a halogen element.

46. A method according to claim 45, in which the halogen element is chlorine.

47. A method according to claim 46, in which chlorine is introduced as hydrogen chloride, and the content of the hydrogen chloride in the inert gas is 0.02 to 10 vol %.

48. A method according to claim 44, in which the heat treatment is carried out at 700 to 950° C.

49. A method according to claim 48, in which the heat treatment is carried out with furnace annealing.

50. A method according to claim 44, in which an ambient temperature for the heat treatment of the formed silicon oxide layer is higher than the ambient temperature at which the formation of the silicon oxide layer in the second step of forming a silicon oxide layer is carried out.

51. A method according to claim 50, in which after the second step of forming a silicon oxide layer is completed, the atmosphere is replaced with an inert gas atmosphere containing a halogen element, and then, an ambient temperature is raised to a temperature for the heat treatment.

52. A method according to claim 51, in which the halogen element is chlorine.

53. A method according to claim 52, in which chlorine is introduced as hydrogen chloride, and the content of the hydrogen chloride in the inert gas is 0.02 to 10 vol %.

54. A method according to claim 44, in which an atmosphere for the heat treatment is a nitrogen-containing gas atmosphere.

55. A method according to claim 19, in which an atmosphere, before the initiation of the first step of forming a silicon oxide layer, is an inert gas atmosphere.

56. A method according to claim 19, including a step for cleaning the surface of the silicon layer before the initiation of the first step of forming a silicon oxide layer is initiated without exposing the surface-cleaned silicon layer to atmosphere.

57. A method according to claim 1, in which the silicon layer is an epitaxial silicon layer formed on a substrate.

58. A method of forming a silicon oxide layer comprising initiating formation of a silicon oxide layer on a surface of a silicon layer by an oxidation method using wet gas at an ambient temperature which is equivalent to, or higher than, a temperature at which the wet gas does not undergo condensation on the surface of the silicon layer and is equivalent to, or lower than, 500° C., and then forming the silicon oxide layer up to a predetermined thickness by an oxidation method using wet gas.

59. A method according to claim 58, in which the formation of a silicon oxide layer on the surface of the silicon layer by an oxidation method using wet gas is initiated at an ambient temperature which is equivalent to, or higher than, a temperature at which the wet gas does not undergo condensation on the surface of the silicon layer and is equivalent to, or lower than, 450° C.

60. A method according to claim 59, in which the formation of a silicon oxide layer on the surface of the silicon layer by an oxidation method using wet gas is initiated at an ambient temperature which is equivalent to, or higher than, a temperature at which the wet gas does not undergo condensation on the surface of the silicon layer and is equivalent to, or lower than, 400° C.

61. A method according to claim 58, in which the oxidation method using wet gas is at least one selected from an oxidation method using pyrogenic gas, an oxidation method using water vapor generated by heating pure water and an oxidation method using water vapor generated by bubbling hot pure water with oxygen gas or inert gas.

62. A method according to claim 58, in which the ambient temperature when the formation of the silicon oxide layer having the predetermined thickness is completed is higher than the ambient temperature at which the formation of a silicon oxide layer is initiated.

63. A method according to claim 58, in which heat treatment of the silicon oxide layer is carried out after the formation of the silicon oxide layer having the predetermined thickness is completed.

64. A method according to claim 63, in which an atmosphere for the heat treatment is an inert gas atmosphere containing a halogen element.

65. A method according to claim 64, in which the halogen element is chlorine.

66. A method according to claim 65, in which chlorine is introduced as hydrogen chloride, and the content of the hydrogen chloride in the inert gas is 0.02 to 10 vol %.

67. A method according to claim 63, in which the heat treatment is carried out at 700 to 950° C.

68. A method according to claim 67, in which the heat treatment is carried out with furnace annealing.

69. A method according to claim 63, in which an ambient temperature for the heat treatment of the formed silicon oxide layer is higher than the ambient temperature at which the formation of the silicon oxide layer having the predetermined thickness is completed.

70. A method according to claim 69, in which after the formation of the silicon oxide layer having the predetermined thickness is completed, the atmosphere is replaced with an inert gas atmosphere containing a halogen element, and then, an ambient temperature is raised to a temperature for the heat treatment.

71. A method according to claim 70, in which the halogen element is chlorine.

72. A method according to claim 71, in which chlorine is introduced as hydrogen chloride, and the content of the hydrogen chloride in the inert gas is 0.02 to 10 vol %.

73. A method according to claim 58, in which an atmosphere, before the formation of a silicon oxide, is an inert gas atmosphere.

74. A method according to claim 58, including a step for cleaning the surface of the silicon layer before forming a silicon oxide layer, and in which the formation of a silicon oxide layer is initiated without exposing the surface-cleaned silicon layer to atmosphere.

75. A method according to claim 58, in which the silicon layer is an epitaxial silicon layer formed on a substrate.

* * * * *